(12) United States Patent
Park et al.

(10) Patent No.: US 10,950,802 B2
(45) Date of Patent: *Mar. 16, 2021

(54) ORGANIC LIGHT-EMITTING DIODE WITH HIGH EFFICIENCY

(71) Applicant: SFC CO., LTD., Cheongju-si (KR)

(72) Inventors: Young-Hwan Park, Cheongju-si (KR); Seo-Yeon Yoon, Seongnam-si (KR); Soon-Wook Cha, Goyang-si (KR); Sung-Keun Choi, Cheongju-si (KR); Si-In Kim, Daejeon (KR)

(73) Assignee: SFC CO., LTD., Cheongju-si (KR)

(*) Notice: Subject to any disclaimer, the term of this patent is extended or adjusted under 35 U.S.C. 154(b) by 384 days.

This patent is subject to a terminal disclaimer.

(21) Appl. No.: 15/574,892

(22) PCT Filed: May 27, 2016

(86) PCT No.: PCT/KR2016/005605
§ 371 (c)(1),
(2) Date: Nov. 17, 2017

(87) PCT Pub. No.: WO2016/200080
PCT Pub. Date: Dec. 15, 2016

(65) Prior Publication Data
US 2018/0166638 A1 Jun. 14, 2018

(30) Foreign Application Priority Data
Jun. 12, 2015 (KR) .......................... 10-2015-0083304

(51) Int. Cl.
| | | |
|---|---|---|
| H01L 51/50 | (2006.01) |
| H01L 51/00 | (2006.01) |
| C09K 11/06 | (2006.01) |
| H01L 51/52 | (2006.01) |
| H01L 27/32 | (2006.01) |

(52) U.S. Cl.
CPC .......... *H01L 51/0073* (2013.01); *C09K 11/06* (2013.01); *H01L 27/3209* (2013.01); *H01L 51/0053* (2013.01); *H01L 51/0058* (2013.01); *H01L 51/0061* (2013.01); *H01L 51/0067* (2013.01); *H01L 51/0074* (2013.01); *H01L 51/0094* (2013.01); *H01L 51/5056* (2013.01); *H01L 51/5092* (2013.01); *H01L 51/5203* (2013.01); *C09K 2211/1033* (2013.01); *C09K 2211/1048* (2013.01); *C09K 2211/1088* (2013.01); *C09K 2211/1092* (2013.01); *C09K 2211/1096* (2013.01); *H01L 51/0072* (2013.01); *H01L 51/5012* (2013.01); *H01L 51/5072* (2013.01); *H01L 51/5096* (2013.01)

(58) Field of Classification Search
CPC ............. H01L 51/0073; H01L 51/0053; H01L 51/0061; H01L 51/0058; H01L 51/5203; H01L 51/5092; H01L 51/5056; H01L 51/0094; H01L 51/0074; H01L 51/0067; H01L 27/3209; H01L 51/5096; H01L 51/5012; H01L 51/5072; H01L 51/0072; H01L 2251/50; H01L 2251/30; H01L 51/50; H01L 51/0071; H01L 51/0052; H01L 51/0059; H01L 51/006; H01L 51/0055; H01L 51/0056; C09K 11/06; C09K 2211/1096; C09K 2211/1092; C09K 2211/1088; C09K 2211/1048; C09K 2211/1033

See application file for complete search history.

(56) References Cited

U.S. PATENT DOCUMENTS

| | | | | |
|---|---|---|---|---|
| 2010/0045170 A1* | 2/2010 | Lee | .................. | C07C 13/547 313/504 |
| 2014/0054559 A1* | 2/2014 | Kim | .................. | H01L 51/0094 257/40 |
| 2014/0332787 A1* | 11/2014 | Hong | .................. | H05B 33/14 257/40 |
| 2016/0260901 A1* | 9/2016 | Kim | .................. | C07C 211/43 |
| 2017/0186967 A1* | 6/2017 | Hayashi | .................. | C07D 401/10 |

FOREIGN PATENT DOCUMENTS

| | | | |
|---|---|---|---|
| CN | 102227485 A | 10/2011 | |
| EP | 0690052 A2 * | 1/1996 | .......... C07D 239/26 |
| EP | 3404735 A1 | 11/2018 | |

(Continued)

OTHER PUBLICATIONS

KR 20140087804 A—translation (Year: 2014).*
EP 0690052 A2—translation (Year: 1996).*
Office Action from Korean Intellectual Property Office of 10-2015-0083304, dated Oct. 4, 2018.
Office Action from China National Intellectual Property Administration, dated Nov. 28, 2018.

(Continued)

*Primary Examiner* — Lucas A Stelling
*Assistant Examiner* — Rachel Simbana
(74) *Attorney, Agent, or Firm* — STIP Law Group, LLC

(57) ABSTRACT

The present invention relates to an organic light-emitting diode which can operate at a low voltage and has a long lifespan compound and, more particular, to an organic light-emitting diode, comprising: a first electrode; a second electrode facing the first electrode; and a light-emitting layer and an electron transport layer sequentially arranged between the first and the second electrode, wherein the light-emitting layer contains at least one of the amine compounds represented by following Chemical Formula A or Chemical Formula B, and the electron transport layer contains at least one of the compounds represented by the following Chemical Formula E. The structures of Chemical Formulas A, B, and E are as shown in the specification.

14 Claims, 2 Drawing Sheets

(56) References Cited

FOREIGN PATENT DOCUMENTS

| JP | 2010034548 A | 2/2010 | |
|---|---|---|---|
| KR | 1020060022676 A | 3/2006 | |
| KR | 1020080015865 A | 2/2008 | |
| KR | 1020100075358 A | 7/2010 | |
| KR | 1020110116157 A | 10/2011 | |
| KR | 1020120047706 A | 5/2012 | |
| KR | 20140087804 A * | 7/2014 | |
| KR | 1020140145000 A | 12/2014 | |
| KR | 1020160141359 A | 12/2016 | |
| WO | WO2014010910 A1 | 1/2014 | |
| WO | WO-2014185751 A1 * | 11/2014 | ........... C07D 405/04 |
| WO | WO2015002208 A1 | 1/2015 | |
| WO | WO2015022051 A1 | 2/2015 | |
| WO | WO2015072520 A1 | 5/2015 | |

OTHER PUBLICATIONS

The extended European search report of EP 16 80 7721, dated Jan. 2, 2019.
International Search Report of PCT/KR2016/005605, dated Aug. 25, 2016.

* cited by examiner

ORGANIC LIGHT-EMITTING DIODE WITH HIGH EFFICIENCY

CROSS-REFERENCE TO RELATED APPLICATIONS

This application is the U.S. National Phase under 35 U.S.C. § 371 of International Application No. PCT/KR2016/005605 filed on May 27, 2016, which in turn claims the benefit of Korean Application No. 10-2015-0083304, filed on Jun. 12, 2015, the disclosures of which are incorporated by reference into the present application.

TECHNICAL FIELD

The present invention relates to an organic light-emitting diode with improved characteristics and, more particularly, to an organic light-emitting diode with high efficiency and low driving voltage in which compounds of specific structures are used for a light-emitting layer and an electron injection layer.

BACKGROUND ART

Organic light-emitting diodes, based on self-luminescence, exhibit the advantages of having a wide viewing angle, excellent contrast, fast response time, high brightness, and excellent driving voltage and response rate characteristics, and furthermore allow for a polychromic display.

A typical organic light-emitting diode includes a positive electrode (anode) and a negative electrode (cathode), facing each other, with an organic emissive layer, disposed therebetween, for emitting light.

As to the general structure of the organic light-emitting diode, a hole transport layer, a light-emitting layer, an electron transport layer, and a cathode are formed in that order on an anode. Here, all of the hole transport layer, the light-emitting layer, and the electron transport layer are organic films comprising organic compounds.

An organic light-emitting diode having such a structure operates as follows: when a voltage is applied between the anode and the cathode, the anode injects holes, which are then transferred to the light-emitting layer via the hole transport layer while electrons injected from the cathode move to the light-emitting layer via the electron transport layer. In the luminescent zone, the carriers, such as holes and electrons, recombine to produce an exciton. When the exciton returns to the ground state from the excited state, the molecule of the light-emitting layer emits light.

Materials used as the organic layers in organic light-emitting diodes may be divided according to the functions thereof into luminescent materials and charge carrier materials, for example, a hole injection material, a hole transport material, an electron injection material, and an electron transport material. The light-emitting mechanism forms the basis of classification of luminescent materials as fluorescent and phosphorescent materials, which use excitons in singlet and triplet states, respectively.

Meanwhile, when a single material is employed as the luminescent material, intermolecular actions cause the maximum luminescence wavelength to shift toward a longer wavelength, resulting in a reduction in color purity and light emission efficiency due to light attenuation. In this regard, a host-dopant system may be used as a luminescent material so as to increase the color purity and the light emission efficiency through energy transfer. This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light of desired wavelengths can be obtained depending on the kind of the dopant because the wavelength of the host moves to the wavelength range of the dopant.

With regard to related arts pertaining to dopant compounds in the light-emitting layer, reference may be made to Korean Patent No. 10-2008-0015865 A (Feb. 20, 2008), which describes an organic light-emitting diode using an arylamine-coupled indenofluorene derivative, and Korean Patent No. 10-2012-0047706 A (May 14, 2012), which describes an organic photoelectric device using a compound in which dibenzofuran or dibenzothiophene intramolecularly coexists with fluorene or in which benzofuran or dibenzothiophene intramolecularly coexists with carbazole.

Another related art for improving the efficiency of an organic light-emitting diode can be found in Korean Patent No. 10-2011-0116157 A (Nov. 25, 2011), which discloses an electron transporting material having a pyridine skeleton with substituents at positions 1, 3 and 5 thereof, and an organic light-emitting diode comprising the same.

Another technique for improving an organic light-emitting diode in luminance efficiency can be found in Korean Patent No. 10-2006-0022676 A (Mar. 10, 2006), which describes an organic electroluminescence device having a blocking layer, disposed between a light-emitting layer and an electron transport layer, for controlling electron density.

Although various efforts including the documents describing the related art have been made to fabricate organic light-emitting devices having more effective luminescence characteristics, the continued development of organic light-emitting devices having higher effective luminance efficiency is still needed.

DETAILED DESCRIPTION OF THE INVENTION

Technical Problem

The present invention has been made in order to solve the above-mentioned problems, and the purpose of the present invention is to provide an organic light-emitting diode exhibiting high efficiency and low driving voltage characteristics.

Technical Solution

The present invention provides an organic light-emitting diode, comprising: a first electrode; a second electrode facing the first electrode; and a light-emitting layer and an electron transport layer sequentially arranged between the first and the second electrode, wherein the light-emitting layer contains at least one of the amine compounds represented by following Chemical Formula A or Chemical Formula B, and the electron transport layer contains at least one of the compounds represented by the following Chemical Formula E:

[Chemical Formula A]

[Chemical Formula B]

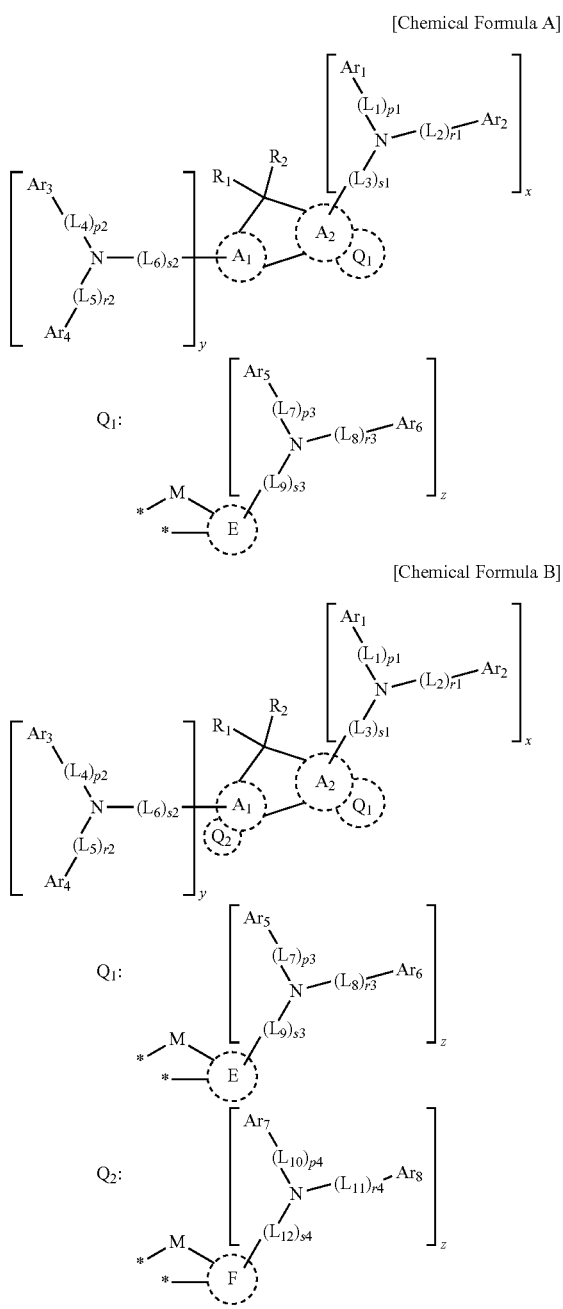

wherein, $A_1$, $A_2$, E, and F may be the same or different, and are each independently a substituted or unsubstituted aromatic hydrocarbon ring of 6 to 50 carbon atoms, or a substituted or unsubstituted heteroaromatic ring of 2 to 40 carbon atoms, wherein two adjacent carbon atoms within the aromatic ring $A_1$ and two adjacent carbon atoms within the aromatic ring $A_2$ form a 5-membered fused ring with a carbon atom to which the substituents $R_1$ and $R_2$ are both bonded;

linkers $L_1$ to $L_{12}$ may be the same or different, and are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_3$, $CR4R5$, $SiR_6R7$, $GeR_8R9$, O, S, and Se;

$R_1$ to R9 and $Ar_1$ to $Ar_8$ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkylgermanium of 1 to 30 carbon atoms, a substituted or unsubstituted arylgermanium of 6 to 30 carbon atoms, a cyano, a nitro, and a halogen, with the proviso that $R_1$ and $R_2$ may be bonded to each other to form a mono- or polycyclic aliphatic or aromatic ring, which may be a heterocyclic ring containing at least one heteroatom selected from among N, O, P, Si, S, Ge, Se, and Te as a ring member;

p1 to p4, r1 to r4, and s1 to s4 are each independently an integer of 1 to 3, with the proviso that when any of them is 2 or greater, the corresponding linkers may be the same or different, x is an integer of 1 or 2, and y and z may be the same or different and are each independently an integer of 0 to 3; and respective rings may be formed through linkages between $Ar_1$ and $Ar_2$, between $Ar_3$ and $Ar_4$, between $Ar_5$ and $Ar_6$, and between $Ar_7$ and $Ar_8$;

two adjacent carbon atoms of the $A_2$ ring moiety of Chemical Formula A may occupy respective positions * of Structural Formula $Q_1$ to form a fused ring; and two adjacent carbon atoms of the $A_1$ ring moiety of Chemical Formula B may occupy respective positions * of structural Formula $Q_2$ to form a fused ring, and two adjacent carbon atoms of the $A_2$ ring moiety of Chemical Formula B may occupy respective positions * of Structural Formula $Q_1$ to form a fused ring; and

[Chemical Formula E]

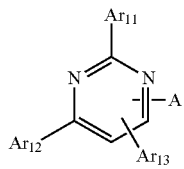

wherein, $Ar_{11}$, $Ar_{12}$, and $Ar_{13}$ may be the same or different, and are each independently a hydrogen atom, a deuterium atom, a substituted or unsubstituted aryl of 6 to 50 carbon atoms, or a substituted or unsubstituted heteroaryl of 2 to 50 carbon atoms, with the proviso that when $Ar_{12}$ is a hydrogen or deuterium atom, $Ar_{13}$ is neither a hydrogen atom nor a deuterium atom, A is a monovalent substituent represented by the following Structural Formula A:

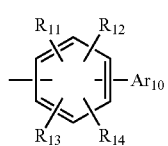

[Structural Formula A]

wherein $Ar_{10}$ is a substituted or unsubstituted heteroaryl of 2 to 50 carbon atoms, $R_{11}$ to $R_{14}$ may be the same or different, and are each independently any one selected from among a hydrogen atom, a deuterium atom, a fluorine atom, a chlorine atom, a cyano, a substituted or unsubstituted alkyl of 1 to 30 carbon atoms, a substituted or unsubstituted aryl of 6 to 50 carbon atoms, and a substituted or unsubstituted heteroaryl of 2 to 50 carbon atoms.

In addition, the present invention provide an organic light-emitting diode comprising a first electrode as an anode; a second electrode as a cathode; and the light-emitting layer and the electron transport layer sequentially arranged between the first and the second electrode, with an electron density control layer between the light-emitting layer and the electron transport layer.

Advantageous Effects

Employing compounds of specific structures in a light-emitting layer and an electron transport layer, the organic light-emitting diode of the present invention can exhibit higher efficiency and a lower driving voltage than on fabricated according to a conventional technique.

In addition, the inclusion of an electron density control layer between a light-emitting layer and an electron transport layer can impart further enhanced efficiency and more desirable characteristics to the organic light-emitting diode.

MODE FOR CARRYING OUT THE INVENTION

Figure 1:
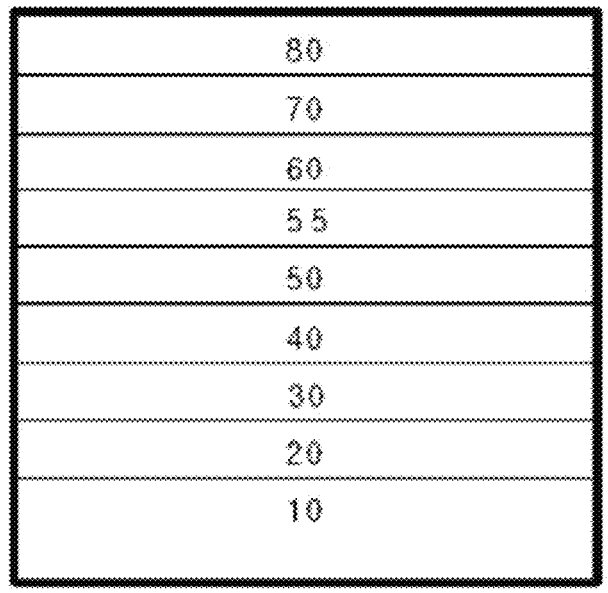
FIG. 1 is a schematic cross-sectional view of the structure of an organic light-emitting diode comprising the hole injection layer and the electron injection layer according to some embodiments of the present invention.

Below, a detailed description is given of the present invention.

The present invention provides an organic light-emitting diode, comprising: a first electrode; a second electrode facing the first electrode; and a light-emitting layer and an electron transport layer sequentially arranged between the first and the second electrode, wherein the light-emitting layer contains at least one of the amine compounds represented by the following Chemical Formula A or Chemical Formula B, and the electron transport layer contains at least one of the compounds represented by the following Chemical Formula E:

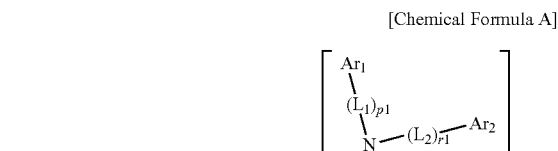

[Chemical Formula A]

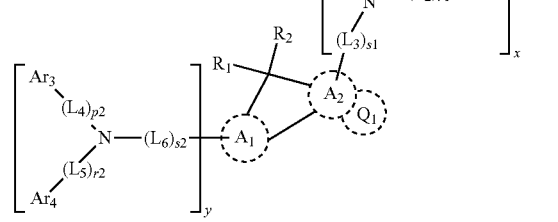

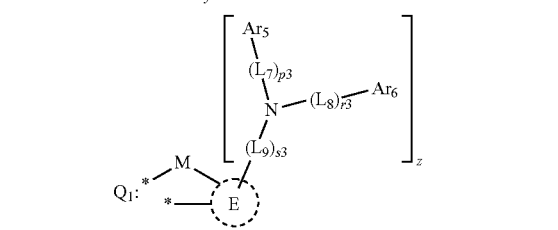

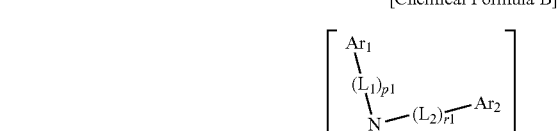

[Chemical Formula B]

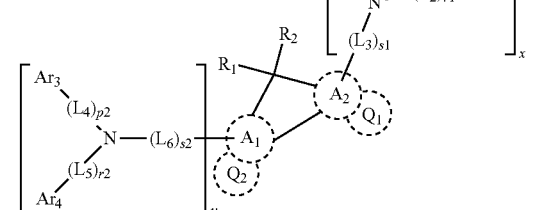

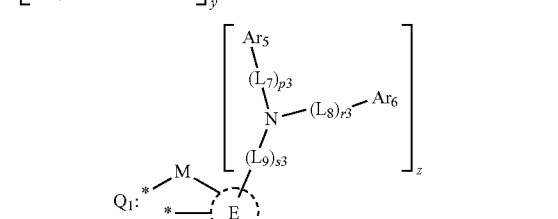

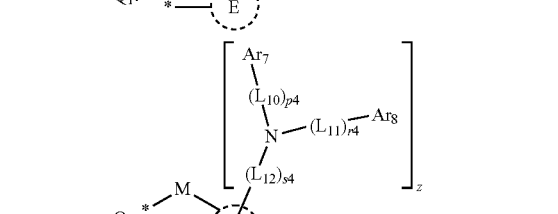

wherein, $A_1$, $A_2$, E, and F may be the same or different, and are each independently a substituted or unsubstituted aromatic hydrocarbon ring of 6 to 50 carbon atoms or a substituted or unsubstituted heteroaromatic ring of 2 to 40 carbon atoms, wherein two adjacent carbon atoms within the aromatic ring $A_1$ and two adjacent carbon atoms within the aromatic ring $A_2$ form a 5-membered fused ring with a carbon atom to which the substituents $R_1$ and $R_2$ are both bonded;

linkers $L_1$ to $L_{12}$ may be the same or different, and are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_3$, $CR_4R_5$, $SiR_6R_7$, $GeR_8R_9$, O, S, and Se;

$R_1$ to $R_9$, and $Ar_1$ to $Ar_8$ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkylgermanium of 1 to 30 carbon atoms, a substituted or unsubstituted arylgermanium of 6 to 30 carbon atoms, a cyano, a nitro, and a halogen, with the proviso that $R_1$ and $R_2$ may be bonded to each other to form a mono- or polycyclic aliphatic or aromatic ring, which may be a heterocyclic ring containing at least one heteroatom selected from among N, O, P, Si, S, Ge, Se, and Te as a ring member;

p1 to p4, r1 to r4, and s1 to s4 are each independently an integer of 1 to 3, with the proviso that when any of them is 2 or greater, the corresponding linkers may be the same or different;

x is an integer of 1 or 2, and y and z may be the same or different and are each independently an integer of 0 to 3; and respective rings may be formed through linkages between $Ar_1$ and $Ar_2$, between $Ar_3$ and $Ar_4$, between $Ar_5$ and $Ar_6$, and between $Ar_7$ and $Ar_8$;

two adjacent carbon atoms of the $A_2$ ring moiety of Chemical Formula A may occupy respective positions * of Structural Formula $Q_1$ to form a fused ring; and two adjacent carbon atoms of the $A_1$ ring moiety of Chemical Formula B may occupy respective positions * of structural Formula $Q_2$ to form a fused ring, and two adjacent carbon atoms of the $A_2$ ring moiety of Chemical Formula B may occupy respective positions * of Structural Formula $Q_1$ to form a fused ring; and

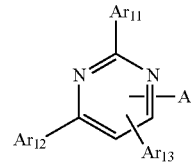

[Chemical Formula E]

wherein, $Ar_{11}$, $Ar_{12}$, and $Ar_{13}$ may be the same or different, and are each independently a hydrogen atom, a deuterium atom, a substituted or unsubstituted aryl of 6 to 50 carbon atoms, or a substituted or unsubstituted heteroaryl of 2 to 50 carbon atoms, with the proviso that when $Ar_{12}$ is a hydrogen or deuterium atom, $Ar_{13}$ is neither a hydrogen atom nor a deuterium atom, A is a monovalent substituent represented by the following Structural Formula A:

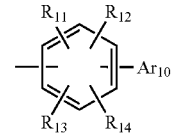

[Structural Formula A]

wherein $Ar_{10}$ is a substituted or unsubstituted heteroaryl of 2 to 50 carbon atoms, $R_{11}$ to $R_{14}$ may be the same or different, and are each independently any one selected from among a hydrogen atom, a deuterium atom, a fluorine atom, a chlorine atom, a cyano, a substituted or unsubstituted alkyl of 1 to 30 carbon atoms, a substituted or unsubstituted aryl of 6 to 50 carbon atoms, and a substituted or unsubstituted heteroaryl of 2 to 50 carbon atoms, wherein the term 'substituted' in the expression 'substituted or unsubstituted' used in Chemical Formulas A, B, and E means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a heteroarylamino of 2 to 24 carbon atoms, an alkylsilyl of 1 to 24 carbon atoms, an arylsilyl of 6 to 24 carbon atoms, and an aryloxy of 6 to 24 carbon atoms.

Account is taken of the range of the alkyl or aryl moiety in the phrases "a substituted or unsubstituted alkyl of 1 to 30 carbon atoms", "a substituted or unsubstituted aryl of 5 to 50 carbon atoms", etc., as used herein. The expression pertaining to the number of carbon atoms in "a substituted or unsubstituted alkyl of 1 to 30 carbon atoms" and "a substituted or unsubstituted aryl of 6 to 50 carbon atoms" means the total number of carbon atoms in the alkyl or aryl radical or moiety alone, exclusive of the number of carbon atoms of the substituent. For instance, a phenyl group with a butyl at the para position falls within the scope of an aryl of 6 carbon atoms, even if it is substituted with a butyl radical of four carbon atoms.

As used herein, the term "aryl" as a substituent used in the compounds of the present invention means an organic radical derived from an aromatic hydrocarbon by removing a hydrogen atom, and may include a 5- to 7-membered, and preferably a 5- or 6-membered, single or fused ring system, and, in greater detail, a fused ring that is formed by adjacent substituents on the organic radical.

Concrete examples of the aryl are aromatic groups including phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl, at least one hydrogen atom of which may be substituted by a deuterium atom, a halogen atom, a hydroxy, a nitro, a cyano, a silyl, an amino (—$NH_2$, —NH(R), or —N(R')(R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The substituent heteroaryl used in the compound of the present invention refers to a cyclic aromatic system of 2 to 24 carbon atoms bearing one to three heteroatoms selected from among N, O, P, Si, S, Ge, Se, and Te. In the aromatic system, two or more rings may be fused. One or more hydrogen atoms on the heteroaryl may be substituted with the same substituents as in the aryl.

As used herein, the term "heteroaromatic ring" refers to an aromatic hydrocarbon ring bearing as a ring member at least one heteroatom selected from among N, O, P, Si, S, Ge, Se, and Te.

Examples of the substituent alkyl useful in the present invention include methyl, ethyl, propyl, isopropyl, isobutyl, sec-butyl, tert-butyl, pentyl, iso-amyl, and hexyl. At least one hydrogen atom of the alkyl may be substituted with the same substituent as in the aryl.

Examples of the substituent alkoxy useful in the present invention include methoxy, ethoxy, propoxy, isobutyloxy, sec-butyloxy, pentyloxy, iso-amyloxy, and hexyloxy. At least one hydrogen atom of the alkoxy may be substituted with the same substituent as in the aryl.

Representative among examples of the substituent silyl useful in the present invention are trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl. One or more hydrogen atoms of the silyl may be substituted with the same substituent as in the aryl.

The amine compound, useful in the organic light-emitting diode of the present invention, represented by Chemical Formula A or B, has structural features whereby, if Structural Formula $Q_1$ is connected to the $A_2$ ring in Chemical Formula A, the amine moiety containing $Ar_1$ and $Ar_2$ must be bonded to the $A_2$ ring, and whereby, if Structural Formula $Q_2$ and $Q_1$ are connected respectively to $A_1$ and $A_2$ rings in Chemical Formula B, the amine moiety containing $Ar_1$ and $Ar_2$ must be bonded to the $A_2$ ring.

The light-emitting layer of the organic light-emitting diode according to the present invention comprises a host and a dopant.

In the light-emitting layer, the amine compounds represented by Chemical Formulas A and B may be used as the dopant, and the host, which is another component of the light-emitting layer, may be a compound represented by the following Chemical Formula C:

[Chemical Formula C]

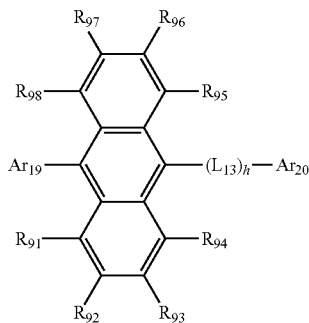

wherein $R_{91}$ to $R_{98}$ may be the same or different, and are each as defined for $R_1$ to $R_9$;

$Ar_{19}$ and $Ar_{20}$ may be the same or different, and are each independently selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, and a substituted or unsubstituted arylsilyl of 6 to 30 carbon atoms;

$L_{13}$ is a single bond, or is selected from among a substituted or unsubstituted arylene of 6 to 20 carbon atoms and a substituted or unsubstituted heteroarylene of 2 to 20 carbon atoms; and h is an integer of 1 to 3, with the proviso that when h is 2 or greater, corresponding $L_{13}$'s may be the same or different.

In the present invention, $Ar_{19}$ in the anthracene derivative represented by Chemical Formula C may be a substituent represented by the following Chemical Formula C-1:

[Chemical Formula C-1]

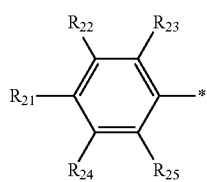

wherein $R_{21}$ to $R_{25}$ may be the same or different, and are each as defined for $R_{11}$ and $R_{12}$, with the proviso that adjacent substituents may form a saturated or unsaturated cyclic ring.

In the anthracene derivative of Chemical Formula C, $L_{13}$ may be a single bond or a substituted or unsubstituted arylene of 6 to 20 carbon atoms, and h may be 1 or 2, with the proviso that when h is 2, corresponding $L_{13}$'s may be the same or different.

According to some embodiments of the present invention, $A_1$, $A_2$, E and F in Chemical Formula A or B may be the same or different, and are each independently a substituted or unsubstituted aromatic hydrocarbon ring of 6 to 50 carbon atoms.

As stated above, when $A_1$, $A_2$, E, and F in Chemical Formula A or B are the same or different and are each independently substituted or unsubstituted aromatic hydrocarbon rings of 6 to 50 carbon atoms, the substituted or unsubstituted aromatic hydrocarbon rings of 6 to 50 carbon atoms may be the same or different, and are each independently selected from among compounds represented by Structural Formulas 10 to 21:

[Structural Formula 10]

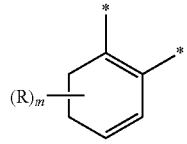

[Structural Formula 11]

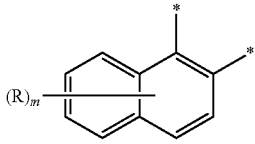

[Structural Formula 12]

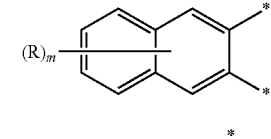

[Structural Formula 13]

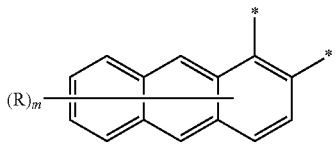

[Structural Formula 14]

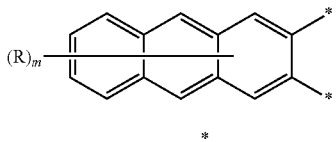

[Structural Formula 15]

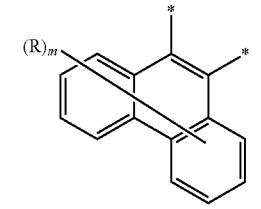

[Structural Formula 16]

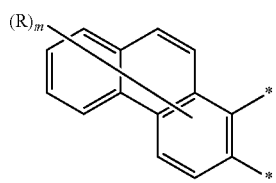

[Structural Formula 17]

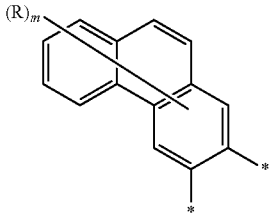

[Structural Formula 18]

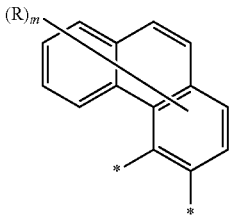

[Structural Formula 19]

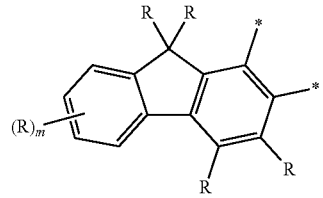

[Structural Formula 20]

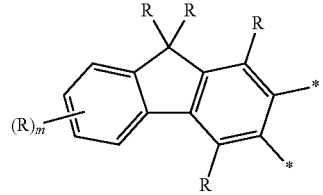

[Structural Formula 21]

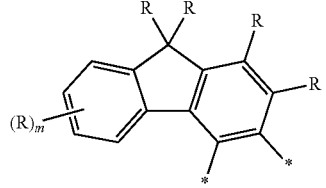

wherein "-*" denotes a bonding site for forming a 5-membered ring bearing a carbon atom which is connected to both the substituents $R_1$ and $R_2$ or a bonding site for forming a 5-membered ring bearing M of the Structural Formulas $Q_1$ and $Q_2$;

when one of the aromatic hydrocarbon rings of [Structural Formula 10] to [Structural Formula 21] for $A_1$ or $A_2$ is bonded to Structural Formula $Q_1$ or Structural Formula $Q_2$, two adjacent carbon atoms of the aromatic hydrocarbon ring occupy respective positions * of Structural Formula $Q_1$ or $Q_2$ to form a fused ring;

R's are the same as defined above for $R_1$ and $R_2$, and m is an integer of 1 to 8, with the proviso that when m is 2 or greater or two or more R's exist, the corresponding R's may be the same or different.

In addition, the linkers $L_1$ to $L_{12}$ in Chemical Formulas A and B may be the same or different, and may be a single bond or any one selected from among a substituted or unsubstituted arylene of 6 to 20 carbon atoms and a substituted or unsubstituted heteroarylene of 2 to 20 carbon atoms.

In this case, the linkers $L_1$ to $L_{12}$ may each be a single bond or any one selected from among the following Structural Formulas 22 to 30, p1 to p4, r1 to r4, and s1 to s4 may each be 1 or 2, and x may be 1:

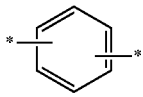

[Structural Formula 22]

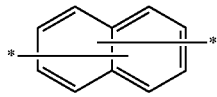

[Structural Formula 23]

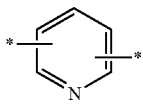

[Structural Formula 24]

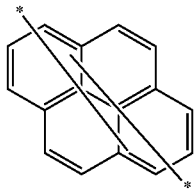

[Structural Formula 25]

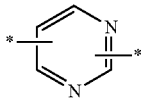

[Structural Formula 26]

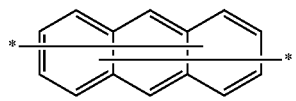

[Structural Formula 27]

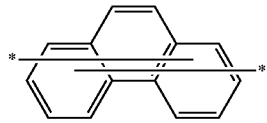

[Structural Formula 28]

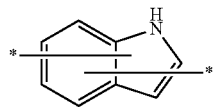

[Structural Formula 29]

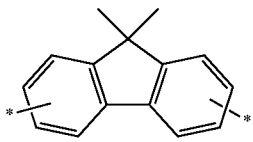

[Structural Formula 30]

In the linkers, each of the unsubstituted carbon atoms of the aromatic ring moiety may be bound with a hydrogen atom or a deuterium atom.

In the amine compound of Chemical Formula A or B according to some embodiments of the present invention, $A_1$, $A_2$, E, F, $Ar_1$ to $Ar_8$, $L_1$ to $L_{12}$, and $R_1$ to R9 may have as a substituent any one selected from the group consisting of a cyano, a halogen, an alkyl of 1 to 6 carbon atoms, an aryl of 6 to 18 carbon atoms, an arylalkyl of 6 to 18 carbon atoms, a heteroaryl of 3 to 18 carbon atoms, an alkylsilyl of 1 to 12 carbon atoms, and an arylsilyl of 6 to 18 carbon atoms.

Further, the amine compound represented by Chemical Formula A or B may be any one selected from among the following Chemical Formulas 1 to 239:

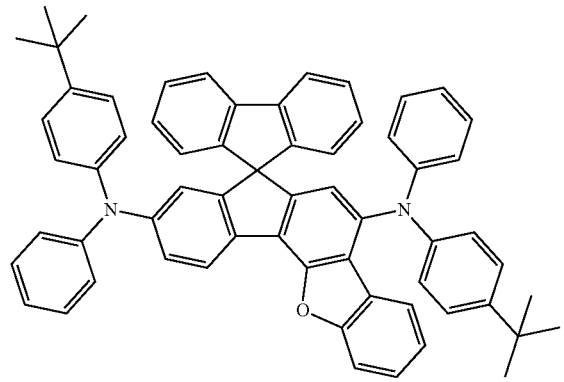

<Chemical Formula 1>

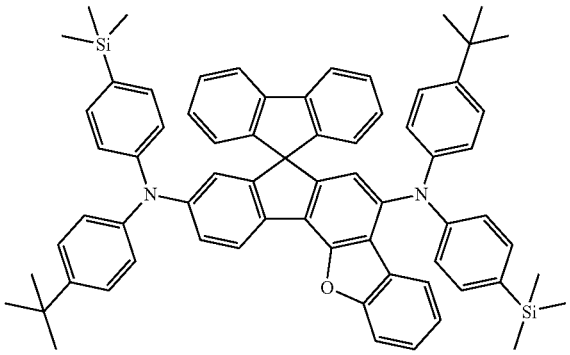

<Chemical Formula 2>

-continued
<Chemical Formula 3>
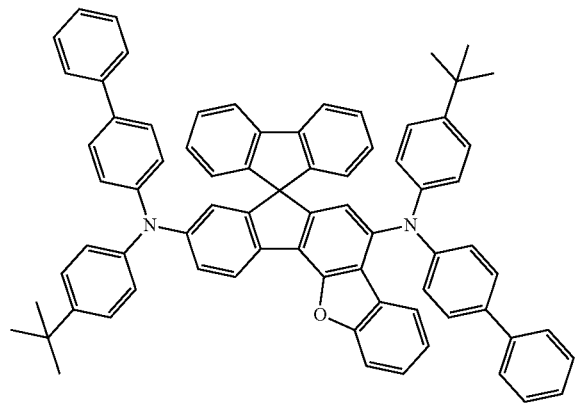
<Chemical Formula 4>
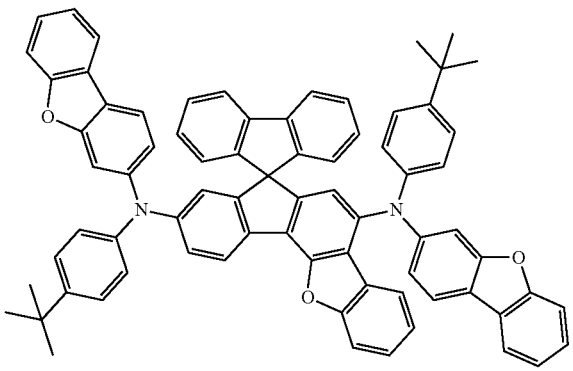
<Chemical Formula 5>
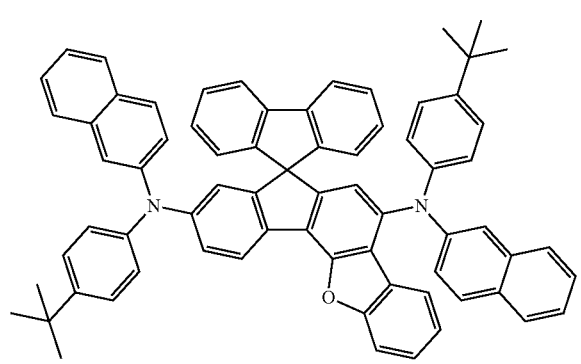
<Chemical Formula 6>
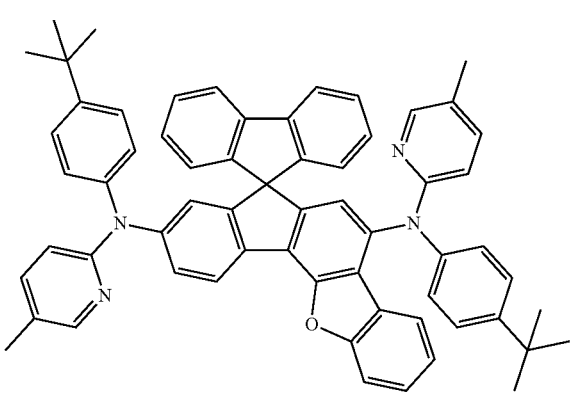
<Chemical Formula 7>
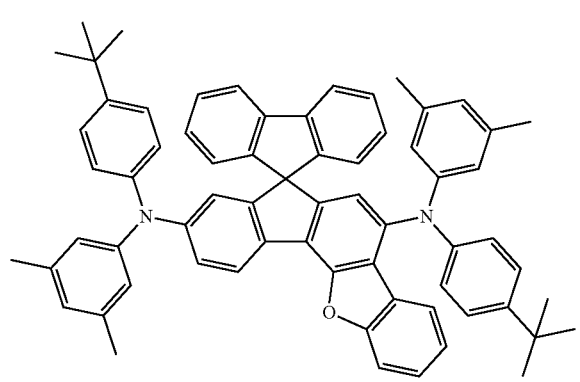
<Chemical Formula 8>
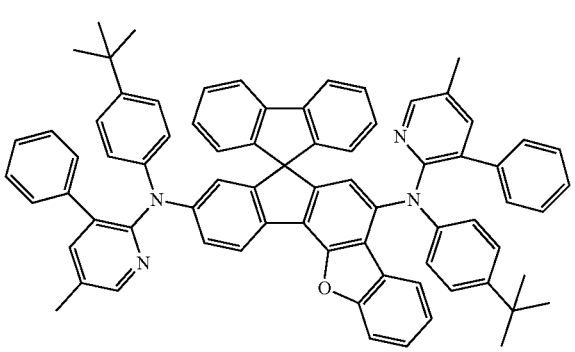
<Chemical Formula 9>
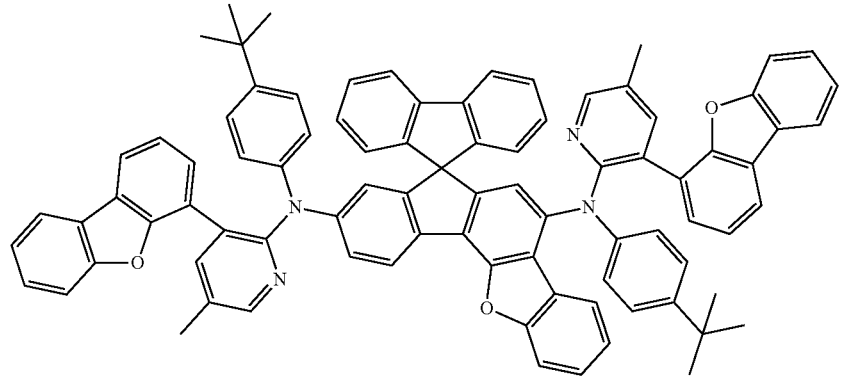

-continued
<Chemical Formula 10>
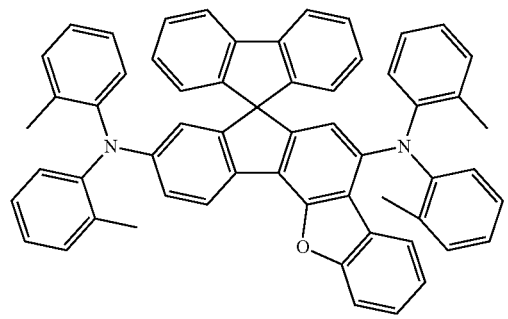
<Chemical Formula 11>
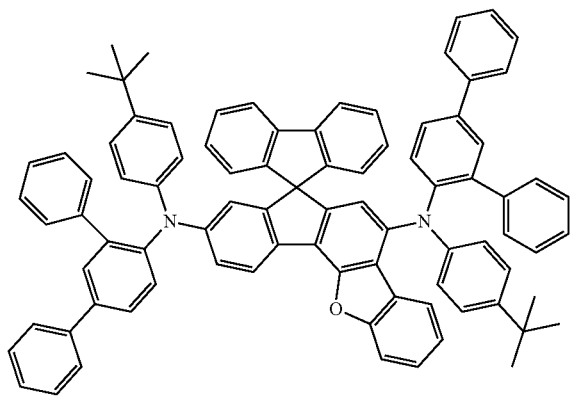
<Chemical Formula 12>
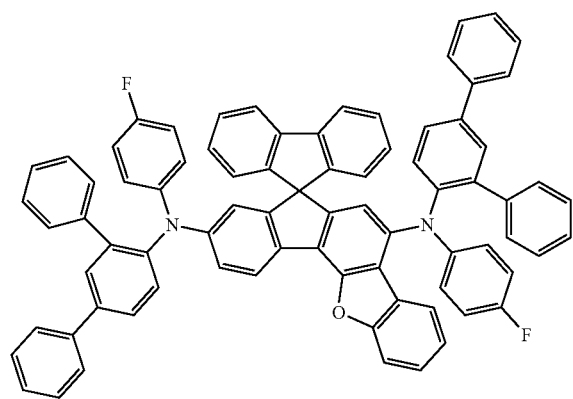
<Chemical Formula 13>
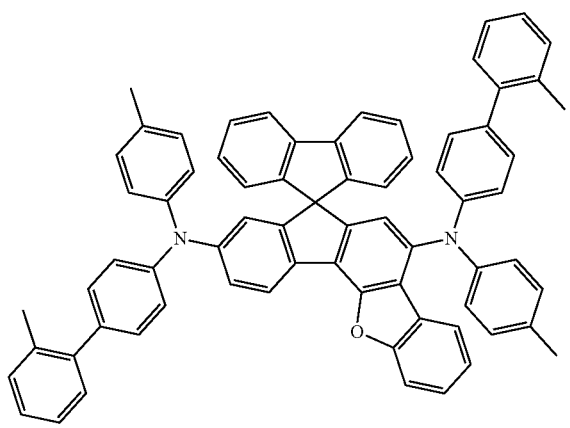
<Chemical Formula 14>
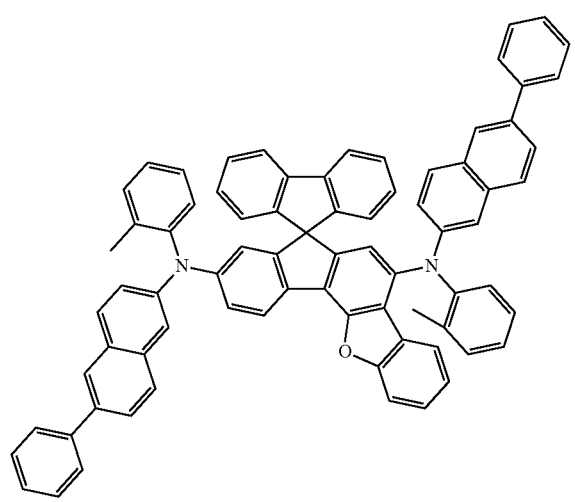
<Chemical Formula 15>
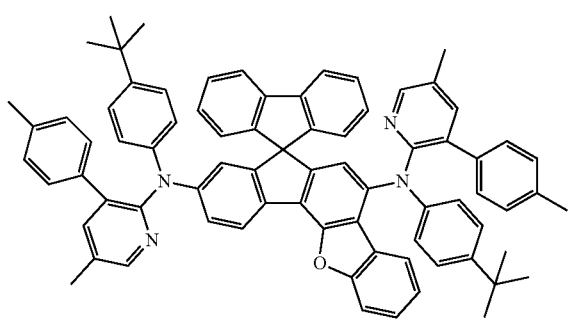

-continued
<Chemical Formula 16>
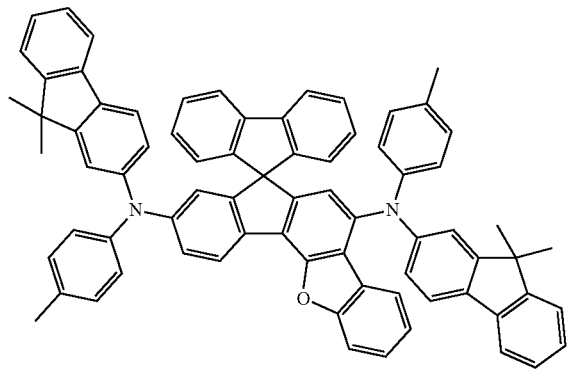
<Chemical Formula 17>
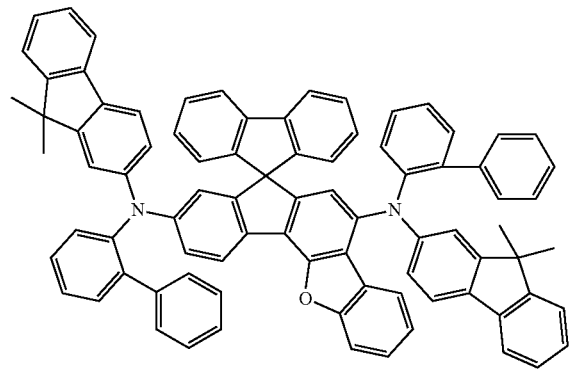
<Chemical Formula 18>
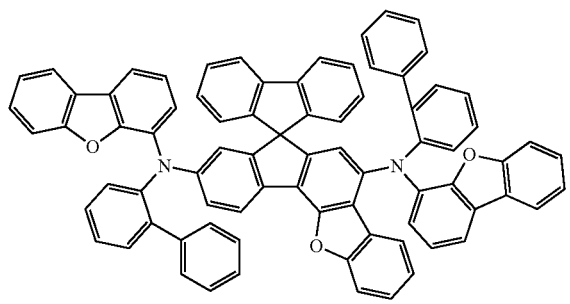
<Chemical Formula 19>
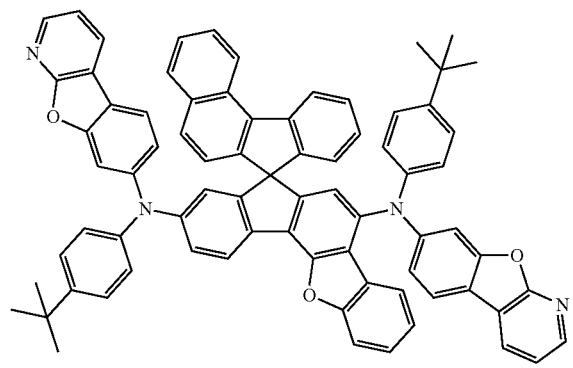
<Chemical Formula 20>
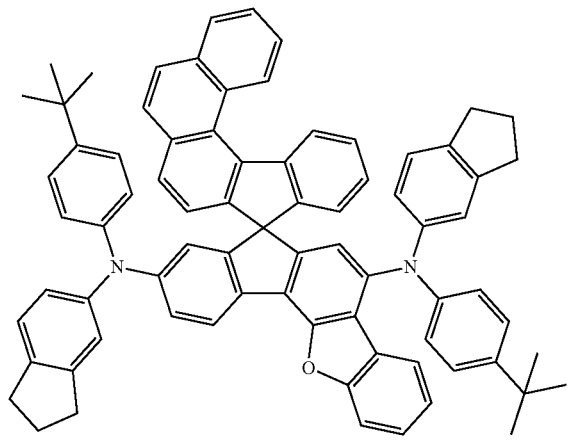
<Chemical Formula 21>
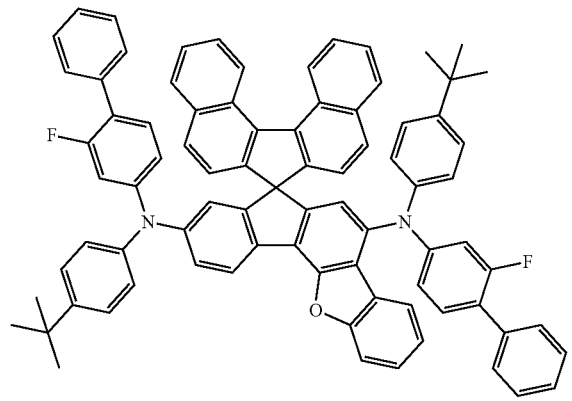
<Chemical Formula 22>
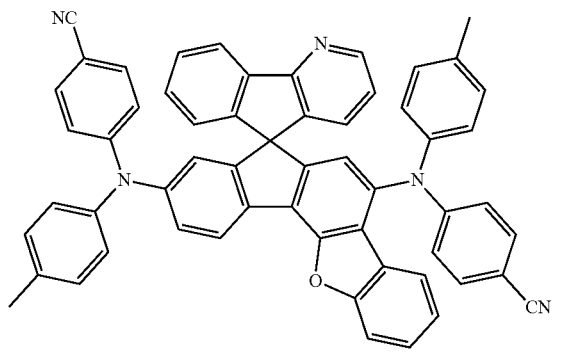
<Chemical Formula 23>
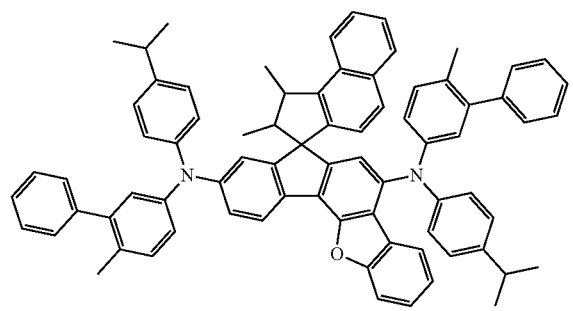

<Chemical Formula 24>
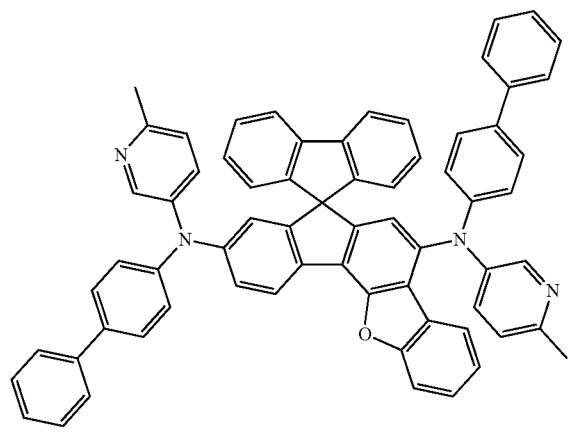
<Chemical Formula 25>
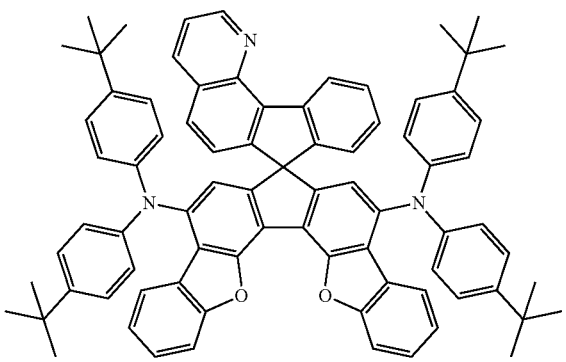
<Chemical Formula 26>
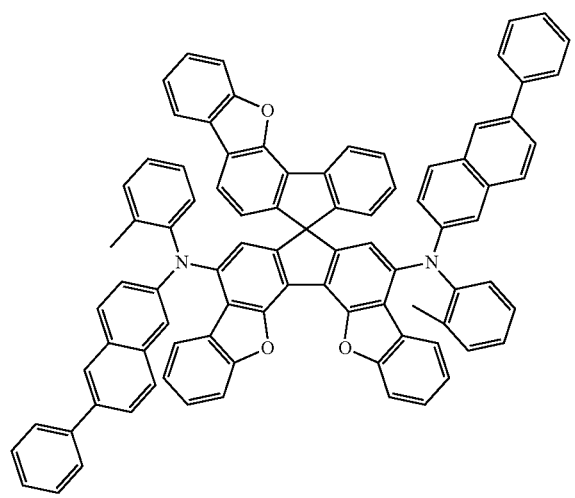
<Chemical Formula 27>
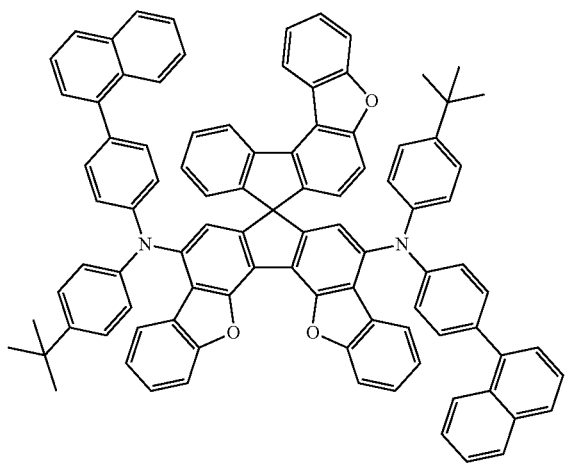
<Chemical Formula 28>
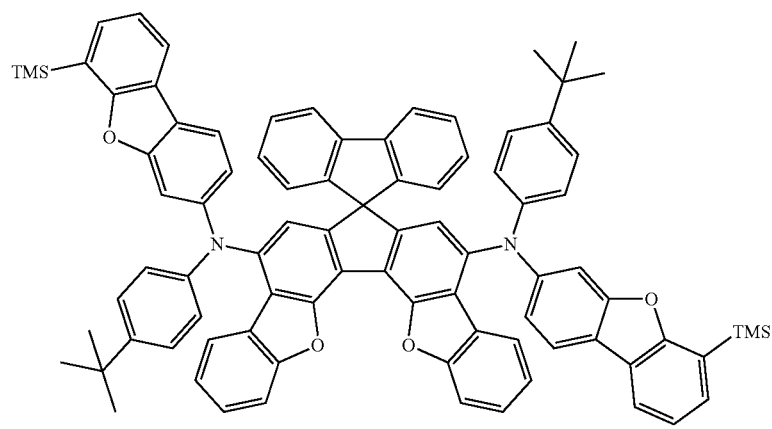

-continued
<Chemical Formula 29>
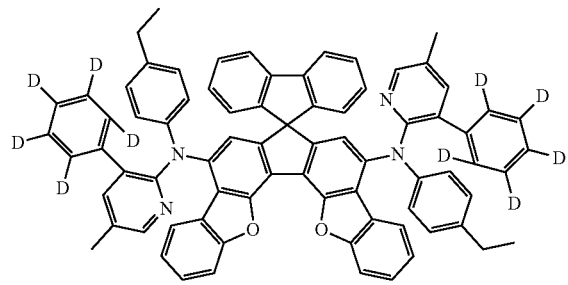
<Chemical Formula 30>
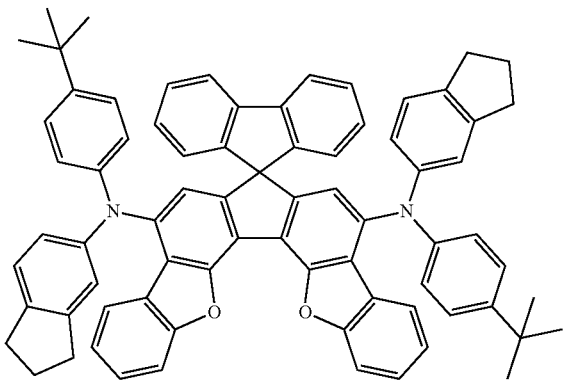
<Chemical Formula 31>
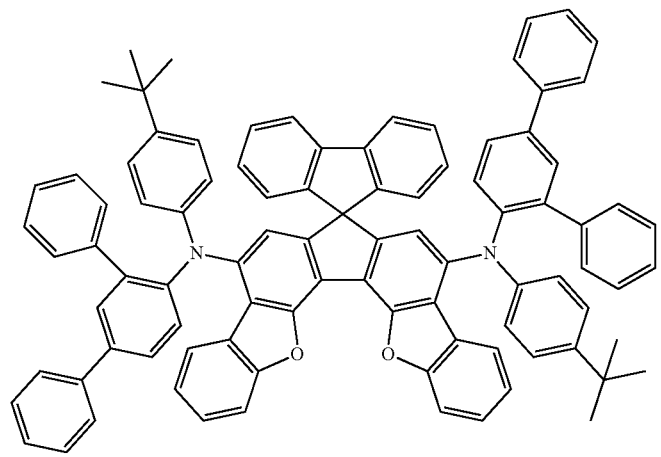
<Chemical Formula 32>
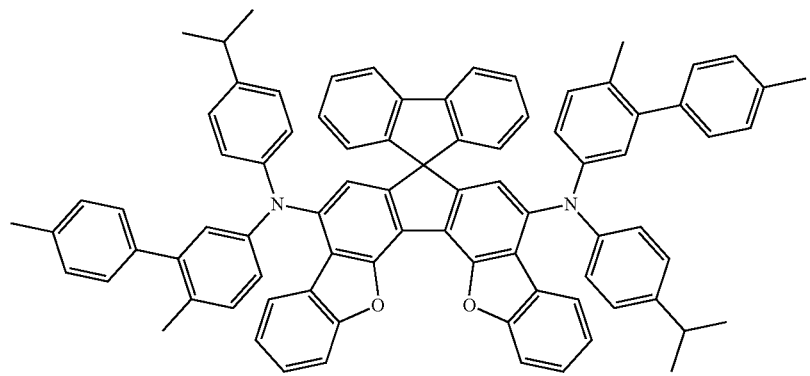
<Chemical Formula 33>
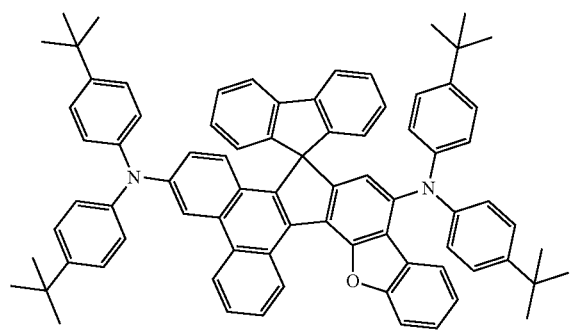
<Chemical Formula 34>
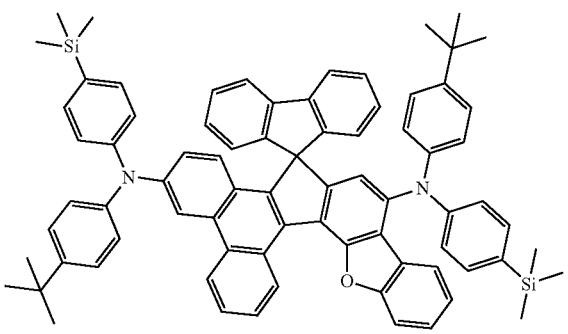

<Chemical Formula 35>
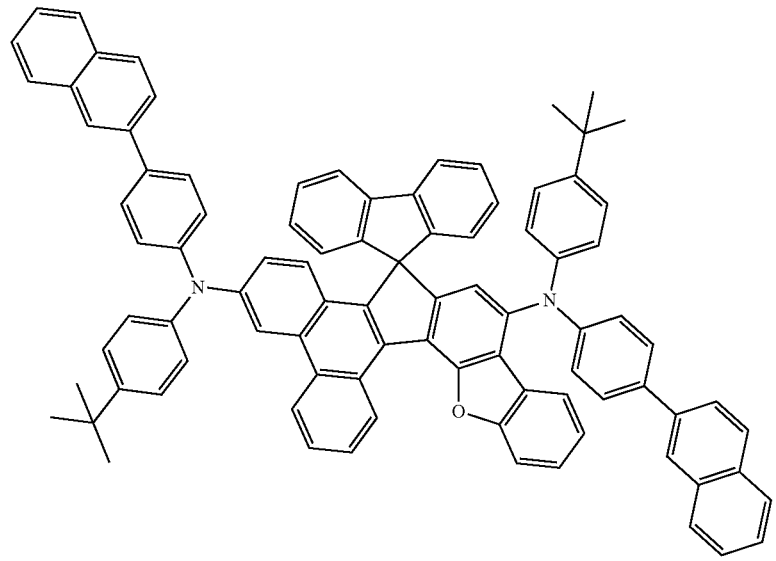
<Chemical Formula 36>
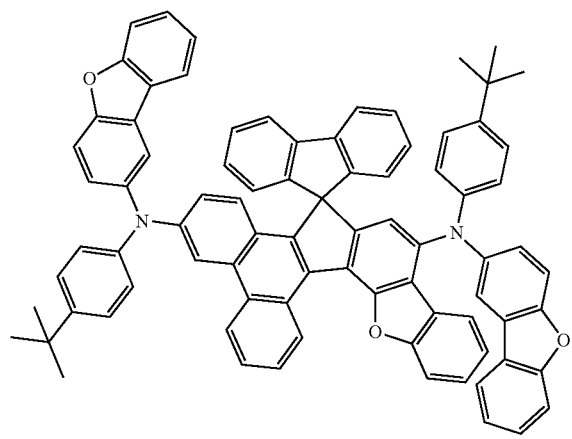
<Chemical Formula 37>
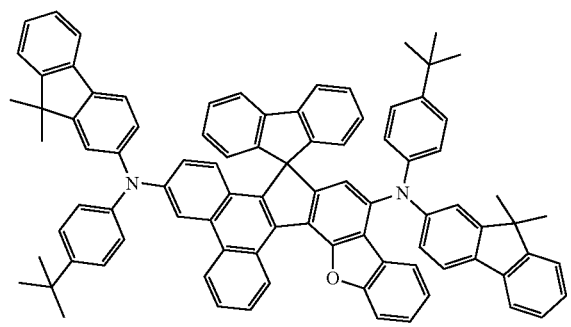
<Chemical Formula 38>
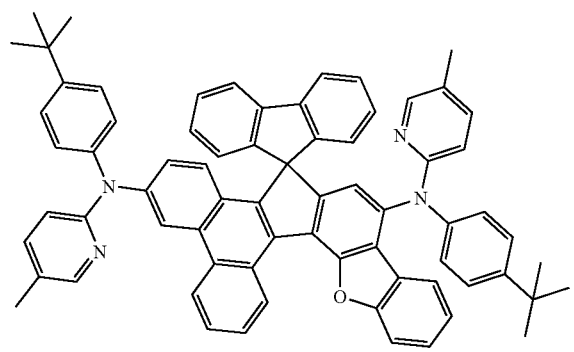
<Chemical Formula 39>
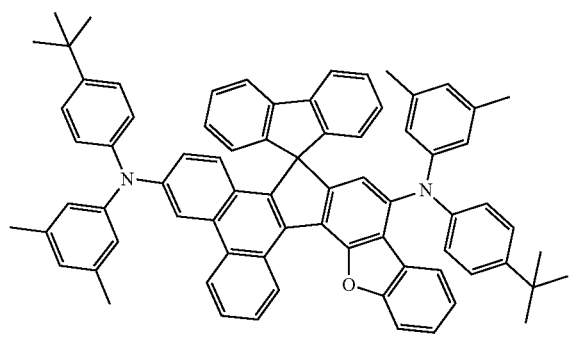

<Chemical Formula 40>
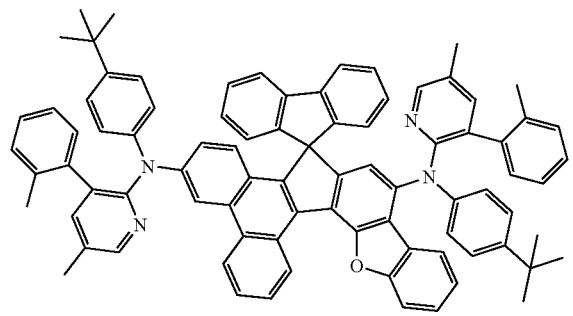
<Chemical Formula 41>
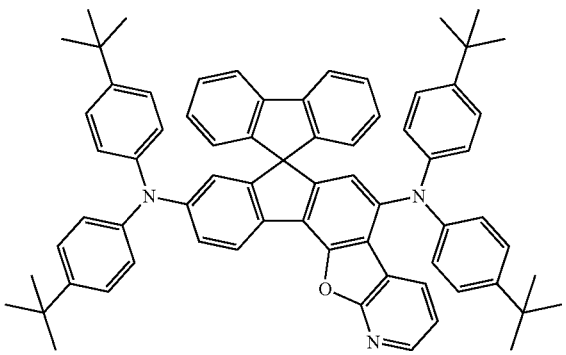
<Chemical Formula 42>
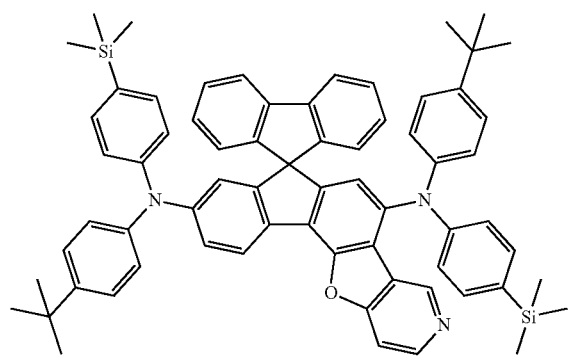
<Chemical Formula 43>
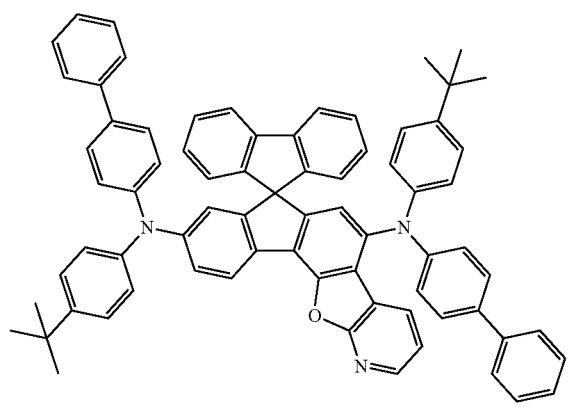
<Chemical Formula 44>
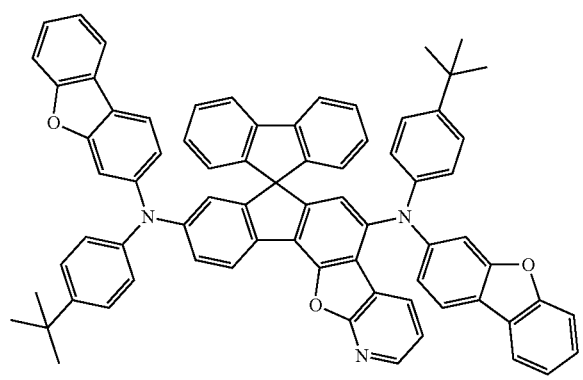
<Chemical Formula 45>
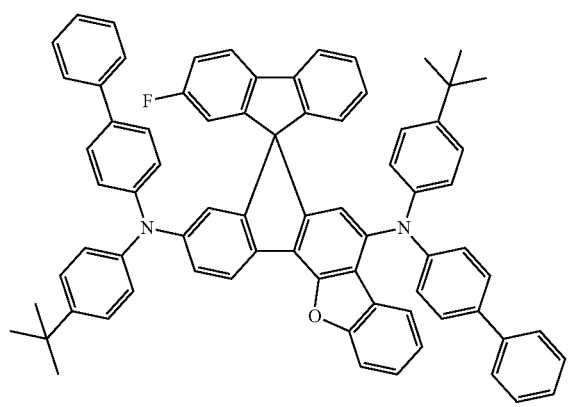

<Chemical Formula 46>
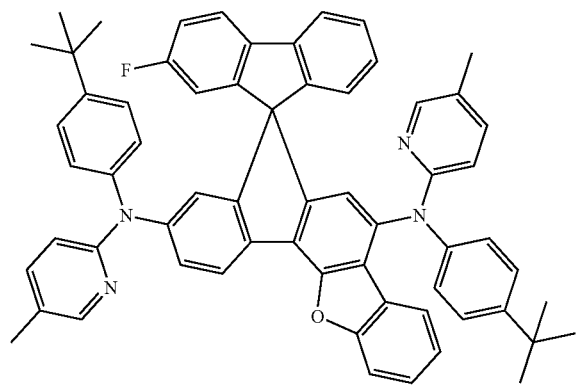
<Chemical Formula 47>
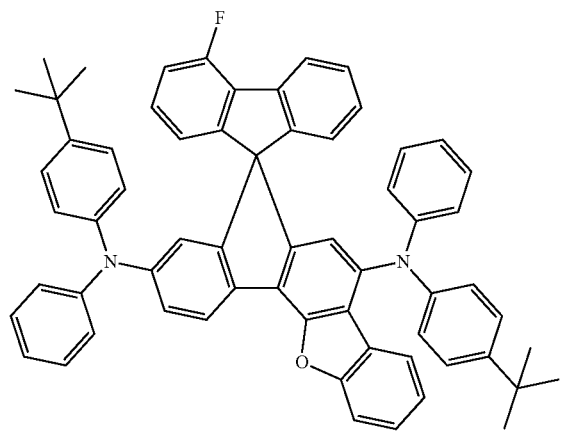
<Chemical Formula 48>
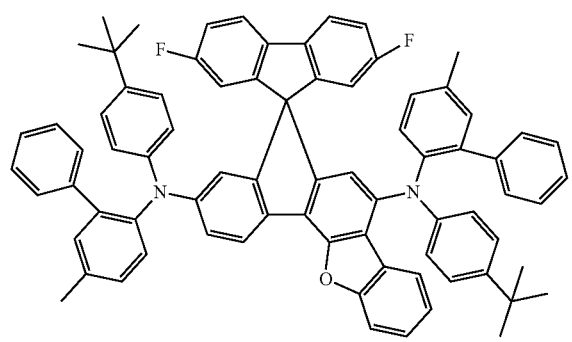
<Chemical Formula 49>
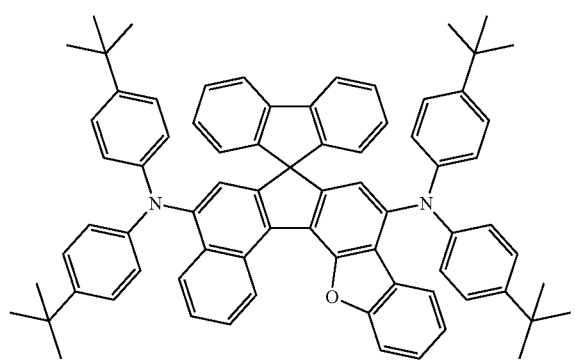
<Chemical Formula 50>
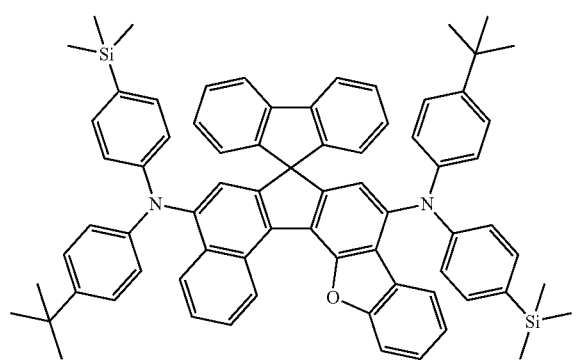
<Chemical Formula 51>
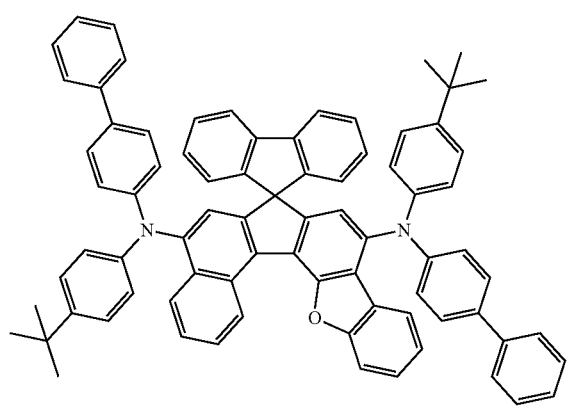
<Chemical Formula 52>
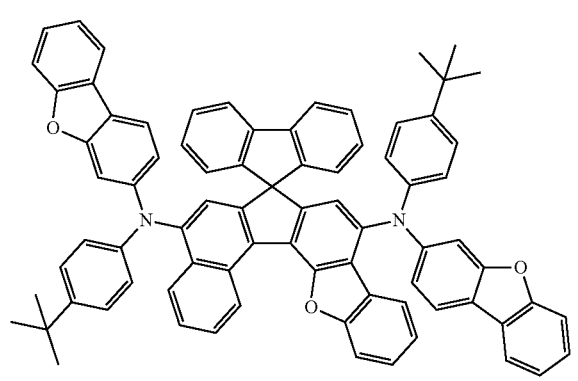
<Chemical Formula 53>
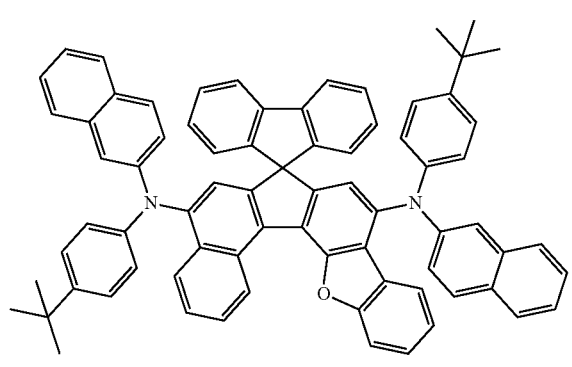

-continued
<Chemical Formula 54>
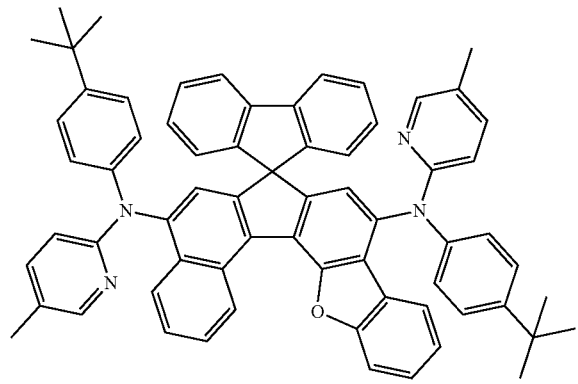
<Chemical Formula 55>
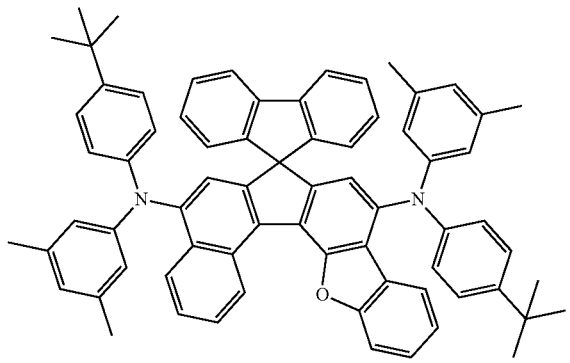
<Chemical Formula 56>
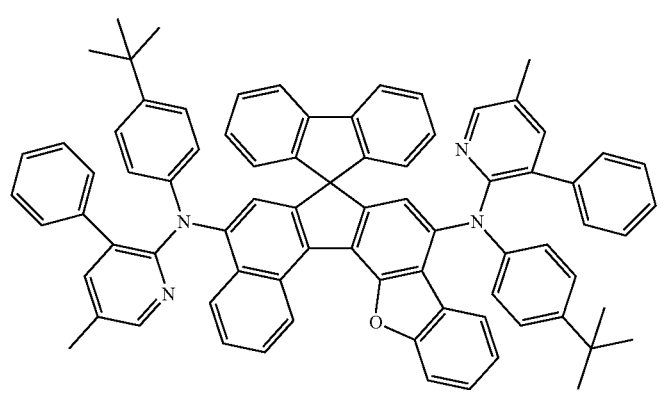
<Chemical Formula 57>
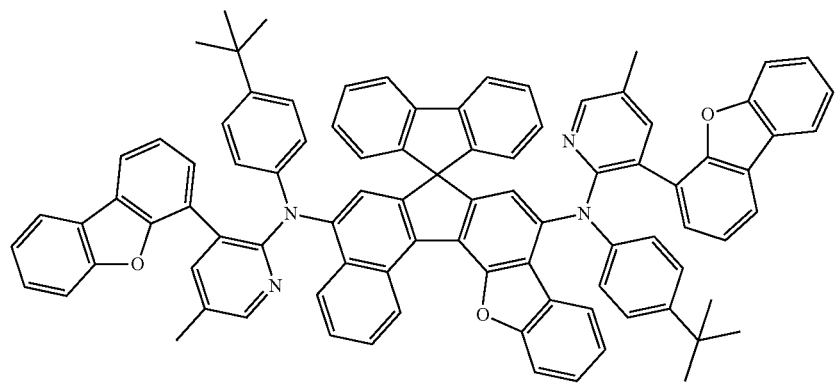
<Chemical Formula 58>
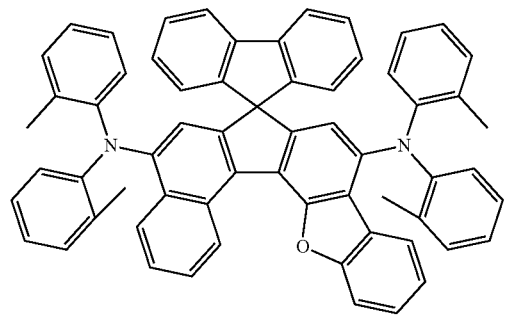
<Chemical Formula 59>
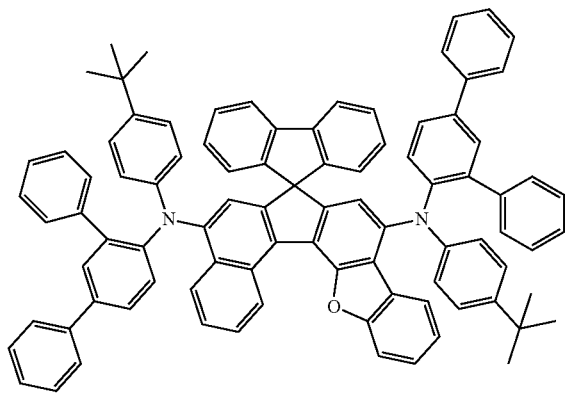

-continued
<Chemical Formula 60>
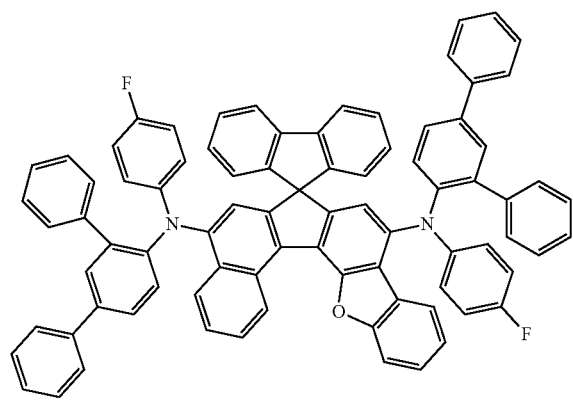
<Chemical Formula 61>
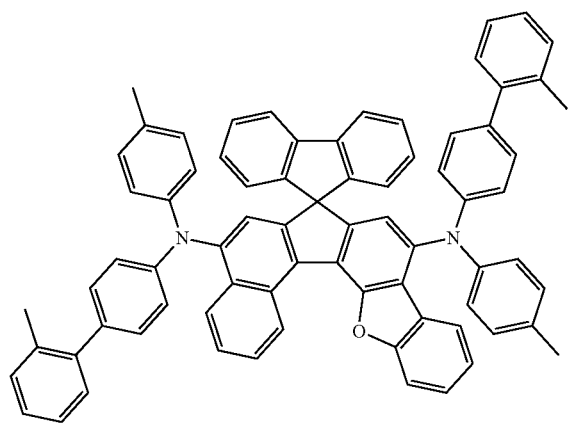
<Chemical Formula 62>
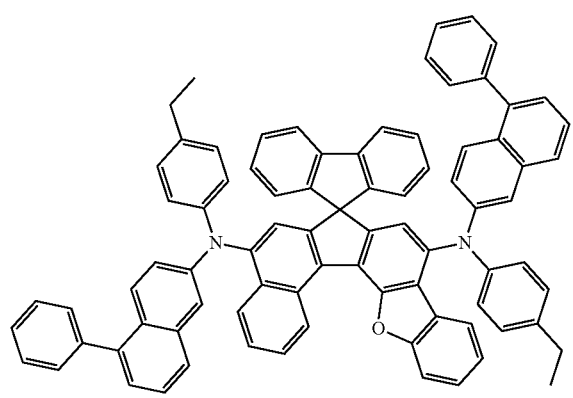
<Chemical Formula 63>
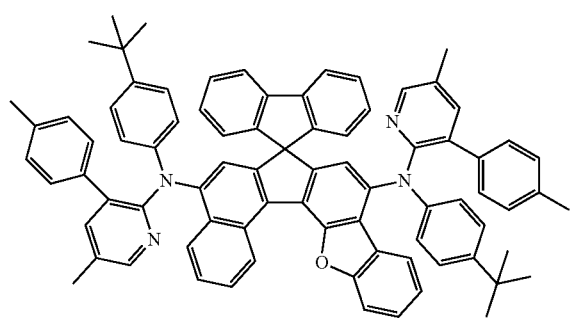
<Chemical Formula 64>
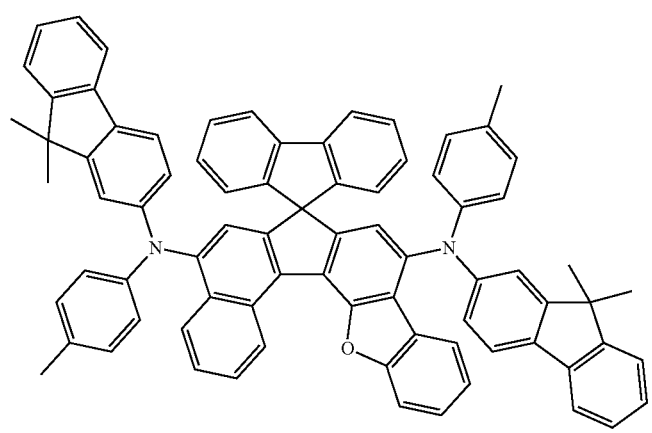

<Chemical Formula 65>
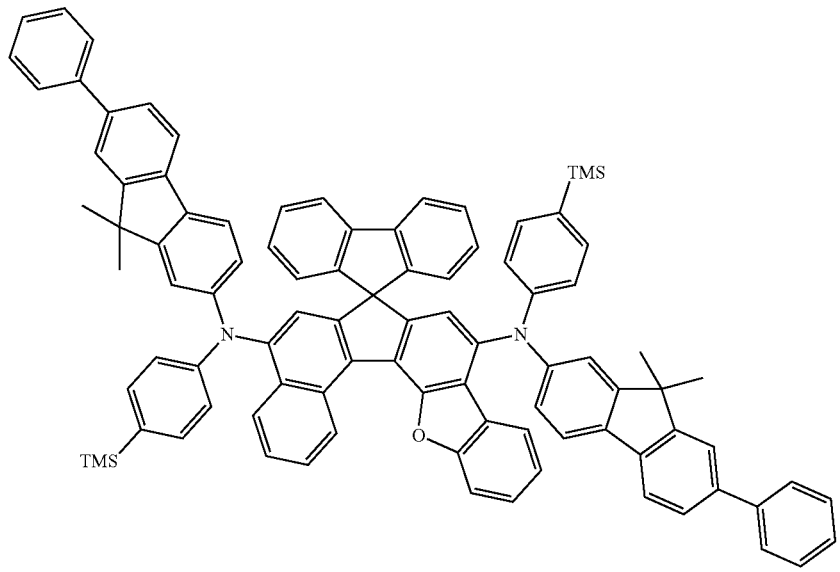
<Chemical Formula 66>
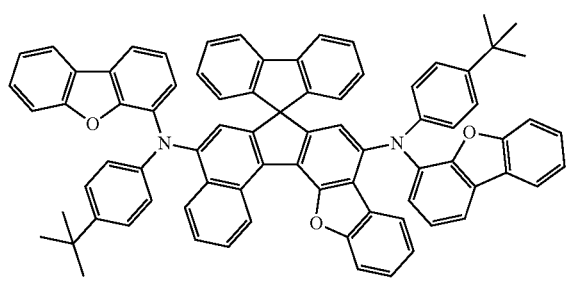
<Chemical Formula 67>
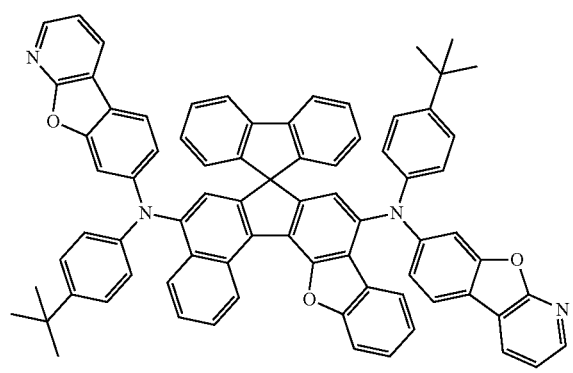
<Chemical Formula 68>
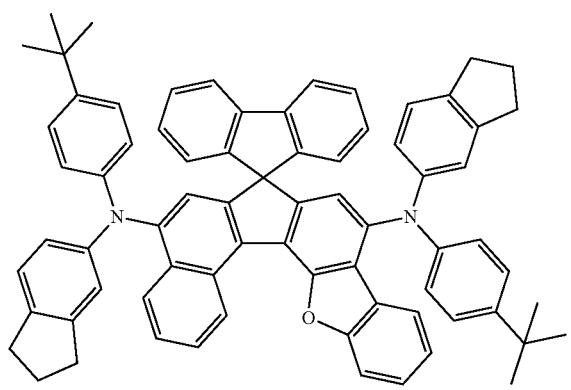
<Chemical Formula 69>
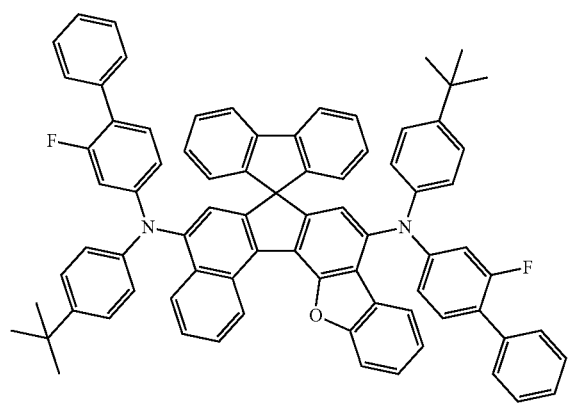

<Chemical Formula 70>
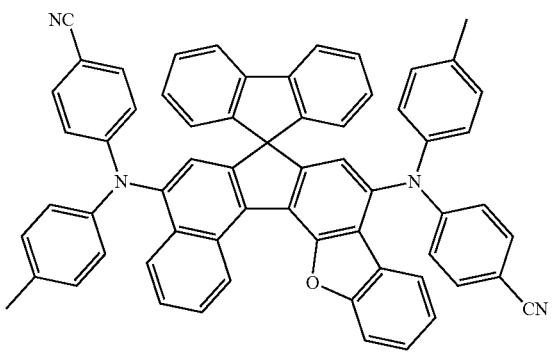
<Chemical Formula 71>
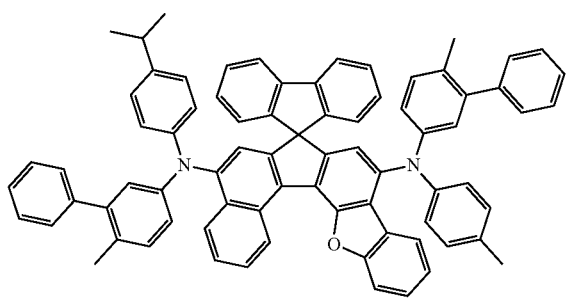
<Chemical Formula 72>
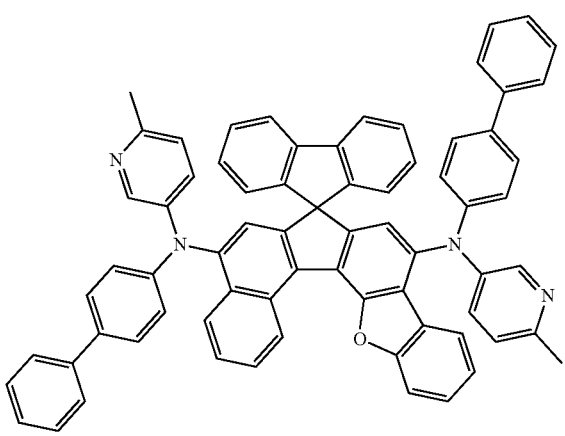
<Chemical Formula 73>
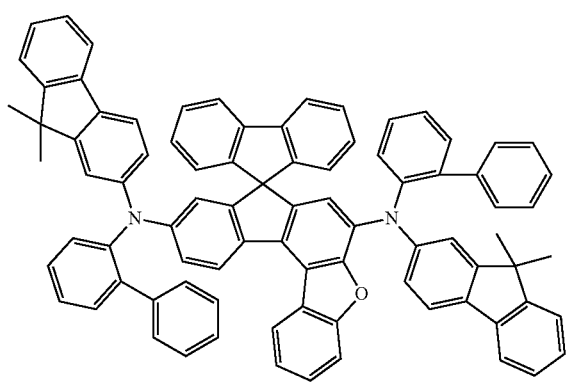
<Chemical Formula 74>
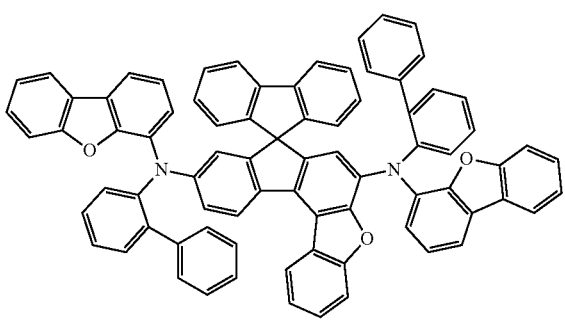
<Chemical Formula 75>
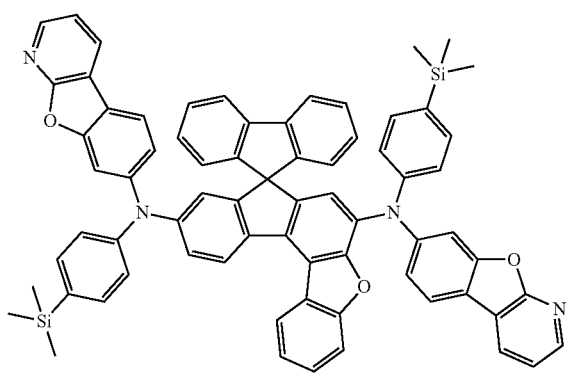
<Chemial Formula 76>
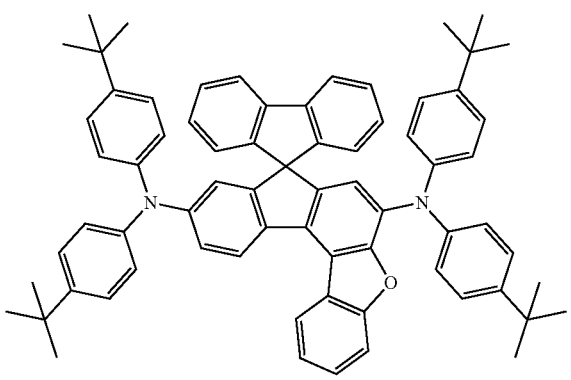
<Chemical Formula 77>
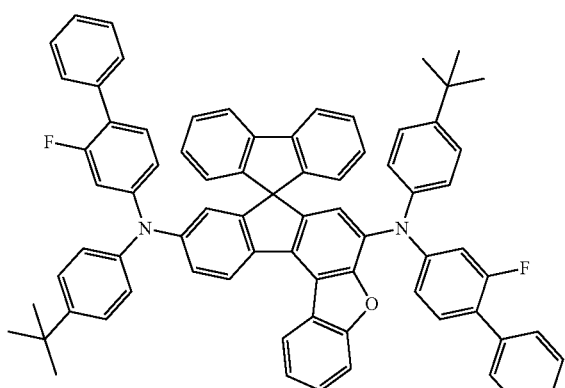

-continued
<Chemical Formula 78>
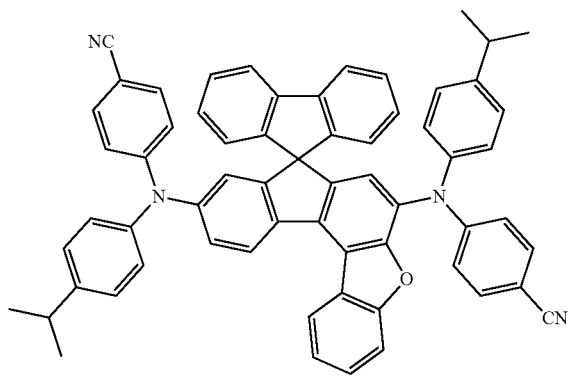
<Chemical Formula 79>
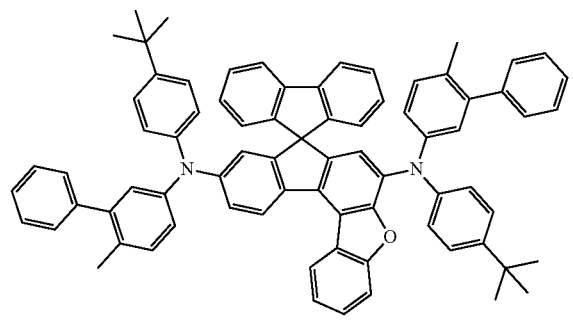
<Chemical Formula 80>
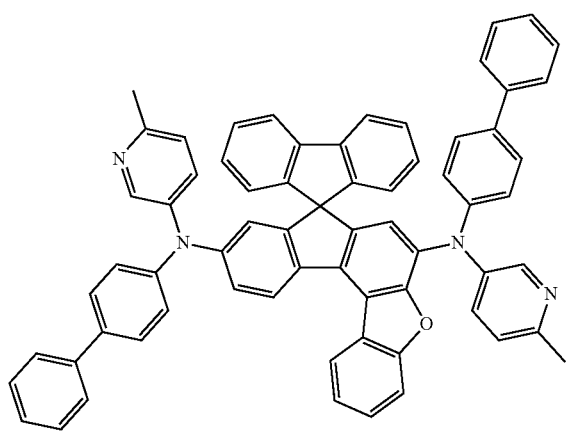
<Chemical Formula 81>
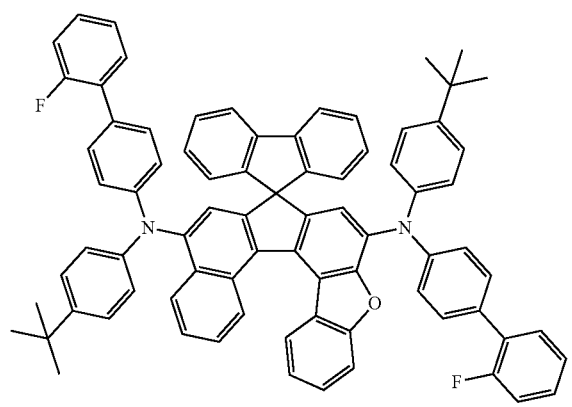
<Chemical Formula 82>
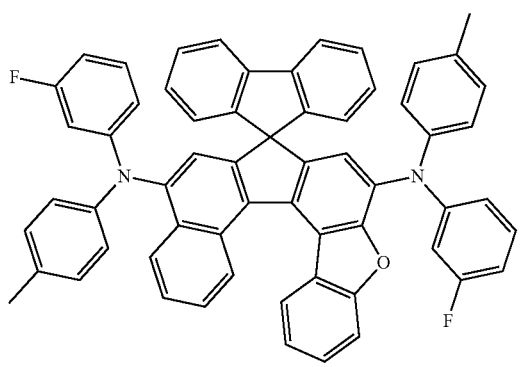
<Chemical Formula 83>
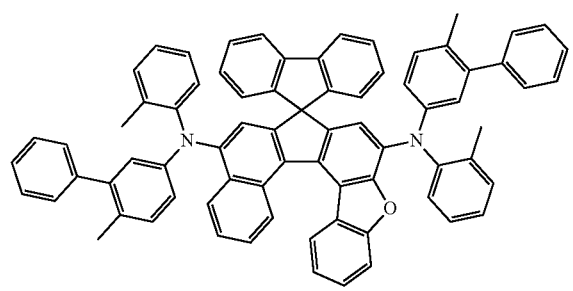

-continued
<Chemical Formula 84>
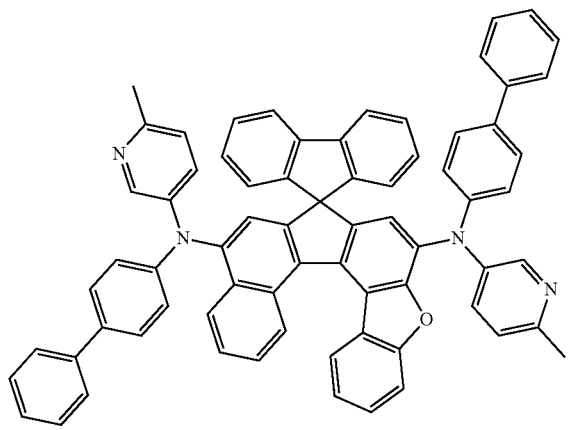
<Chemical Formula 85>
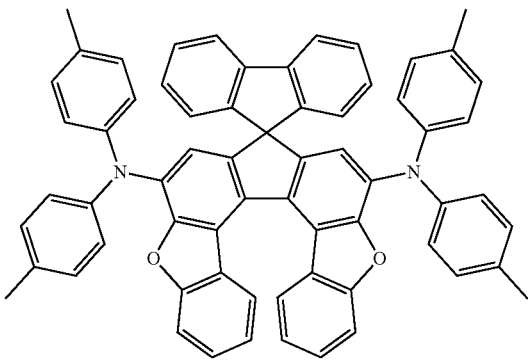
<Chemical Formula 86>
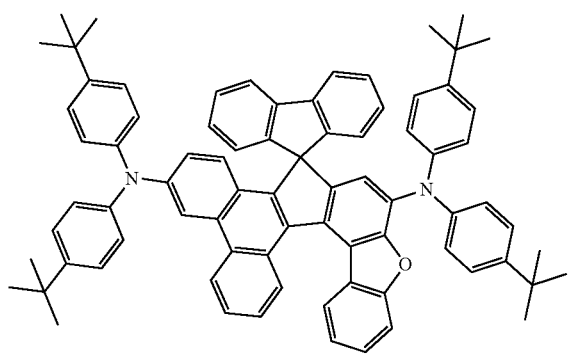
<Chemical Formula 87>
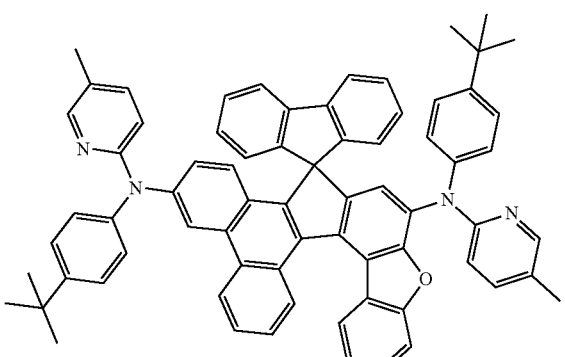
<Chemical Formula 88>
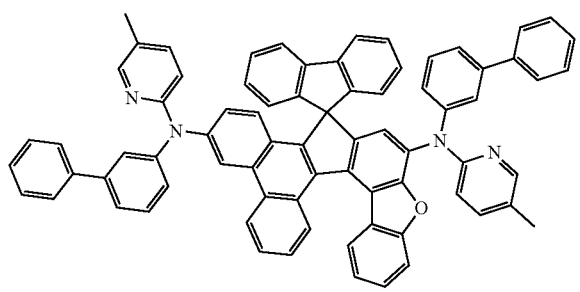
<Chemical Formula 89>
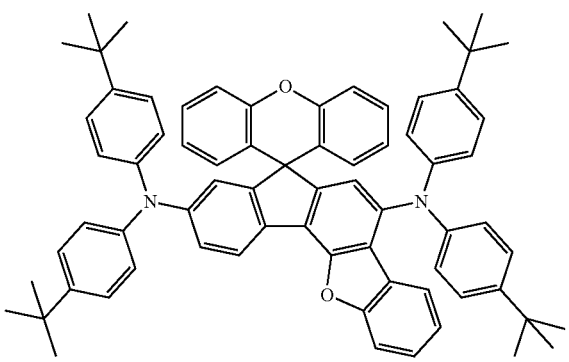
<Chemical Formula 90>
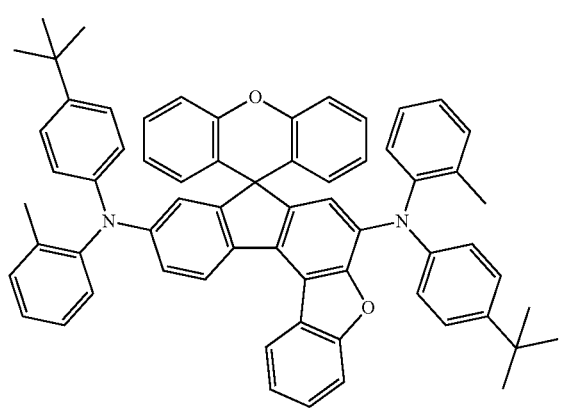
<Chemical Formula 91>
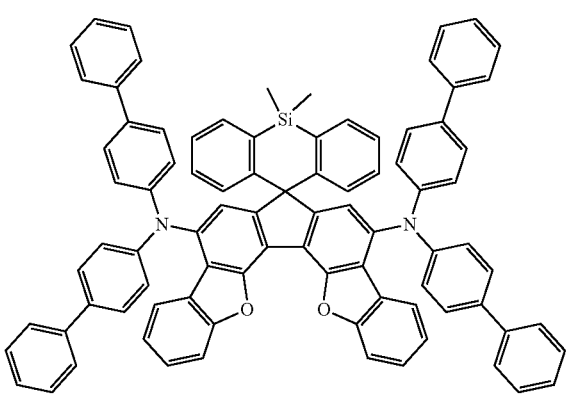

<Chemical Formula 92>
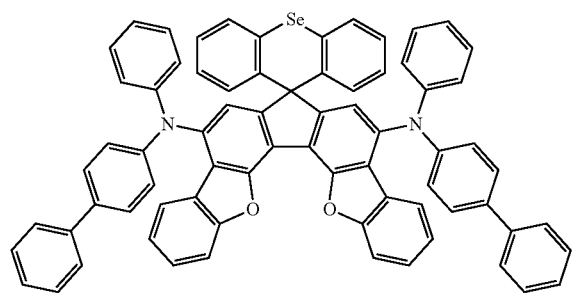
<Chemical Formula 93>
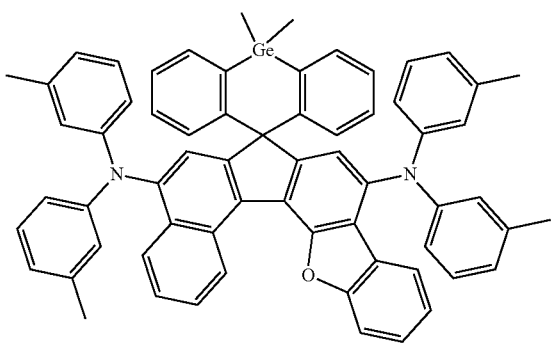
<Chemical Formula 94>
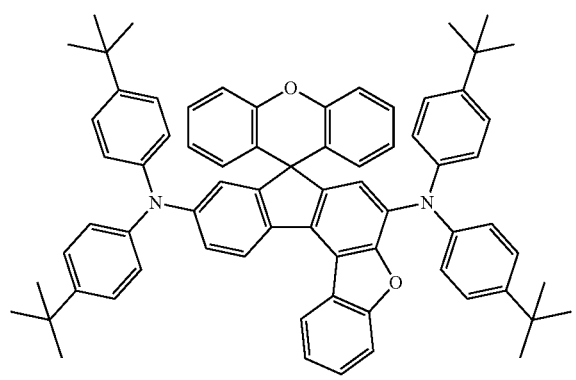
<Chemical Formula 95>
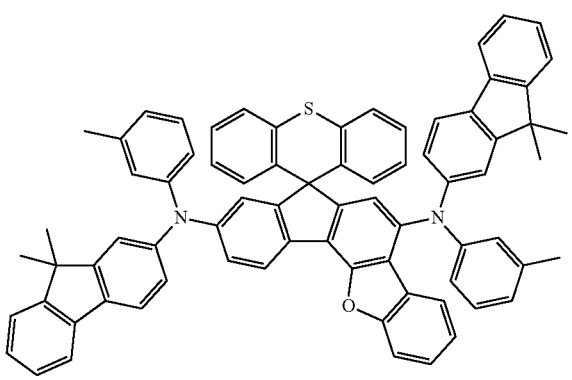
<Chemical Formula 96>
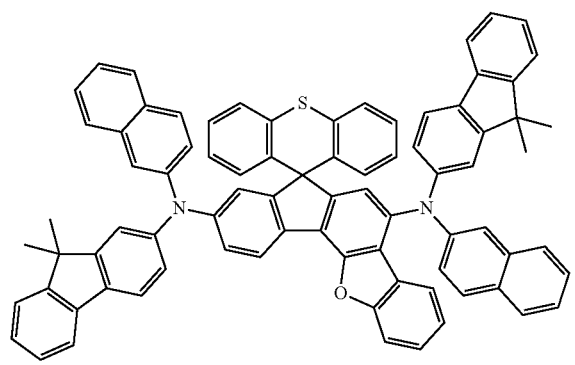
<Chemical Formula 97>
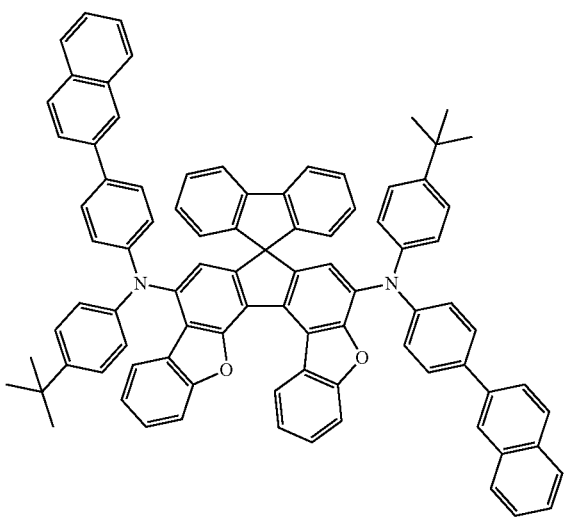

<Chemical Formula 98>
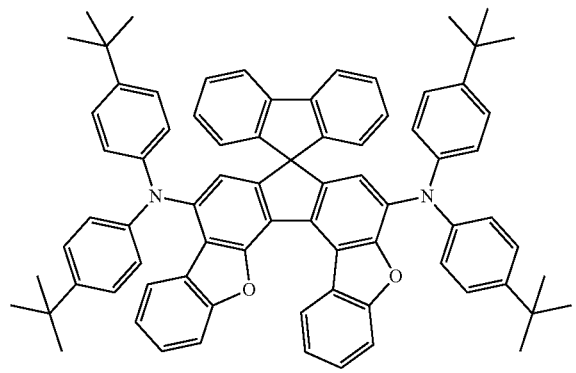
<Chemical Formula 99>
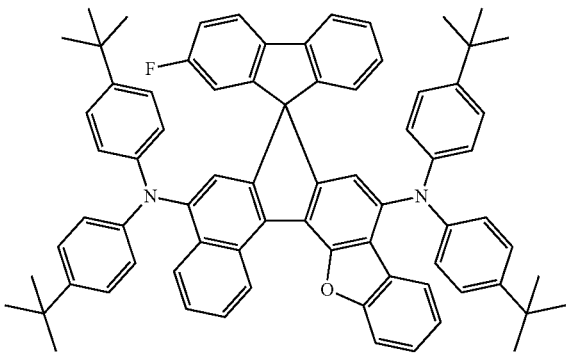
<Chemical Formula 100>
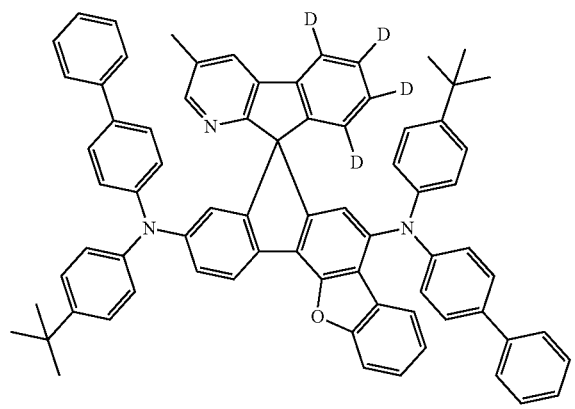
<Chemical Formula 101>
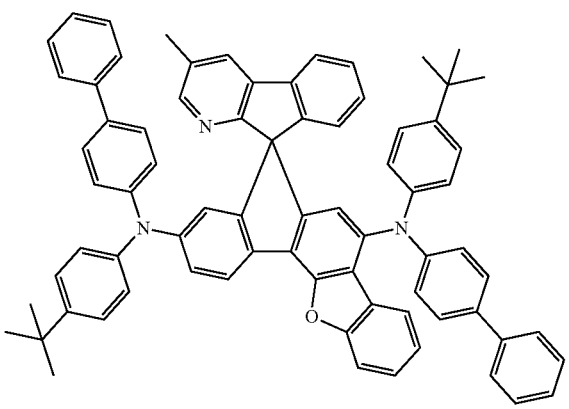
<Chemical Formula 102>
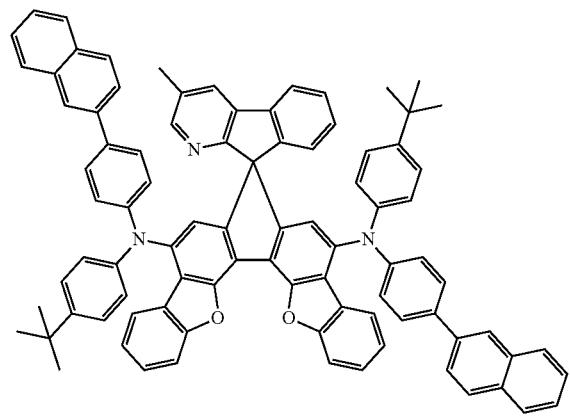
<Chemical Formula 103>
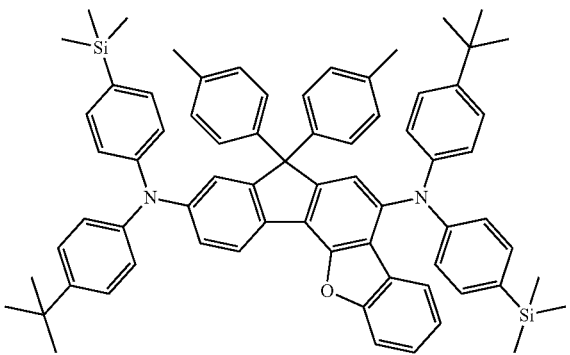
<Chemical Formula 104>
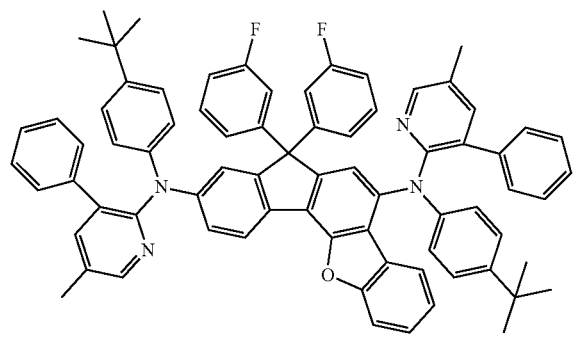
<Chemical Formula 105>
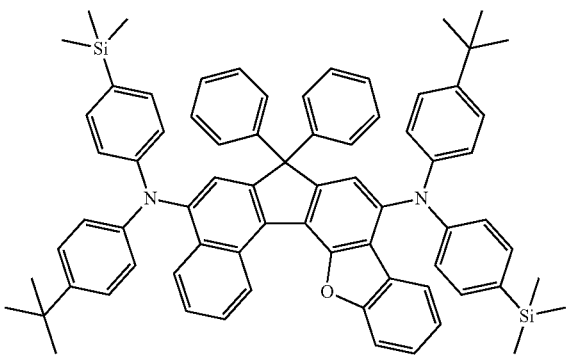

-continued
<Chemical Formula 106>
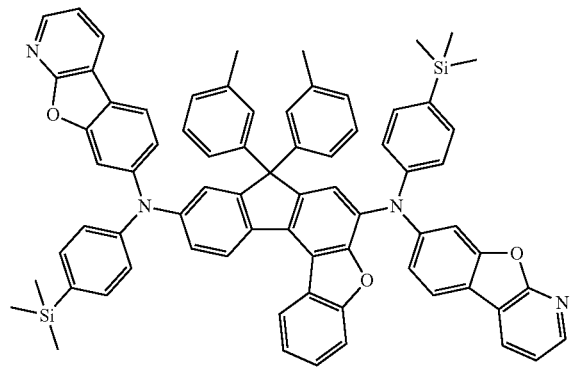
<Chemical Formula 107>
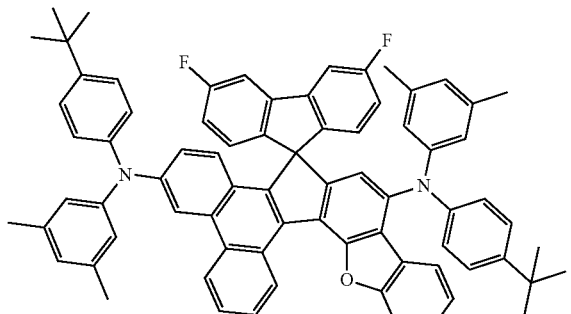
<Chemical Formula 108>
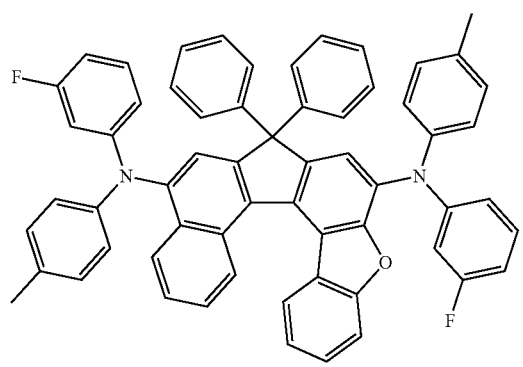
<Chemical Formula 109>
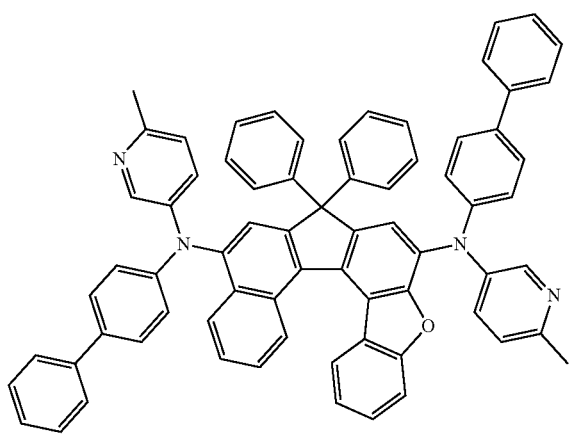
<Chemical Formula 110>
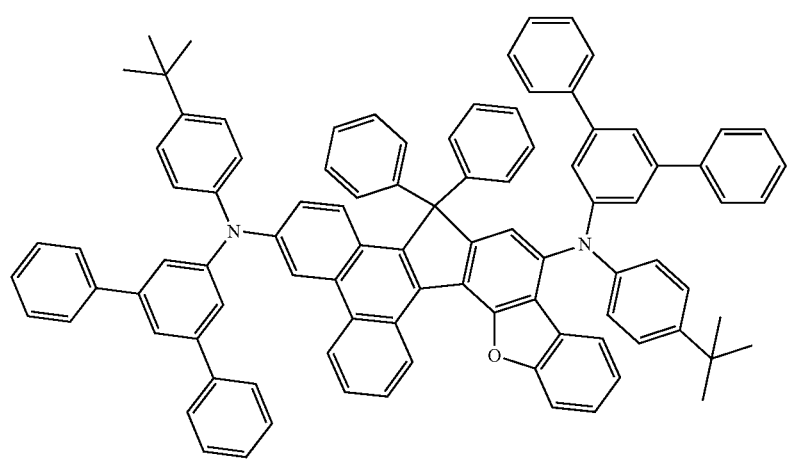

<Chemical Formula 111>
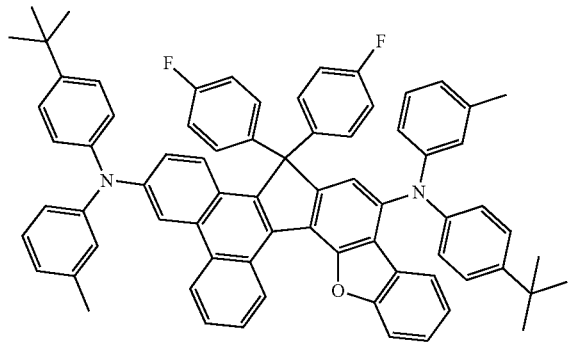
<Chemical Formula 112>
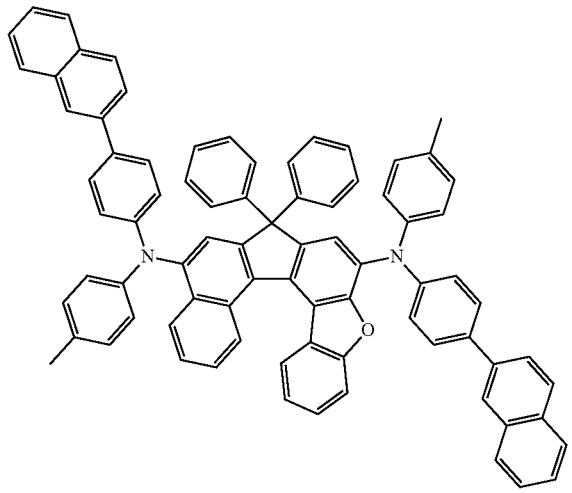
<Chemical Formula 113>
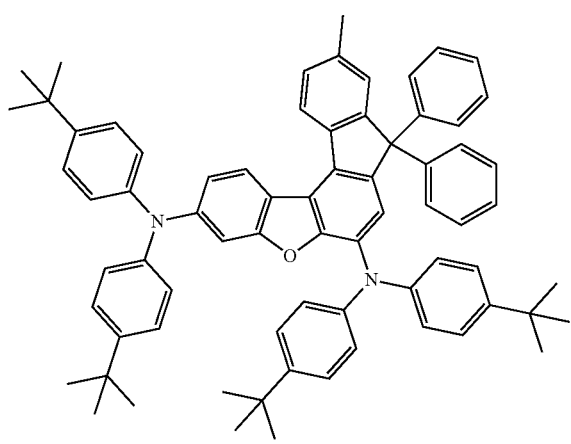
<Chemical Formula 114>
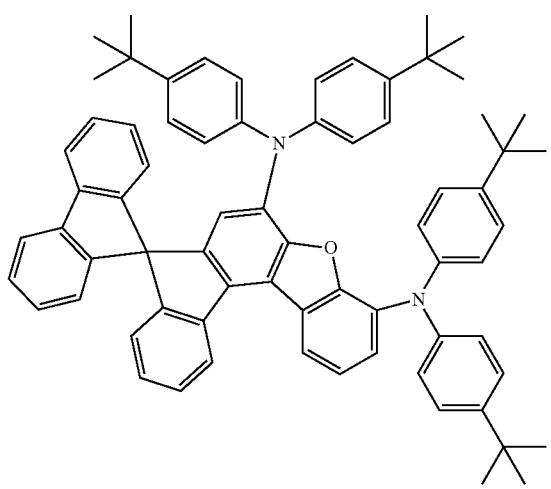
<Chemical Formula 115>
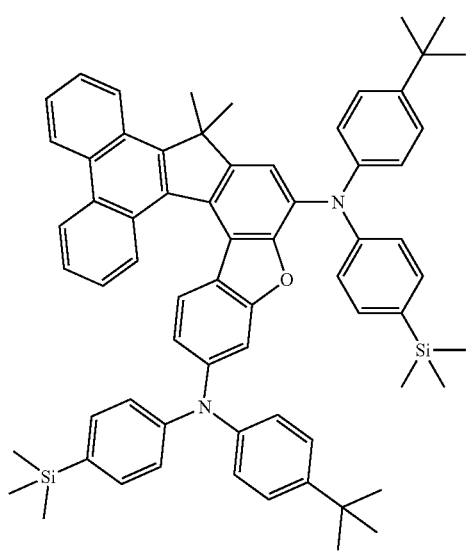
<Chemical Formula 116>
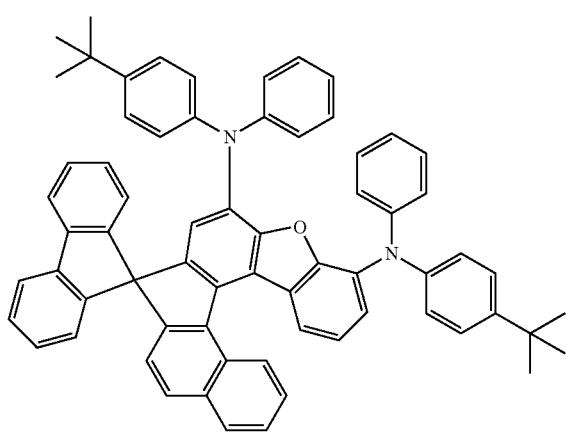

-continued
<Chemical Formula 117>
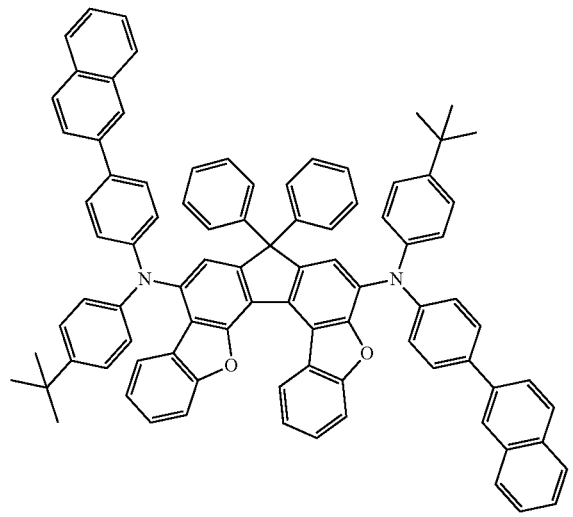
<Chemical Formula 118>
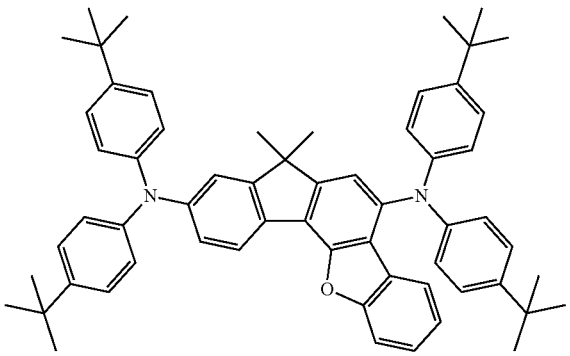
<Chemical Formula 119>
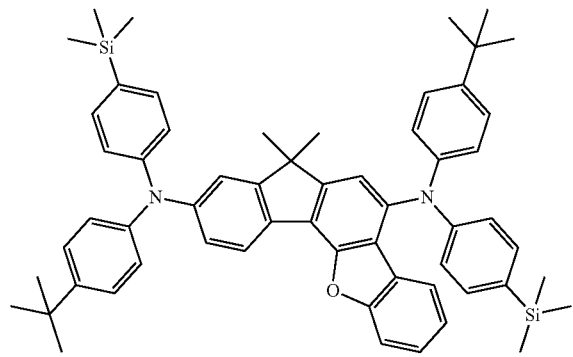
<Chemical Formula 120>
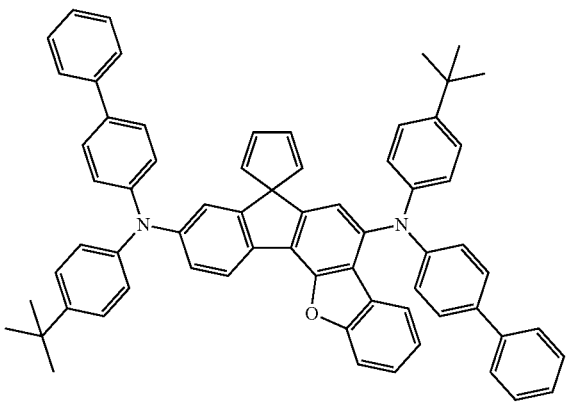
<Chemical Formula 121>
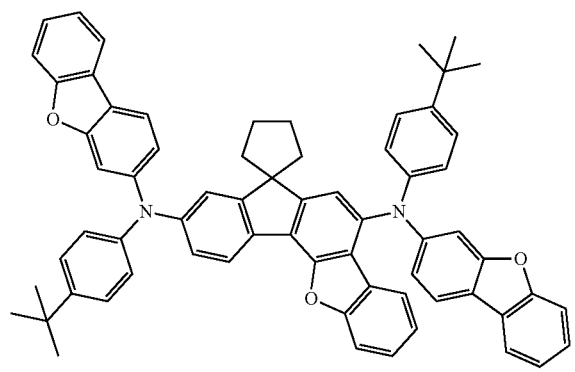
<Chemical Formula 122>
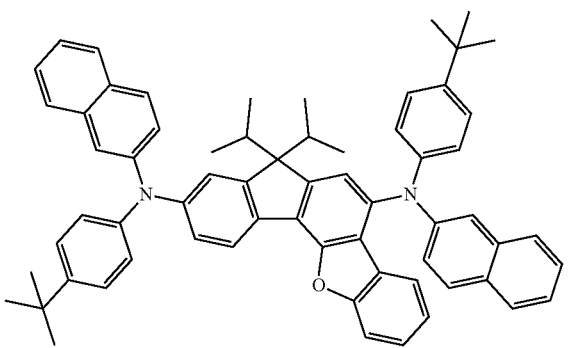

-continued
<Chemical Formula 123>
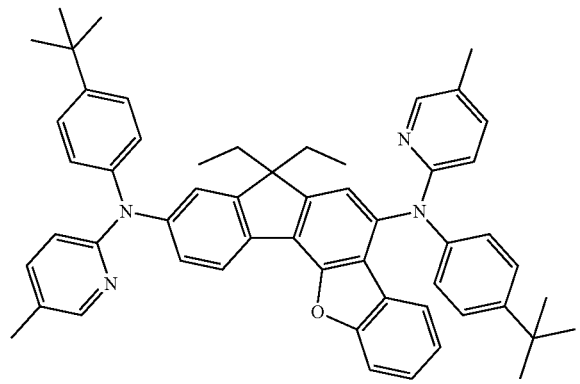
<Chemical Formula 124>
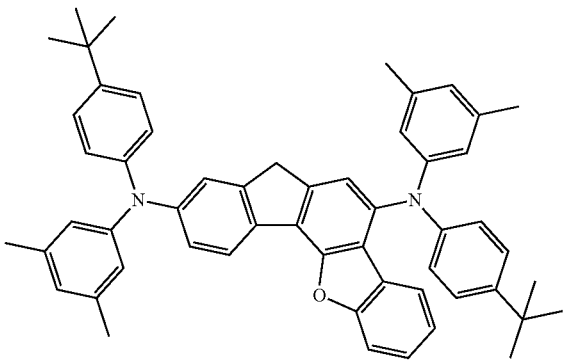
<Chemical Formula 125>
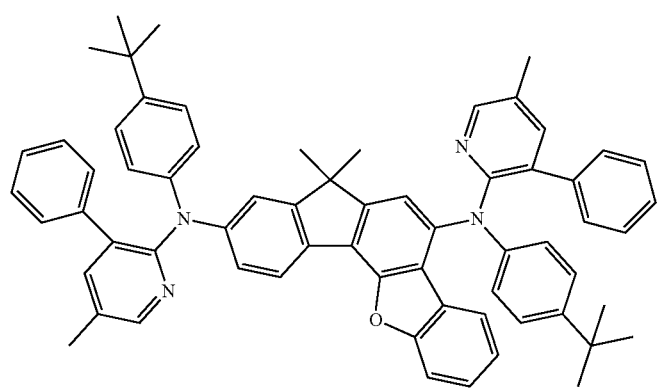
<Chemical Formula 126>
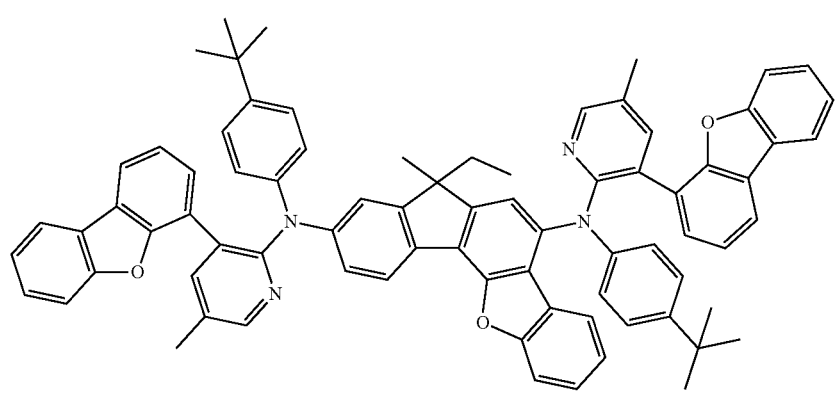
<Chemical Formula 127>
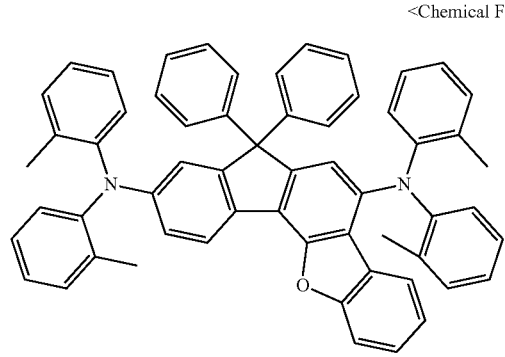
<Chemical Formula 128>
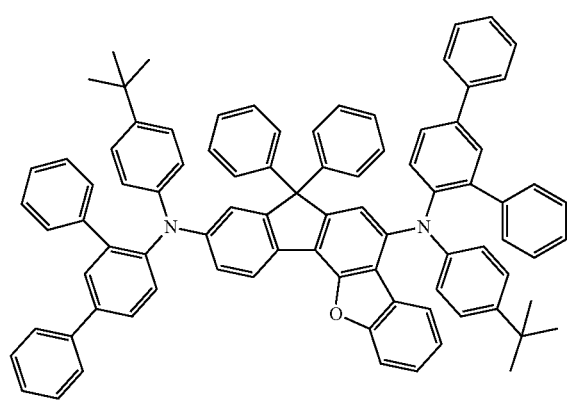

-continued
<Chemical Formula 129>
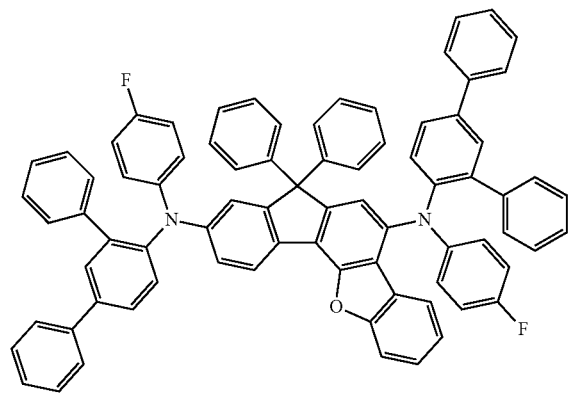
<Chemical Formula 130>
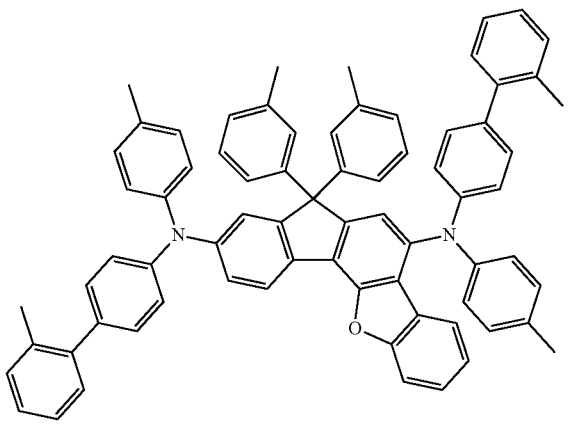
<Chemical Formula 131>
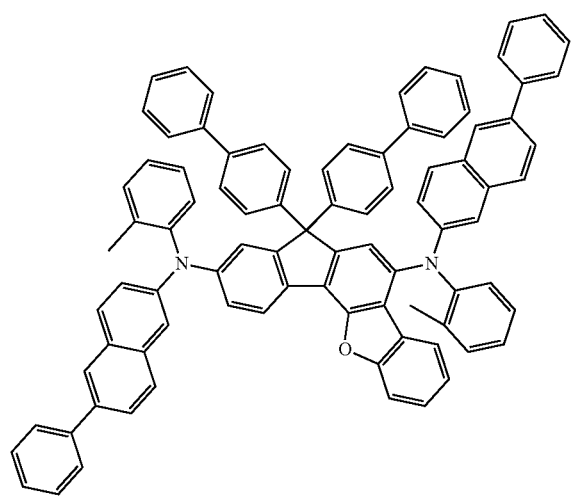
<Chemical Formula 132>
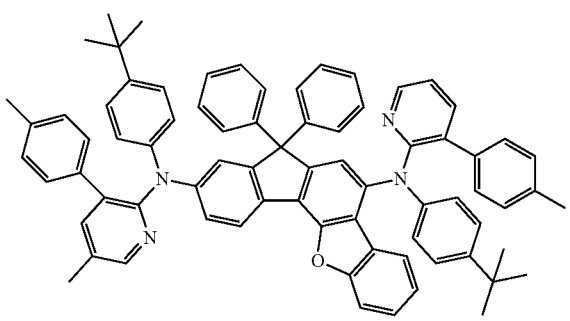
<Chemical Formula 133>
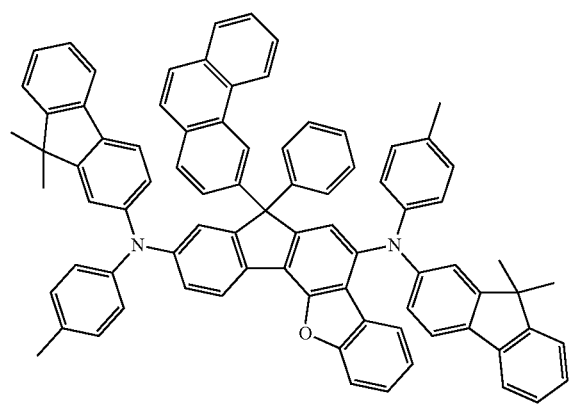
<Chemical Formula 134>
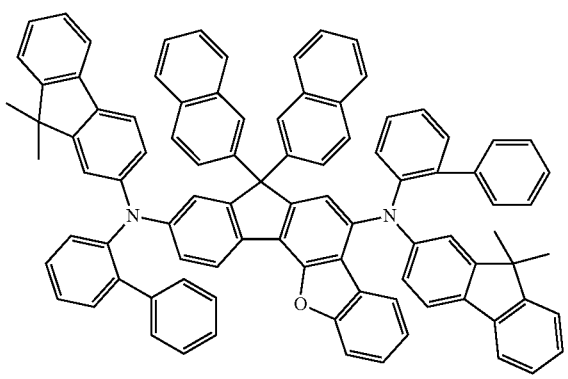

-continued
<Chemical FormulA₁₃5>
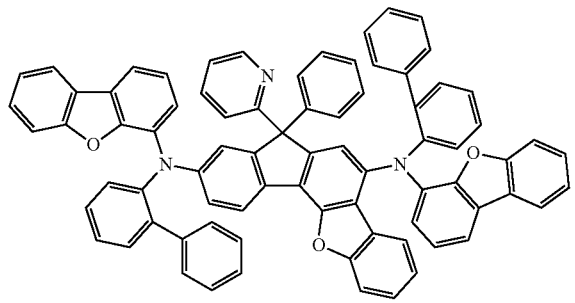
<Chemical Formula 136>
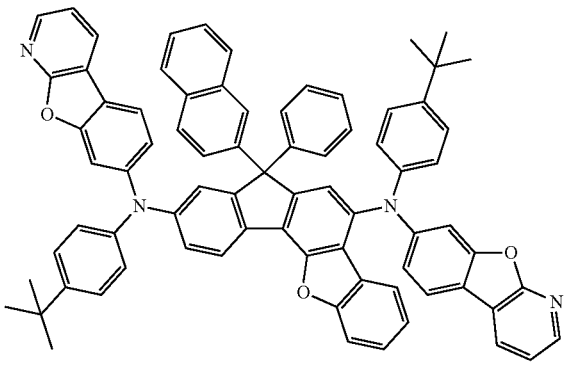
<Chemical Formula 137>
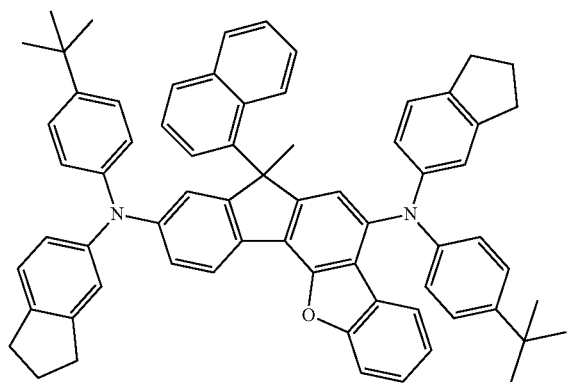
<Chemical Formula 138>
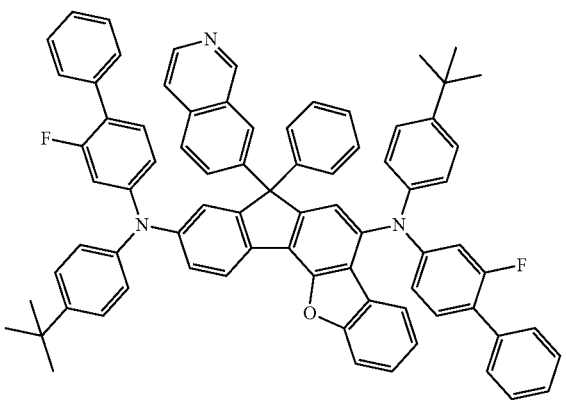
<Chemical Formula 139>
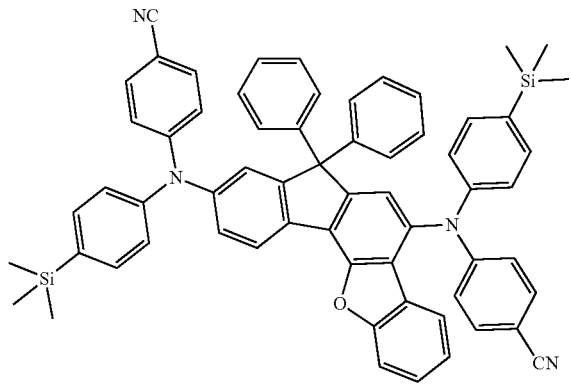
<Chemical Formula 140>
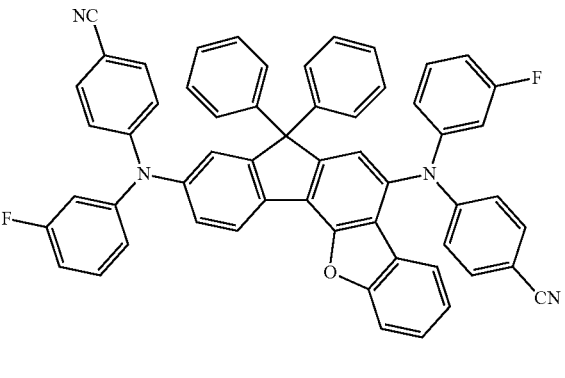
<Chemical Formula 141>
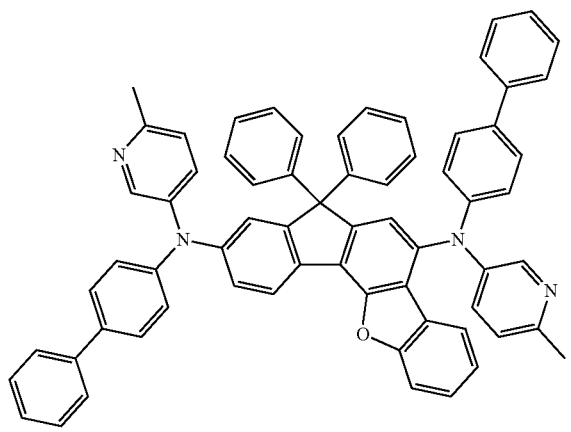
<Chemical Formula 142>
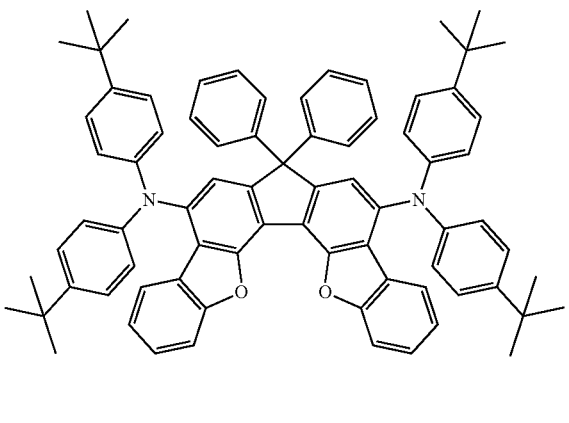

<Chemical Formula 143>
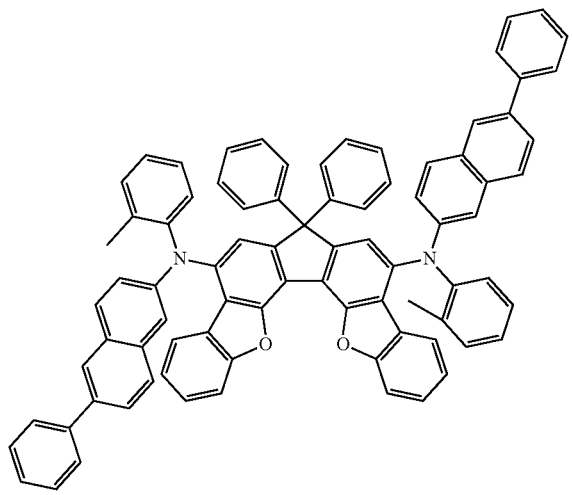
<Chemical Formula 144>
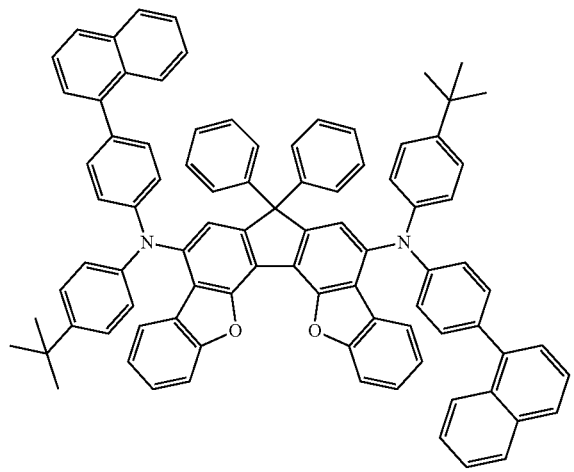
<Chemical Formula 145>
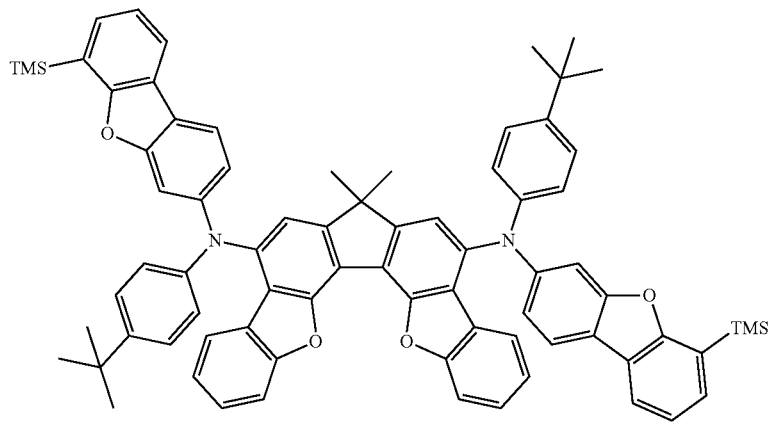
<Chemical Formula 146>
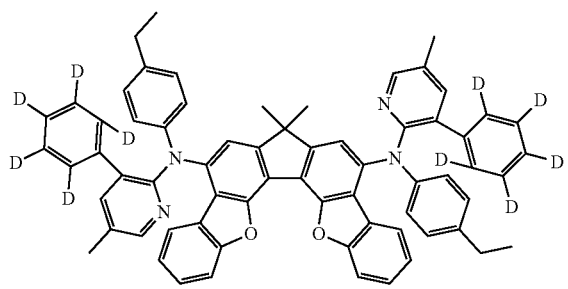
<Chemical Formula 147>
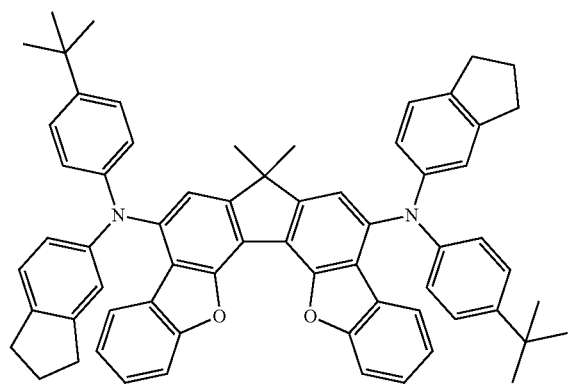

-continued
<Chemical Formula 148>
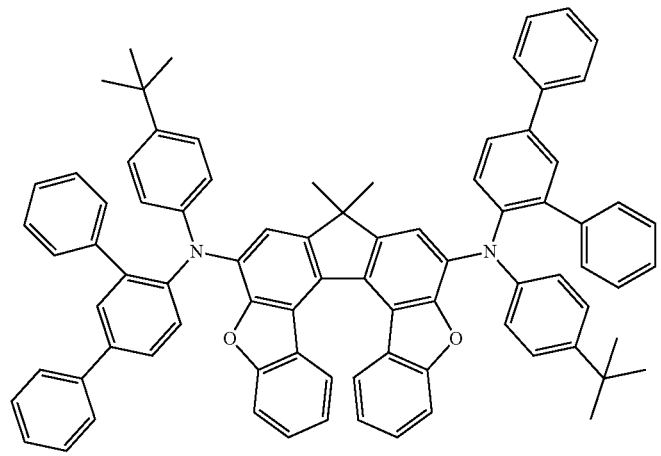
<Chemical Formula 149>
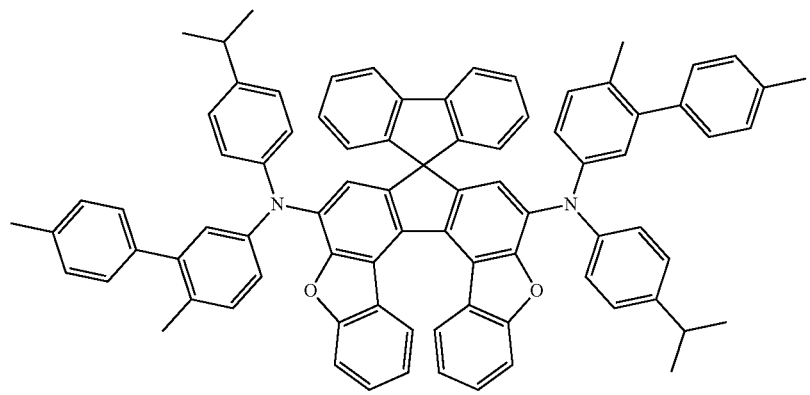
<Chemical Formula 150>
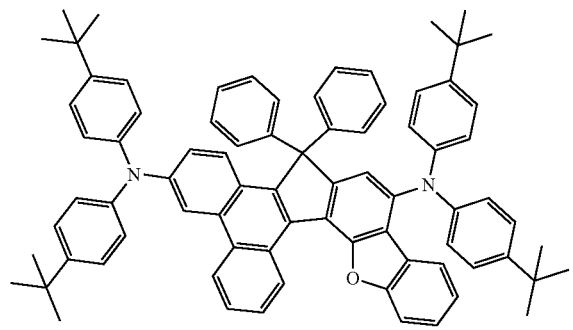
<Chemical Formula 151>
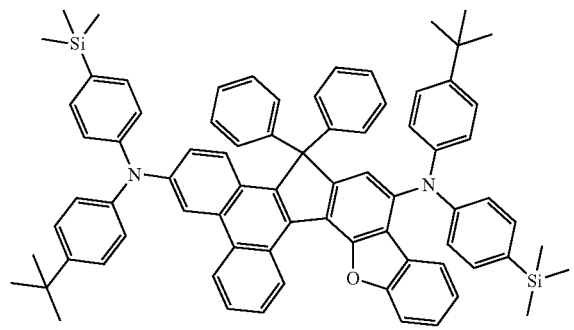

<Chemical Formula 152>
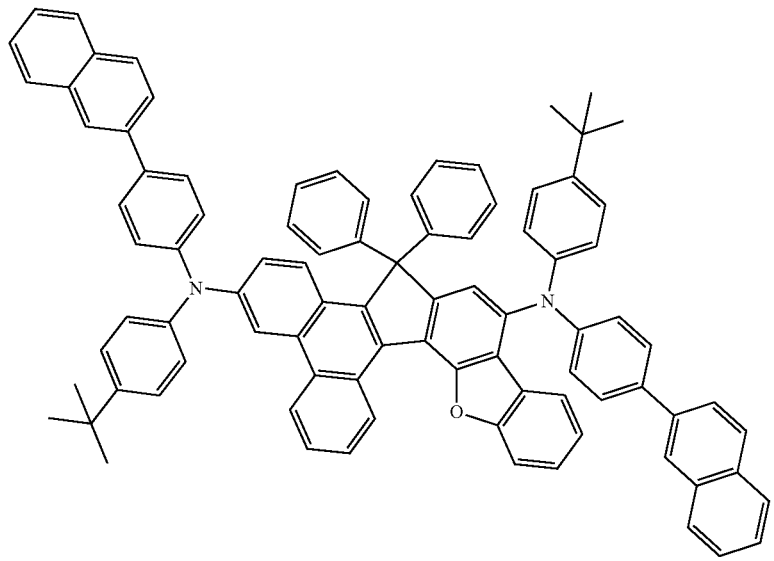
<Chemical Formula 153>
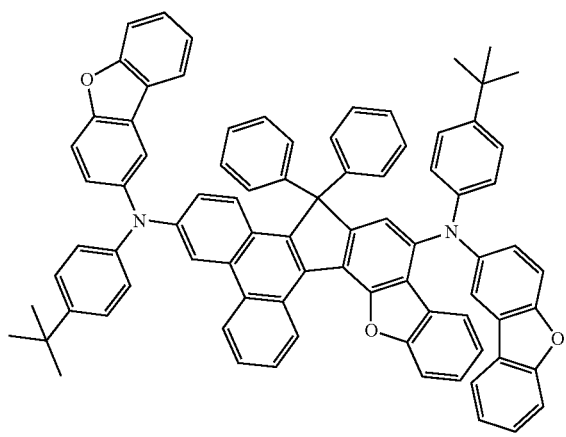
<Chemical Formula 154>
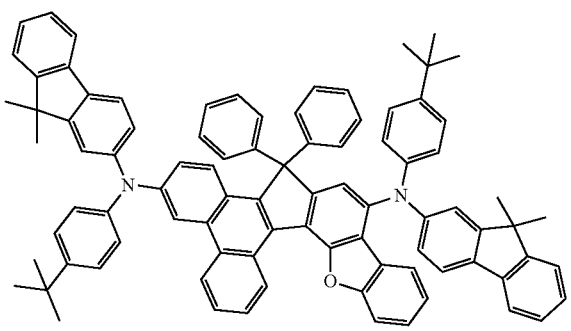
<Chemical Formula 155>
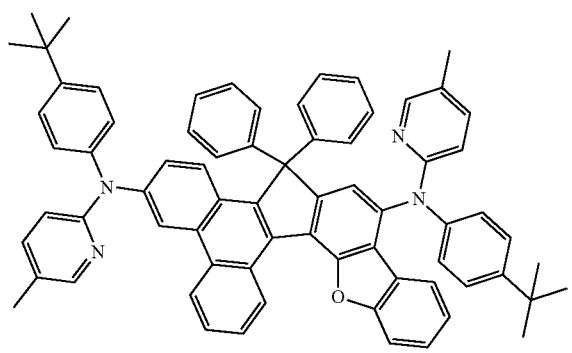
<Chemical Formula 156>
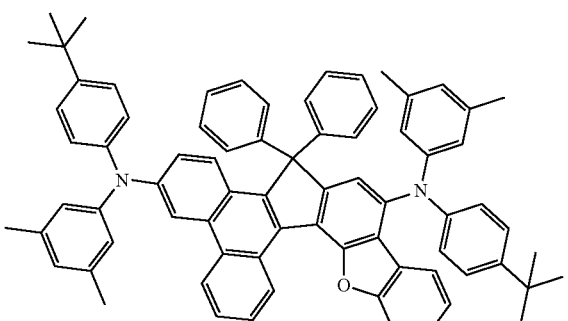

-continued
<Chemical Formula 157>
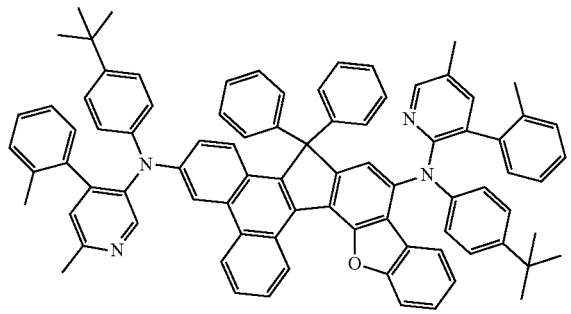
<Chemical Formula 158>
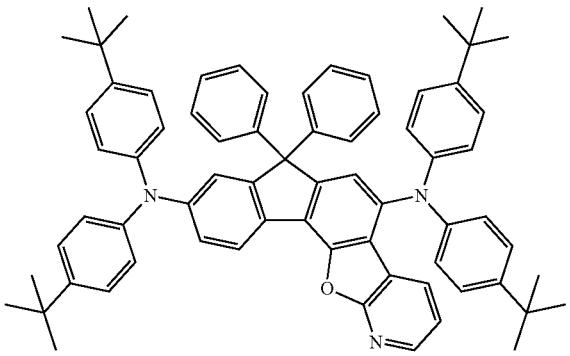
<Chemical Formula 159>
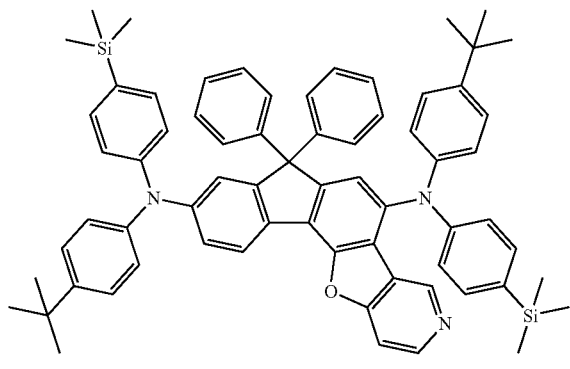
<Chemical Formula 160>
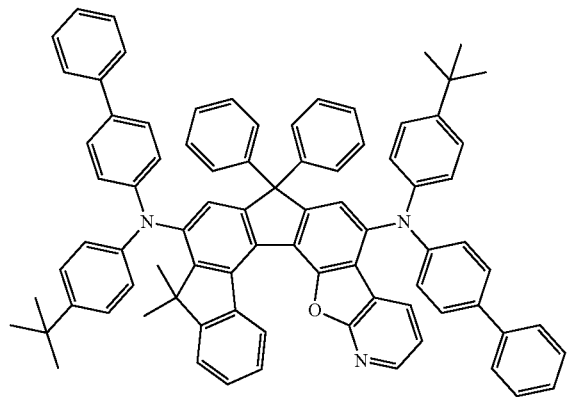
<Chemical Formula 161>
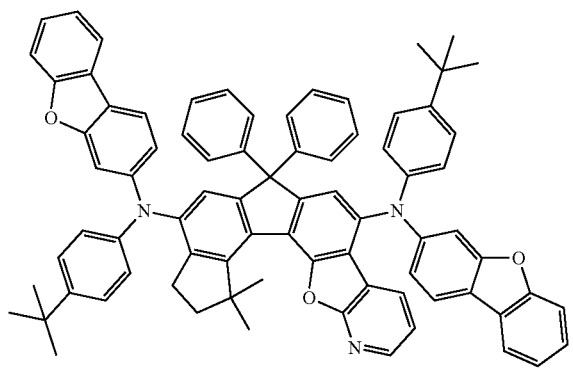
<Chemical Formula 162>
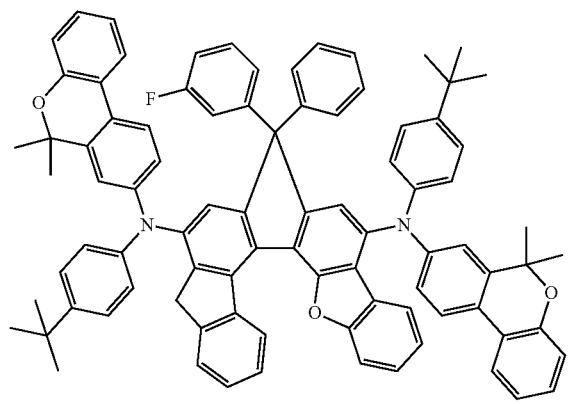

\<Chemical Formula 163\>
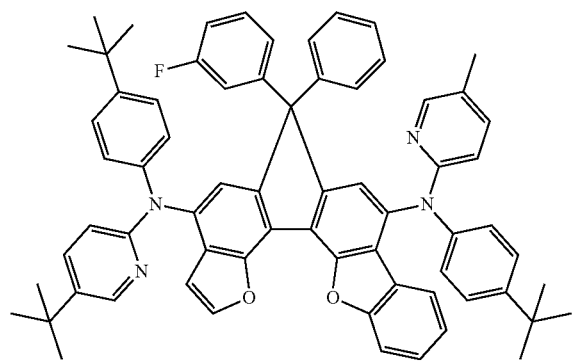
\<Chemical Formula 164\>
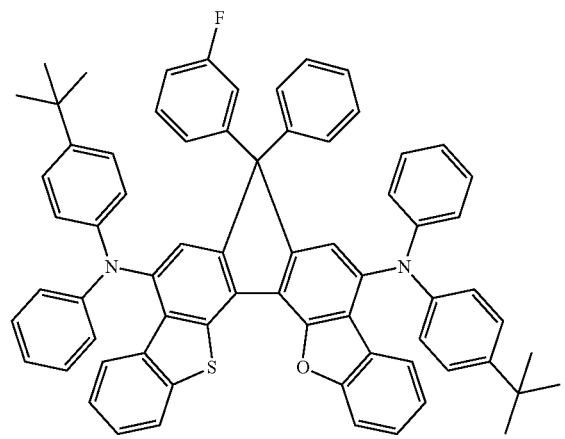
\<Chemical Formula 165\>
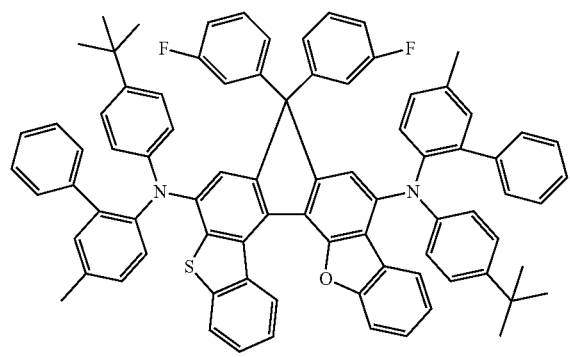
\<Chemical Formula 166\>
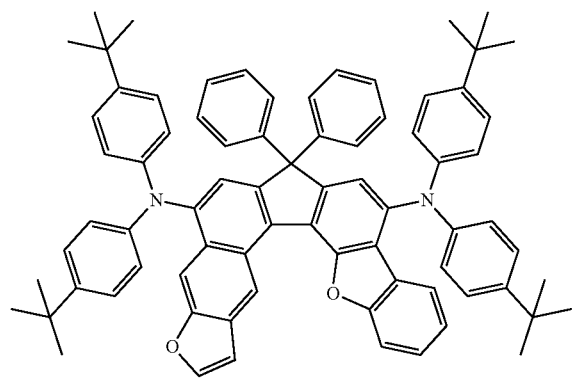
\<Chemical Formula 167\>
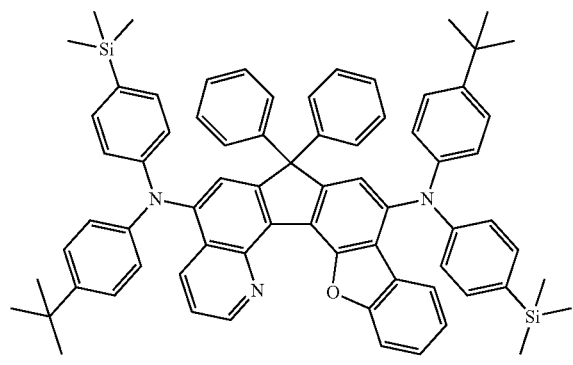
\<Chemical Formula 168\>
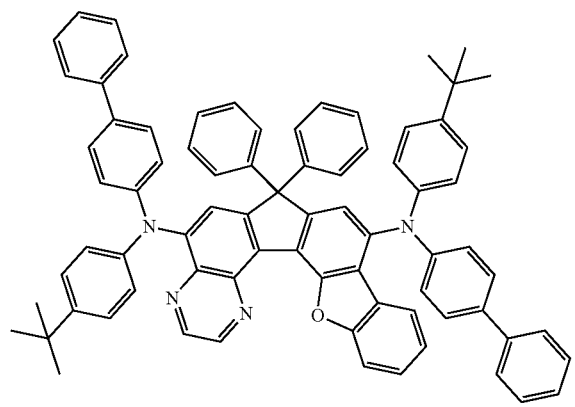

<Chemical Formula 169>
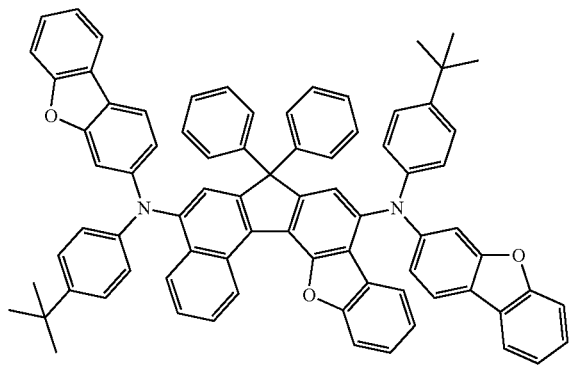
<Chemical Formula 170>
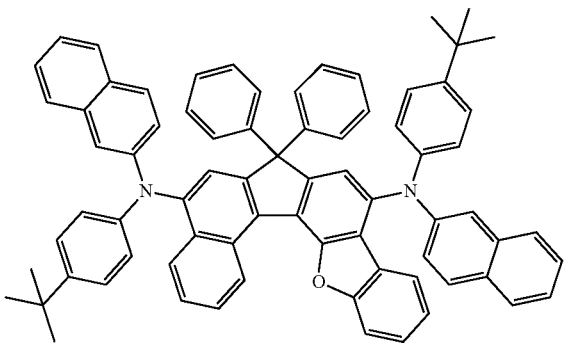
<Chemical Formula 171>
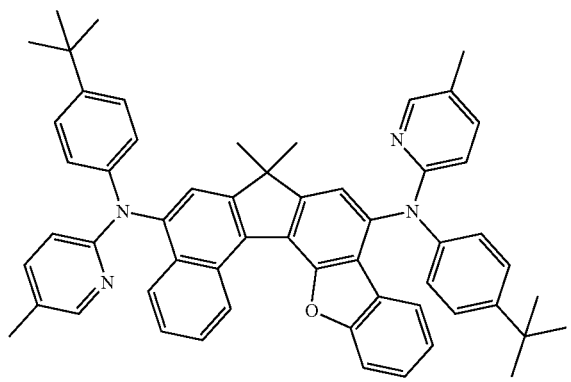
<Chemical Formula 172>
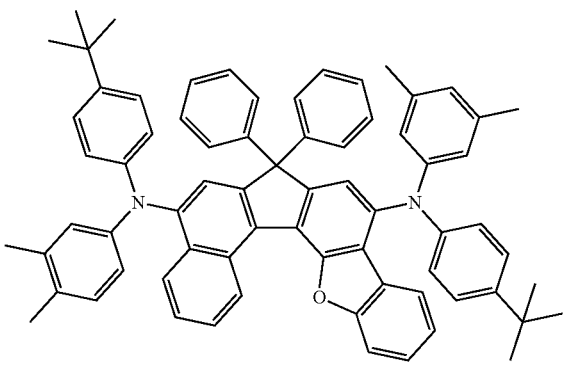
<Chemical Formula 173>
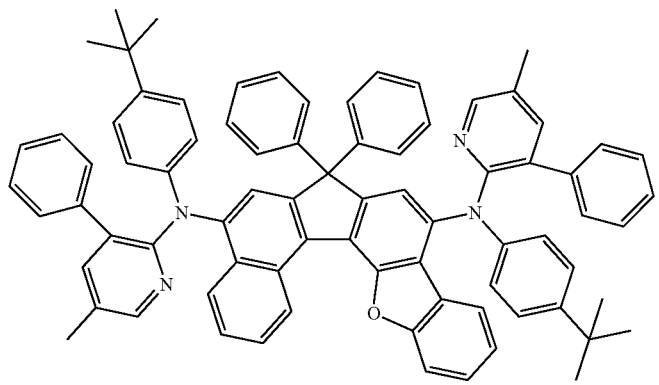
<Chemical Formula 174>
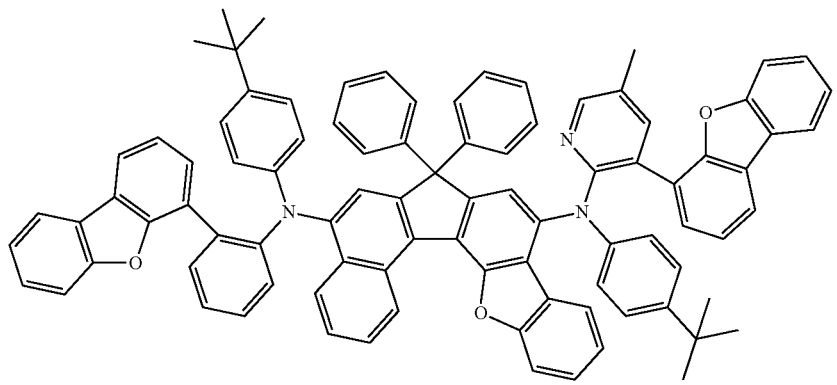

-continued
<Chemical Formula 175>
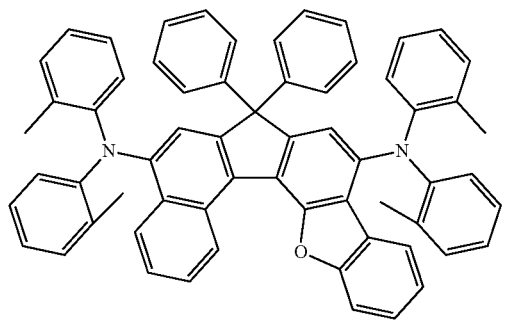
<Chemical Formula 176>
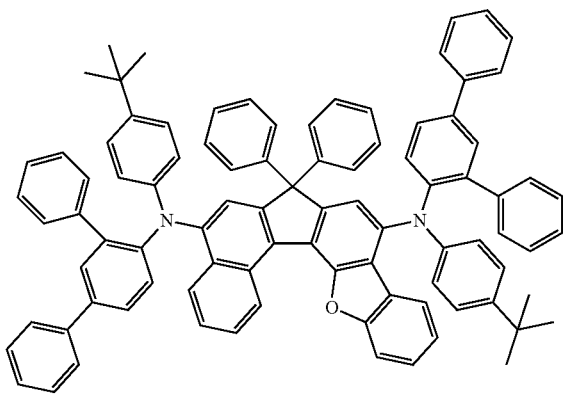
<Chemical Formula 177>
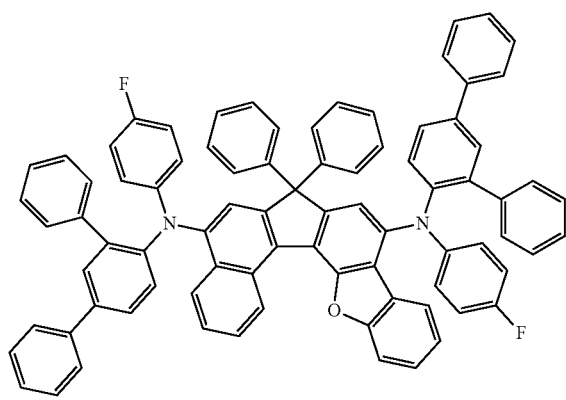
<Chemical Formula 178>
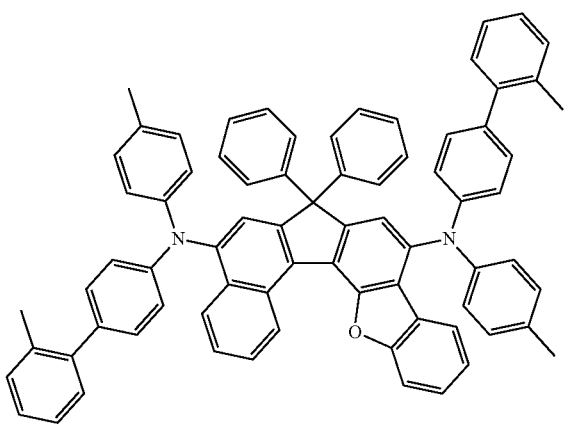
<Chemical Formula 179>
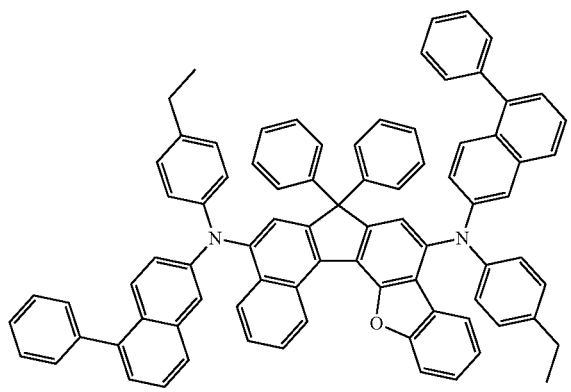
<Chemical Formula 180>
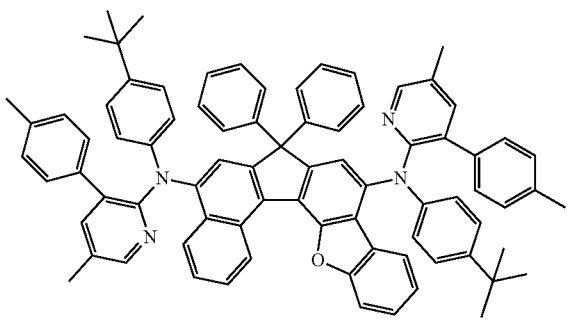

<Chemical Formula 181>
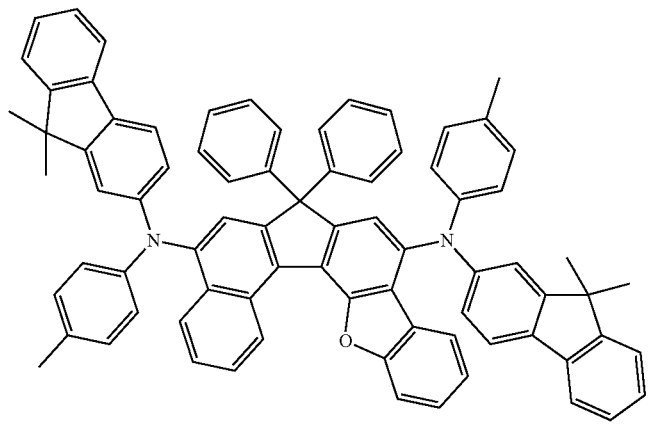
<Chemical Formula 182>
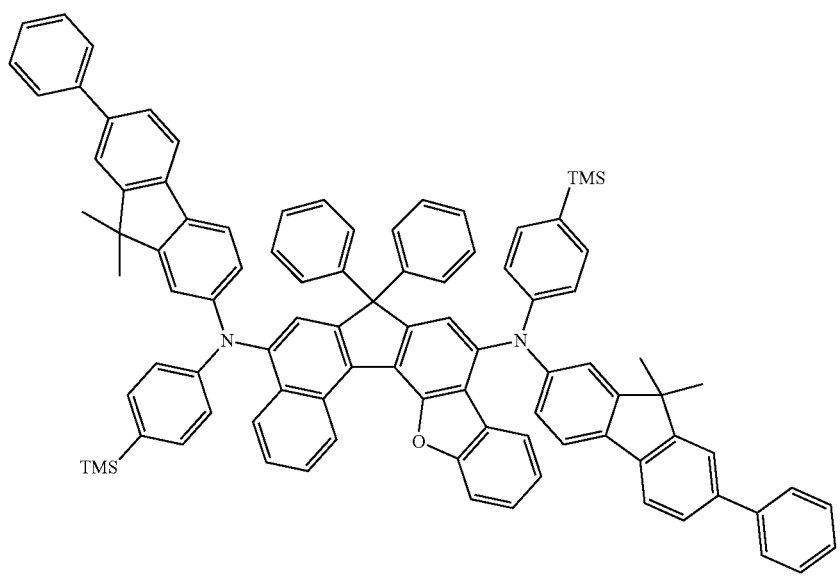
<Chemical Formula 183>
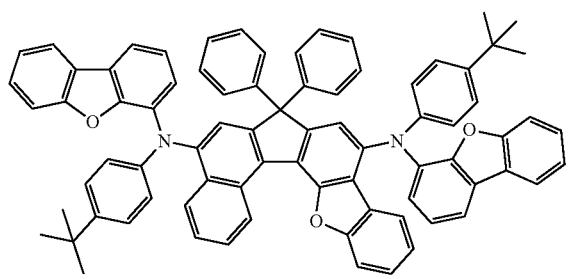
<Chemical Formula 184>
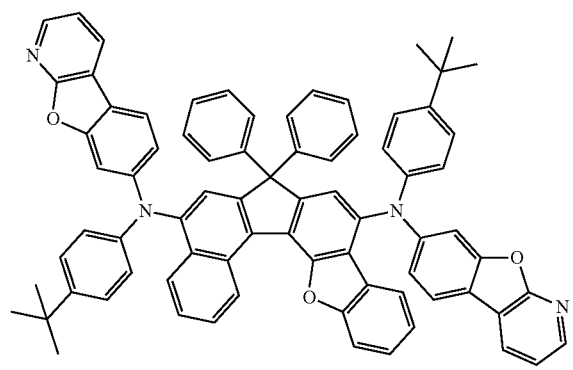

-continued
<Chemical Formula 185>
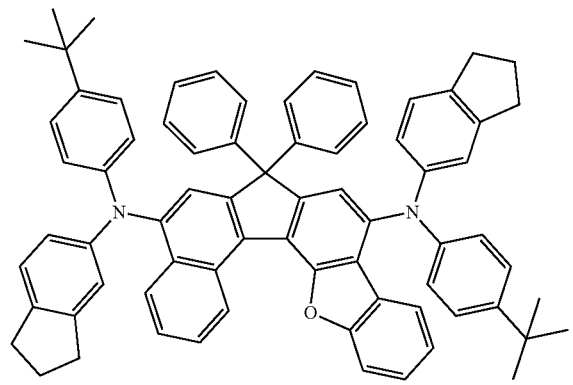
<Chemical Formula 186>
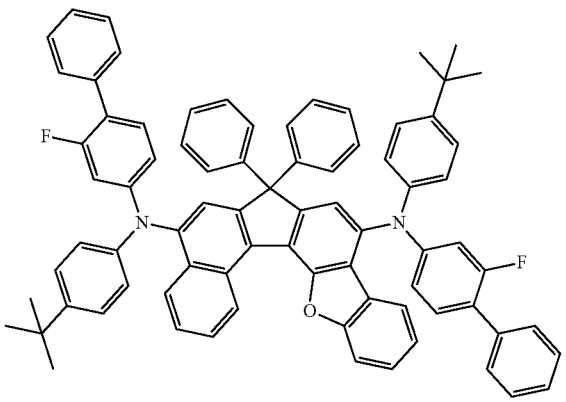
<Chemical Formula 187>
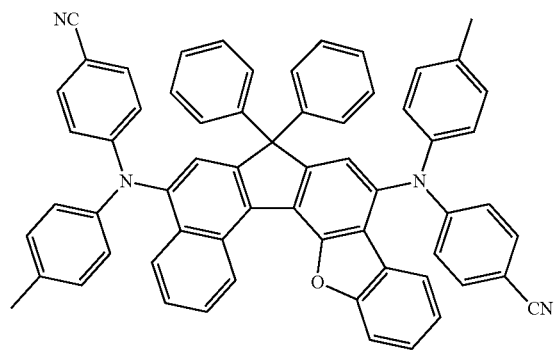
<Chemical Formula 188>
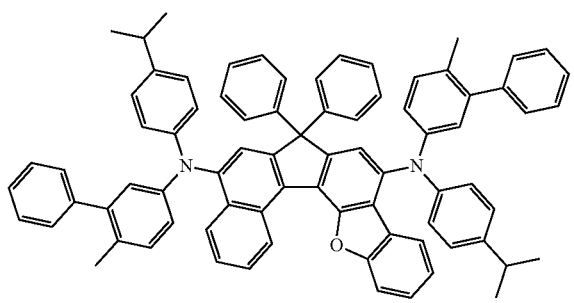
<Chemical Formula 189>
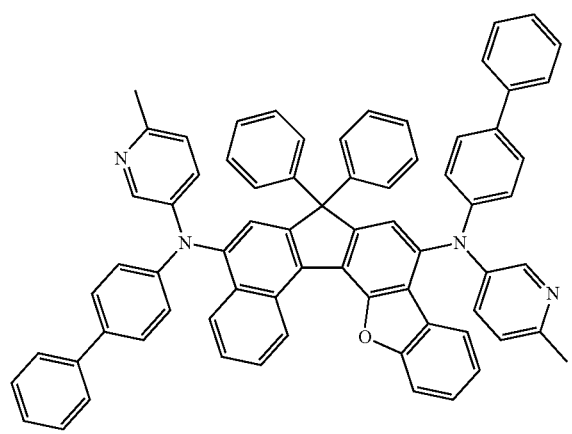
<Chemical Formula 190>
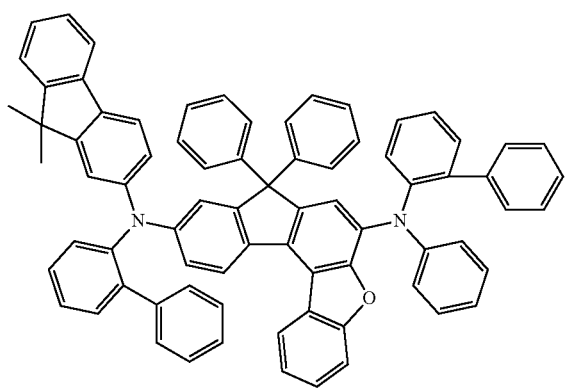

<Chemical Formula 191>
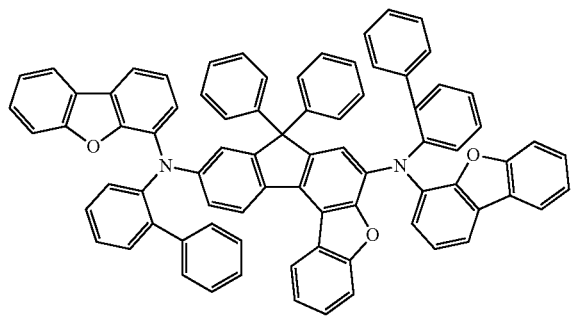
<Chemical Formula 192>
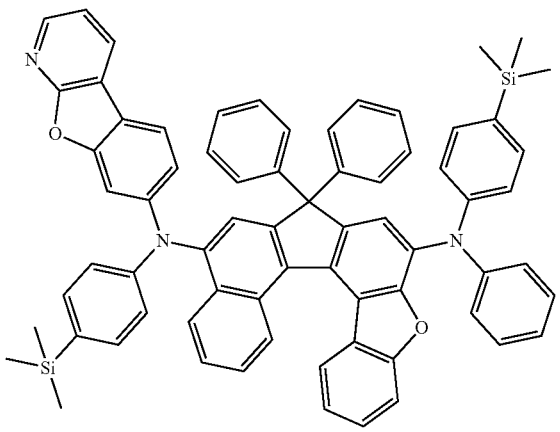
<Chemical Formula 193>
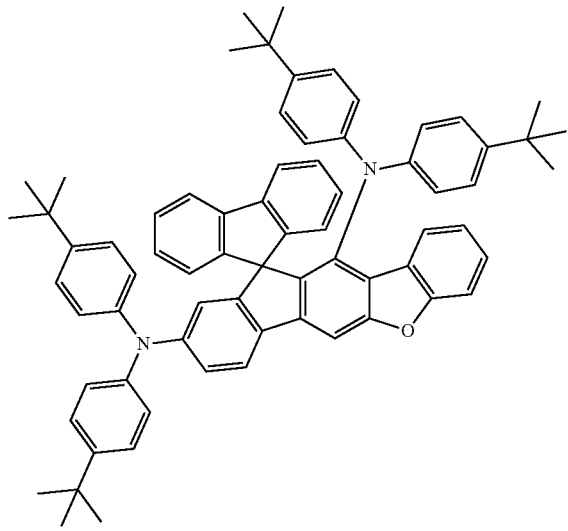
<Chemical Formula 194>
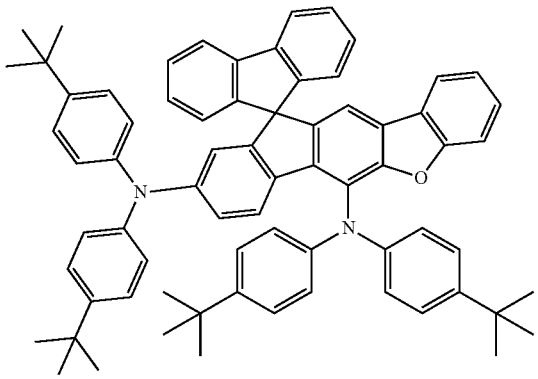
<Chemical Formula 195>
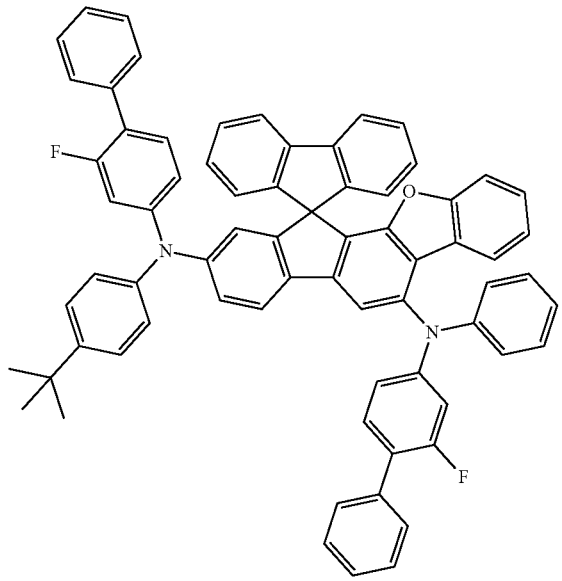
<Chemical Formula 196>
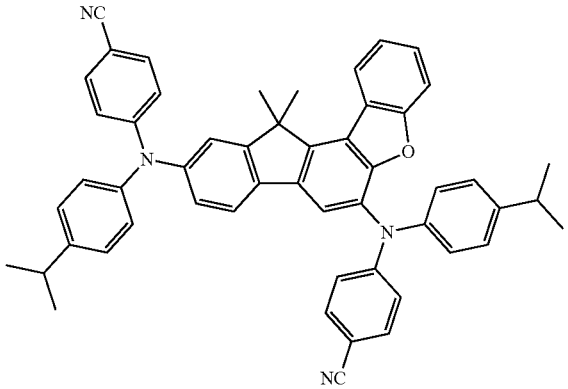

<Chemical Formula 197>
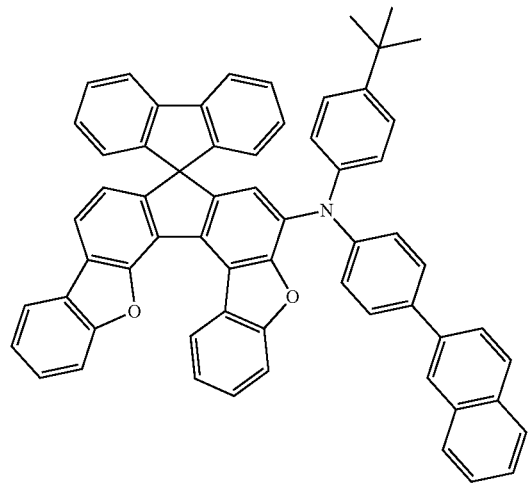
<Chemical Formula 198>
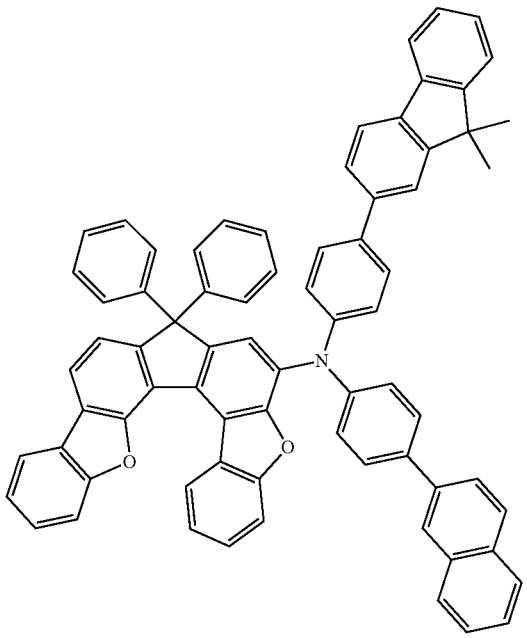
<Chemical Formula 199>
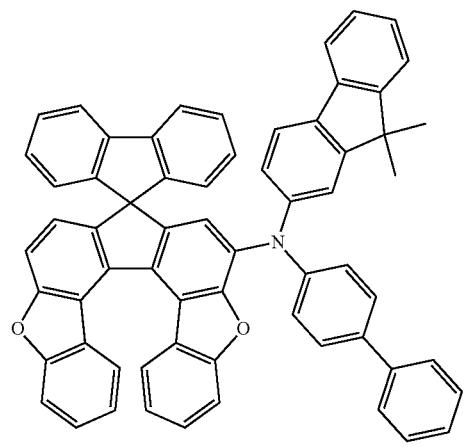
<Chemical Formula 200>
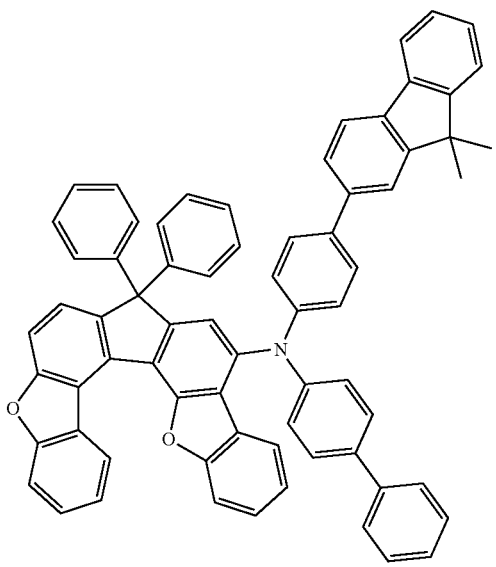

<Chemical Formula 201>
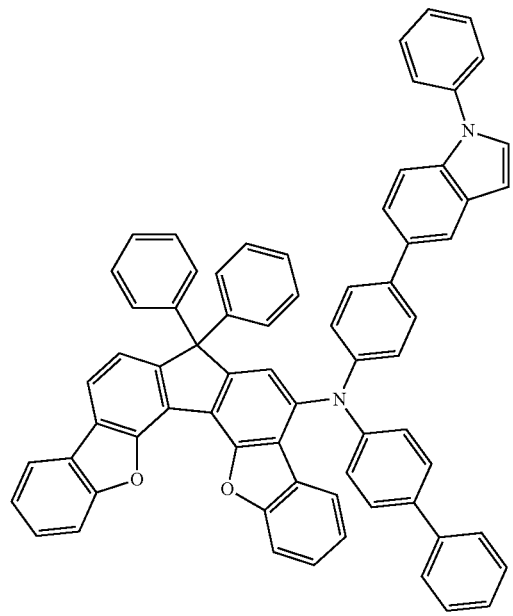
<Chemical Formula 202>
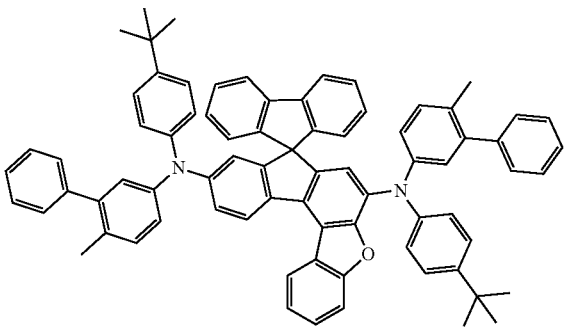
<Chemical Formula 203>
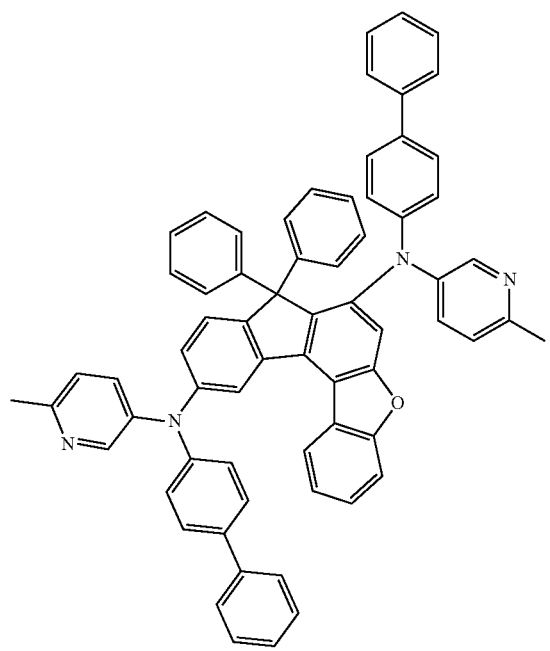
<Chemical Formula 204>
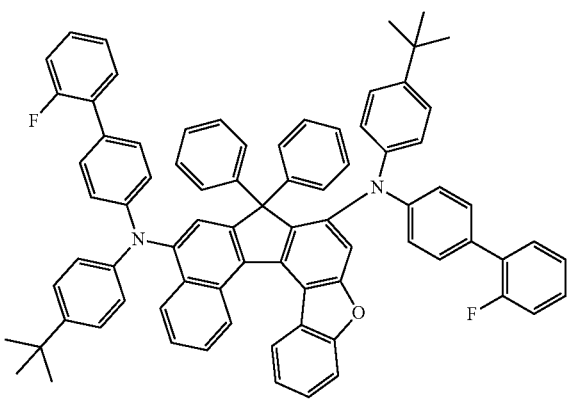
<Chemical Formula 205>
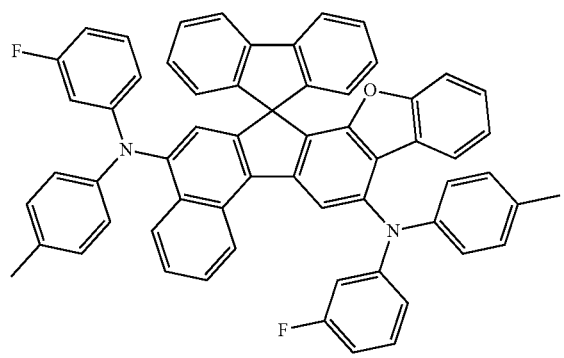
<Chemical Formula 206>
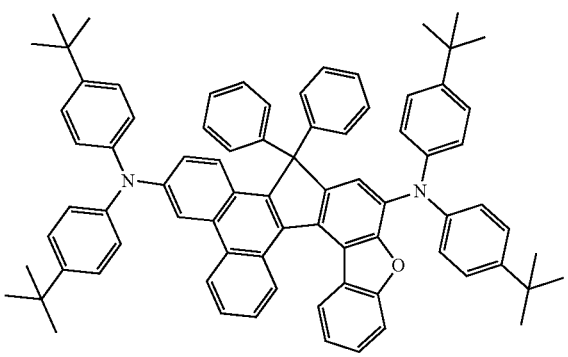

<Chemical Formula 207>
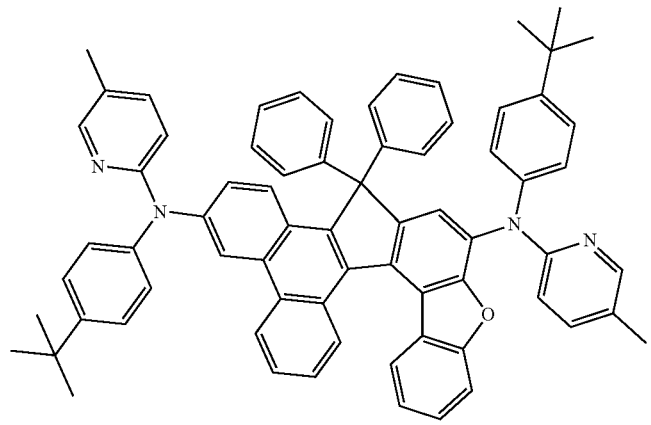
<Chemical Formula 208>
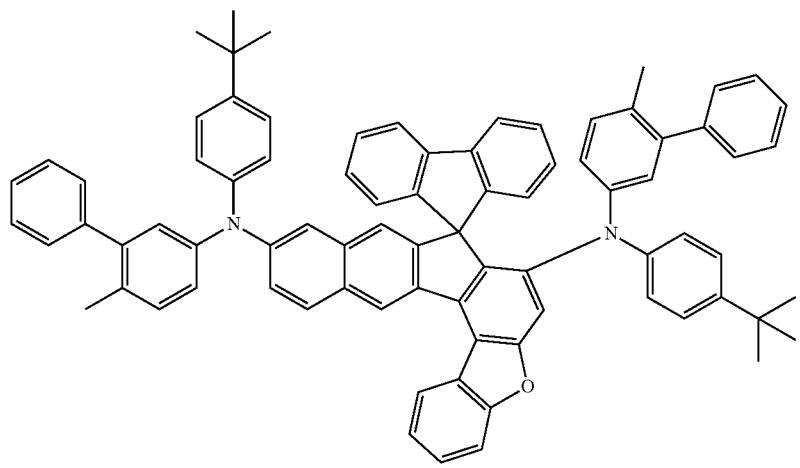
<Chemical Formula 209>
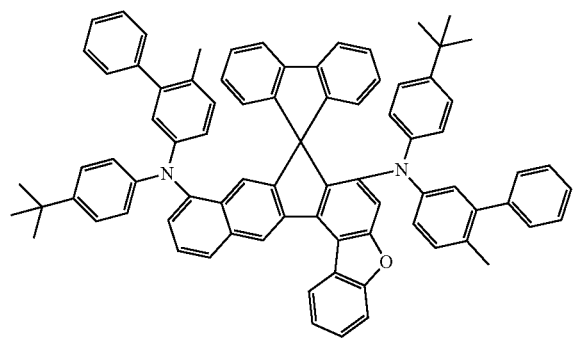
<Chemical Formula 210>
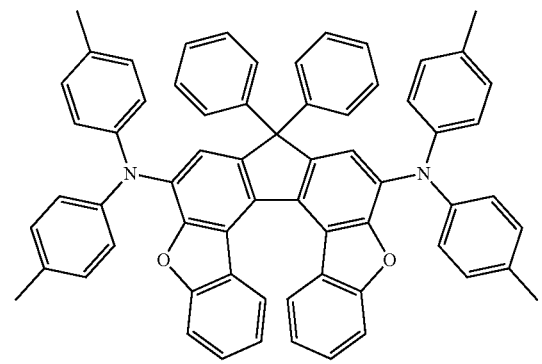

<Chemical Formula 211>
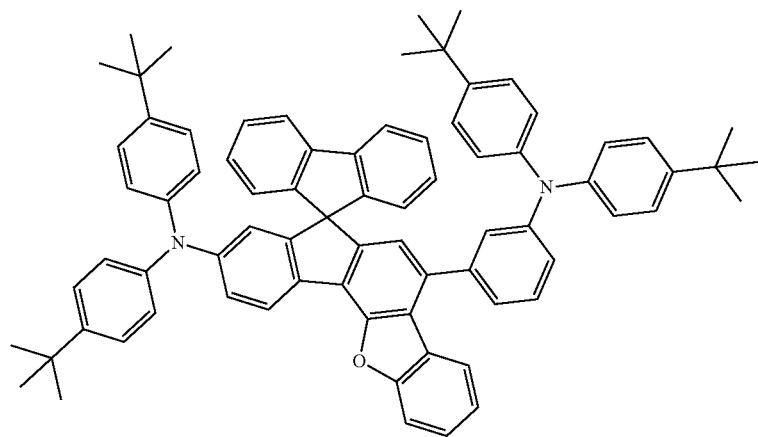
<Chemical Formula 212>
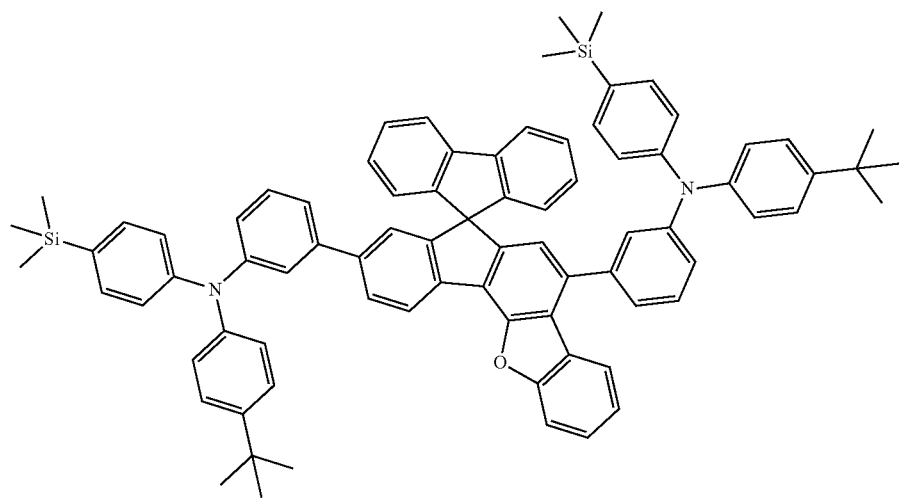
<Chemical Formula 213>
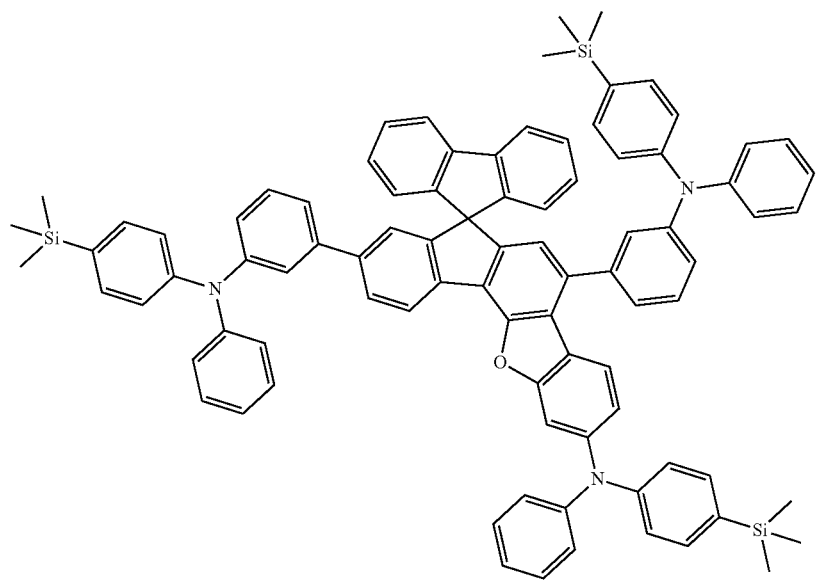

-continued
<Chemical Formula 214>
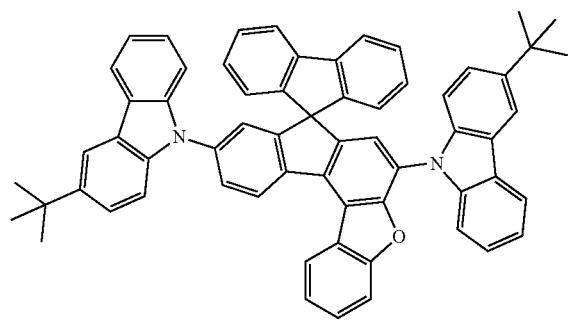
<Chemical Formula 215>
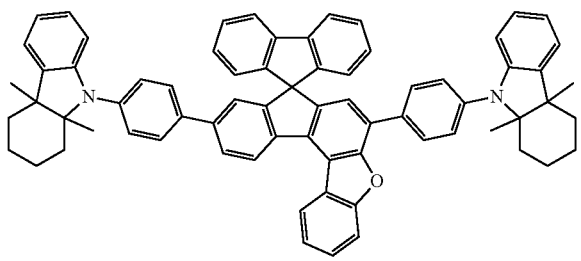
<Chemical Formula 216>
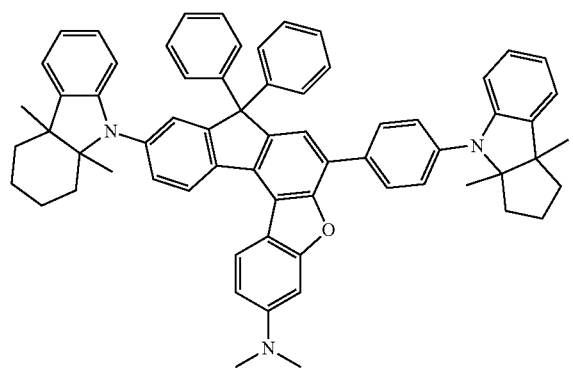
<Chemical Formula 217>
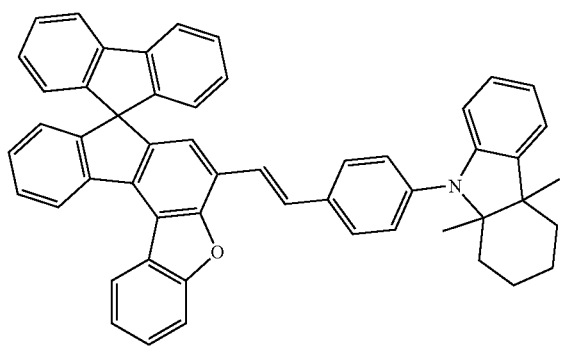
<Chemical Formula 218>
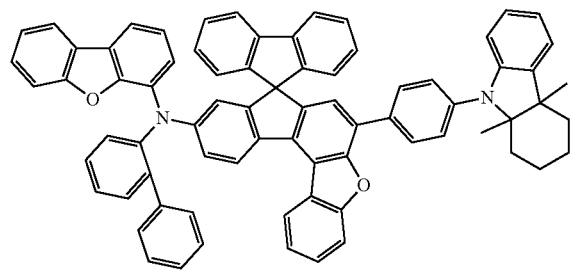
<Chemical Formula 219>
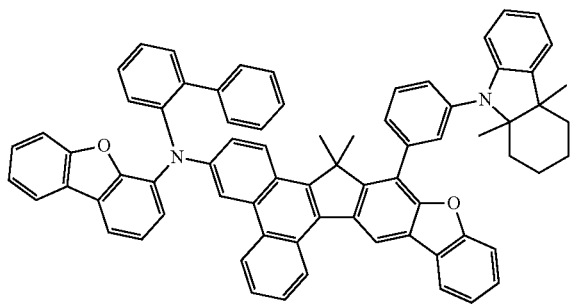
<Chemical Formula 220>
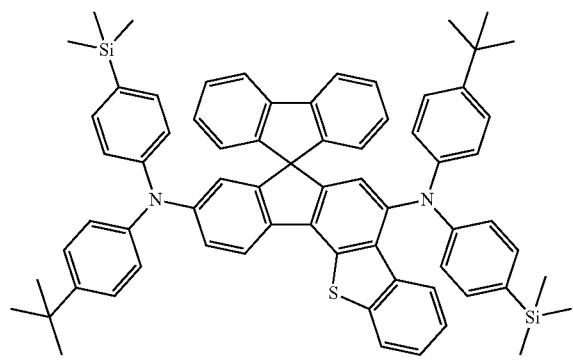
<Chemical Formula 221>
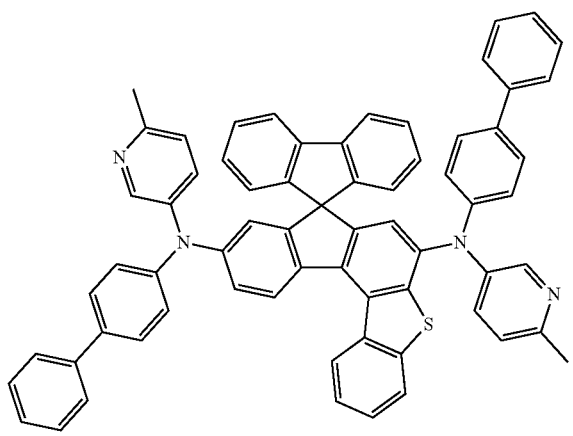

-continued
<Chemical Formula 222>
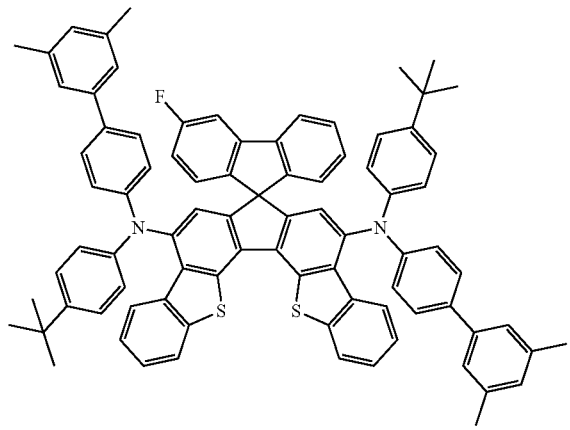
<Chemical Formula 223>
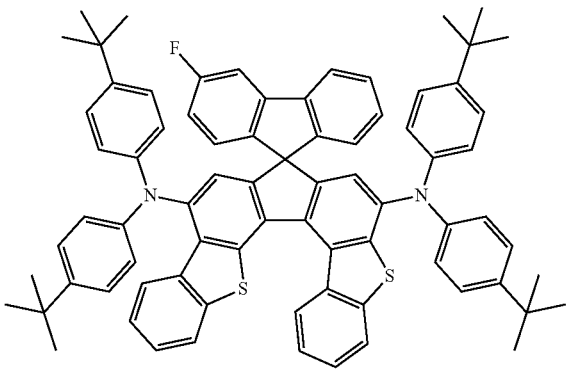
<Chemical Formula 224>
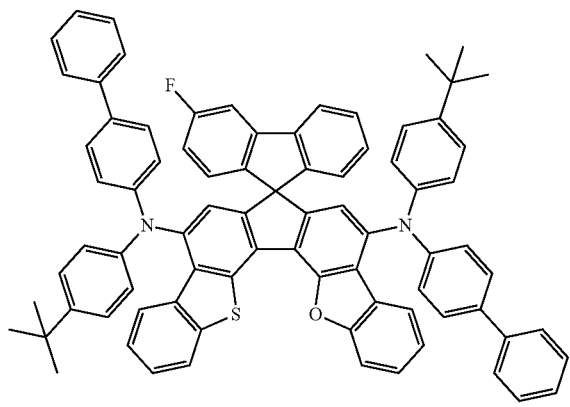
<Chemical Formula 225>
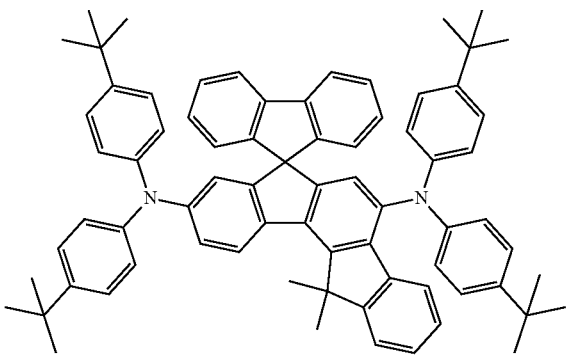
<Chemical Formula 226>
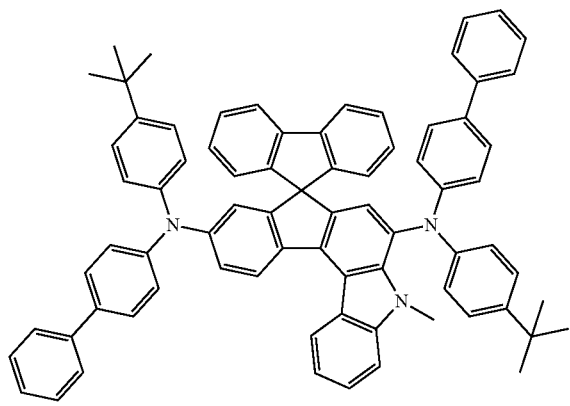
<Chemical Formula 227>
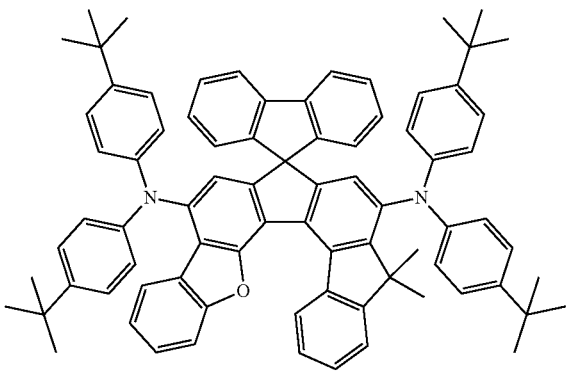

<Chemical Formula 228>
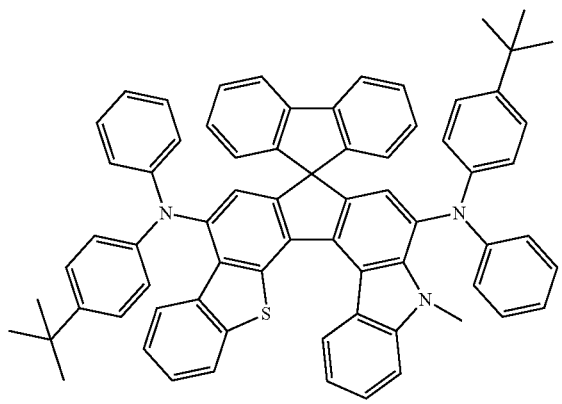
<Chemical Formula 229>
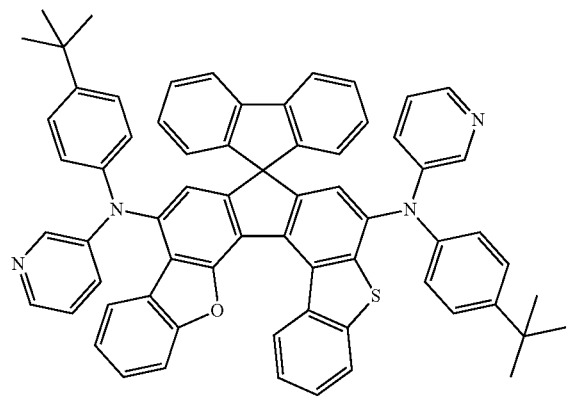
<Chemical Formula 230>
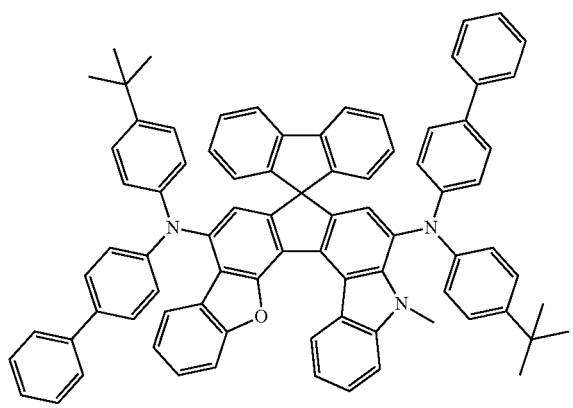
<Chemical Formula 231>
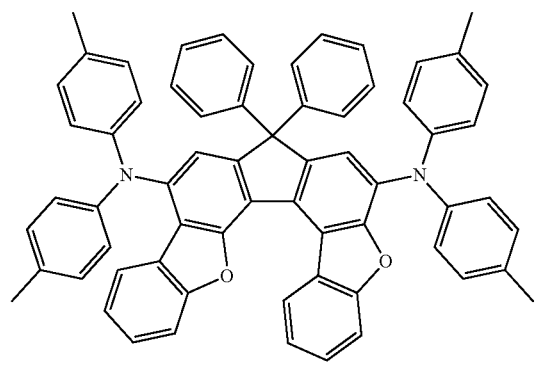
<Chemical Formula 232>
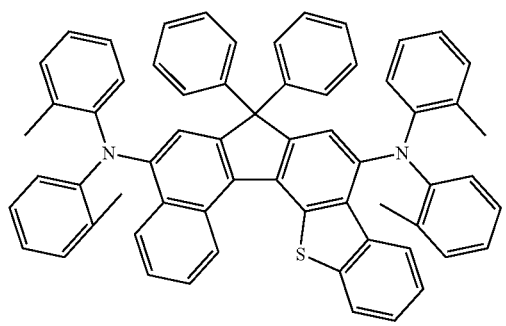
<Chemical Formula 233>
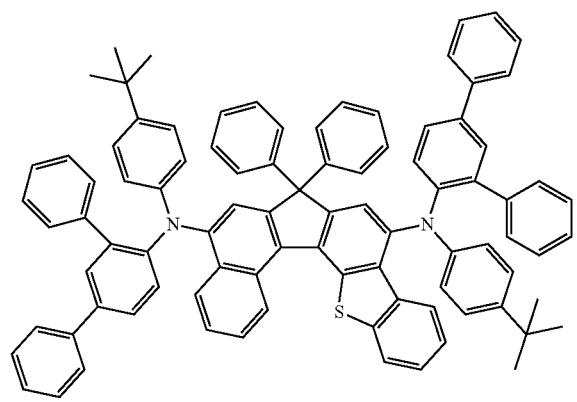

<Chemical Formula 234>
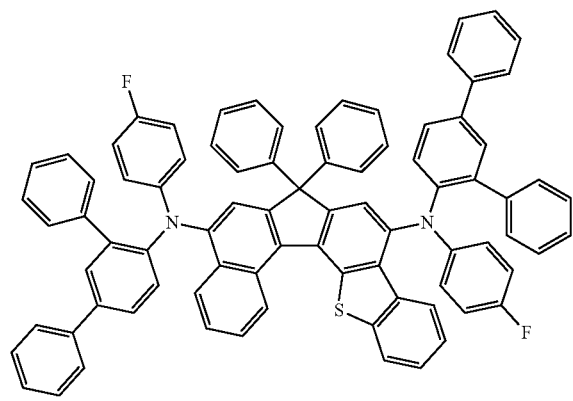
<Chemical Formula 235>
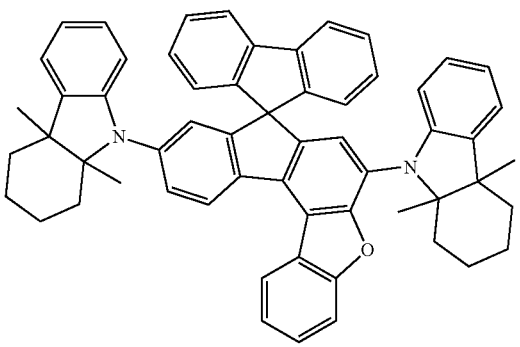
<Chemical Formula 236>
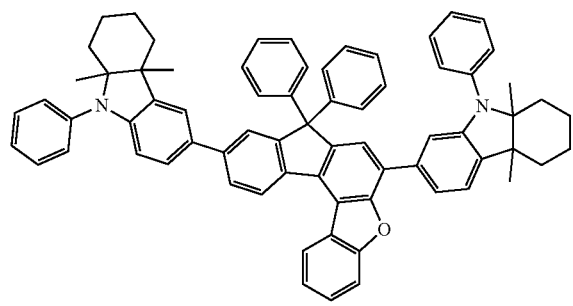
<Chemical Formula 237>
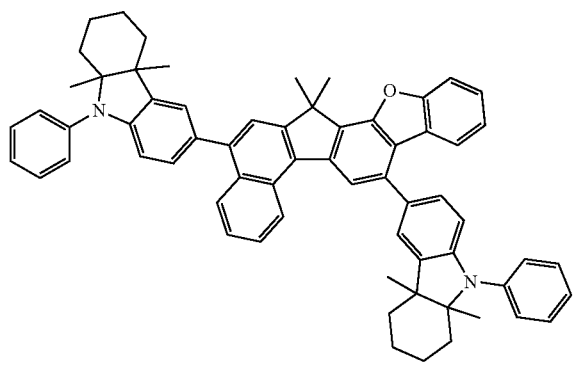
<Chemical Formula 238>
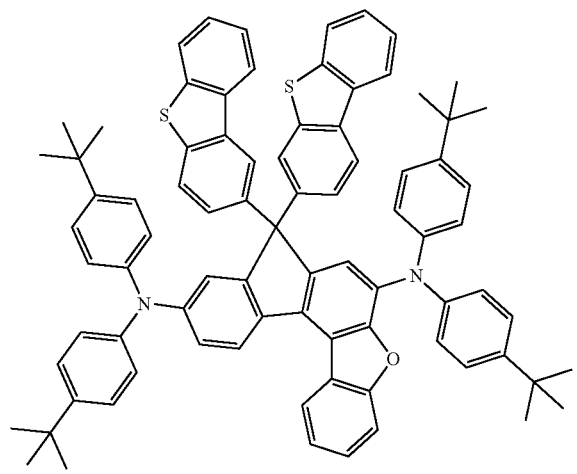
<Chemical Formula 239>
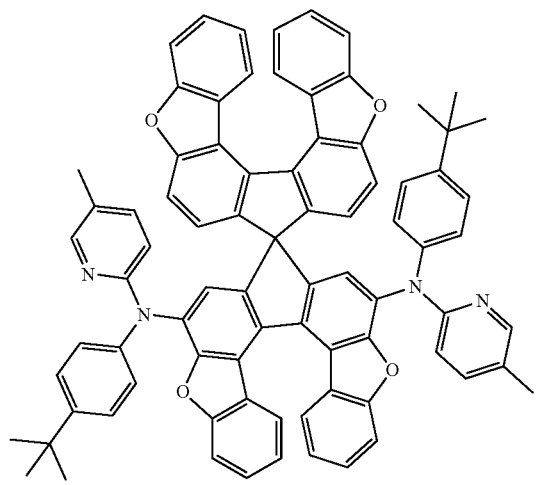

Using the amine compound represented by Chemical Formula A or B as a dopant in a light-emitting layer and the compound represented by Chemical Formula E as a material in an electron transport layer, the organic light-emitting diode according to the present invention exhibits improved light emission efficiency and longevity compared to conventional organic light-emitting diodes.

Meanwhile, the compound represented by Chemical Formula E in the present invention, as shown in the following Diagram 1, is structurally characterized by having $Ar_{11}$ at position 2, $Ar_{12}$ at position 6, $Ar_{13}$ at position 4 or 5, and A at position 4 or 5 on the pyrimidine ring.

Here, the case where $Ar_{12}$ and $Ar_{13}$ in Chemical Formula E are each simultaneously a hydrogen atom or a deuterium atom is excluded, so that at least one of $Ar_{12}$ and $Ar_{13}$ is a substituent other than a hydrogen atom or a deuterium atom:

[Chemical Formula E]

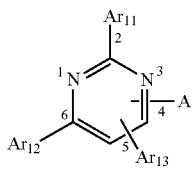

[Diagram 1. Pyrimidine Ring in Chemical Formula E]

In one embodiment, the compound represented by Chemical Formula E may be a compound represented by the following Chemical Formula E-1 or E-2:

[Chemical Formula E-1]

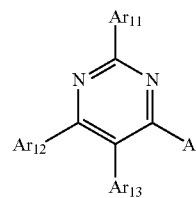

[Chemical Formula E-2]

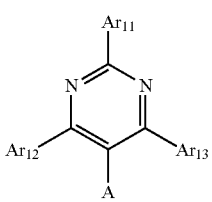

wherein $Ar_{11}$ to $Ar_{13}$ are as defined above.

Further, the Structural Formula A in Chemical Formula E of the present invention may be the following Structural Formula A-1:

[Structural Formula A-1]

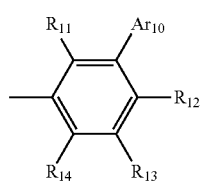

wherein $R_{11}$ to $R_{14}$ and $Ar_{10}$ are each as defined above.

In addition, the compound represented by Chemical Formula E according to the present invention may be any one selected from among the following Compounds 1 to 63:

[Compound 1]

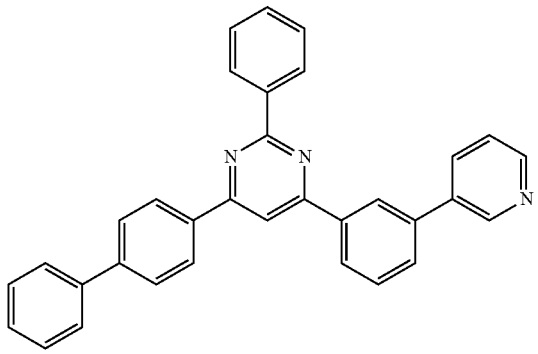

[Compound 2]

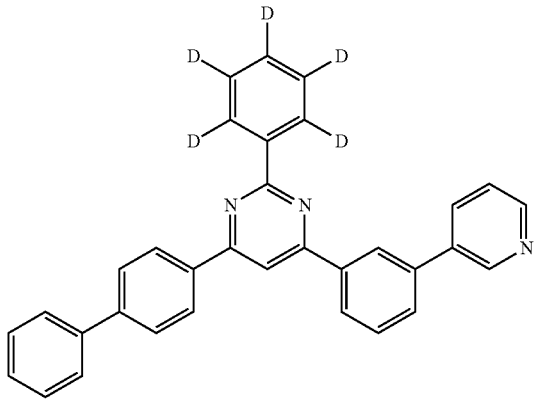

[Compound 3]

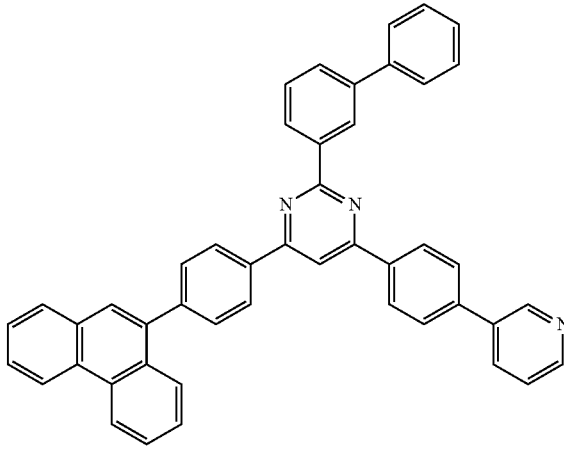

[Compound 4]

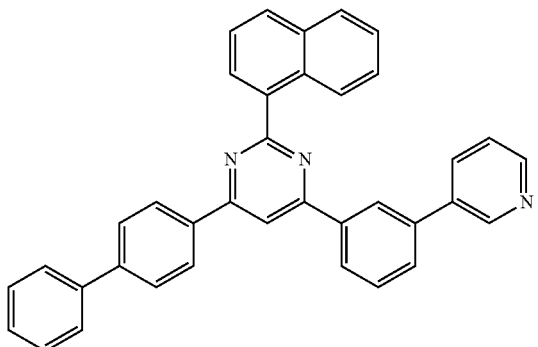

[Compound 5]
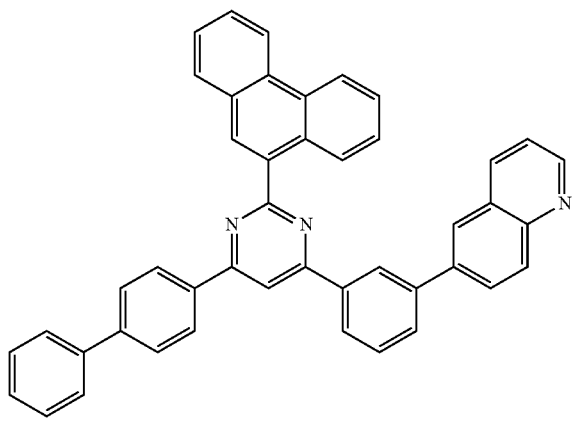
[Compound 6]
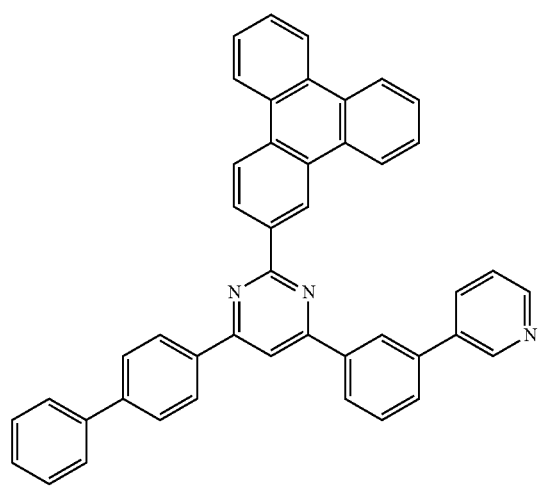
[Compound 7]
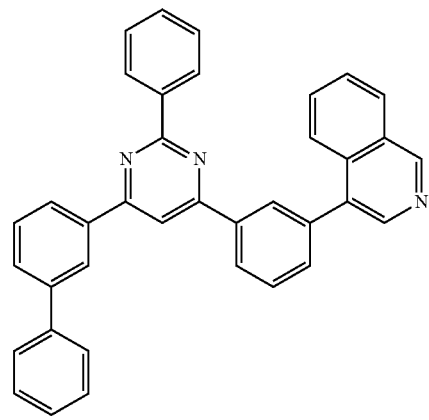
[Compound 8]
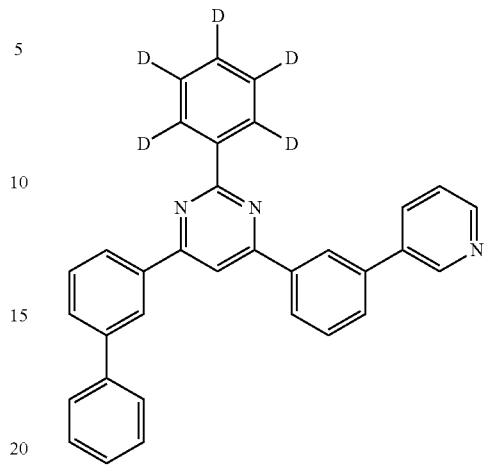
[Compound 9]
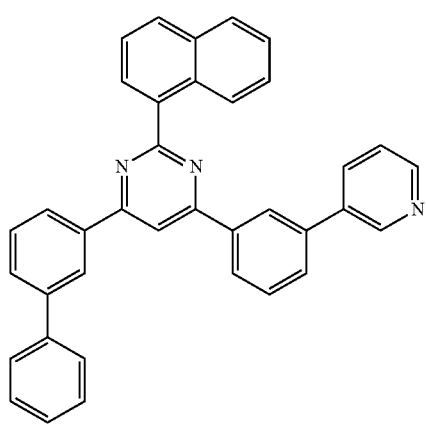
[Compound 10]
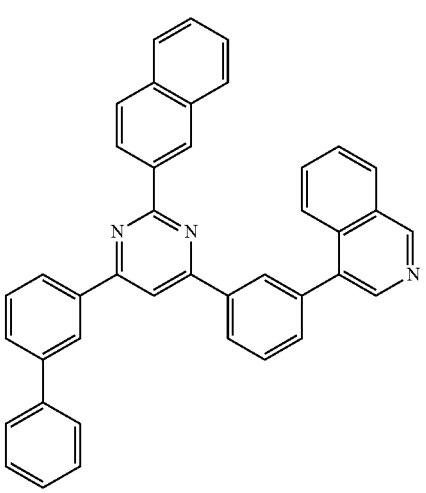

[Compound 11]
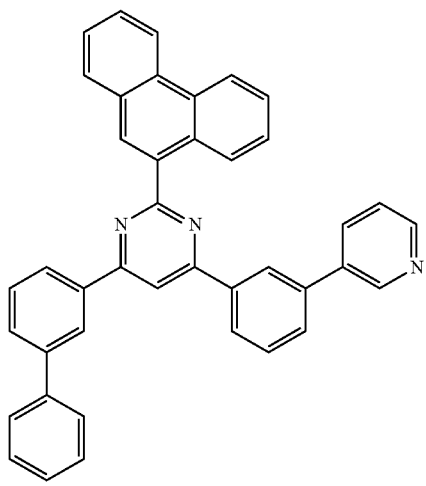
[Compound 14]
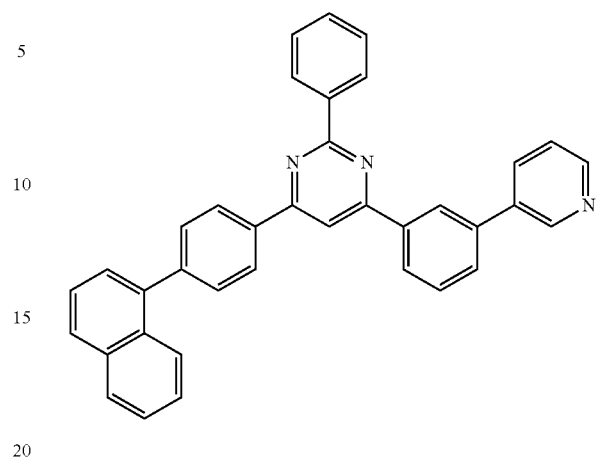
[Compound 12]
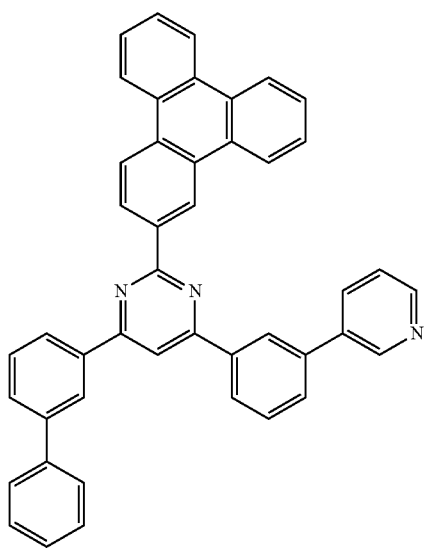
[Compound 15]
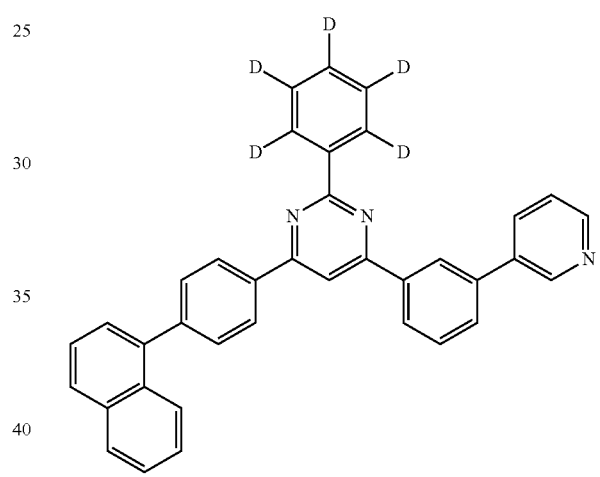
[Compound 13]
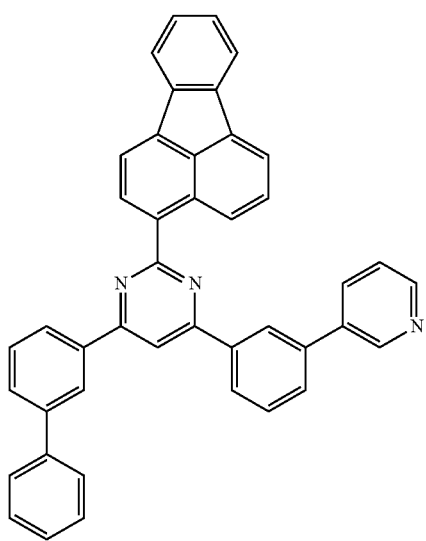
[Compound 16]
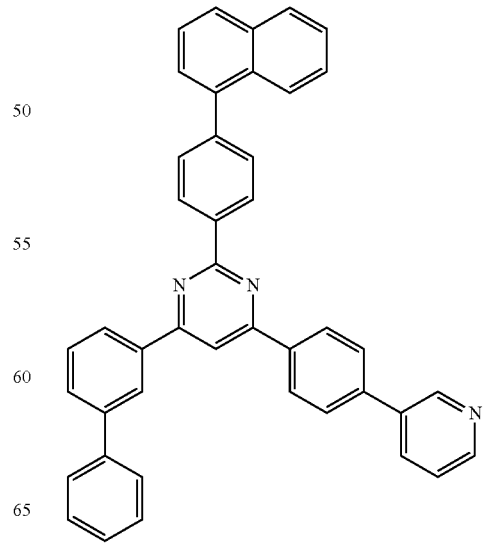

[Compound 17]
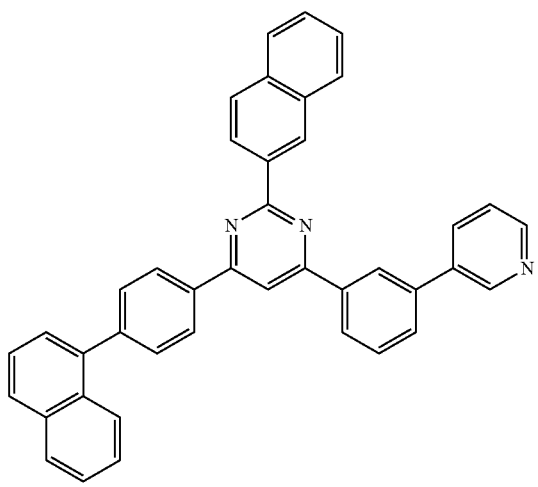
[Compound 18]
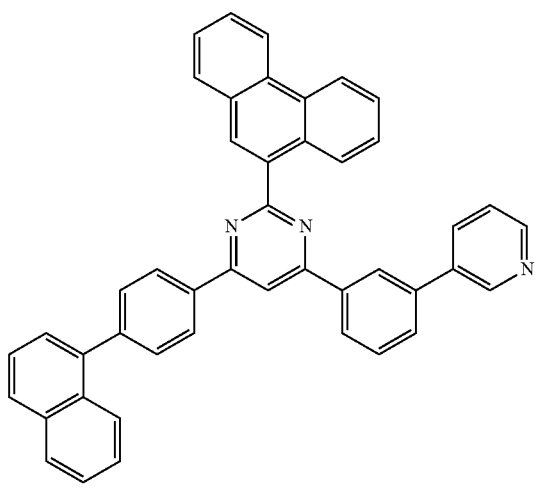
[Compound 19]
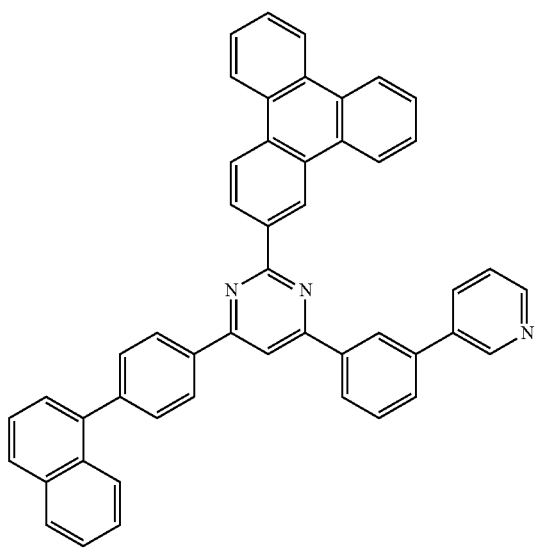
[Compound 20]
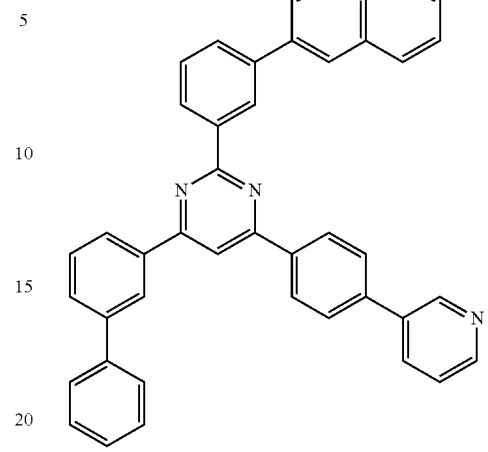
[Compound 21]
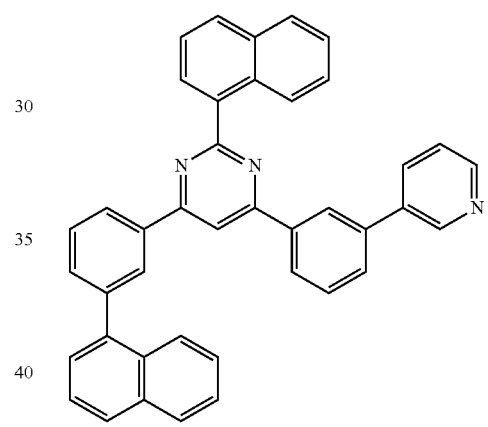
[Compound 22]
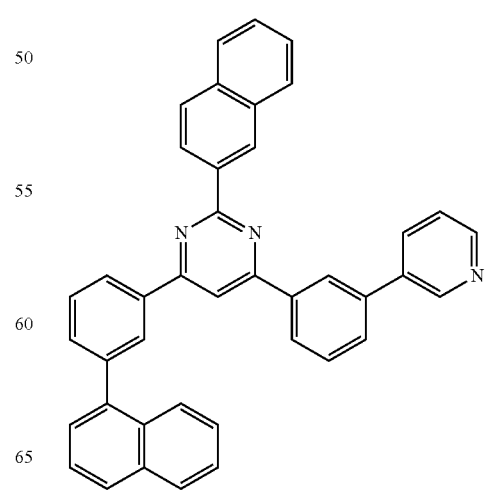

[Compound 23]
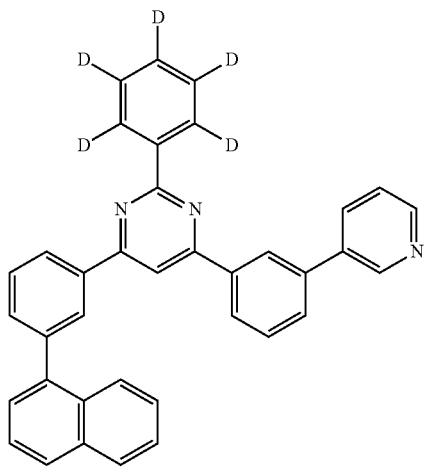
[Compound 24]
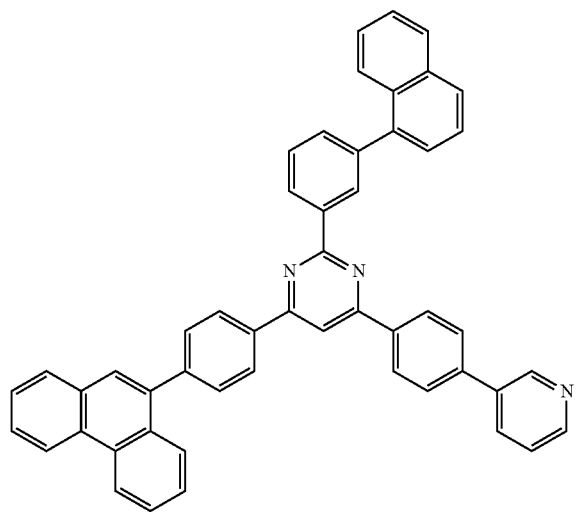
[Compound 25]
[Compound 26]
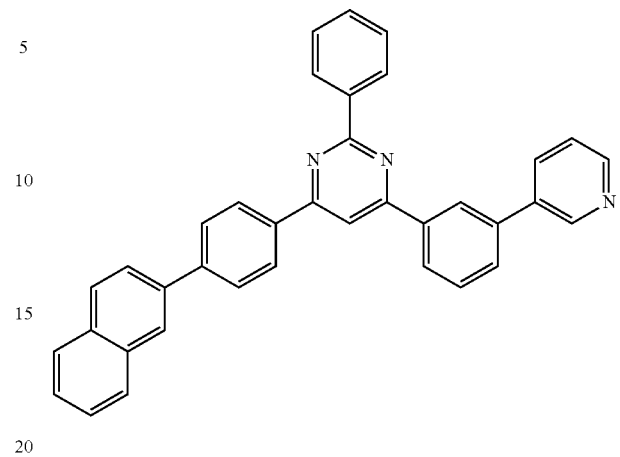
[Compound 27]
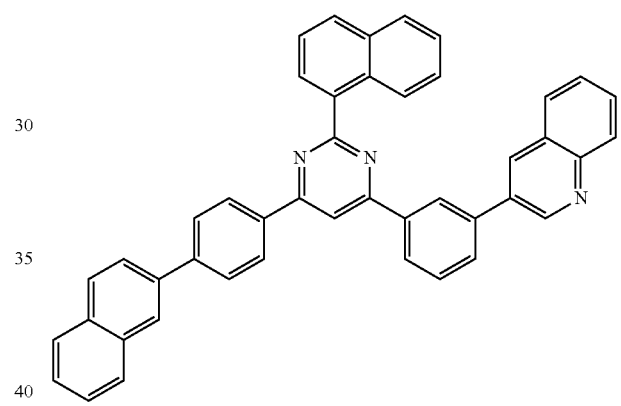
[Compound 28]
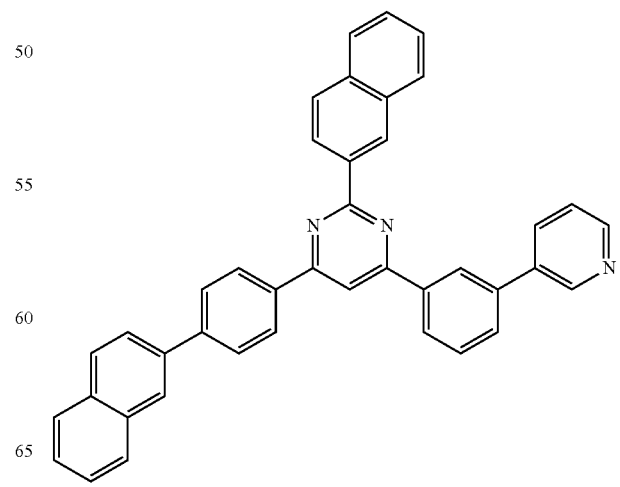
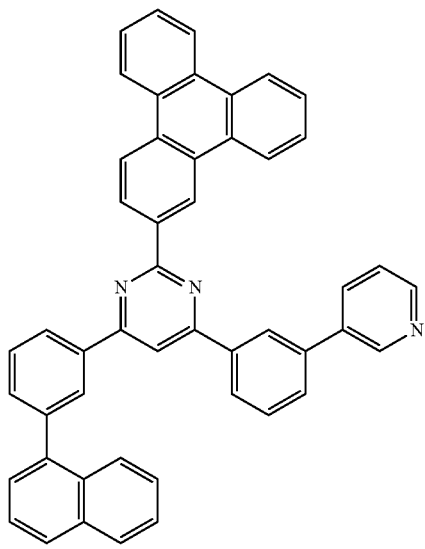

[Compound 29]
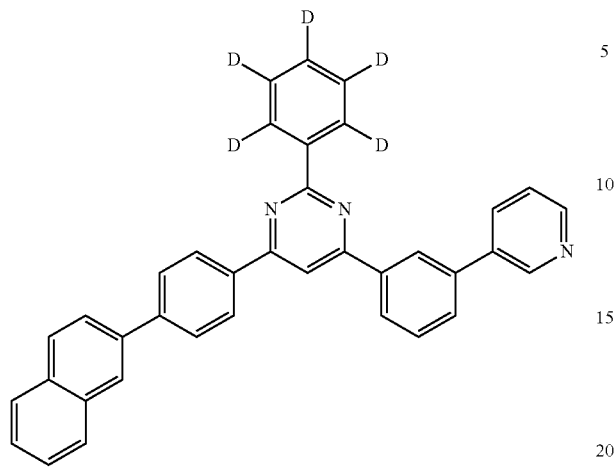
[Compound 30]
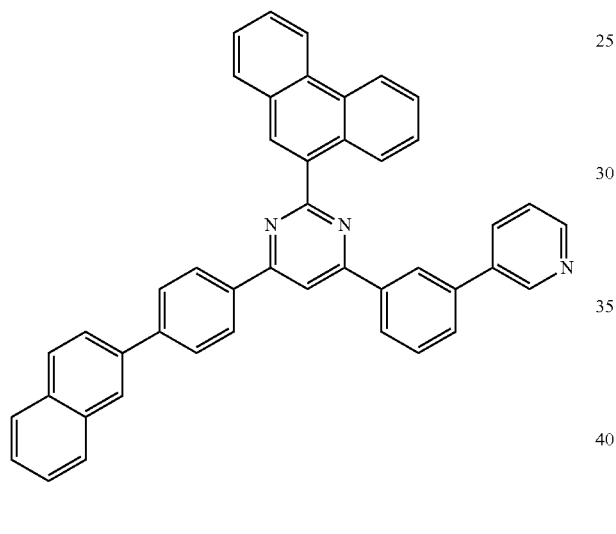
[Compound 31]
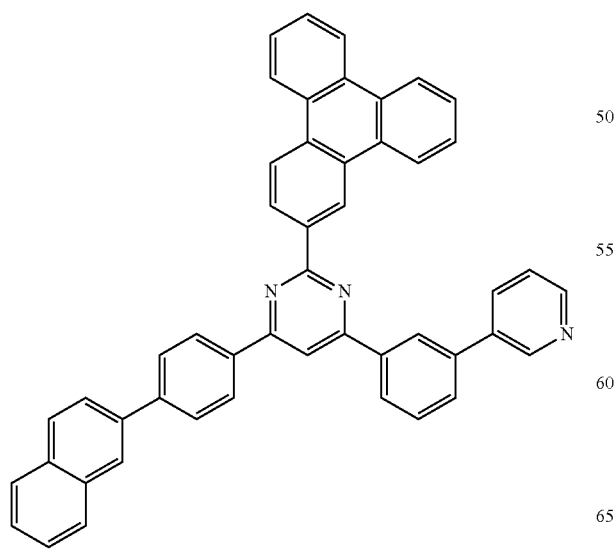
[Compound 32]
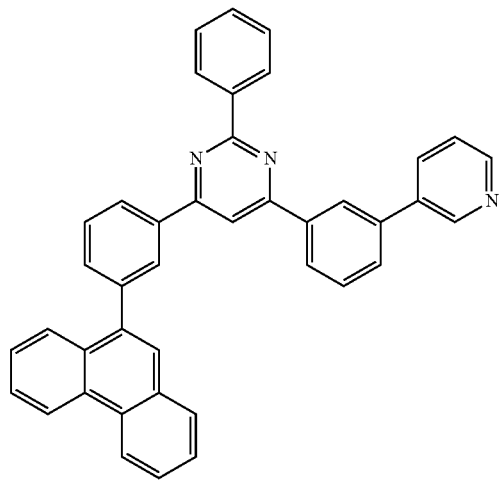
[Compound 33]
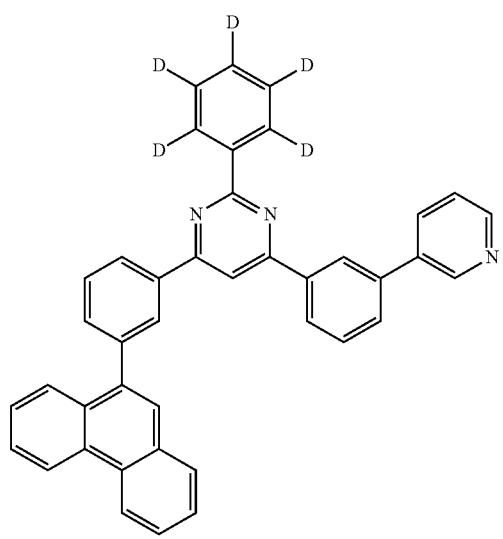
[Compound 34]
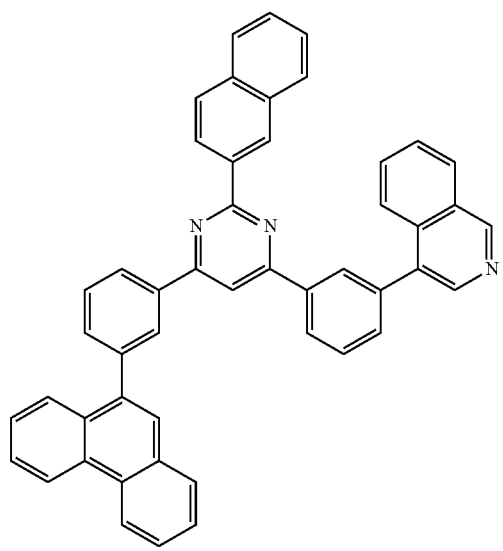

[Compound 35]
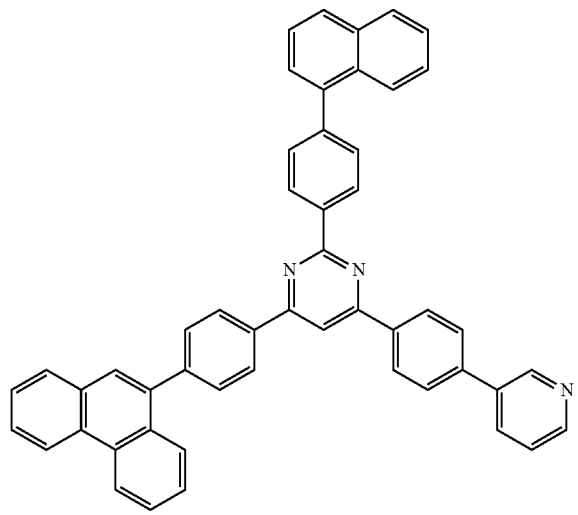
[Compound 37]
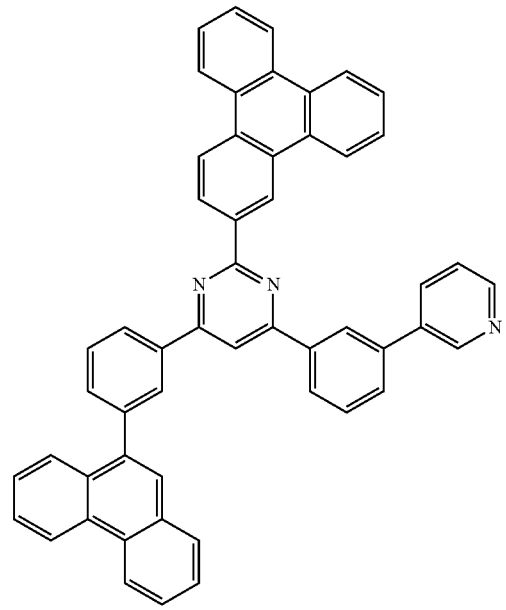
[Compound 38]
[Compound 36]
[Compound 39]
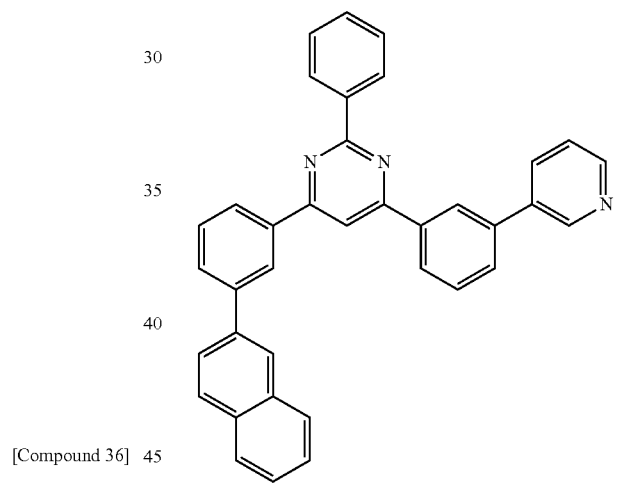
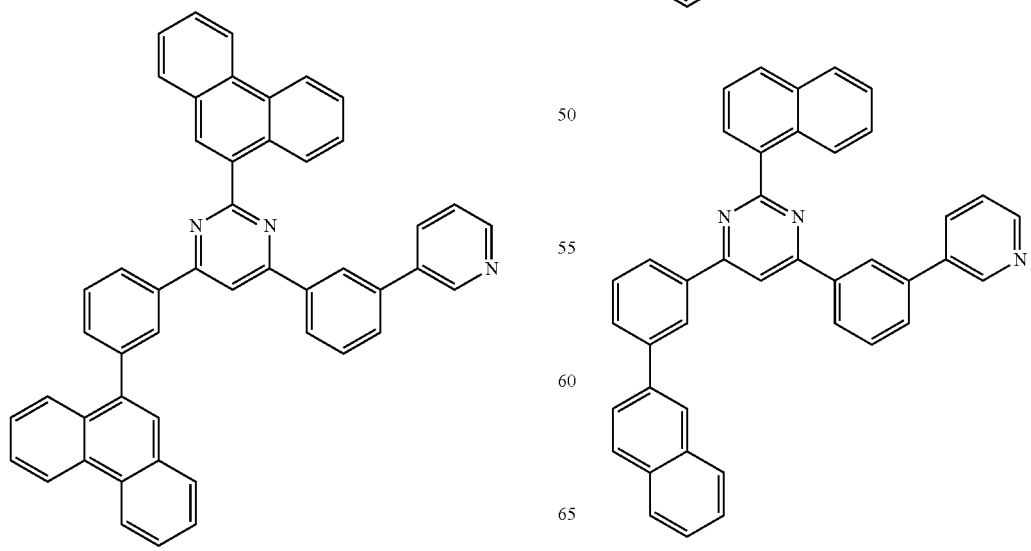

[Compound 40]
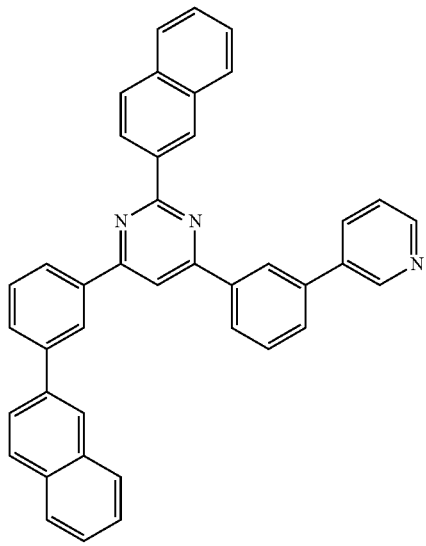
[Compound 41]
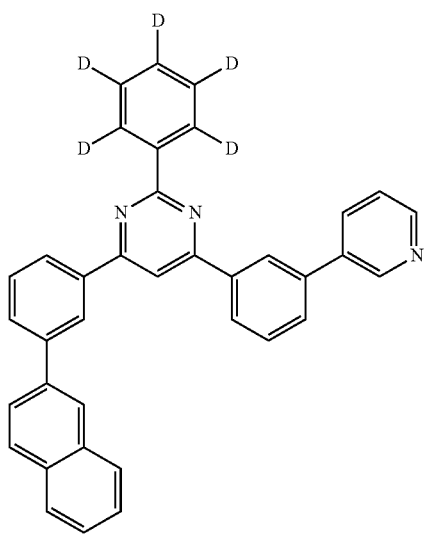
[Compound 42]
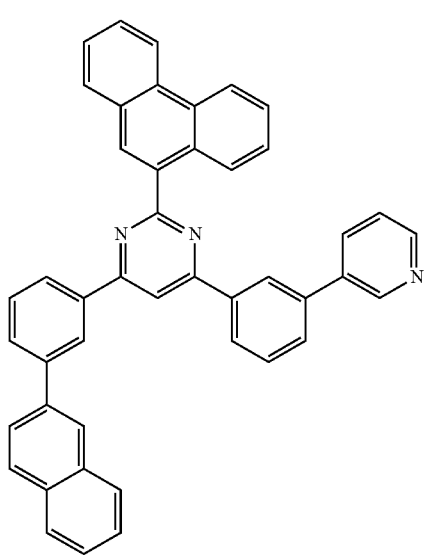
[Compound 43]
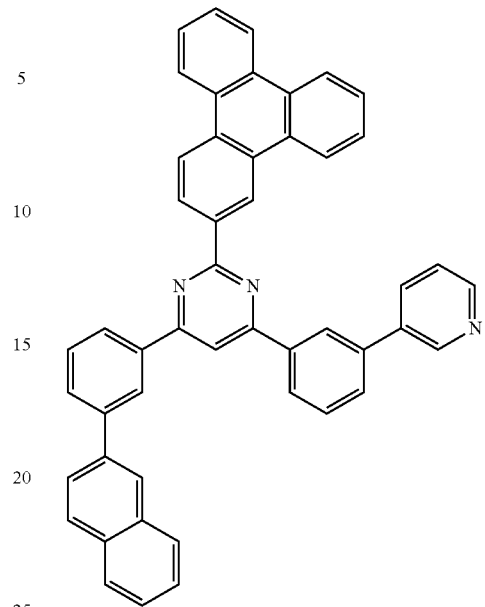
[Compound 44]
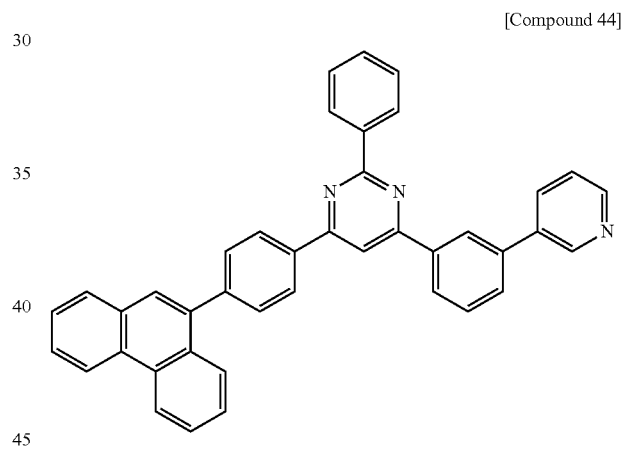
[Compound 45]
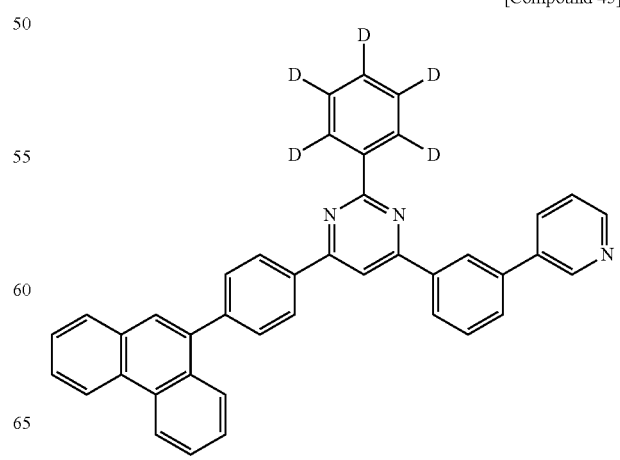

[Compound 46]
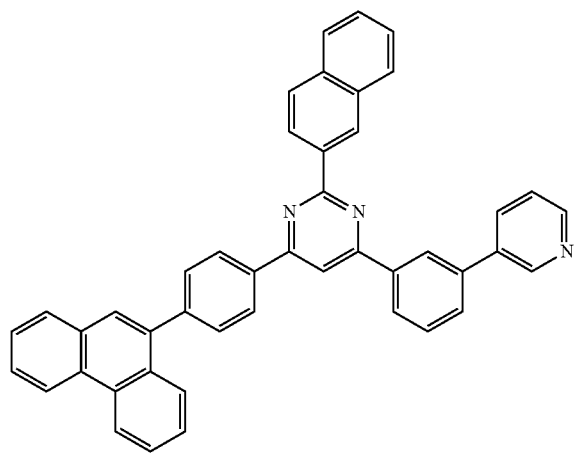
[Compound 47]
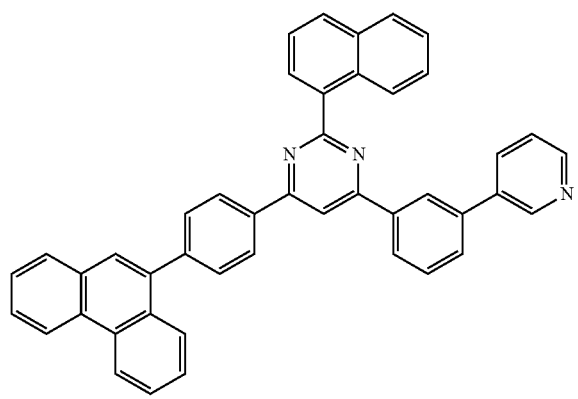
[Compound 48]
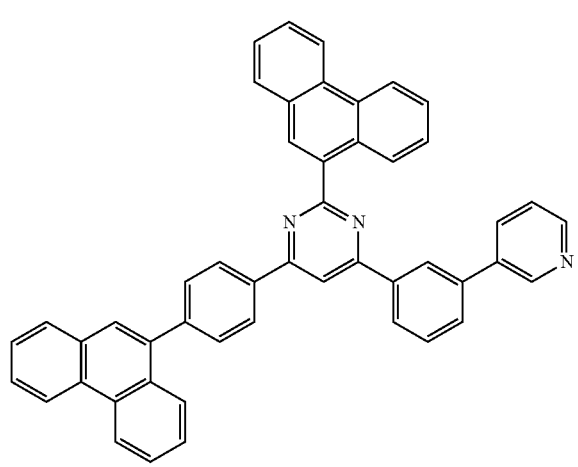
[Compound 49]
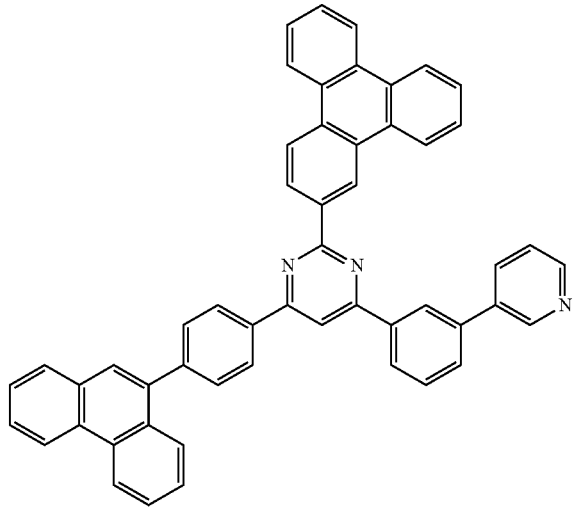
[Compound 50]
[Compound 51]
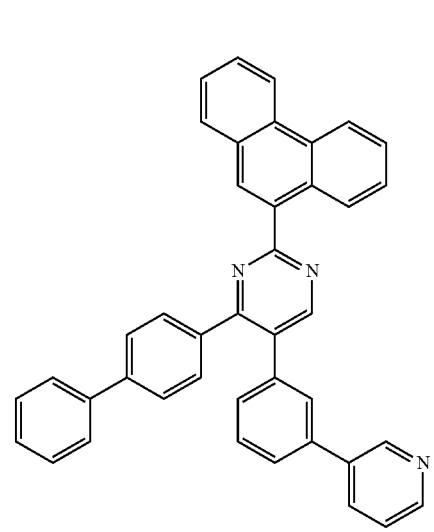

[Compound 52]
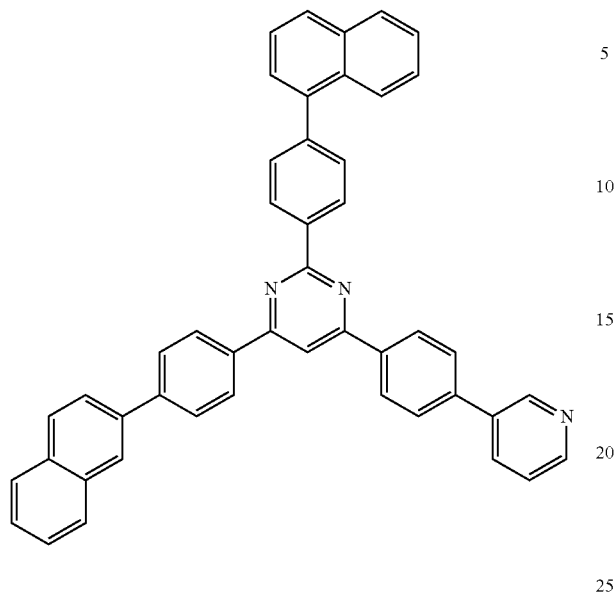
[Compound 55]
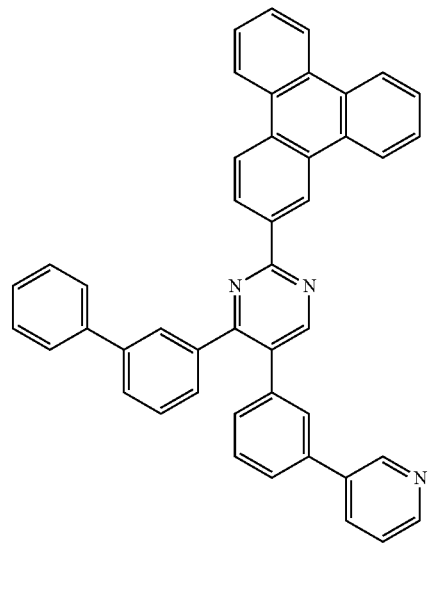
[Compound 53]
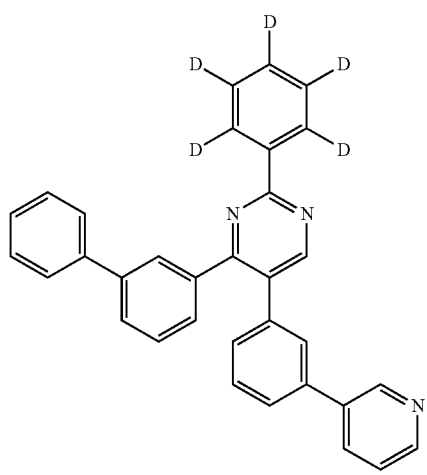
[Compound 56]
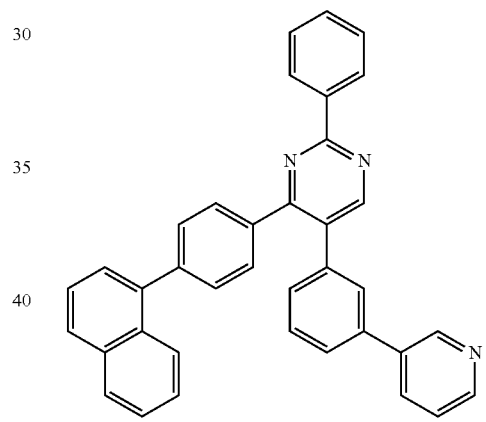
[Compound 54]
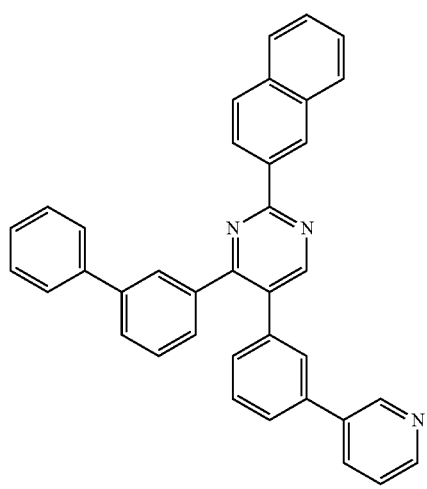
[Compound 57]
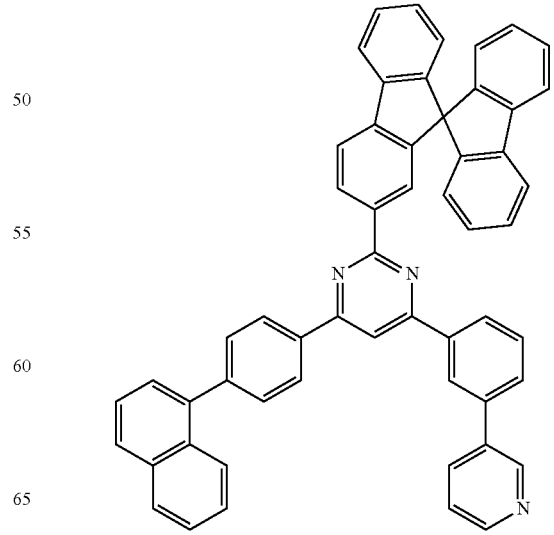

[Compound 58]
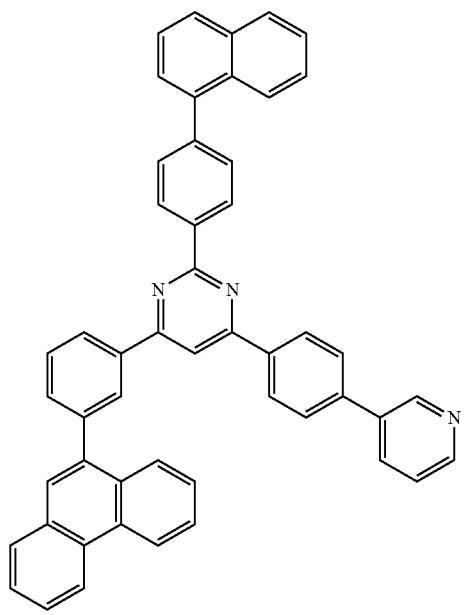
[Compound 59]
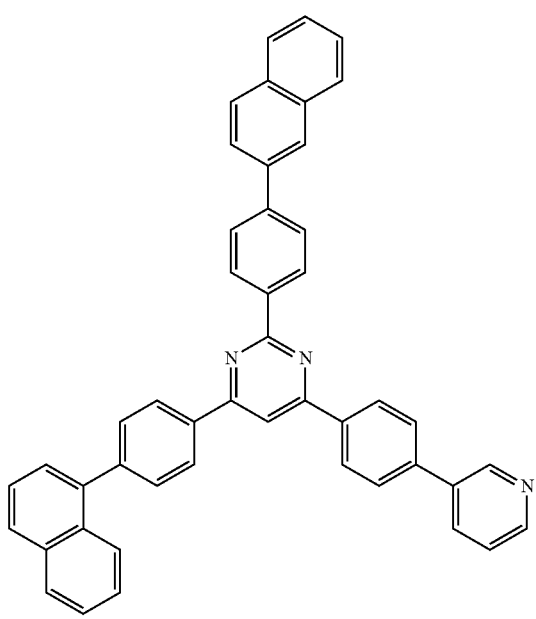
[Compound 60]
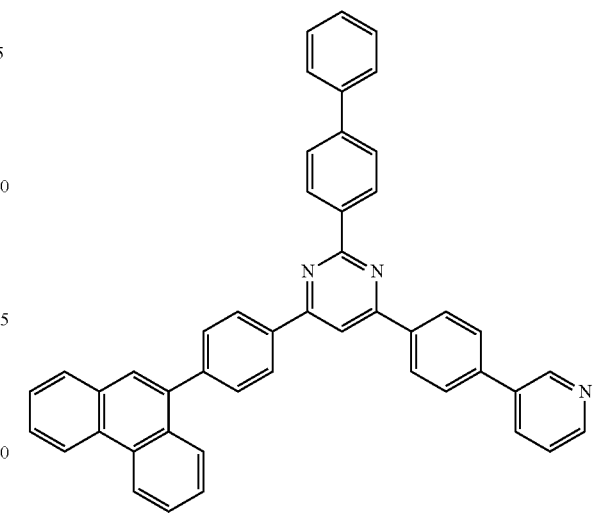
[Compound 61]
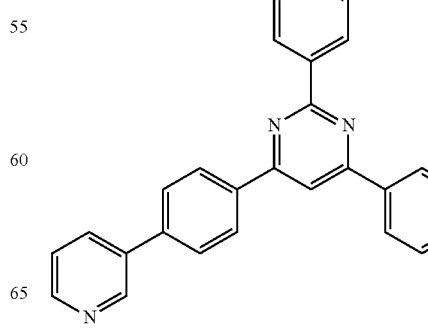

[Compound 62]

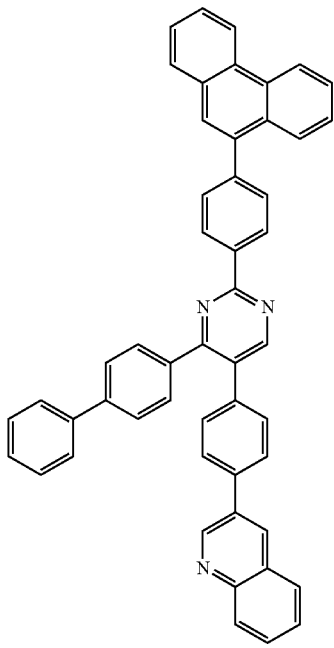

[Compound 63]

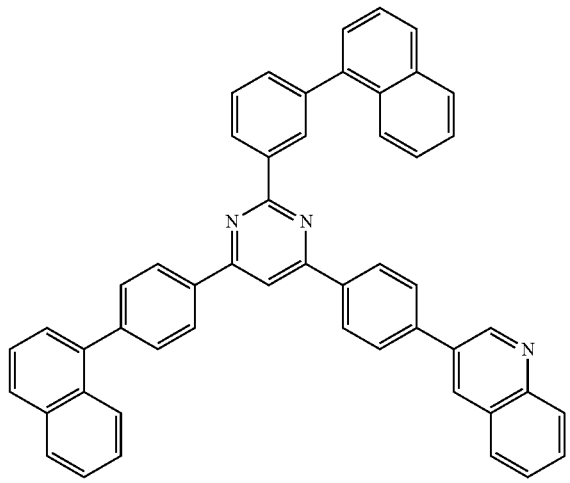

injection layer and a hole transport layer is arranged between an anode and a light-emitting layer, with the option that an electron injection layer may be formed between the electron transport layer and a cathode.

According to some particular embodiments of the present invention, the organic light-emitting diode may further comprise at least one of a hole injection layer, a hole transport layer, a functional layer capable of both hole injection and hole transport, and an electron injection layer, in addition to the light-emitting layer and the electron transport layer.

A material for use in the electron transport layer functions to stably carry the electrons injected from the electron injection electrode (cathode), and in this regard, the compound represented by Chemical Formula E according to the present invention may be used alone or in combination with an electron transport material known in the art.

Examples of the electron transport material known in the art include quinoline derivatives, particularly, tris(8-quinolinorate)aluminum (Alq3), TAZ, BAlq, beryllium bis(benzoquinolin-10-olate) (Bebq$_2$), ADN, Compound 401, Compound 402, BCP, and oxadiazole derivatives such as PBD, BMD, BND, etc., but are not limited thereto.

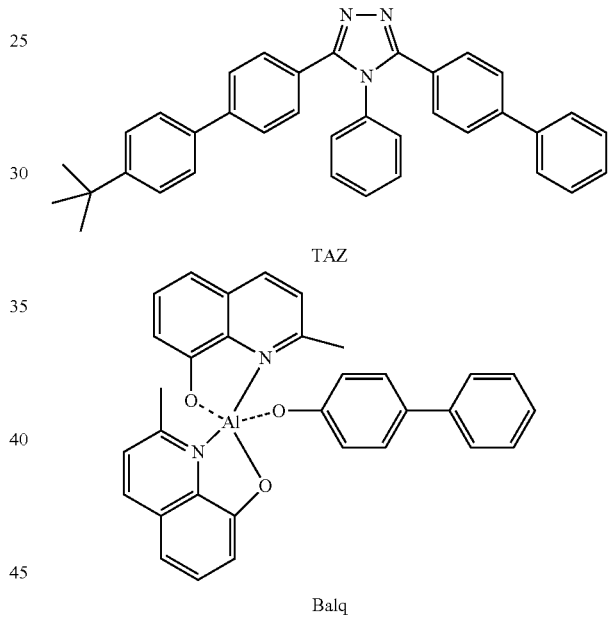

TAZ

Balq

<Compound 401>

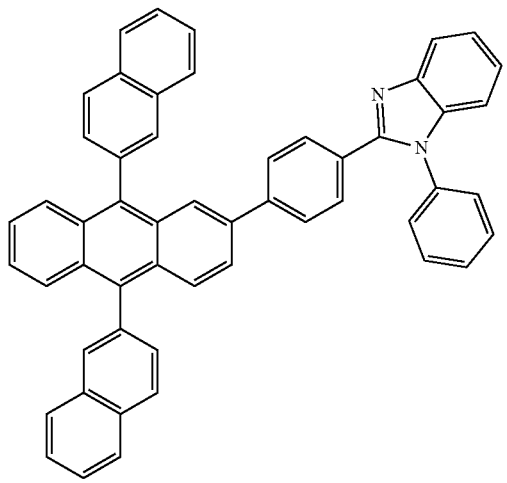

As used herein, the expression "(the organic layer) includes at least one organic compound" is to be construed to mean that (the organic layer) may include one organic compound falling within the scope of the present invention or two or more different compounds falling within the scope of the present invention.

The amount of the dopant in the light-emitting layer may range from about 0.01 to about 20 weight parts, based on 100 weight parts of the host, but is not limited thereto.

In addition to the above-mentioned dopants and hosts, the light-emitting layer may further include various hosts and dopant materials.

Selection of an appropriate amine compound represented by Chemical Formula A or B as a dopant and an appropriate compound represented by Chemical Formula E as a host in the light-emitting layer can impart high light emission efficiency and longevity to the light-emitting diode of the present invention.

In an organic light-emitting diode according to another embodiment of the present invention, at least one of a hole -continued <Compound 402>

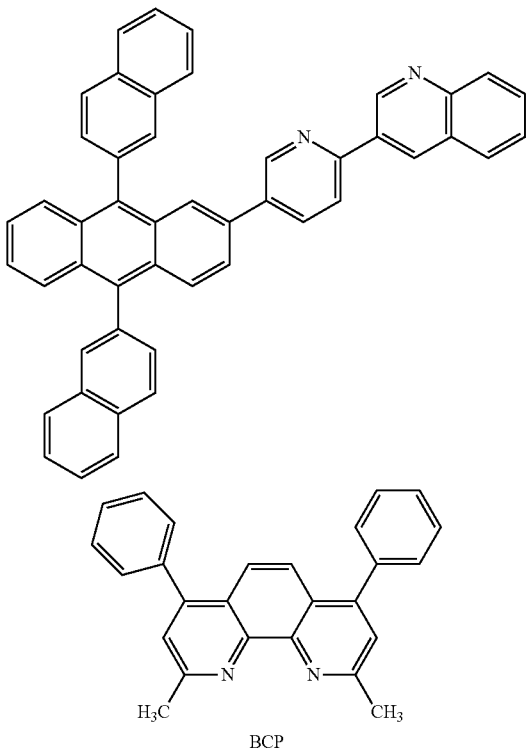

BCP

FIG. 1 is a schematic cross-sectional view of the structure of an organic light-emitting diode comprising the hole injection layer and the electron injection layer according to some embodiments of the present invention.

As shown in FIG. 1, the organic light-emitting diode comprises an anode 20, a hole transport layer 40, an organic light-emitting layer 50, an electron density control layer 55, an electron transport layer 60, and a cathode 80, and optionally a hole injection layer 30 and an electron injection layer 70. In addition, one or two intermediate layers may be further formed in the organic light-emitting diode. Here, the electron density control layer may include one or more anthracene derivatives represented by Chemical Formula F or G.

The configuration of the electron density control layer will be explained in detail later.

Reference is made to FIG. 1 with regard to the organic light-emitting diode of the present invention and the fabrication thereof.

First, a substrate 10 is coated with an anode electrode material to form an anode 20. So long as it is used in a typical organic EL device, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide (SnO2), or zinc oxide (ZnO), which are transparent and superior in terms of conductivity, may be used.

A hole injection layer material is applied on the anode electrode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imposed on the hole injection layer material, as long as it is one that is typically used in the art. For example, mention may be made of, without limitation to, 2-TNATA [4,4',4''-tris(2-naphthylphenyl-phenylamino)-triphenylamine], NPD [N,N'-di(1-naphthyl)-N,N'-diphenylbenzidine], TPD [N,N'-diphenyl-N,N'-bis(3-methylphenyl)-1,1'-biphenyl-4,4'-diamine], or DNTPD [N,N'-diphenyl-N,N'-bis-[4-(phenyl-m-tolyl-amino)-phenyl]-biphenyl-4,4'-diamine].

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenyl-benzidine (a-NPD).

Subsequently, a light-emitting layer 50 is deposited on the hole transport layer 40 by use of a vacuum deposition method or a spin-coating method, followed by forming an electron density control layer 55 on the light-emitting layer 50 by use of a vacuum deposition method or spin-coating method.

Herein, the light-emitting layer may be composed of a host and a dopant, and appropriate compounds may be selected, as explained above, for the host and the dopant in the present invention.

In some embodiments of the present invention, the light-emitting layer particularly ranges in thickness from 50 to 2,000 Å and contains the dopant in an amount of about 0.01 to 20 parts by weight based on 100 parts by weight of the host, but the content is not limited thereto.

Using a vacuum deposition method or a spin-coating method, an electron transport layer 60 may be deposited on the electron density control layer 55 of the light-emitting layer, and may then be overlaid with an electron injection layer 70. A cathode metal is deposited on the electron injection layer 70 by thermal deposition in a vacuum to form a cathode 80, thus obtaining an organic EL diode.

By way of example, the material for the electron injection layer may be CsF, NaF, LiF, NaCl, Li2O, or BaO. The conditions for depositing the electron injection layer are dependent on the compound that is employed, but may fall within the range of conditions for the formation of the hole injection layer.

The electron injection layer may range in thickness from about 1 Å to about 100 Å, and particularly from about 3 Å to about 90 Å. Given this thickness range, the electron injection layer can exhibit satisfactory electron injection properties without an actual increase in driving voltage.

The cathode may be made of a metal or metal alloy such as lithium (Li), magnesium (Mg), aluminum (Al), aluminum-lithium (Al—Li), calcium (Ca), magnesium-indium (Mg—In), and magnesium-silver (Mg—Ag). Alternatively, ITO or IZO may be employed to form a transparent cathode for a top-emitting organic light-emitting diode.

In some more particular embodiments of the present invention, the organic light-emitting diode may comprise an electron density control layer between the light-emitting layer and the electron transport layer in order to improve organic light-emitting diode characteristics.

According to one embodiment, an organic light-emitting diode of the present invention comprises a first electrode as an anode, a second electrode as a cathode, and a light-emitting layer and an electron transport layer which are sequentially arranged between the anode and the cathode, and optionally an electron density control layer between the light-emitting layer and the electron transport layer.

In this regard, the electron density control layer may include compounds represented by the following Chemical Formulas F to H:

[Chemical Formula F]

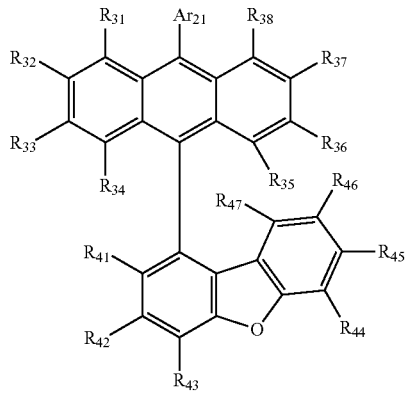

[Chemical Formula G]

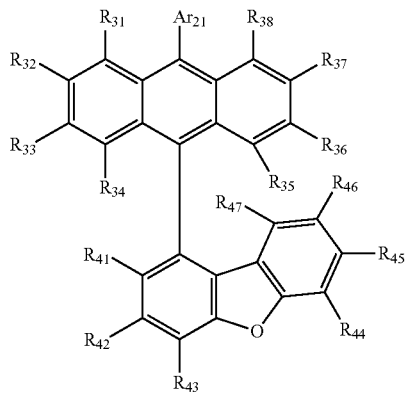

Structural Formula Q:

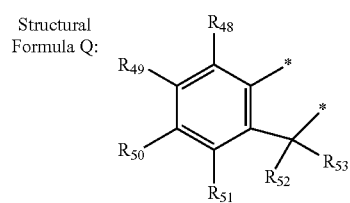

wherein, $R_{31}$ to $R_{38}$, and $R_{41}$ to $R_{53}$ may be the same or different, and are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 2 to 50 carbon atoms bearing O, N or S as a hetero atom, a cyano, a nitro, a halogen, a substituted or unsubstituted silyl of 1 to 30 carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium atom, a tellurium atom, an amide, an ether, and an ester;

$Ar_{21}$ is a substituted or unsubstituted aryl of 6 to 50 carbon atoms or a substituted or unsubstituted heteroaryl of 2 to 50 carbon atoms;

wherein adjacent two of the substituents $R_{41}$ to $R_{43}$ or adjacent two of the substituents $R_{44}$ to $R_{47}$ in Chemical Formula G are respective single bonds to form a 5-membered ring as a fused ring together with a carbon to which substituents $R_{52}$ and $R_{53}$ of Structural Formula Q are bonded, wherein a bond may be formed between the substituents $R_{52}$ and $R_{53}$ to form respective rings;

[Chemical Formula H]

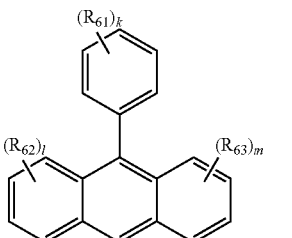

$X =$ 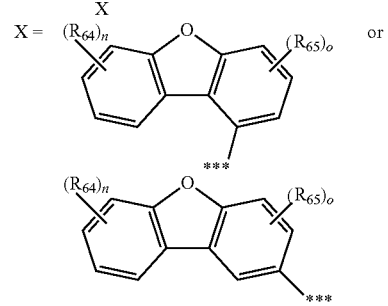

wherein, $R_{61}$ to $R_{65}$ may be the same or different, and are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted aryl thioxy of 5 to 30 carbon atoms, a substituted or unsubstituted alkylamine of 1 to 30 carbon atoms, a substituted or unsubstituted aryl amine of 5 to 30 carbon atoms, a substituted or unsubstituted aryl of 6 to 50 carbon atoms, a substituted or unsubstituted heteroaryl of 2 to 50 carbon atoms bearing O, N or S as a hetero atom, a cyano, a nitro, a halogen, a substituted or unsubstituted silyl of 1 to 30 carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium atom, a tellurium atom, an amide, an ether, and an ester, with the proviso that a hydrogen atom is positioned on each of the aromatic ring carbon atoms to which none of the substituents $R_{61}$ to $R_65$ are bonded;

the linker L is a single bond or a substituted or unsubstituted arylene of 6 to 60 carbon atoms;

j is an integer of 0 to 2;

k is an integer of 1 to 5;

l to n may be the same or different, and are each independently an integer of 1 to 4;

o is an integer of 1 to 3, with the proviso that when each of k to o is 2 or greater, corresponding R61's to R65's may be the same or different;

'***' denotes a bonding site for bonding the linker L;

wherein the term 'substituted' in the expression 'substituted or unsubstituted' used in Chemical Formulas F to H means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

In the compounds represented by Chemical Formula F or G according to the present invention, the anthracene ring moiety may have a substituted or unsubstituted arylene of 6 to 50 carbon atoms or a substituted or unsubstituted heteroarylene of 2 to 50 carbon atoms bonded at position 10 thereof and is directly connected with a dibenzofuran ring between position 9 of the anthracene ring moiety and position 1 or 2 of the dibenzofuran ring, as shown in Diagram 2, below. The anthracene derivative represented by Chemical Formula F or G can enhance the efficiency of an organic light-emitting device when used in an additional layer disposed between a light-emitting layer and an electron transport layer in the organic light-emitting device.

[Diagram 2]

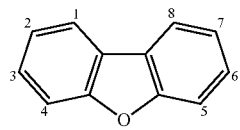

Meanwhile, as shown in Chemical Formula G, two adjacent substituents of $R_{41}$ to $R_{43}$ on the anthracene-connected ring moiety of the dibenzofuran ring correspond respectively to a single bond involved in forming a 5-membered ring as a fused ring with the carbon atom to which the substituents $R_{52}$ and $R_{53}$ on Structural Formula Q are both bonded in such a way that the dibenzofuran ring is bonded at two adjacent positions selected from among positions 2 to 8 in Diagram 2 with the radical represented by Structural Formula Q.

In one embodiment of the present invention, the substituents $R_{52}$ and $R_{53}$ in Structural Formula Q may be the same or different, and may each be independently a substituted or unsubstituted aryl of 6 to 24 carbon atoms.

Further, the substituent $Ar_{21}$ may be a substituted or unsubstituted aryl of 6 to 50 carbon atoms, and preferably a substituted or unsubstituted aryl of 6 to 18 carbon atoms.

In addition, the substituents $R_{52}$ and $R_{53}$ may be connected to each other to form a ring. By way of example, when the substituents $R_{52}$ and $R_{53}$ are connected to each other, the compound represented by Chemical Formula G may include a substituted or unsubstituted spirobisfluorene ring as illustrated in Diagram 3, below.

[Diagram 3]

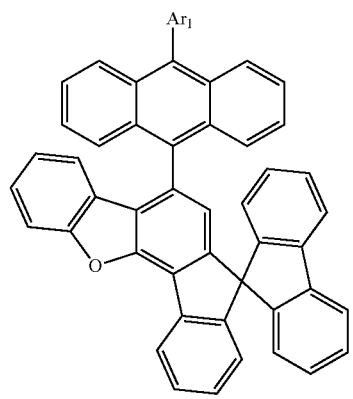

Concrete examples of the anthracene derivatives represented by Chemical Formulas F to H according to the present invention include, but are not limited to, the compounds represented by the following Compounds 201 to 338:

<Compound 201>

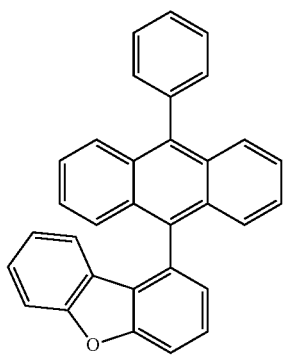

<Compound 202>

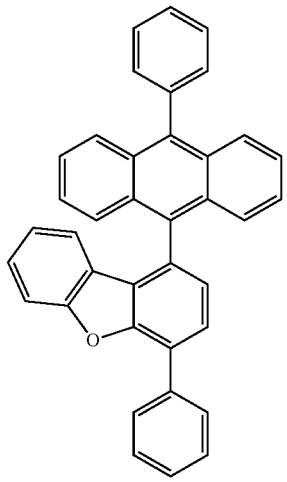

<Compound 203>
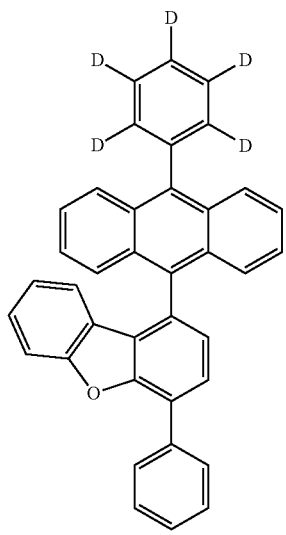
<Compound 204>
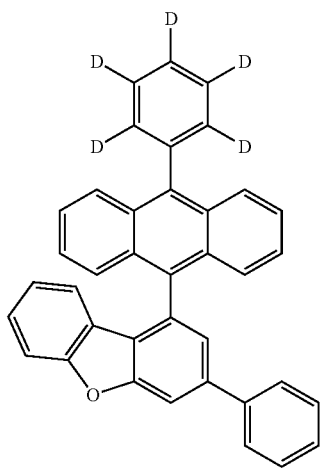
<Compound 205>
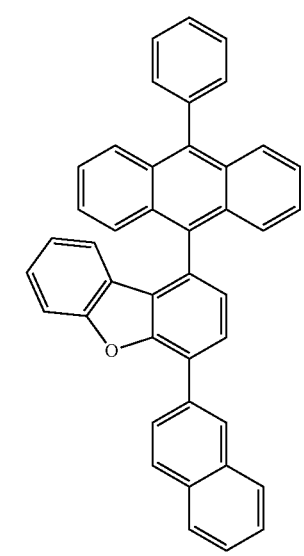
<Compound 206>
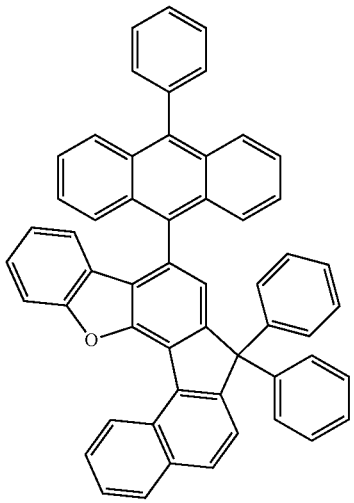
<Compound 207>
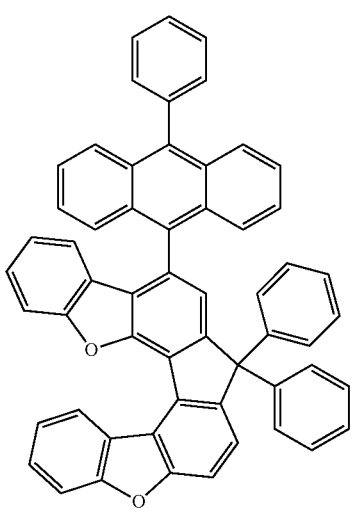
<Compound 208>
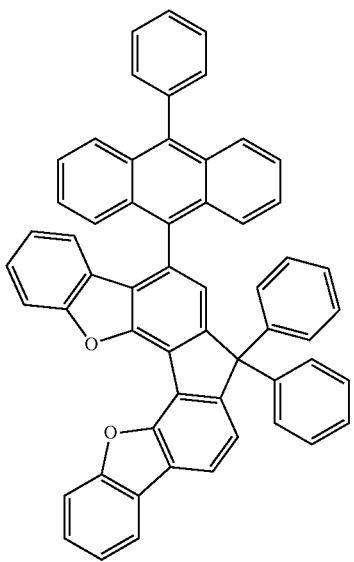

<Compound 209>
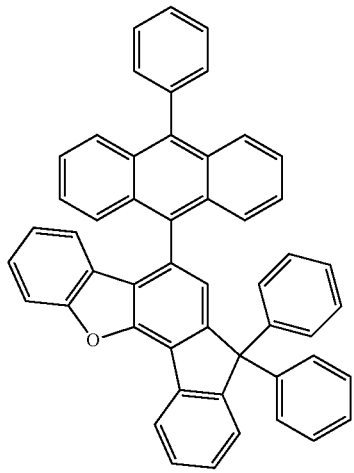
<Compound 210>
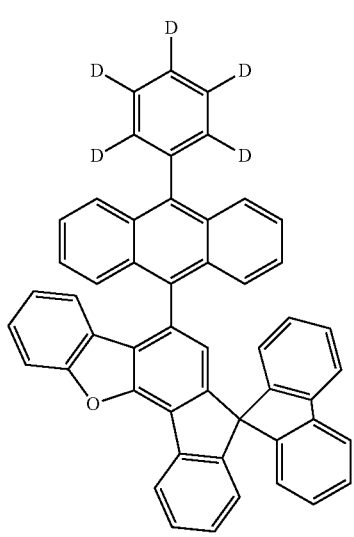
<Compound 211>
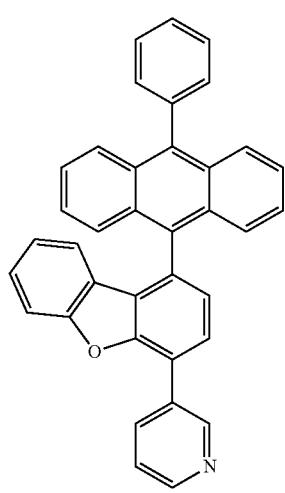
<Compound 212>
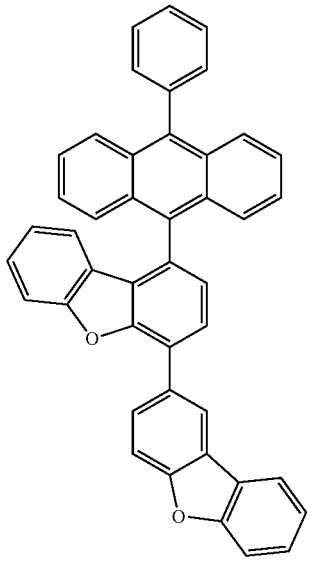
<Compound 213>
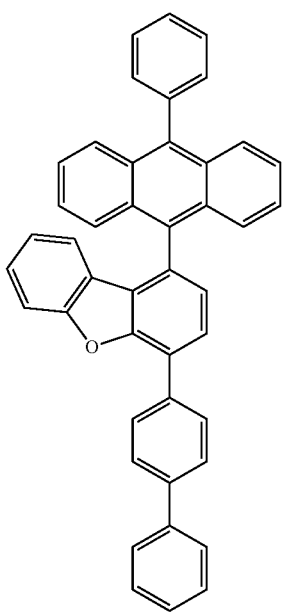

<Compound 214>
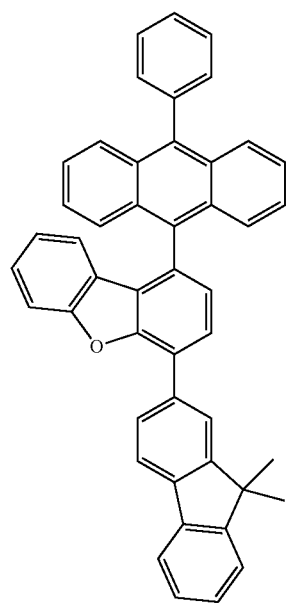
<Compound 215>
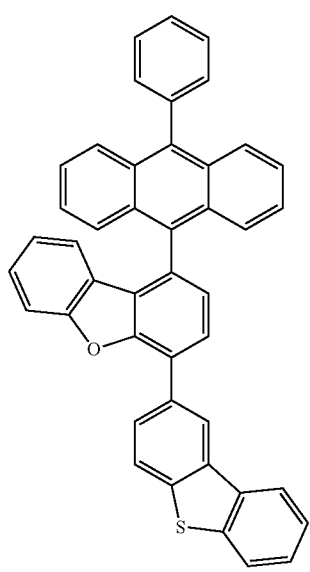
<Compound 216>
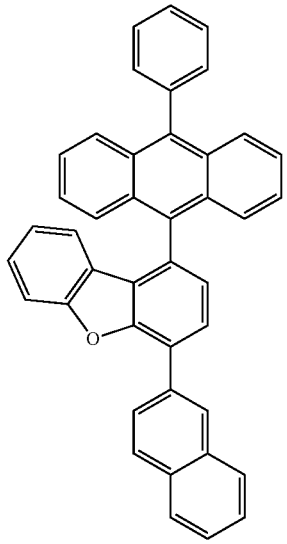
<Compound 217>
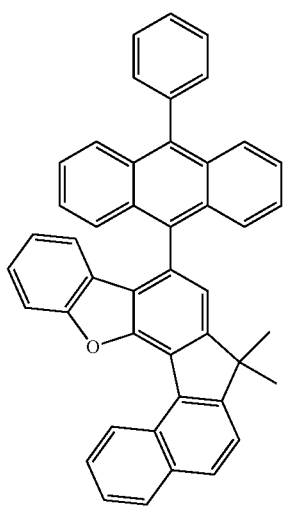
<Compound 218>
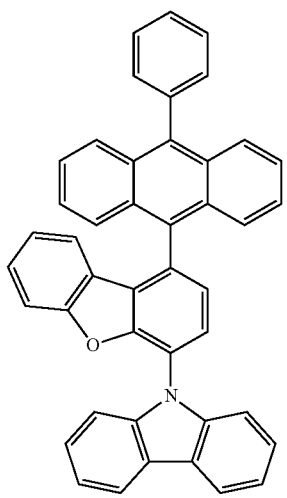

<Compound 219>
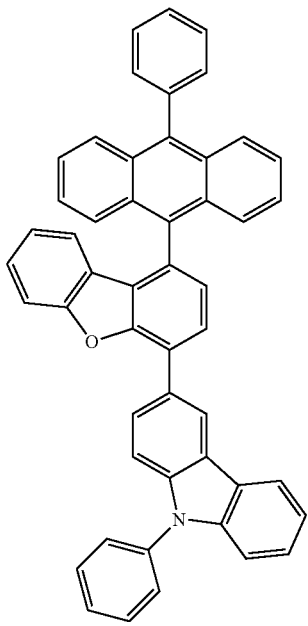
<Compound 220>
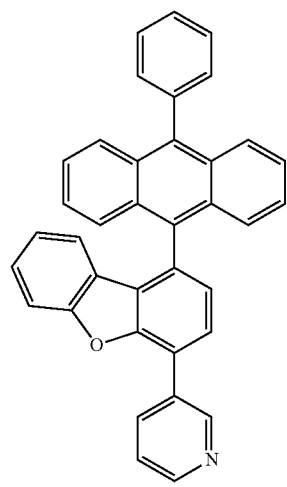
<Compound 221>
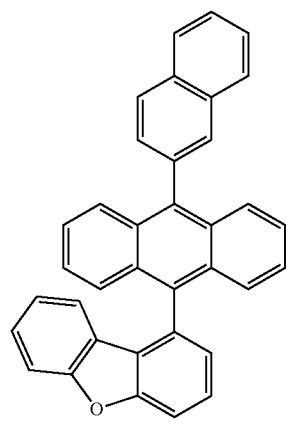
<Compound 222>
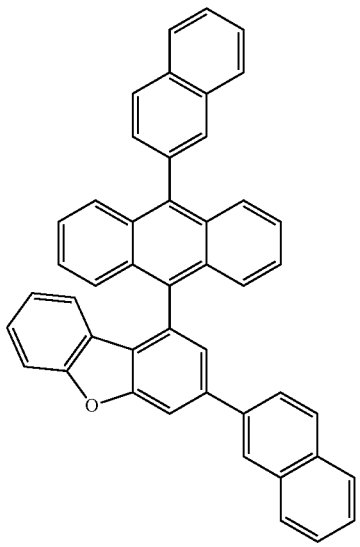
<Compound 223>
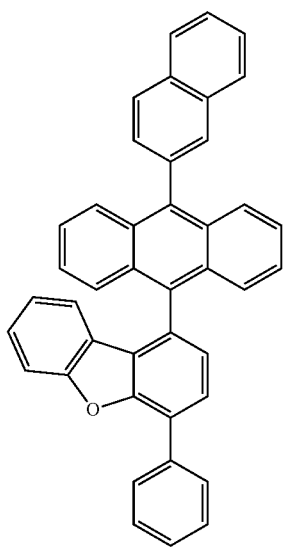
<Compound 224>
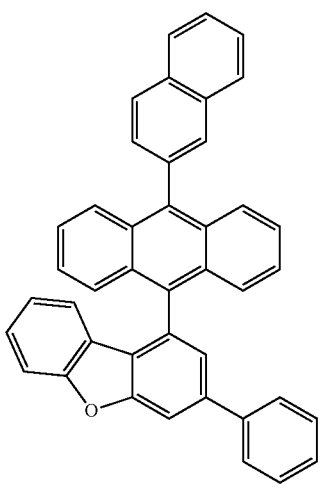

<Compound 225>
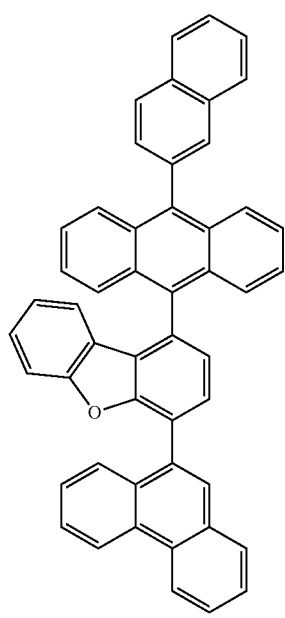
<Compound 227>
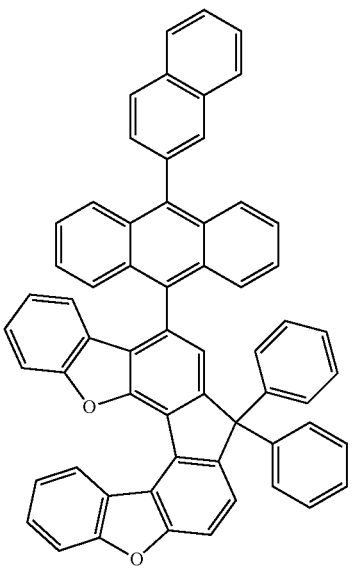
<Compound 226>
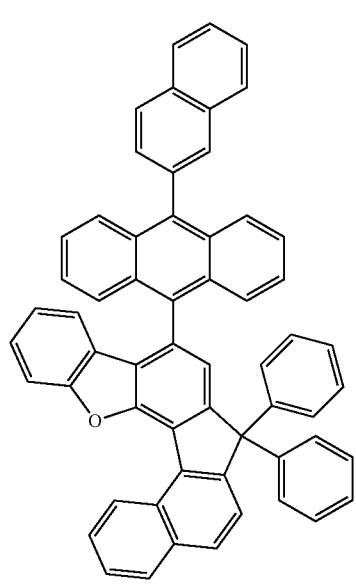
<Compound 228>
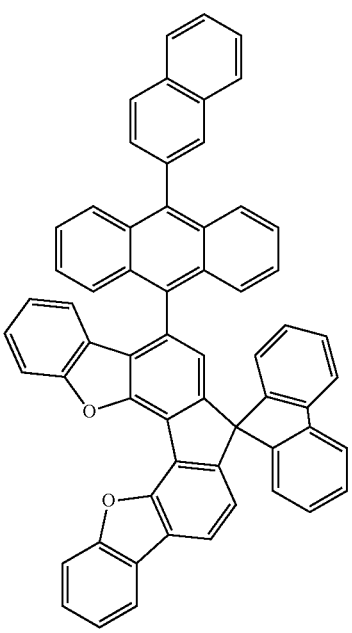

<Compound 229>
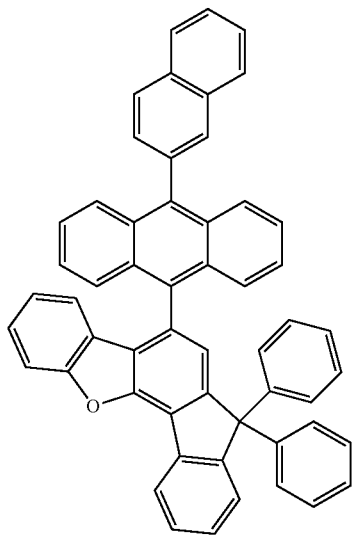
<Compound 230>
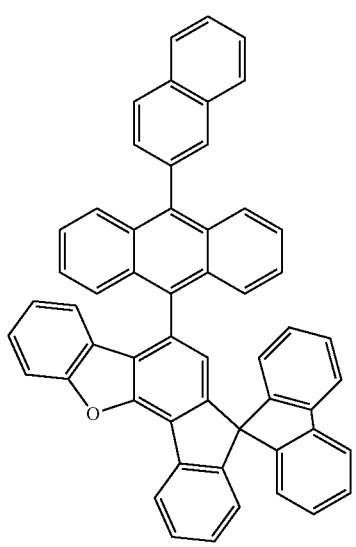
<Compound 231>
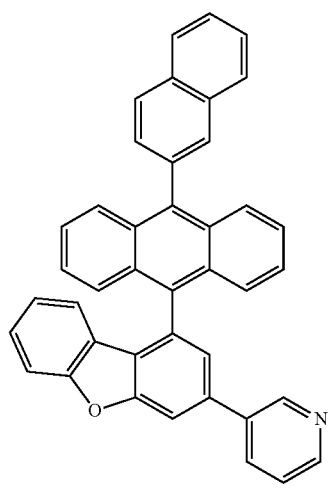
<Compound 232>
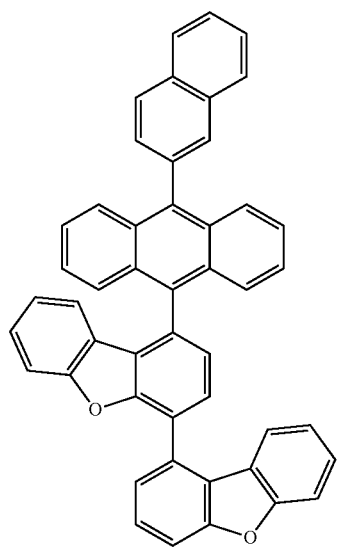
<Compound 233>
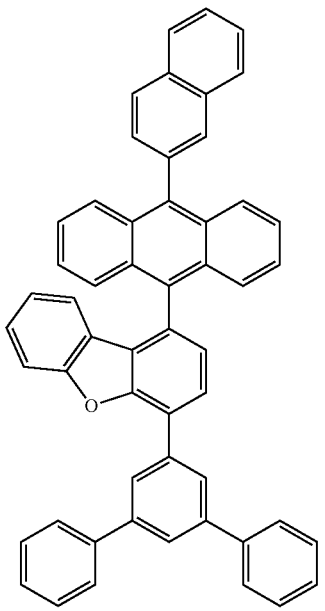

<Compound 234>
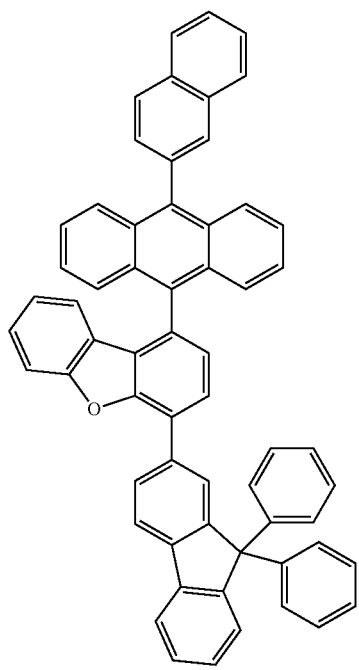
<Compound 235>
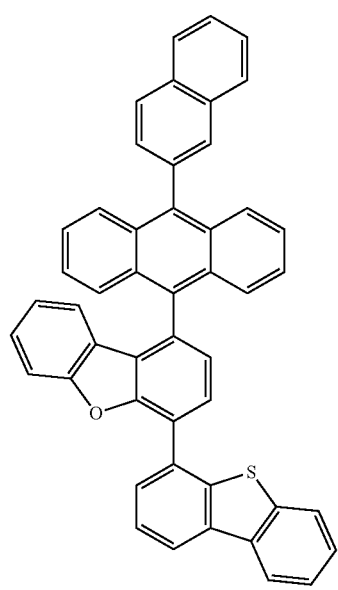
<Compound 236>
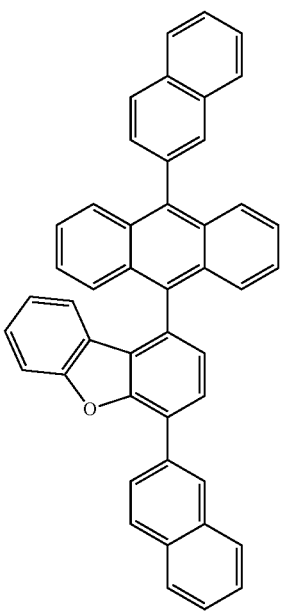
<Compound 237>
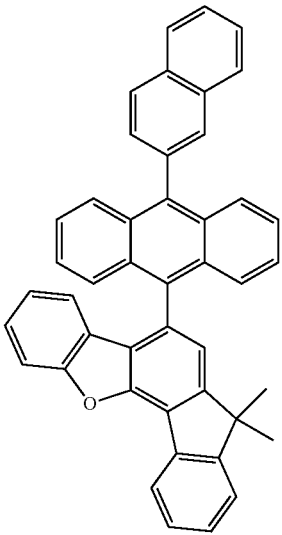

<Compound 238>
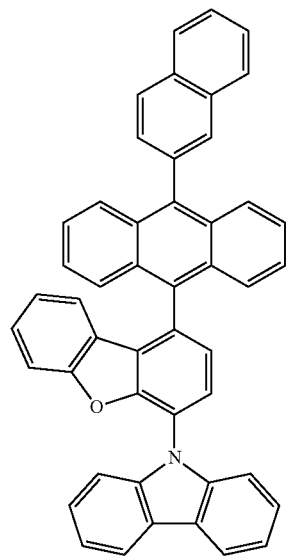
<Compound 239>
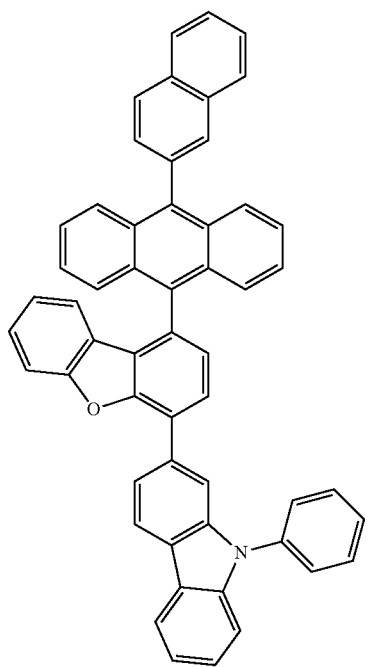
<Compound 240>
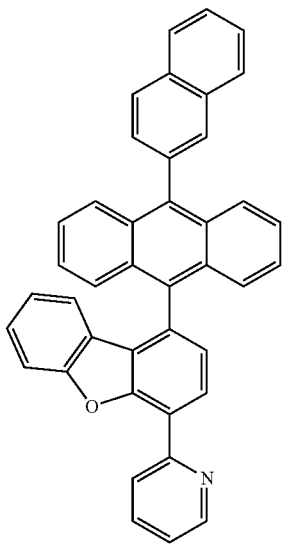
<Compound 241>
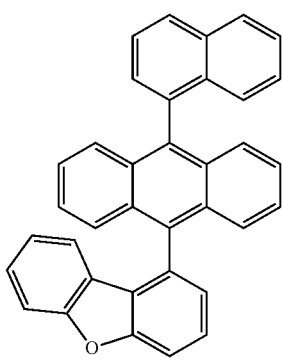
<Compound 242>
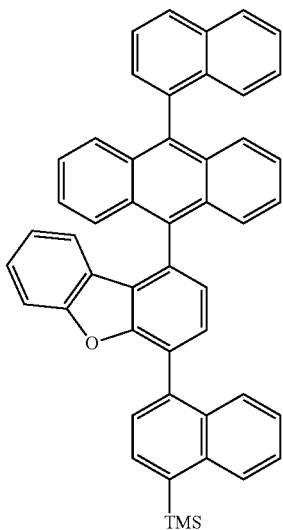

<Compound 243>
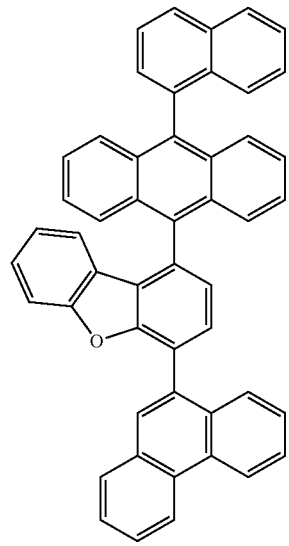
<Compound 246>
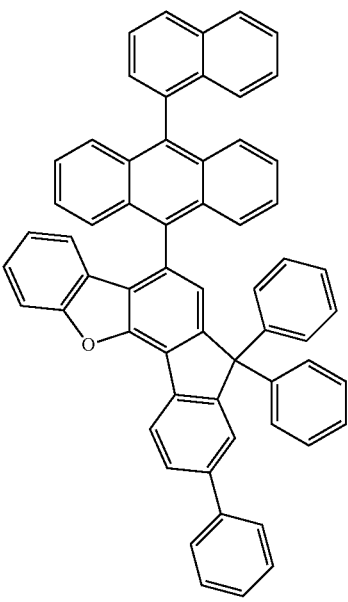
<Compound 244>
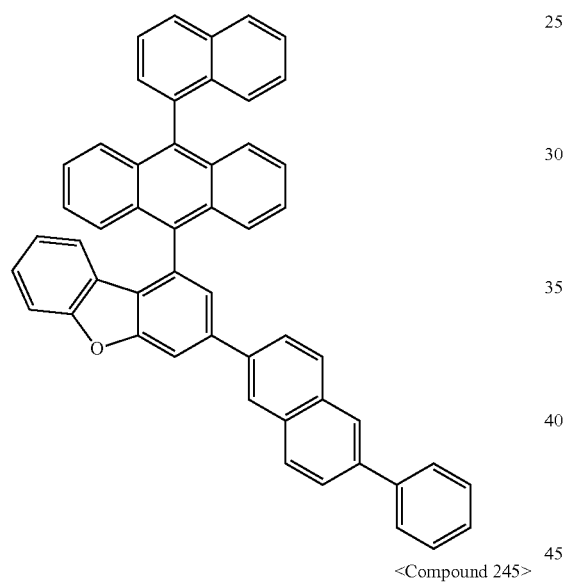
<Compound 245>
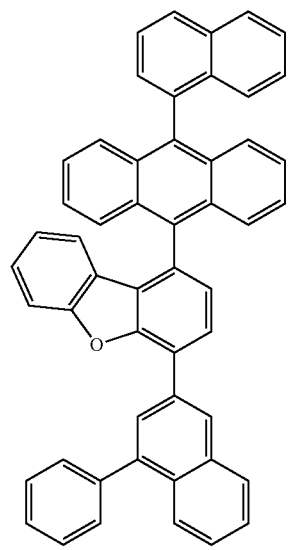
<Compound 247>
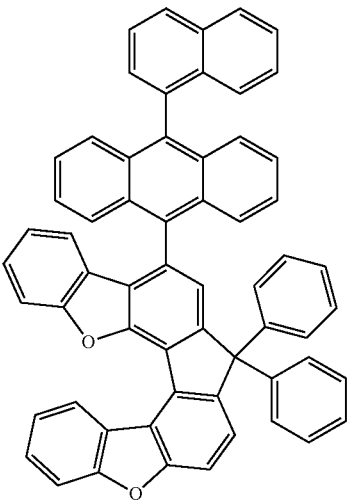

<Compound 248>
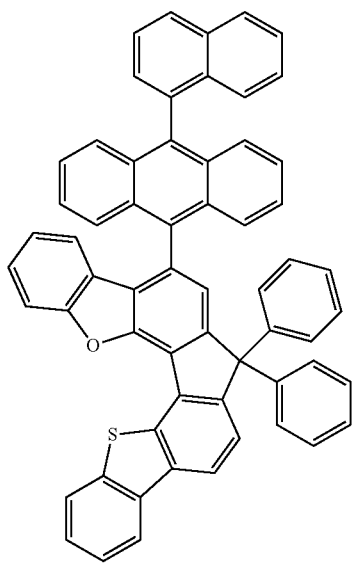
<Compound 249>
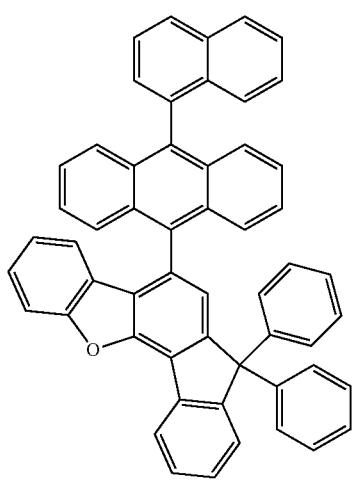
<Compound 250>
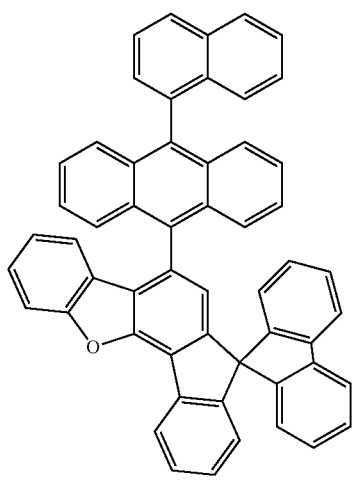
<Compound 251>
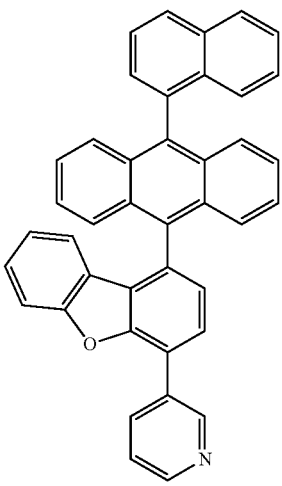
<Compound 252>
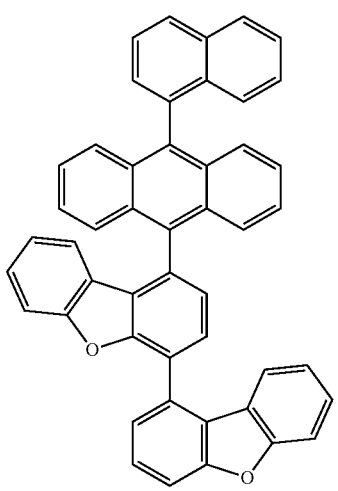
<Compound 253>
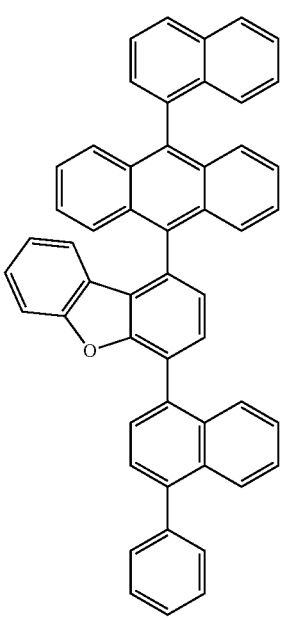

<Compound 254>
<Compound 255>
<Compound 256>
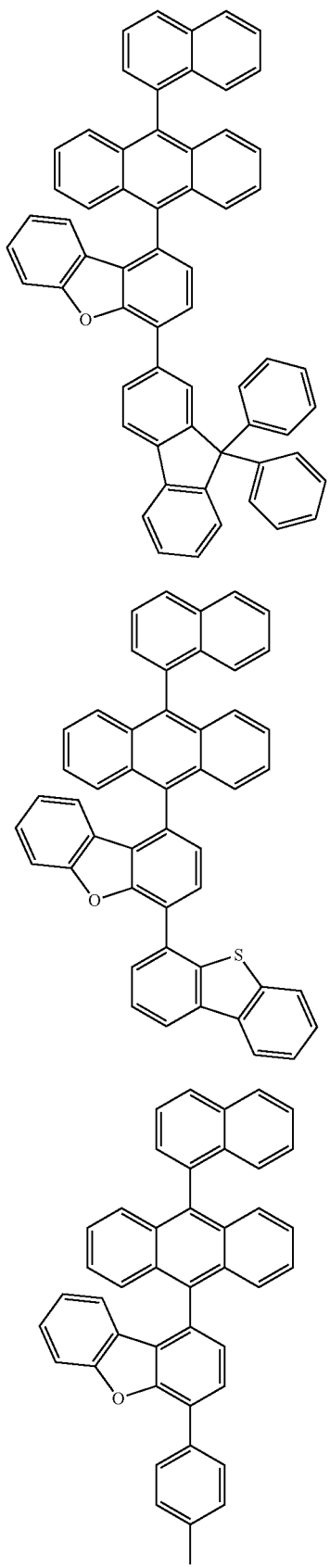
<Compound 257>
<Compound 258>
<Compound 259>
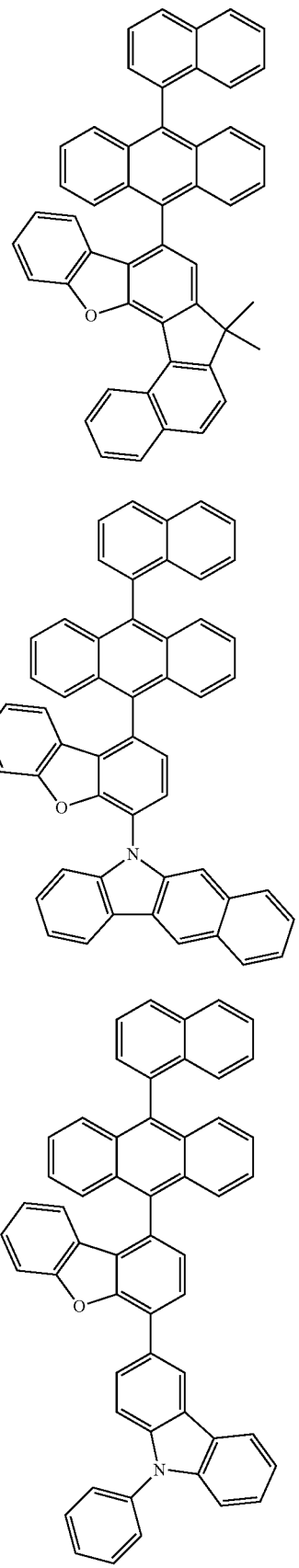

147
-continued
<Compound 260>
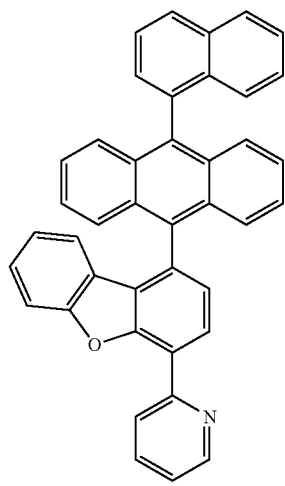
<Compound 261>
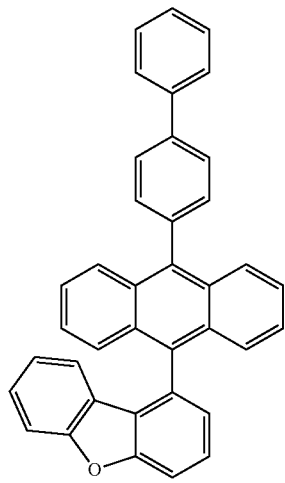
<Compound 262>
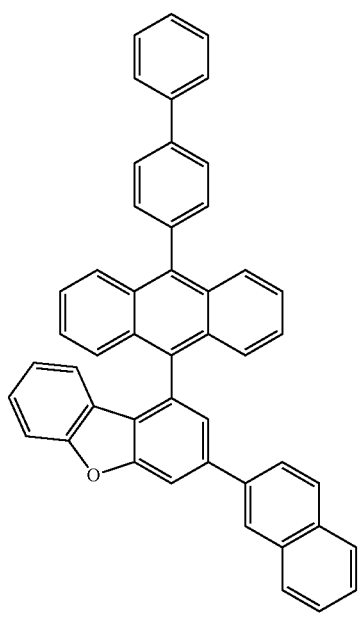
148
-continued
<Compound 263>
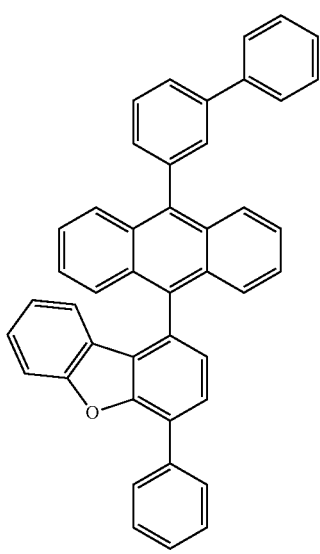
<Compound 264>
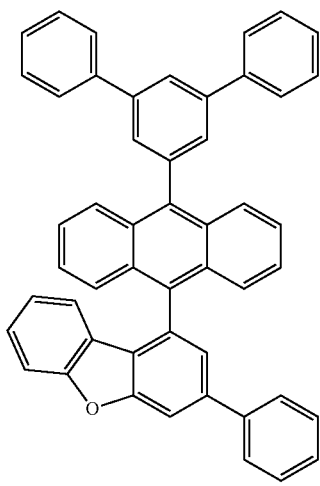
<Compound 265>
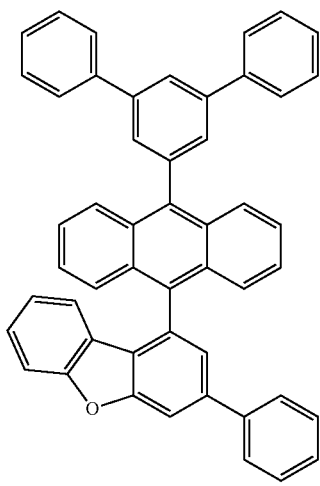

<Compound 266>
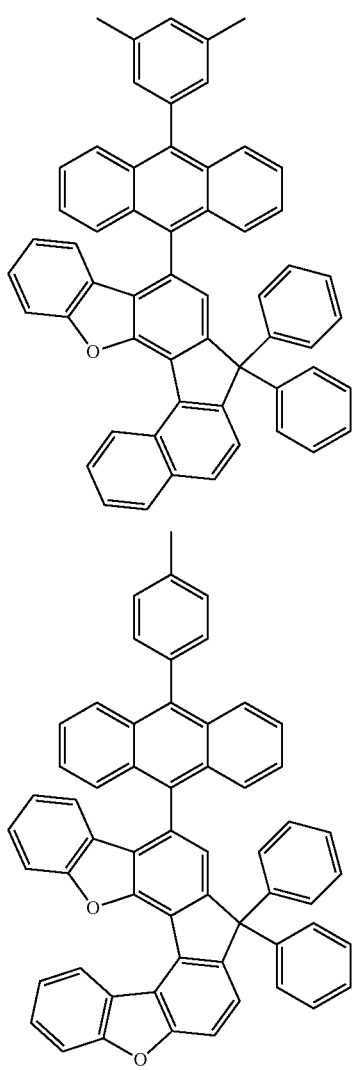
<Compound 267>
<Compound 269>
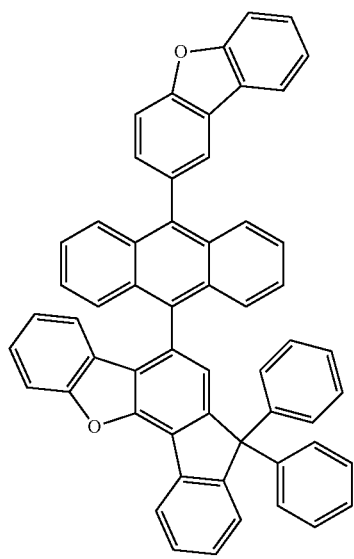
<Compound 268>
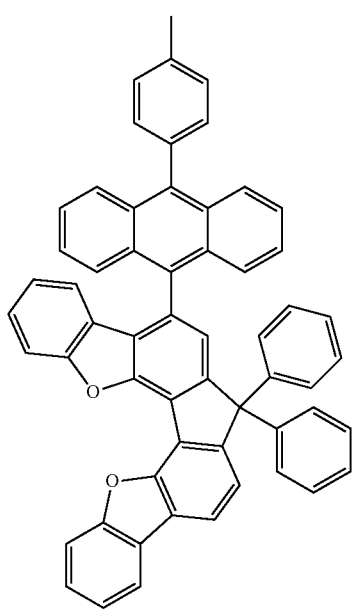
<Compound 270>
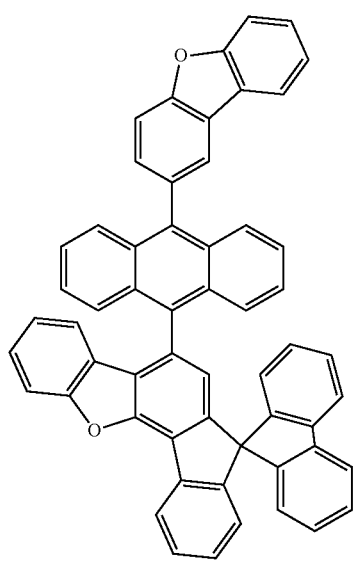

<Compound 271>
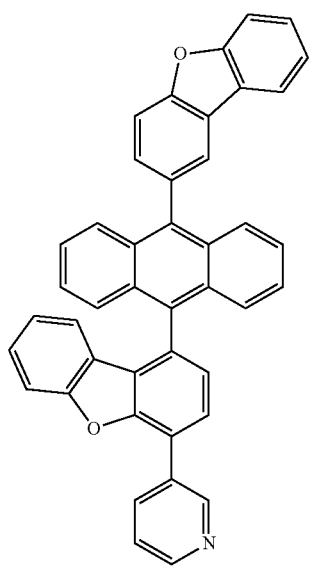
<Compound 272>
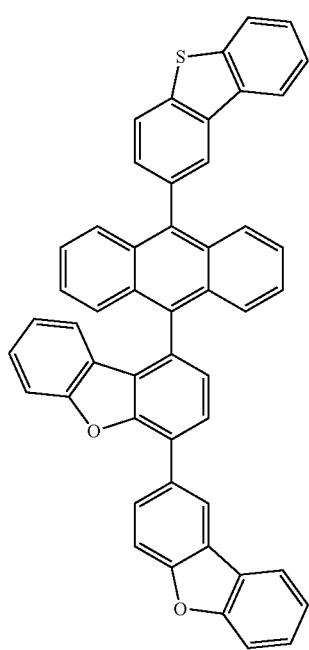
<Compound 273>
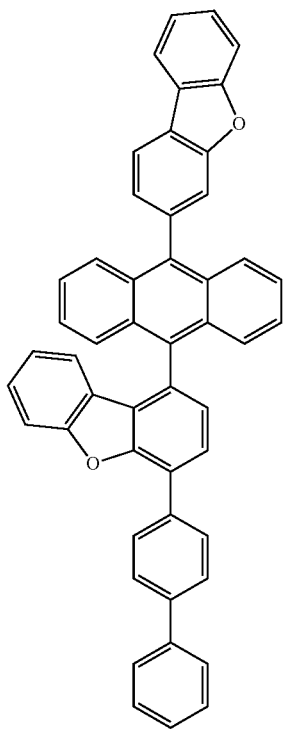
<Compound 274>
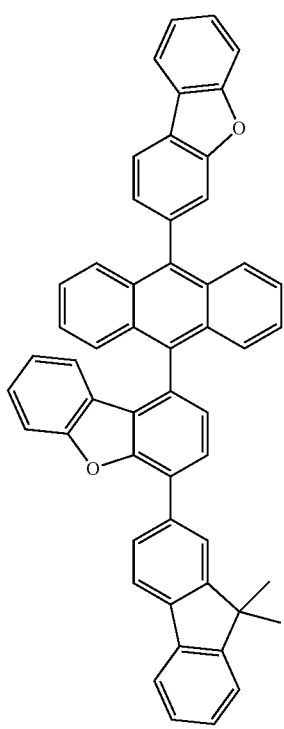

<Compound 275>
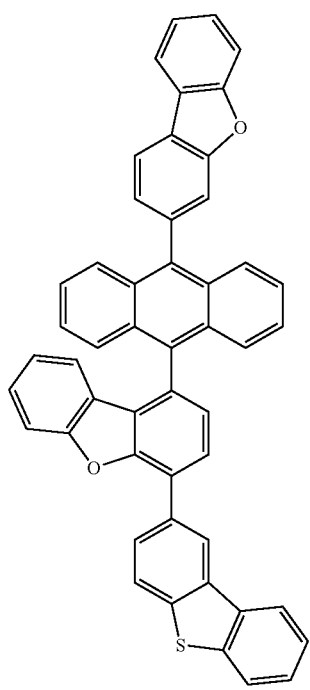
<Compound 276>
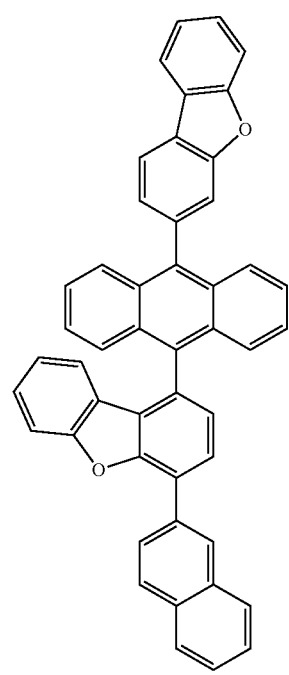
<Compound 277>
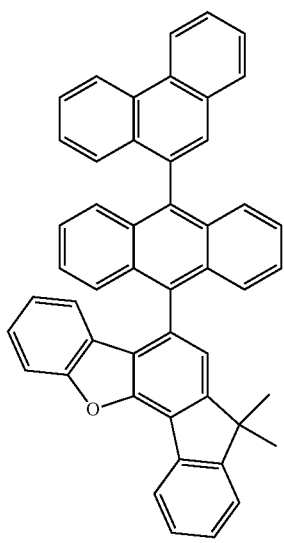
<Compound 278>
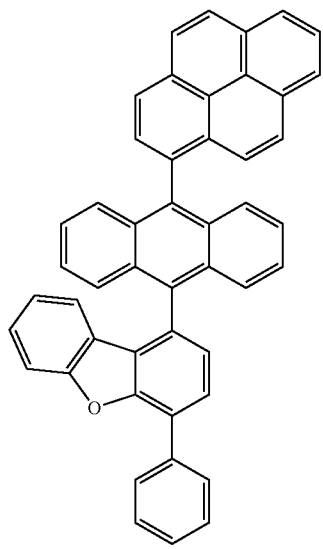

<Compound 279>
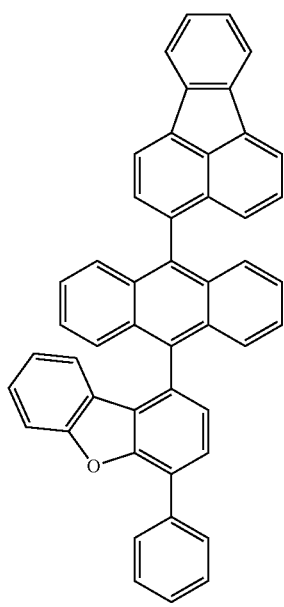
<Compound 281>
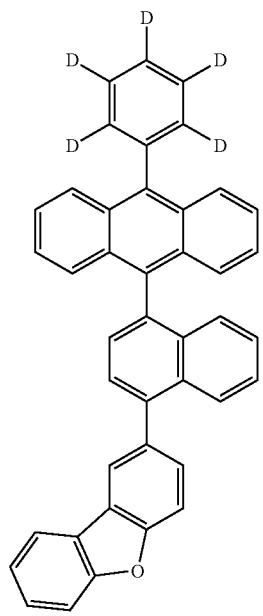
<Compound 280>
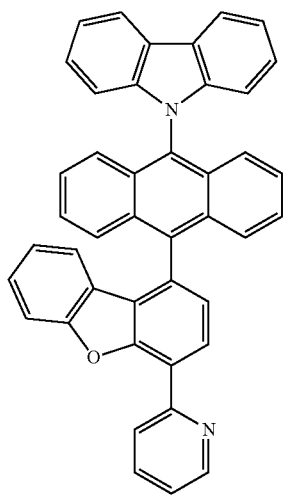
<Compound 282>
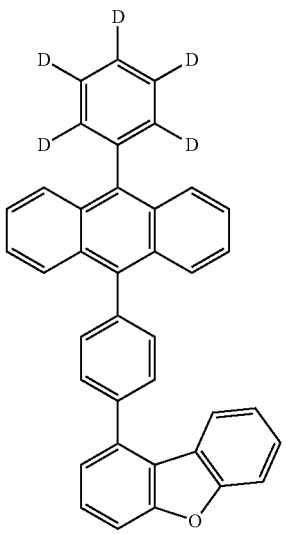

<Compound 283>
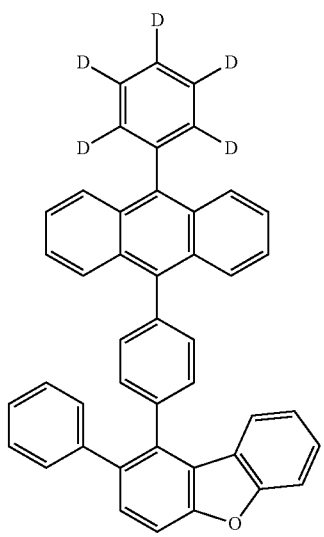
<Compound 284>
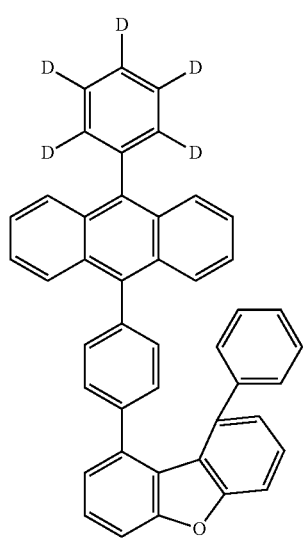
<Compound 285>
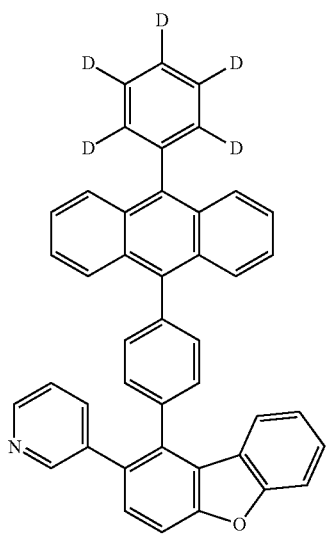
<Compound 286>
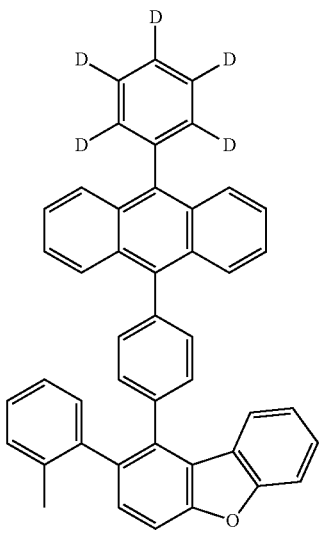
<Compound 287>
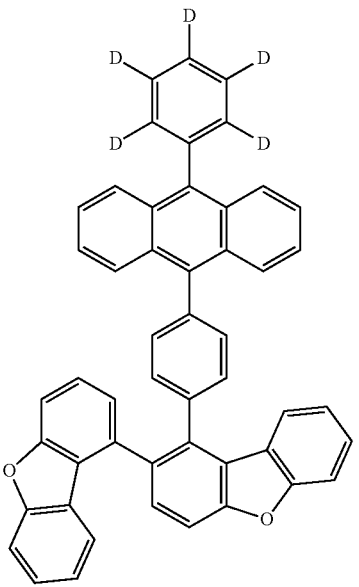

<Compound 288>
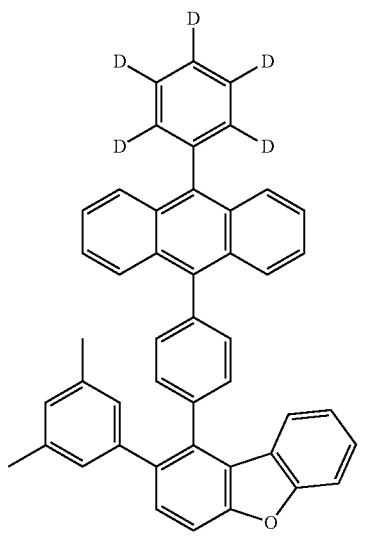
<Compound 289>
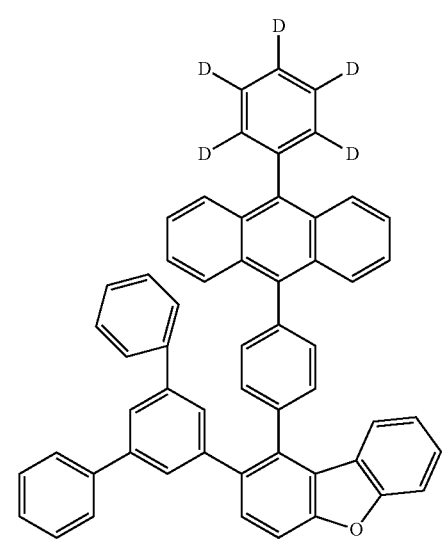
<Compound 290>
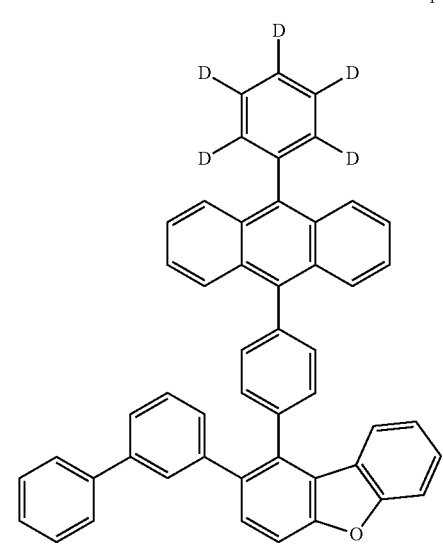
<Compound 291>
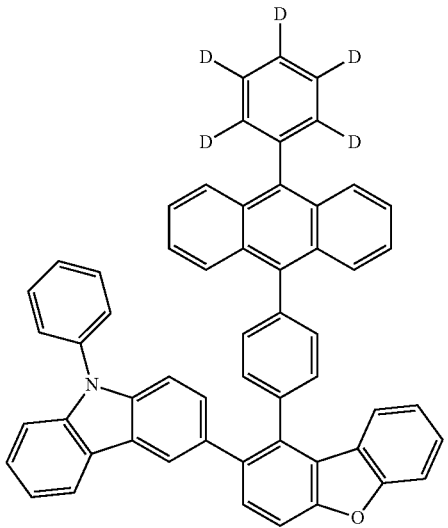
<Compound 292>
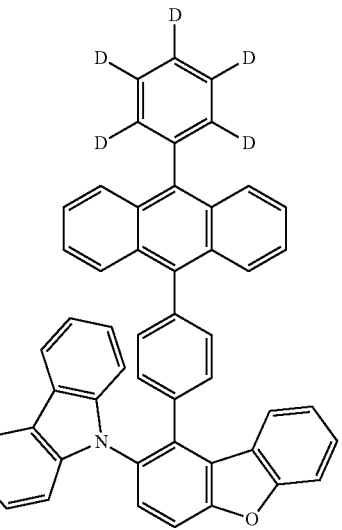
<Compound 293>
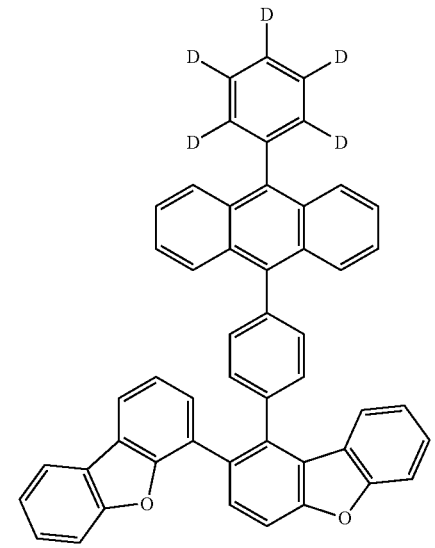

<Compound 294>
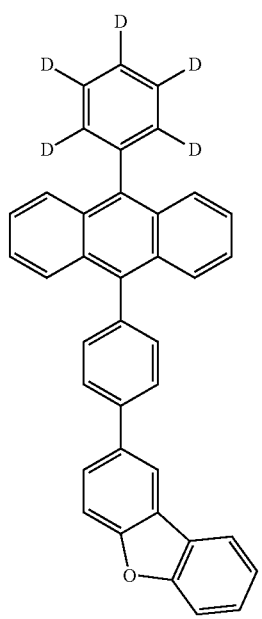
<Compound 295>
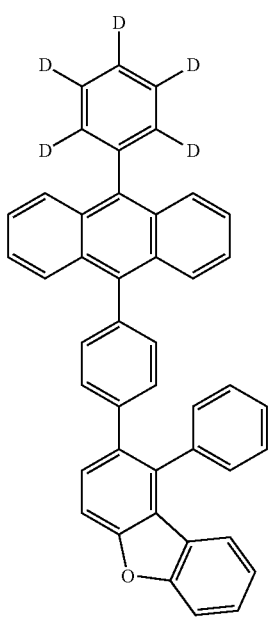
<Compound 296>
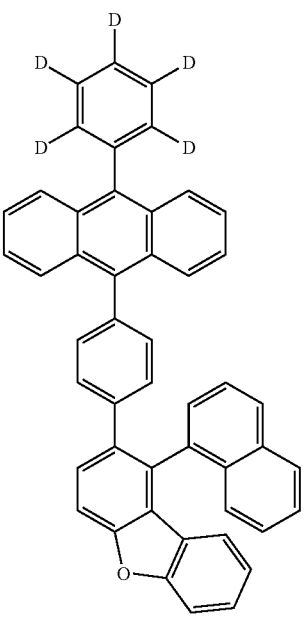
<Compound 297>
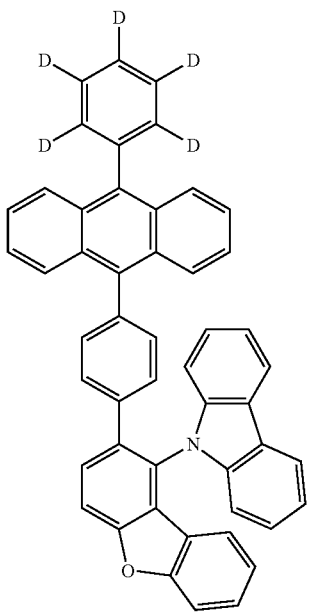

<Compound 298>
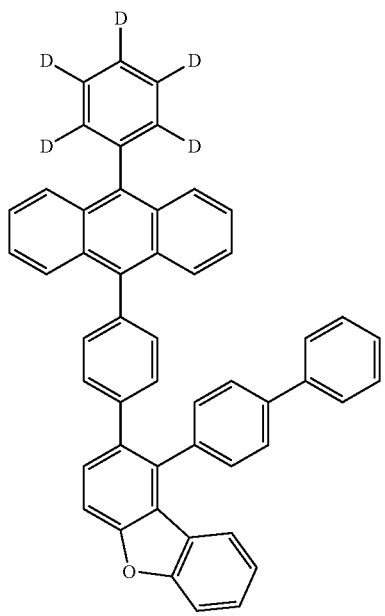
<Compound 299>
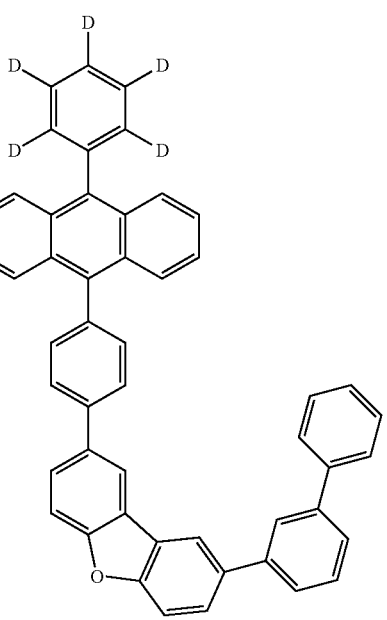
<Compound 300>
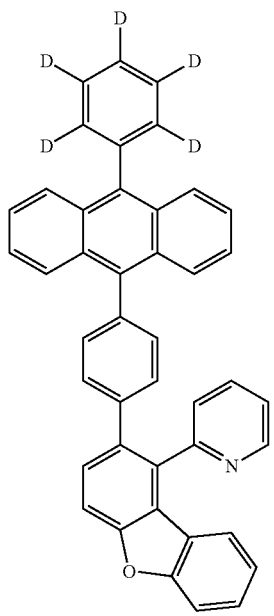
<Compound 301>
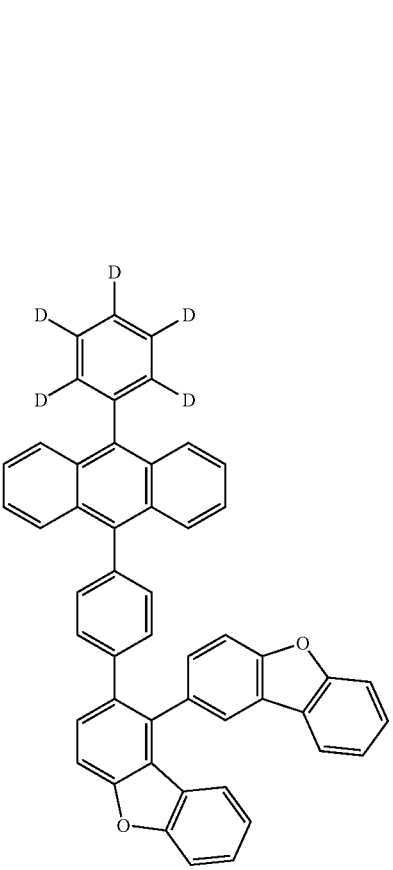

<Compound 302>
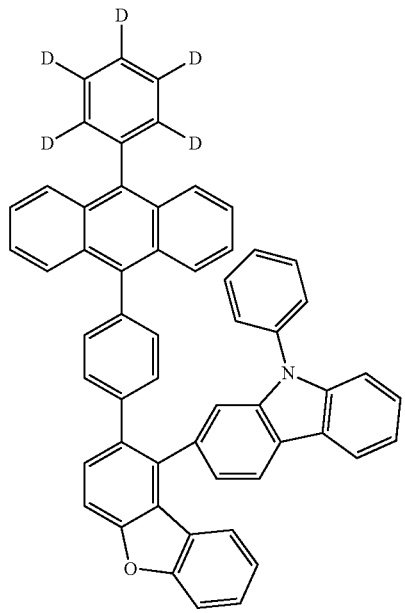
<Compound 304>
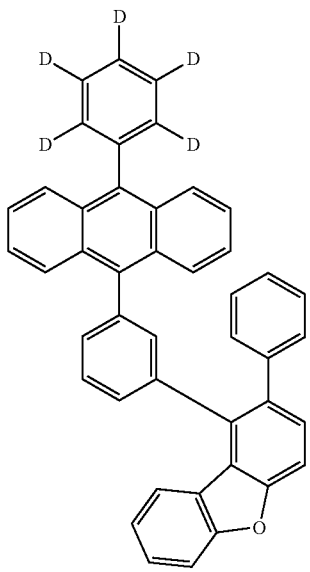
<Compound 303>
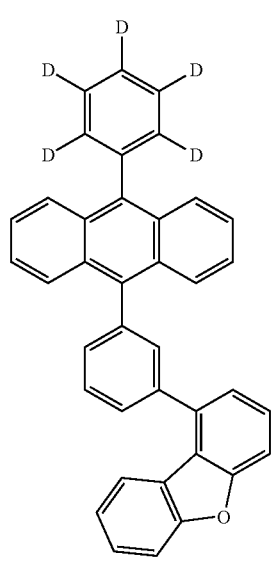
<Compound 305>
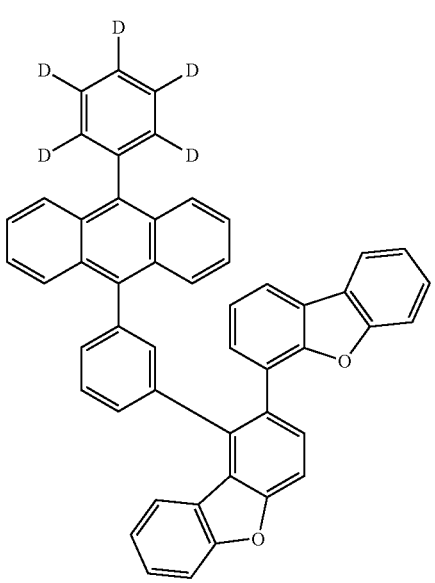

<Compound 306>
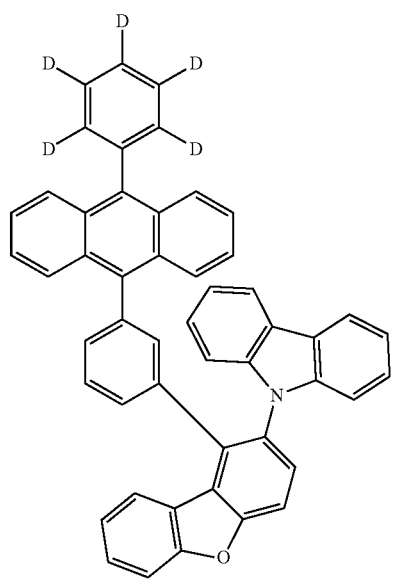
<Compound 308>
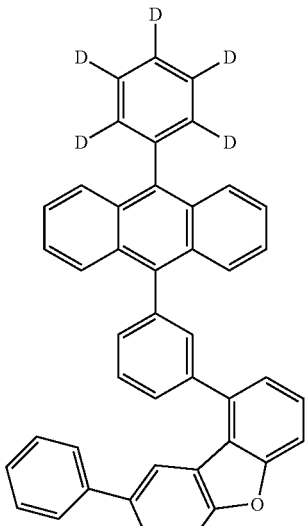
<Compound 307>
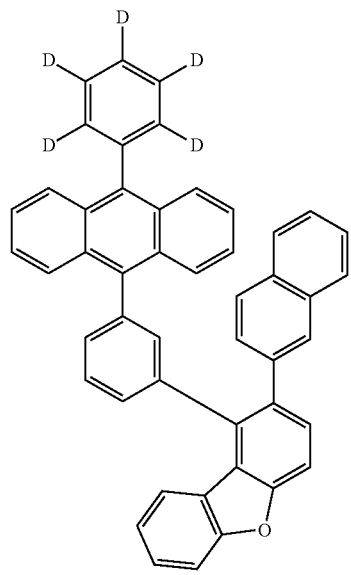
<Compound 309>
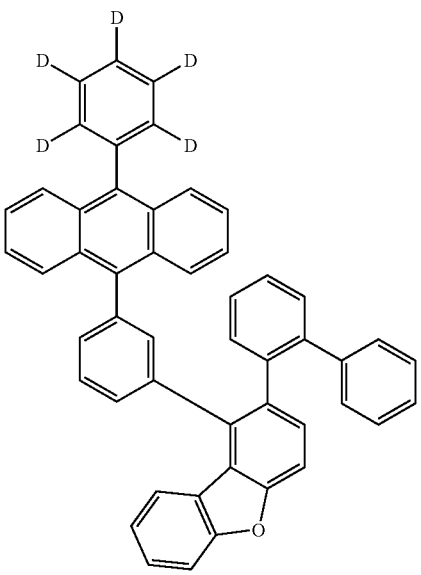

<Compound 310>
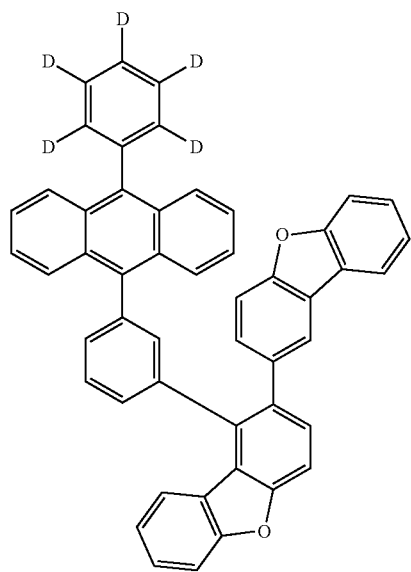
<Compound 312>
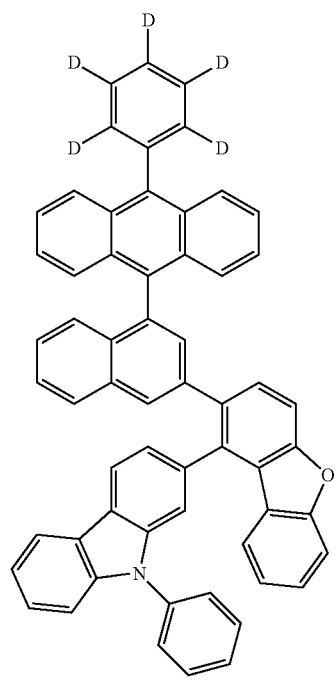
<Compound 311>
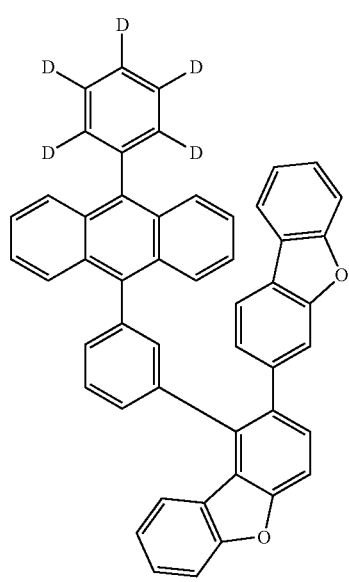
<Compound 313>
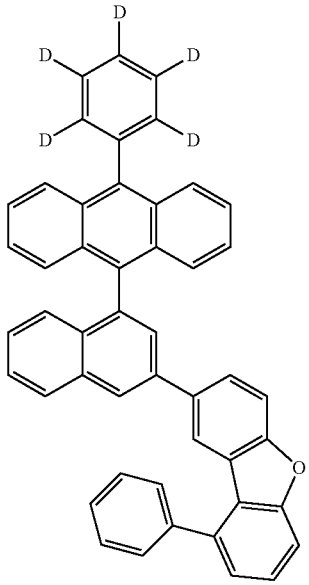

<Compound 314>
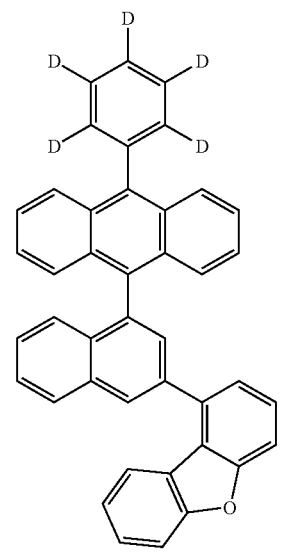
<Compound 315>
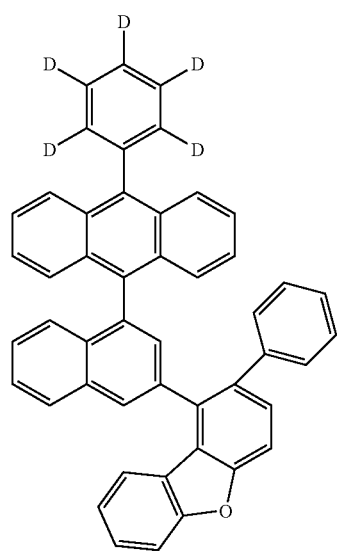
<Compound 316>
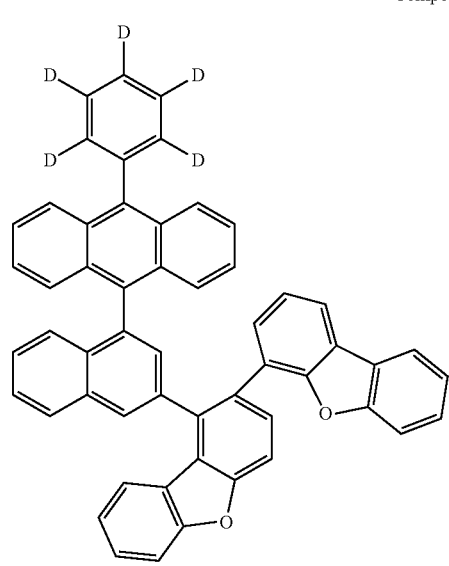
<Compound 317>
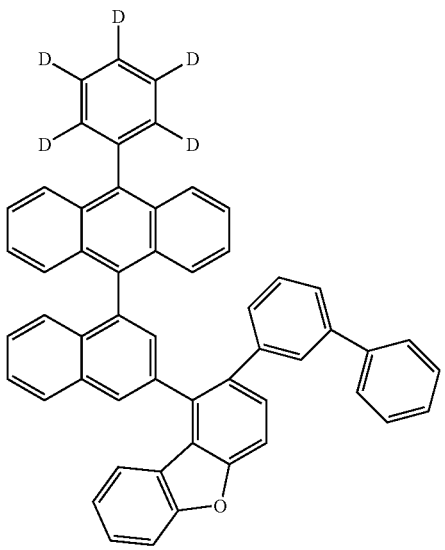
<Compound 318>
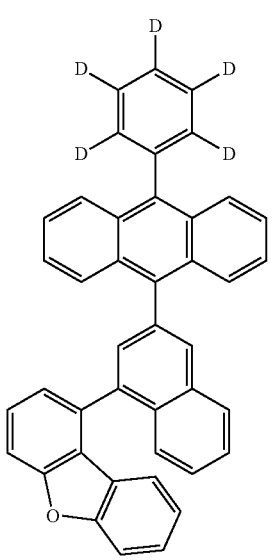

<Compound 319>
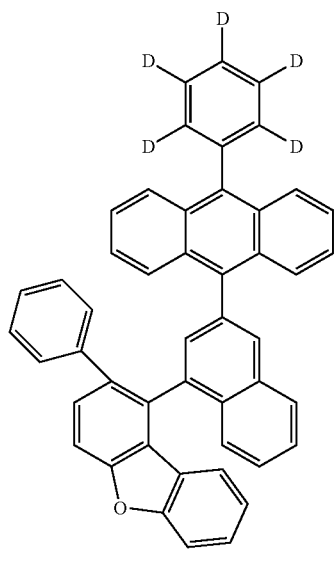
<Compound 320>
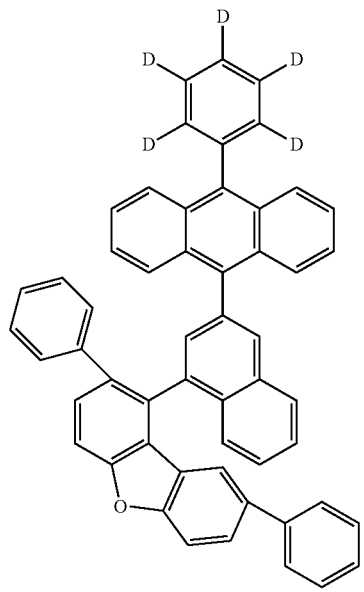
<Compound 321>
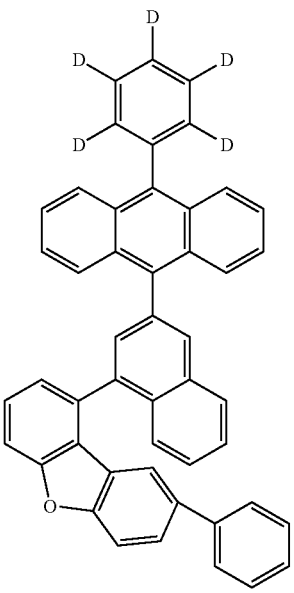
<Compound 322>
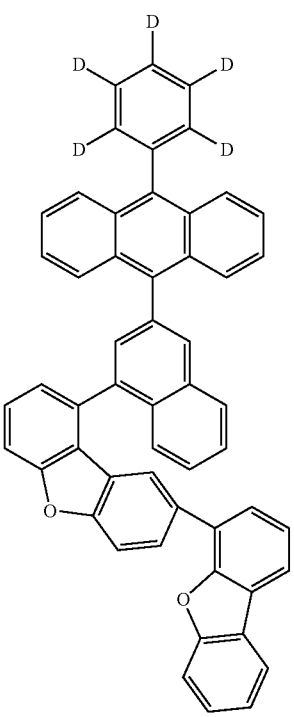

<Compound 323>
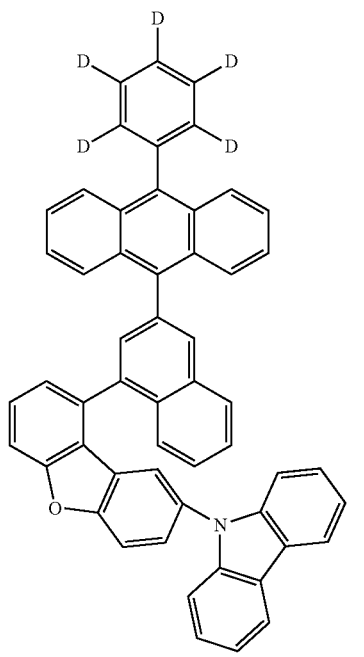
<Compound 324>
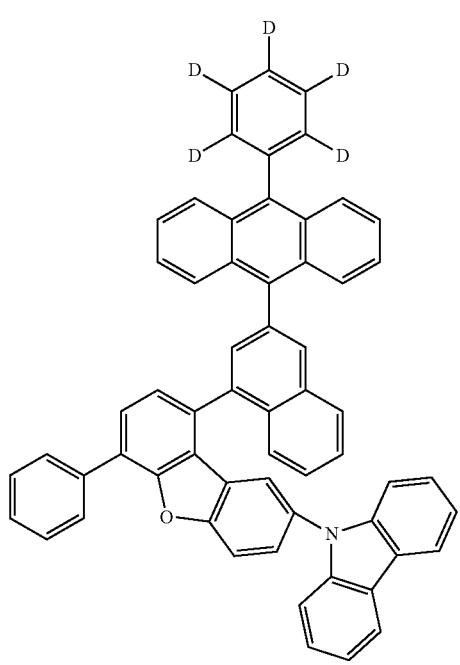
<Compound 325>
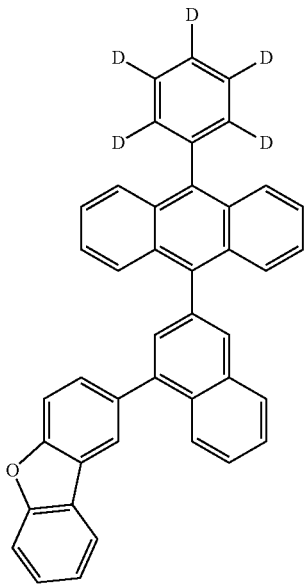
<Compound 326>
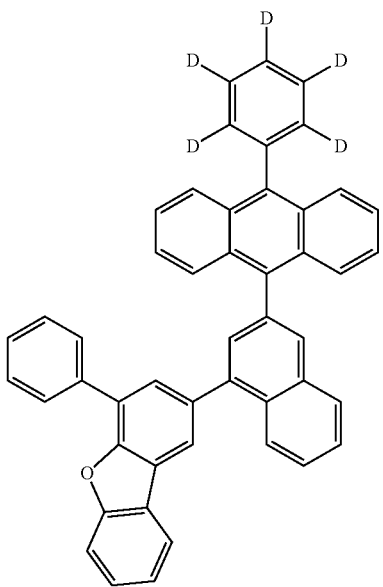

<Compound 327>
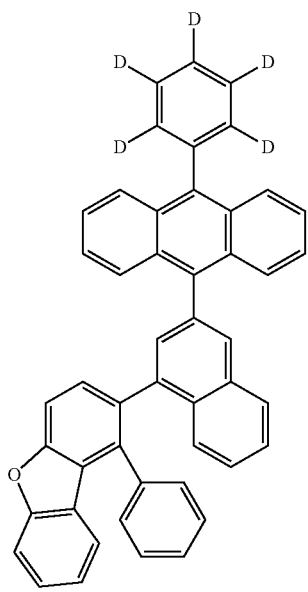
<Compound 328>
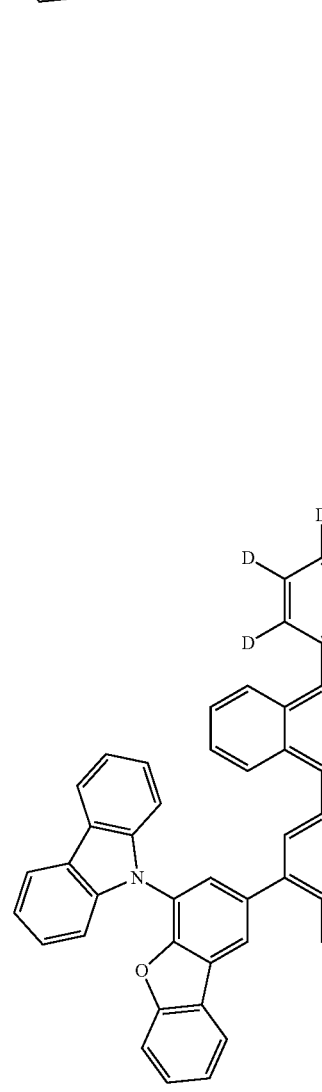
<Compound 329>
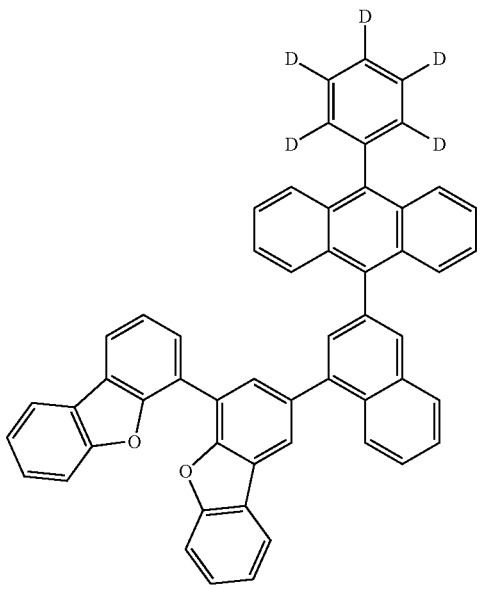
<Compound 330>
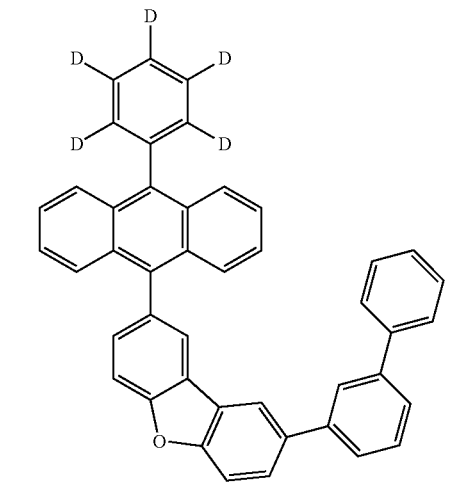
<Compound 331>
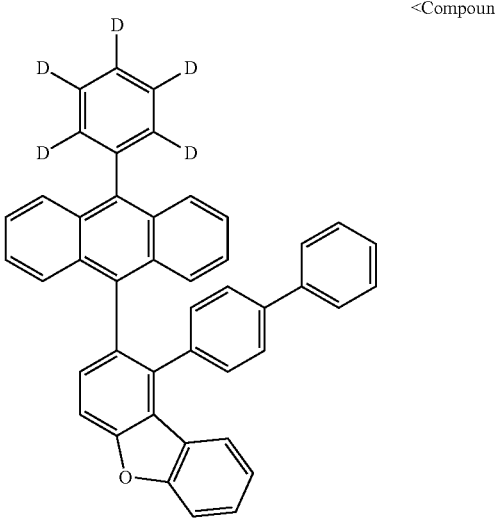

<Compound 332>
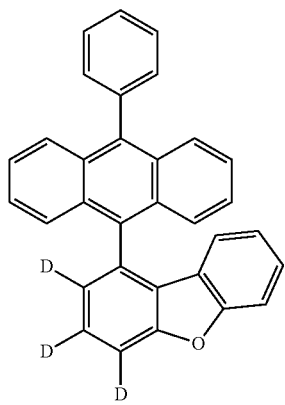
<Compound 333>
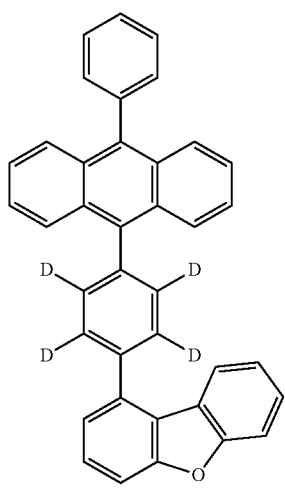
<Compound 334>
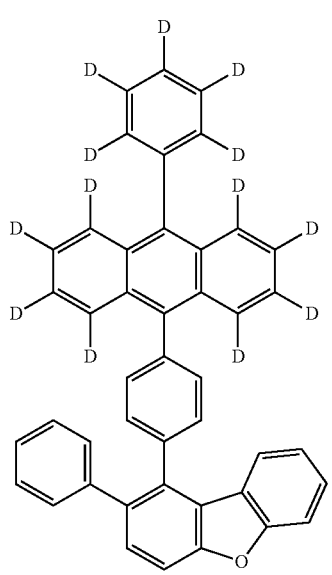
<Compound 335>
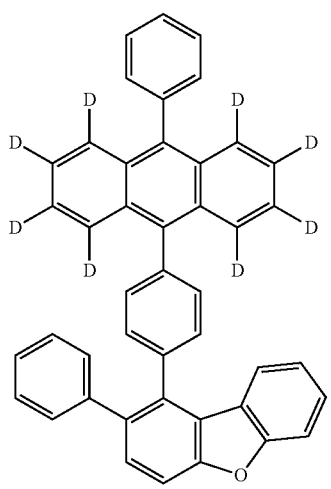
<Compound 336>
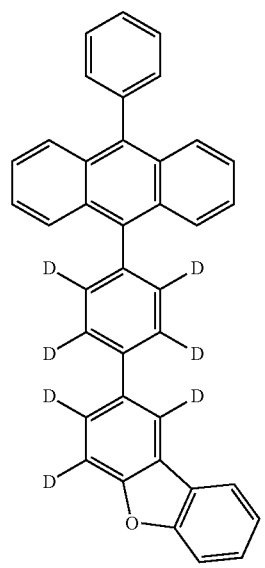
<Compound 337>
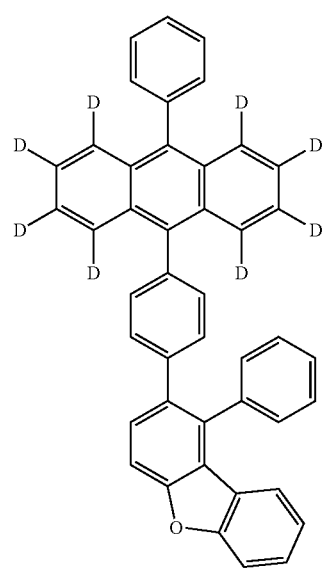

<Compound 338>

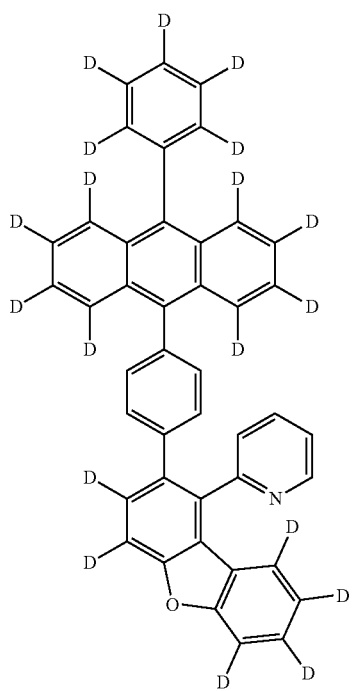

Functioning to lower a barrier to electron injection from an electron transport layer to a light-emitting layer, the electron density control layer in the organic light-emitting diode of the present invention allows for the effective injection of electrons into the light-emitting layer so that the diode can increase the electron density of the light-emitting layer and the density of excitons generated in the light-emitting layer, resulting in an improvement in external quantum efficiency (EQE).

Figure 2:
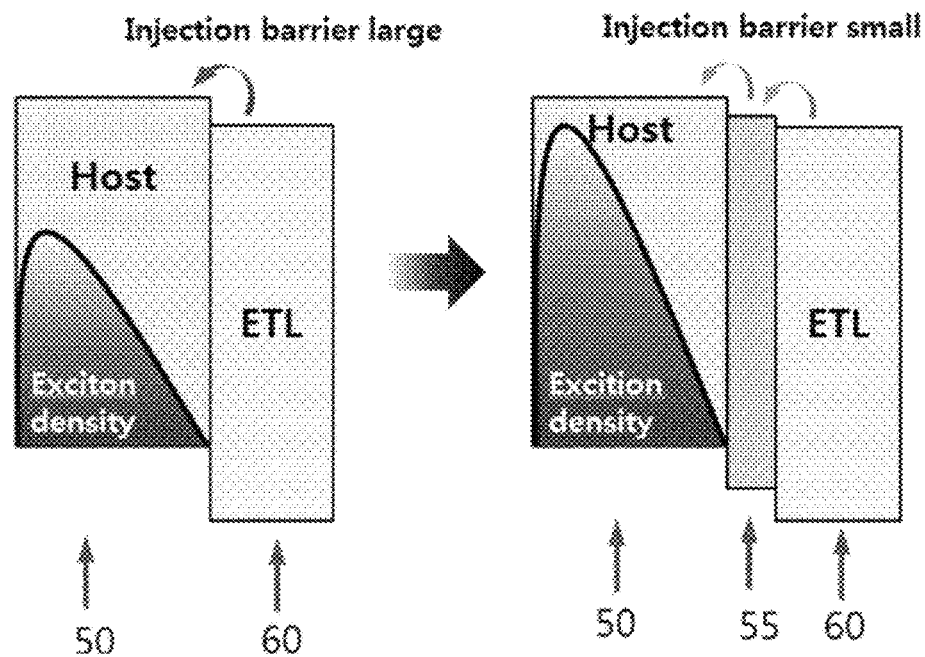
FIG. 2 shows schematic diagrams of the structure of an organic light-emitting diode including or lacking an electron density control layer according to some embodiments of the present invention.

In this regard, the electron density control layer is elucidated in greater detail with reference to FIG. 2.

FIG. 2 shows the structure of a light-emitting diode in which an electron density control layer is absent (left panel) or present (right panel).

As shown in the left panel of FIG. 2, when the electron transport layer 60 is in direct contact with the light-emitting layer 50, the electrons injected from the cathode are less prone to move through the electron transport layer 60 to the host 50 in the light-emitting layer because there is a large electron injection barrier between the cathode and the host 50, resulting in low exciton density in the host of the light-emitting layer. In contrast, as in the present invention, when an affinity $A_{ed}$ (eV) of the electron density control layer is set to be between an affinity $A_h$ (eV) of the host in the light-emitting layer and an affinity $A_e$ (eV) of the electron transport layer ($A_h \geq A_{ed} \geq A_e$), smaller interlayer electron injection barriers exist, resulting in greater exciton density in the host of the light-emitting layer.

It is estimated that higher current efficiency and EL intensities are detected as the dipole location zone within the light-emitting layer in which excitons recombine is nearer to the hole transport layer. That is, given the condition that the affinity $A_{ed}$ (eV) of the electron density control layer is between the affinity $A_h$ (eV) of the host of the light-emitting layer and the affinity $A_e$ (eV) of the electron transport layer ($A_h \geq A_{ed} \geq A_e$), the organic light-emitting diode of the present invention can increase the electron density in the light-emitting layer, which shifts the dipole location zone toward the hole transport layer, with the consequent improvement of current efficiency and EL intensity.

According to one embodiment of the present invention, the electron mobility of the anthracene derivative in the electron density control layer may be the same as or greater than that of the material in the electron transport layer.

Since the material of the electron density control layer is not smaller in electron mobility than that of the electron transport layer, the electrons supplied from the electron transport layer can move quickly toward the light-emitting layer without delay in the electron density control layer, thereby facilitating the elevation of exciton density in the light-emitting layer.

This can be further explained with reference to FIG. 3.

Figure 3:
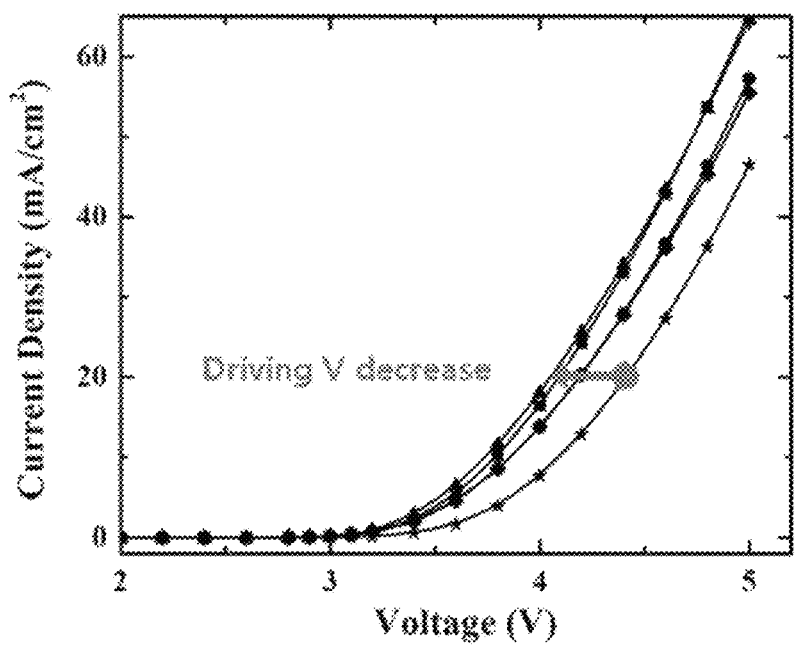
FIG. 3 shows changes in current efficiency with voltage in the presence or absence of an electron density control layer according to Examples and Comparative Examples.

FIG. 3 shows changes in current efficiency with voltage in the presence or absence of an electron density control layer according to Examples and Comparative Examples. In order to obtain the effect of the electron density control layer on electron mobility, an electron-only device (EOD) was measured for current density while applying direct voltages thereto.

As can be understood from FIG. 3, an electron density control layer helps increase the current density at the same voltage.

Even from this measurement result, it can be discovered that the introduction of an electron density control layer enhances the electron injection properties of the device.

According to exemplary embodiments of the present invention, the electron density control layer and the electron transport layer may have electron mobility of at least $10^{-6}$ cm2/Vs at an electronic field strength of 0.04 MV/cm to 0.5 MV/cm.

Further, one or more layers selected from among a hole injection layer, a hole transport layer, a light-emitting layer, an electron density control layer, an electron transport layer, and an electron injection layer may be deposited using a deposition process or a solution process.

Here, the deposition process is a process by which a material is vaporized in a vacuum or at a low pressure and is deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present invention may be applied to a device selected from among flat display devices, flexible display devices, monochrome or grayscale flat illumination devices, and monochrome or grayscale flexible illumination devices.

A better understanding of the present invention may be obtained through the following examples which are set forth to illustrate, but are not to be construed as limiting the present invention.

EXAMPLES

Preparation of Material for Electron Transport Layer (Chemical Formula E)

Synthesis Example 1: Synthesis of [Compound 3]

In a reactor, 3-(naphthalen-1-yl)phenylboronic acid (5.0 g), 2-chloro 4-(biphenyl-4-yl)-6-(4-(pyridin-3-yl)phenyl) pyridine (7.0 g), tetrakistriphenyl phosphine (0.96 g), potassium carbonate (6.9 g), toluene (35 mL), 1,4-dioxane (70 mL), and water (35 mL) were heated together at 85° C. for 12 hours and then cooled to room temperature before vacuum concentration. Isolation through column chromatography and recrystallization in chlorobenzene/dichloromethane afforded [Compound 3] (3.1 g). (yield 32%)

$^1$H-NMR (THF-d$_8$), δ (ppm)=8.97-8.84 (3H), 8.60-8.45 (6H), 8.08-7.32 (20H).

Synthesis Example 2: Synthesis of [Compound 57]

The same procedure as in Synthesis Example 1 was carried out, with the exception of using 9,9'-spirobi[9H-fluorene]-2-boronic acid and 2-chloro 4-{4-(naphthalen-1-yl)phenyl}-6-{3-(pyridin-3-yl)phenyl}pyrimidine instead of 3-(naphthalen-1-yl)phenylboronic acid and 2-chloro 4-(biphenyl-4-yl)-6-(4-(pyridin-3-yl)phenyl) pyrimidine, respectively, to afford [Compound 57] (1.3 g). (yield 20%)

$^1$H-NMR (CDCl$_3$) δ (ppm)=8.95 (1H), 8.86 (1H), 8.70 (1H), 8.42 (1H), 8.30 (2H), 8.22 (1H), 8.12-8.03 (3H), 8.01-7.89 (8H), 7.74 (1H), 7.67-7.37 (12H), 7.20-7.10 (3H), 6.83 (2H), 6.78 (1H).

Synthesis Example 3: Synthesis of [Compound 61]

The same procedure as in Synthesis Example 1 was carried out, with the exception of using 3-(naphthalen-1-yl) phenylboronic acid and 2-chloro 4-{4-(naphthalen-1-yl)phenyl}-6-{4-(pyridin-3-yl)phenyl}pyrimidine instead of 4-(naphthalen-1-yl)phenylboronic acid and 2-chloro 4-(biphenyl-4-yl)-6-(4-(pyridin-3-yl)phenyl) pyrimidine, respectively, to afford [Compound 61] (21.6 g). (yield 80%)

$^1$H-NMR (THF-d$_8$), δ (ppm)=9.00 (1H), 8.95 (2H), 8.68 (1H), 8.54-8.48 (4H), 8.22 (1H), 8.21-7.91 (7H), 7.82 (2H), 7.79-7.72 (4H), 7.64-7.42 (9H).

Synthesis Example 4: Synthesis of [Compound 62]

The same procedure as in Synthesis Example 1 was carried out, with the exception of using 4-(naphthalen-1-yl) phenylboronic acid and 2-chloro 4-{3-(phenanthren-9-yl) phenyl}-6-{4-(pyridin-3-yl)phenyl}pyrimidine instead of 3-(naphthalen-1-yl)phenylboronic acid and 2-chloro 4-(biphenyl-4-yl)-6-(4-(pyridin-3-yl)phenyl) pyrimidine, respectively, to afford [Compound 62] (2.5 g). (yield 42%)

$^1$H-NMR (CDCl$_3$) δ (ppm)=8.97 (1H), 8.97-8.76 (4H), 8.67 (1H), 8.52-8.46 (4H), 8.17 (1H), 8.01-7.43 (22H).

Synthesis Example 5: Synthesis of [Compound 63]

The same procedure as in Synthesis Example 1 was carried out, with the exception of using 3-(naphthalen-1-yl) phenylboronic acid and 2-chloro 4-{4-(naphthalen-1-yl)phenyl}-6-{4-(quinolin-3-yl)phenyl}pyrimidine instead of 3-(naphthalen-1-yl)phenylboronic acid and 2-chloro 4-(biphenyl-4-yl)-6-(4-(pyridin-3-yl)phenyl) pyrimidine, respectively, to afford [Compound 63] (1.5 g). (yield 23%)

$^1$H-NMR (THF-d$_8$) δ (ppm)=9.33 (1H), 8.94 (2H), 8.59-8.42 (5H), 8.23-8.17 (2H), 8.04-7.90 (9H), 7.82-7.72 (5H), 7.64-7.45 (9H).

Synthesis Example 6: Synthesis of Compound of [Chemical Formula 1]

Synthesis Example 6-(1): Synthesis of [Intermediate 6-a]

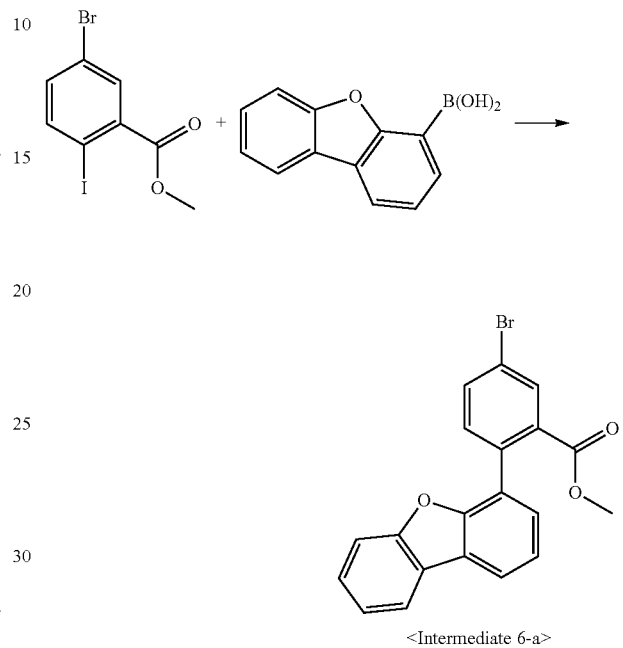

<Intermediate 6-a>

In a 500-mL round-bottom flask reactor, methyl 5-bromo-2-iodobenzoate (25.0 g, 73 mmol), 4-dibenzofuran boronic acid (18.7 g, 88 mmol), tetrakis (triphenylphosphine)palladium (1.7 g, 0.15 mmol), and potassium carbonate (20.2 g, 146.7 mmol) were stirred together with toluene (125 mL), tetrahydrofuran (125 mL), and water (50 mL) for 10 hours at 80° C. After completion of the reaction, the reaction mixture was cooled to room temperature and extracted with ethyl acetate. The organic layer thus formed was separated, concentrated in a vacuum, and purified by column chromatography to afford <Intermediate 6-a>. (75.0 g, 60.1%).

Synthesis Example 6-(2): Synthesis of [Intermediate 6-b]

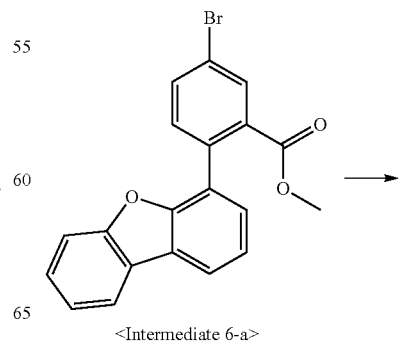

<Intermediate 6-a>

-continued

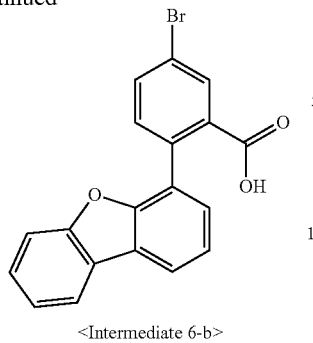

<Intermediate 6-b>

In a 500-mL round-bottom flask reactor, <Intermediate 6-a> (17.0 g, 45 mmol), sodium hydroxide (2.14 g, 54 mmol) and ethanol (170 ml) were stirred together for 48 hours under reflux. After completion of the reaction was confirmed using thin-layer chromatography, the reaction mixture was cooled to room temperature. The chilled solution was acidified with drops of 2-N HCl, followed by stirring for 30 min. The solid thus formed was filtered and then recrystallized in dichloromethane and n-hexane to afford <Intermediate 6-b>. (14.5 g, 88.6%)

Synthesis Example 6-(3): Synthesis of [Intermediate 6-c]

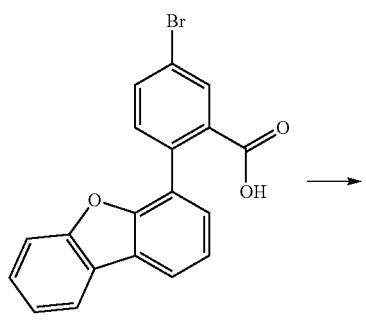

<Intermediate 6-b>

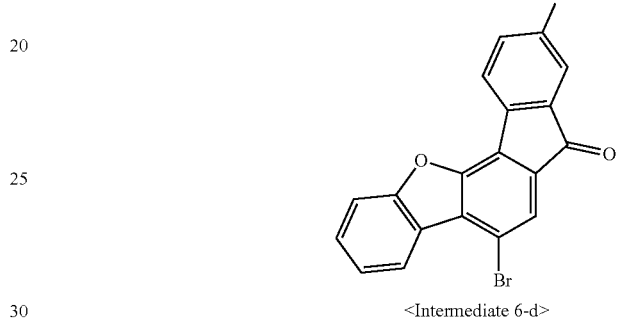

<Intermediate 6-c>

In a 250-mL round-bottom flask reactor, <Intermediate 6-b> (14.5 g, 39 mmol) and methanesulfonic acid (145 ml) were stirred together for 3 hours at 80° C. After the completion of the reaction was confirmed using thin-layer chromatography, the reaction mixture was cooled to room temperature and dropwise added to ice water (150 ml). After stirring for 30 min, the solid thus formed was filtered and washed with water and methanol to afford <Intermediate 6-c>. (11.50 g, 83.4%)

Synthesis Example 6-(4): Synthesis of [Intermediate 6-d]

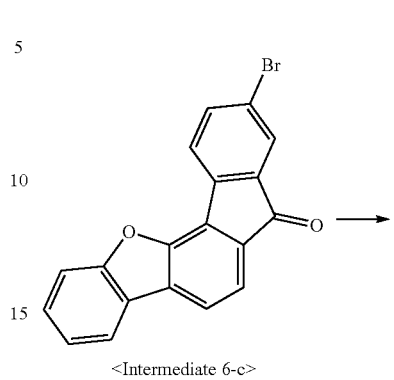

<Intermediate 6-c>

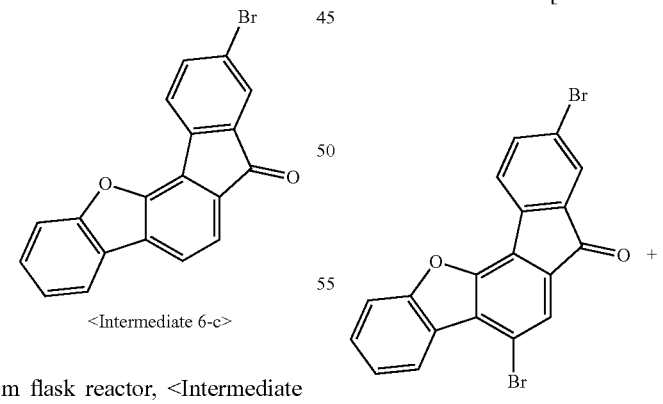

<Intermediate 6-d>

In a 1-L round-bottom flask reactor, <Intermediate 6-c> (11.5 g, 33 mmol> and dichloromethane (300 ml) were stirred together at room temperature. A dilution of bromine (3.4 ml, 66 mmol) in dichloromethane (50 ml) was dropwise added, followed by stirring at room temperature for 8 hours. After completion of the reaction, the reaction mixture was stirred together with acetone (100 ml). The solid thus formed was filtered and washed with acetone. Recrystallization in monochlorobenzene afforded <Intermediate 6-d>. (11.0 g, 78%)

Synthesis Example 6-(5): Synthesis of [Intermediate 6-e]

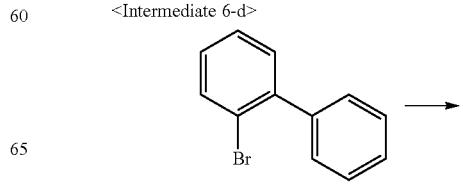

<Intermediate 6-d>

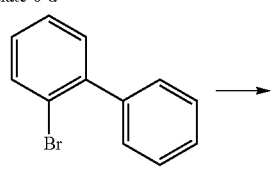

-continued

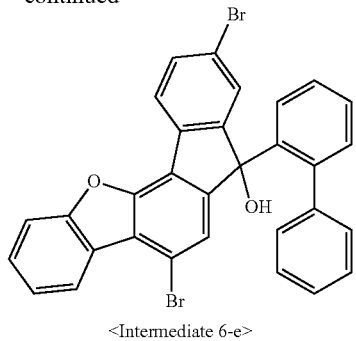

<Intermediate 6-e>

In a 250-ml round-bottom flask reactor, 2-bromobiphenyl (8.4 g, 0.036 mol) and tetrahydrofuran (110 ml) were frozen at −78° C. in a nitrogen atmosphere. At the same temperature, n-butyl lithium (19.3 ml, 0.031 mol) was dropwise added to the reaction solution, which was then stirred for 2 hours. Thereafter, <Intermediate 6-d> (11.0 g, 0.026 mol) was added little by little to the reaction solution and stirred at room temperature. When the reaction mixture started to change color, the reaction was monitored via TLC. After the reaction was stopped with H₂O (50 ml), extraction was conducted with ethyl acetate and water. The organic layer was separated, concentrated in a vacuum, and recrystallized in acetonitrile to afford <Intermediate 6-e> as a solid. (12.2 g, 81.5%)

Synthesis Example 6-(6): Synthesis of [Intermediate 6-f]

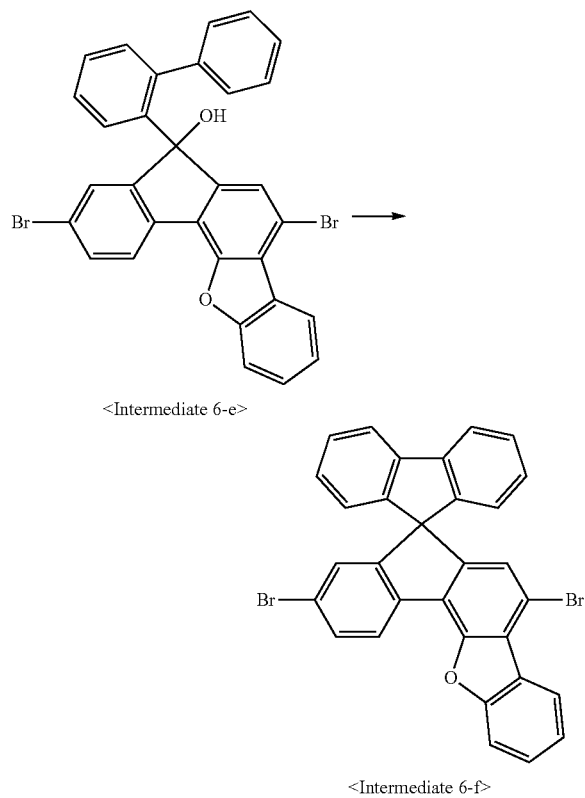

In a 250-ml round-bottom flask reactor, a mixture of <Intermediate 6-e> (12.0 g, 0.021 mol), acetic acid (120 ml), and sulfuric acid (2 ml) was stirred for 5 hours under reflux. When a precipitate was formed, completion of the reaction was monitored using thin-layer chromatography. The reaction mixture was then cooled to room temperature and filtered. The filtrate was washed with H₂O and methanol and dissolved in monochlorobenzene. Following silica gel chromatography, the fraction was concentrated and cooled to room temperature to give <Intermediate 6-f>. (10.7 g, 90%>

Synthesis Example 6-(7): Synthesis of Compound of [Chemical Formula 1]

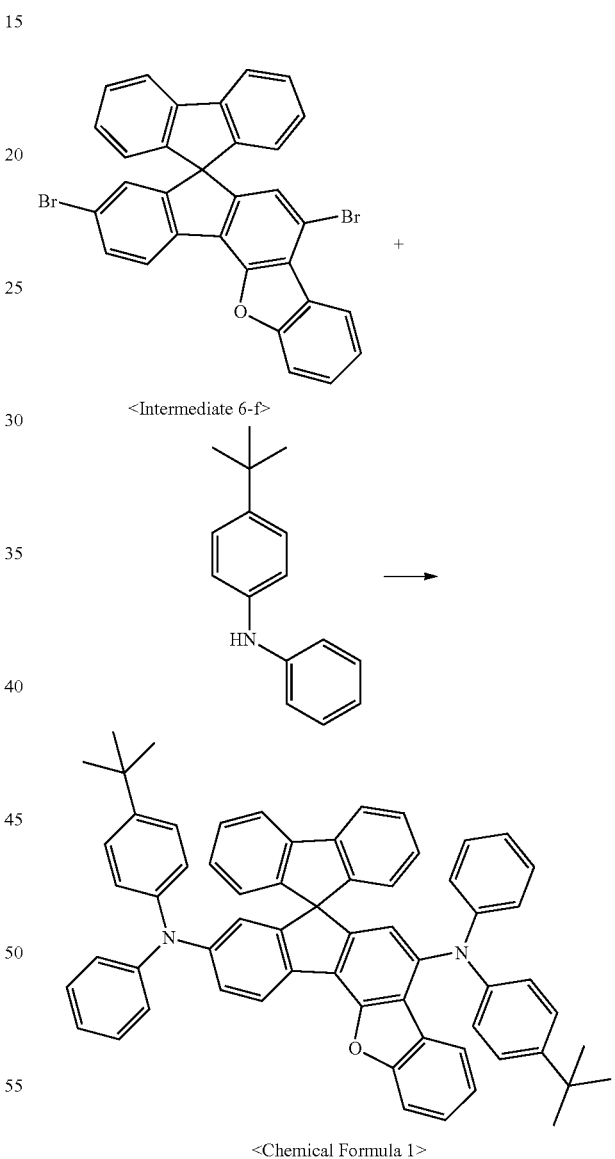

In a 250-ml round-bottom flask reactor, a mixture of <Intermediate 6-f> (5.0 g, 0.009 mol), (4-tert-butylphenyl)-phenylamine (4.7 g, 0.021 mol), palladium (II) acetate (0.08 g, 0.4 mmol), sodium tert-butoxide (3.4 g, 0.035 mol), tri-tert-butyl phosphine (0.07 g, 0.4 mmol), and toluene (60 ml) was stirred for 2 hours under reflux. After completion of the reaction, the reaction mixture was cooled to room temperature and then extracted with dichloromethane and water. The organic layer thus formed was separated, dried over magnesium sulfate, and concentrated in a vacuum. The concentrate was purified by column chromatography and recrystallized in dichloromethane and acetone to yield the compound of Chemical Formula 1 as a solid (2.9 g, 38%).
MS (MALDI-TOF): m/z 852.41 [M$^+$]

Synthesis Example 7: Synthesis of Compound of Chemical Formula 231

Synthesis Example 7-(1): Synthesis of Intermediate 4-a

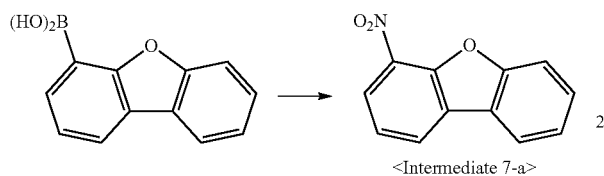
<Intermediate 7-a>

In a 1-L round-bottom flask reactor, 4-dibenzofuran boronic acid (85.0 g, 0.401 mol), bismuth (III) nitrate pentahydrate (99.2 g, 0.200 mol), and toluene (400 ml) were stirred together at 70° C. for 3 hours under a nitrogen atmosphere. After completion of the reaction, the reaction mixture was cooled to room temperature, and the precipitates thus formed were filtered and washed with toluene to afford <Intermediate 7-a> (61.5 g, 72%).

Synthesis Example 7-(2): Synthesis of Intermediate 7-b

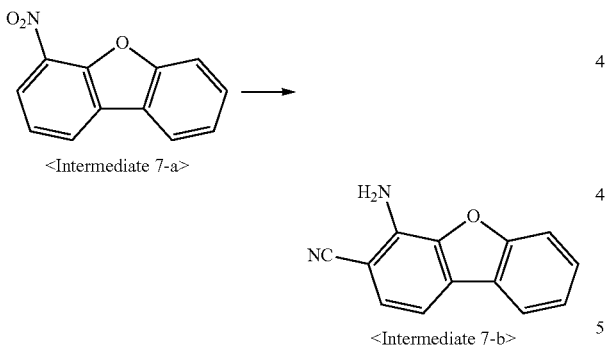
<Intermediate 7-a>
<Intermediate 7-b>

In a 2-L round-bottom flask reactor, ethyl cyanoacetate (202.9 g, 1.794 mol) and dimethylformamide (500 ml) were placed. Potassium hydroxide (67.10 g, 1.196 mol) and potassium cyanide (38.95 g, 0.598 mol) were added thereto, followed by dimethyl formamide (200 ml). The reaction solution was stirred at room temperature. <Intermediate 7-a> (127.5 g, 0.737 mol) was added little by little to the reaction solution, followed by stirring at 50° C. for 72 hours. After completion of the reaction, an aqueous sodium hydroxide solution (25%, 200 ml) was added to the reaction solution, which was then stirred for 3 hours under reflux and cooled to room temperature. Extraction was performed using ethyl acetate and water. The organic layer was isolated and concentrated in a vacuum. Purification through column chromatography afforded <Intermediate 7-b> (20.0 g, 16%).

Synthesis Example 7-(3): Synthesis of Intermediate 7-c

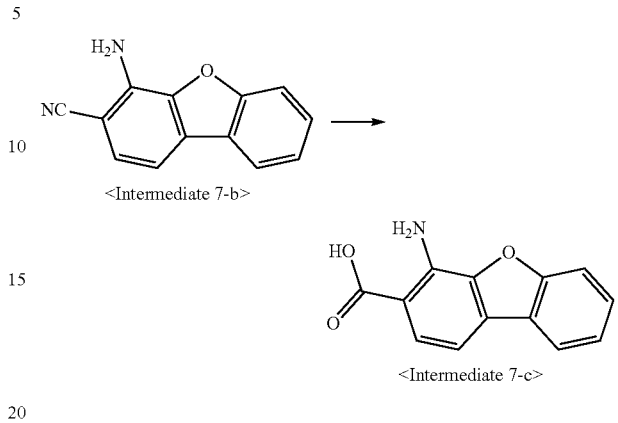
<Intermediate 7-b>
<Intermediate 7-c>

In a 2-L round-bottom flask reactor, <Intermediate 7-b> (20.0 g, 0.096 mol), ethanol (600 ml), and an aqueous potassium hydroxide solution (142.26 g, 2.53 mol, 170 ml) were stirred together for 12 hours under reflux. After completion of the reaction, the reaction mixture was cooled to room temperature and acidified with 6-N HCl (400 ml). The solid thus formed was stirred for 20 min and filtered. The filtrate was washed with ethanol to afford <Intermediate 7-c> (17.0 g, 88.5%).

Synthesis Example 7-(4): Synthesis of Intermediate 7-d

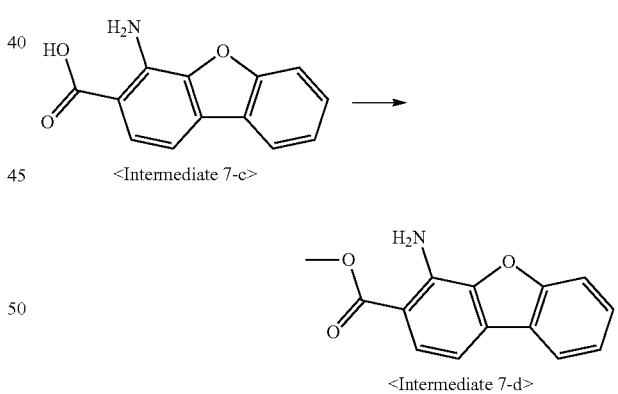
<Intermediate 7-c>
<Intermediate 7-d>

In a 2-L round-bottom flask reactor, <Intermediate 7-c> (17.0 g, 0.075 mol) and sulfuric acid (15 ml) were stirred together for 72 hours under reflux. After completion of the reaction, the reaction mixture was cooled to room temperature and then extracted with ethyl acetate and water. The organic layer was isolated and washed with an aqueous sodium hydrogen carbonate, followed by concentration in a vacuum. The concentrate was crystallized in an excess of methanol and filtered to afford <Intermediate 7-d> (14.0 77.6%).

Synthesis Example 7-(5): Synthesis of Intermediate 7-e

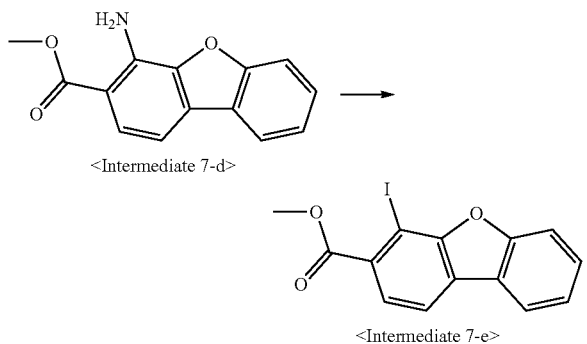

<Intermediate 7-d>

<Intermediate 7-e>

In a 500-mL round-bottom flask reactor, a mixture of <Intermediate 7-d> (14.0 g, 0.058 mol), HCl (20 ml), and water (100 ml) was cooled to 0° C. and stirred for 1 hour. At the same temperature, an aqueous solution (50 ml) of sodium nitrite (7.4 g, 0.116 mol) was added and then stirred for 1 hour. An aqueous solution (100 ml) of potassium iodide (30.0 g, 0.180 mol) was dropwise added, taking care not to increase the temperature of the reaction solution above 5° C. Stirring was continued for 5 hours at room temperature, and after completion of the reaction, the reaction mixture was washed with an aqueous sodium thiosulfate solution and extracted with ethyl acetate and water. The organic layer was separated and concentrated in a vacuum. Purification through column chromatography gave <Intermediate 7-e> (9.1 g, 48%).

Synthesis Example 7-(6): Synthesis of Intermediate 7-f

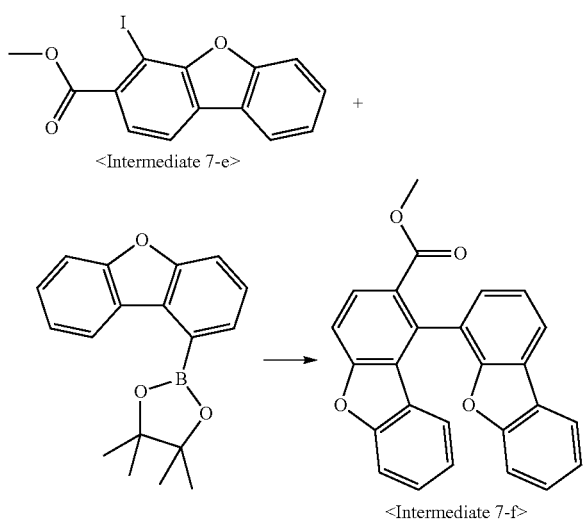

<Intermediate 7-e>

+

<Intermediate 7-f>

In a 250-mL round-bottom flask reactor, <Intermediate 7-e> (9.3 g, 25 mmol), 4-dibenzofuran boronic acid (8.3 g, 28 mmol), tetrakis (triphenylphosphine)palladium (0.6 g, 0.05 mmol), and potassium carbonate (6.7 g, 50 mmol) were stirred together with toluene (50 mL), tetrahydrofuran (50 mL), and water (20 mL) for 10 hours at 80° C. After completion of the reaction, the reaction mixture was cooled to room temperature and extracted with ethyl acetate. The organic layer thus formed was separated, concentrated in a vacuum, and purified by column chromatography to afford <Intermediate 7-f> (5.3 g, 52.3%).

Synthesis Example 7-(7): Synthesis of Intermediate 7-g

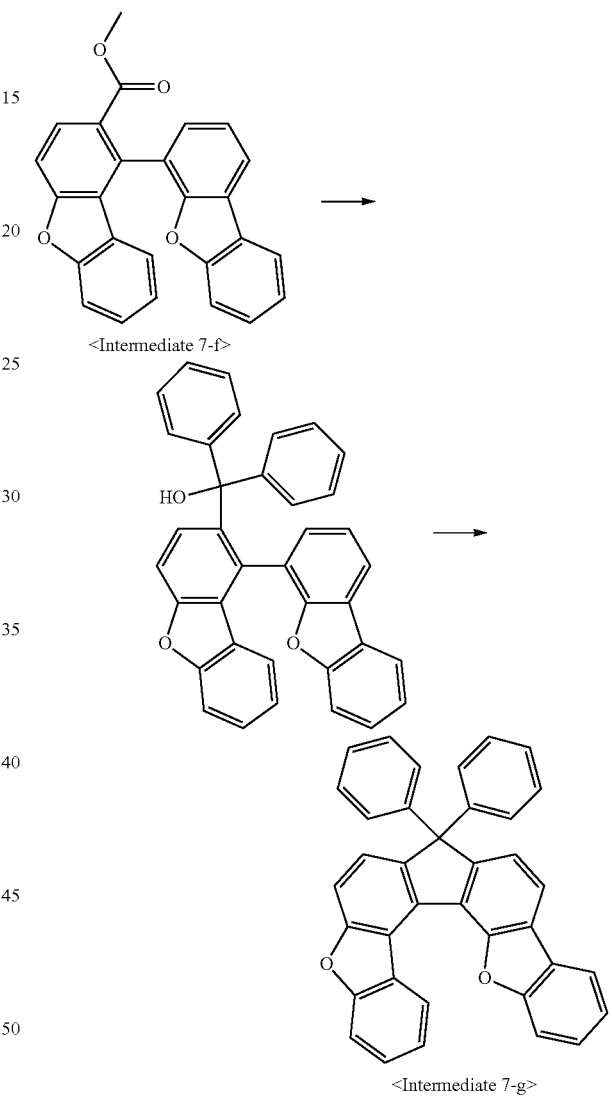

<Intermediate 7-f>

<Intermediate 7-g>

In a 500-ml round-bottom flask reactor, a mixture of bromobenzene (25.5 g, 0.163 mol) and tetrahydrofuran (170 ml) was cooled to −78° C. under a nitrogen atmosphere. n-Butyl lithium (1.6 M, 95.6 ml, 0.153 mol) was dropwise added to the cold mixture, after which stirring was conducted at the same temperature for one hour. <Intermediate 7-f> (20.0 g, 0.051 mol) was added to the mixture and then stirred at room temperature for 3 hours. After completion of the reaction, the reaction mixture was added with water (50 ml) and stirred for 30 min. Extraction with ethyl acetate and water gave an organic layer which was then isolated and concentrated in a vacuum. The concentrate was mixed with acetic acid (200 ml) and HCl (1 ml) and stirred at 80° C.

After the reaction was completed, the reaction mixture was cooled to room temperature and the precipitate thus formed was filtered and washed with methanol to afford <Intermediate 7-g> (20.0 g, 78%).

Synthesis Example 7-(8): Synthesis of Intermediate 7-h

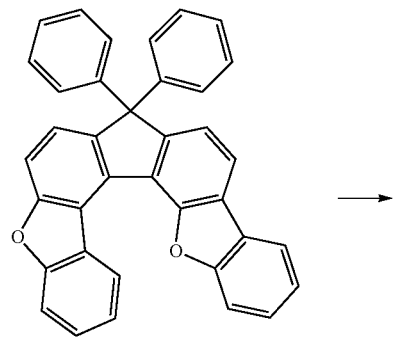

<Intermediate 7-g>

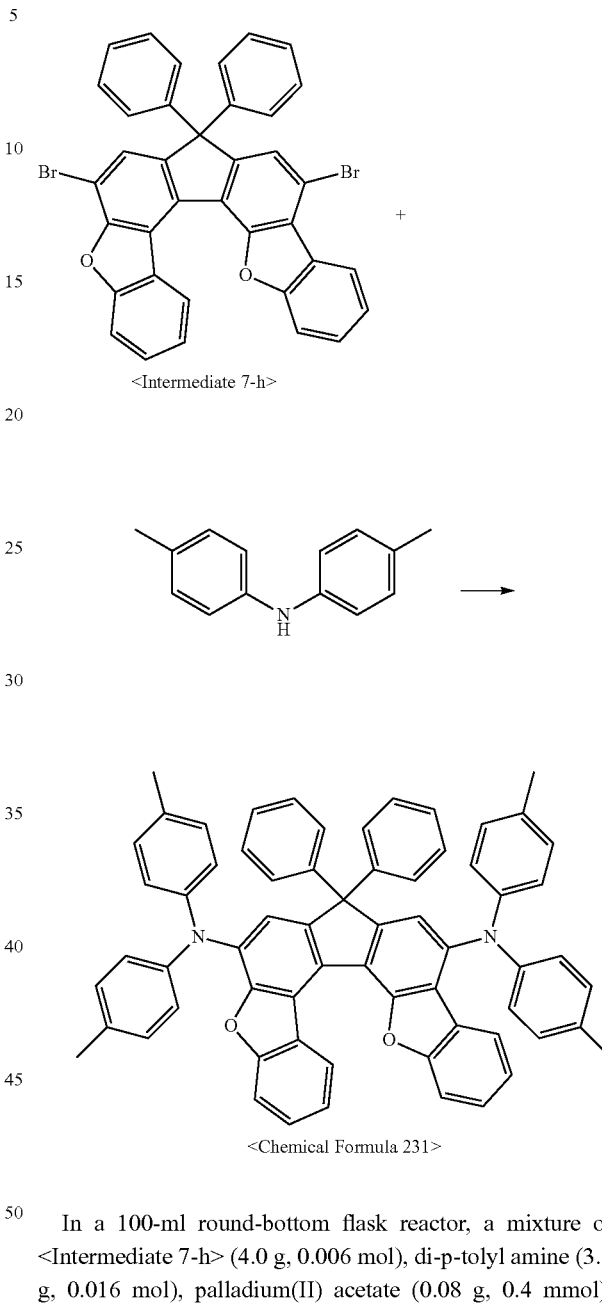

<Intermediate 7-h>

In a 100-mL round-bottom flask reactor, a mixture of <Intermediate 7-g> (20 g, 58 mmol) and dichloromethane (40 ml) was stirred at room temperature. A dilution of bromine (5.8 ml, 116 mmol) in dichloromethane (10 ml) was dropwise added to the reactor and stirred for 8 hours at room temperature. After completion of the reaction, acetone (20 ml) was added to the reactor and stirred. The solid thus formed was filtered and washed with acetone. Recrystallization in monochlorobenzene afforded <Intermediate 7-h> as a solid (15.8 g, 55%).

Synthesis Example 7-(9): Synthesis of Compound of Chemical Formula 231

In a 100-ml round-bottom flask reactor, a mixture of <Intermediate 7-h> (4.0 g, 0.006 mol), di-p-tolyl amine (3.2 g, 0.016 mol), palladium(II) acetate (0.08 g, 0.4 mmol), sodium tert-butoxide (3.2 g, 0.032 mol), tri-tert-butyl phosphine (0.08 g, 0.4 mmol), and toluene (50 ml) was stirred for 2 hours under reflux. After completion of the reaction, the reaction mixture was cooled to room temperature and then extracted with dichloromethane and water. The organic layer thus formed was separated, dried over magnesium sulfate, and concentrated in a vacuum. The concentrate was purified by column chromatography and recrystallized in dichloromethane and acetone to afford the compound of <Chemical Formula 231> (2.1 g, 41%).

MS (MALDI-TOF): m/z 890.0 [M$^+$]

Preparation of Material for Electron Density Control Layer (EDCL)

Synthesis Example 8: Synthesis of Compound 203

Synthesis Example 8-(1): Synthesis of Intermediate 8-a

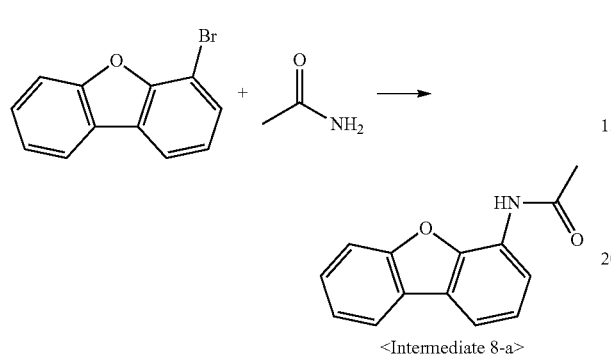

In a 2-L round-bottom flask reactor, 4-bromodibenzofuran (150.0 g, 0.607 mol), acetamide (53.8 g, 0.911 mol), copper iodide (57.8 g, 0.30 mol), (±)trans-1,2-diaminocyclihexane (63.9 g, 0.60 mol), potassium carbonate (167.8 g, 1.21 mol), and toluene (1500 ml) were together stirred under reflux. After completion of the reaction, the reaction mixture was filtered through a silica gel pad and then washed many times with hot toluene. The filtrate was concentrated in a vacuum, and the concentrate was crystalized in acetonitrile and filtered to afford <Intermediate 8-a> as a solid. (70.0 g, 51%)

Synthesis Example 8-(2): Synthesis of Intermediate 8-b

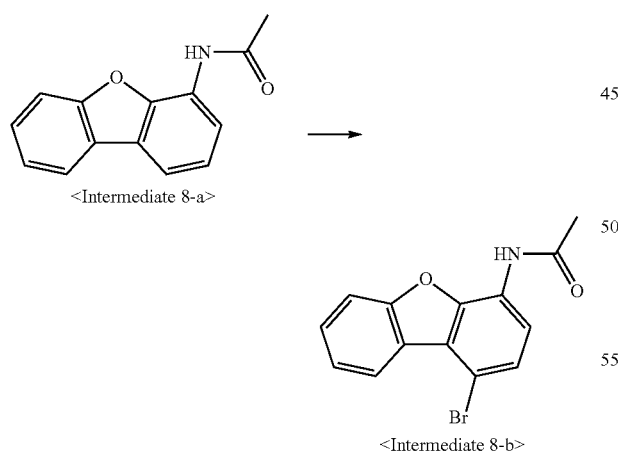

In a 2-L round-bottom flask reactor, <Intermediate 8-a> (70.0 g, 0.311 mol) was dissolved in acetic acid (630 ml). A mixture of bromine (49.7 g, 0.311 mol) and acetic acid (280 ml) was dropwise added to the reactor, followed by stirring at room temperature for 2 hours. After completion of the reaction, water (100 ml) was added to the reaction mixture, which was then stirred. The gray solid thus formed was placed in ethanol (500 ml), stirred, and filtered. The solid was slurried in ethanol, filtered and dried to afford <Intermediate 8-b>. (86.0 g, 91%)

Synthesis Example 8-(3): Synthesis of Intermediate 8-c

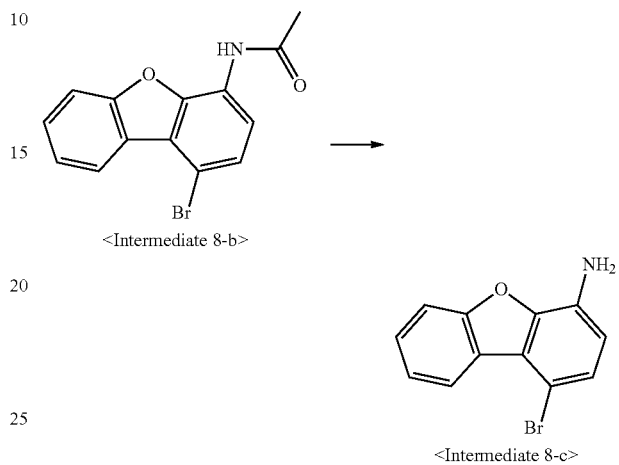

In a 2-L round-bottom flask reactor, <Intermediate 8-b> (86.0 g, 0.283 mol) was dissolved in ethanol (600 ml) and tetrahydrofuran (430 ml) and stirred. A solution of potassium hydroxide (47.6 g, 0.848 mol) in water (260 ml) was slowly added to the reactor and stirred overnight under reflux. After completion of the reaction, the reaction mixture was cooled to room temperature. Extraction with ethyl acetate and water was conducted, followed by isolation and vacuum concentration of the organic layer. The solid thus obtained was added with an excess of ethanol, stirred, and then filtered. Recrystallization in methylene chloride and heptane afforded <Intermediate 8-c>. (73.0 g, 98%)

Synthesis Example 8-(4): Synthesis of Intermediate 8-d

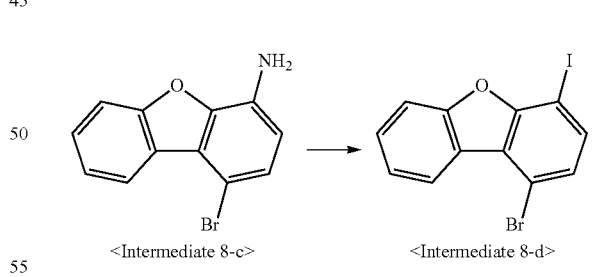

In a 2-L round-bottom flask reactor, <Intermediate 8-c> (73.0 g, 0.279 mol), HCl (90 ml), and water (440 ml) were cooled to 0° C. and stirred together. A solution of sodium nitrite (25.0 g, 0.362 mol) in water (90 ml) was dropwise added to the reactor and stirred at the same temperature for 1 hour. Again, a solution of potassium iodide (92.5 g, 0.557 mol) in water (90 ml) was dropwise added to the reactor and stirred at room temperature. After completion of the reaction, the reaction mixture was extracted with ethyl acetate and water. The organic layer was washed with an aqueous sodium thiosulfate pentahydrate solution, isolated, and concentrated in a vacuum. Purification by column chromatography afforded <Intermediate 8-d>. (52.3 g, 50.3%)

Synthesis Example 8-(5): Synthesis of Intermediate 8-e

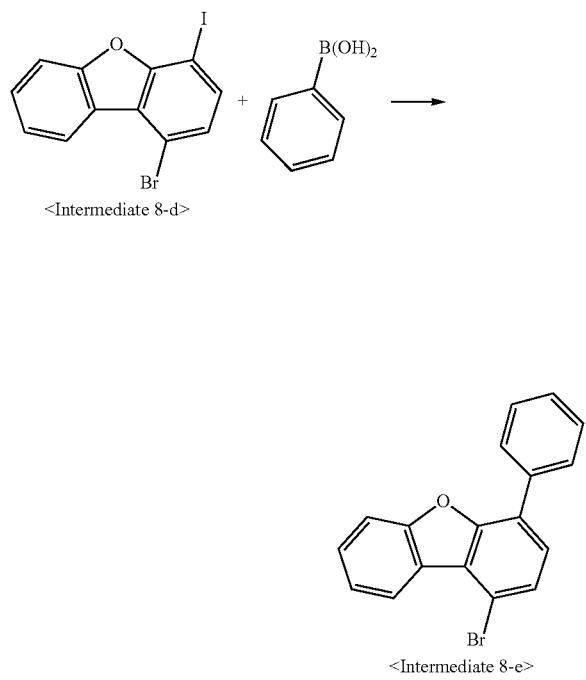

<Intermediate 8-d>

<Intermediate 8-e>

In a 2-L round-bottom flask reactor were placed <Intermediate 8-d> (15.0 g, 40 mmol), phenylboronic acid (5.4 g, 44 mmol), tetrakis(triphenylphosphine)palladium (0.9 g, 1 mmol), and potassium carbonate (11.1 g, 80 mmol), followed by toluene (100 mL), methanol (45 mL), and water (30 mL). The mixture was stirred overnight under reflux. After completion of the reaction, the reaction mixture was cooled to room temperature and extracted with ethyl acetate. The organic layer thus formed was concentrated in a vacuum and isolated by column chromatography. Recrystallization in heptane afforded <Intermediate 8-e> as a solid. (7.0 g, 53.9%)

Synthesis Example 8-(6): Synthesis of Compound 203

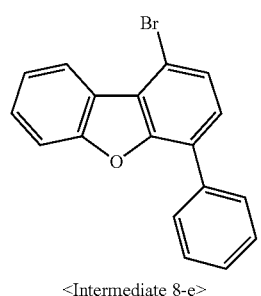

<Intermediate 8-e>

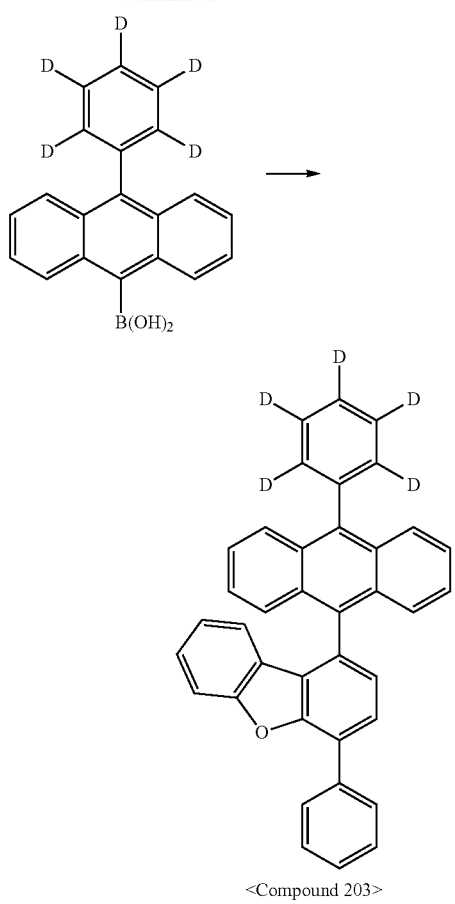

<Compound 203>

In a 250-mL round-bottom flask reactor were placed <Intermediate 8-e> (7.0 g, 22 mmol), 10-phenyl($d_5$)-anthracene-9-boronic acid (7.9 g, 26 mmol), tetrakis(triphenylphosphine)palladium (0.5 g, 1 mmol), and potassium carbonate (6.0 g, 43 mmol), followed by toluene (50 mL), ethanol (21 mL), and water (14 mL). The reactor was heated to 90° C. before stirring overnight. After completion of the reaction, the reaction mixture was cooled to room temperature and then stirred together with methanol (50 ml) at room temperature. The solid thus formed was washed with methanol. Recrystallization in toluene and acetone afforded <Compound 203> as a solid.

MS (MALDI-TOF): m/z 501.21 [M⁺]

Synthesis Example 9: Synthesis of Compound 209

Synthesis Example 9-(1): Synthesis of Intermediate 9-a

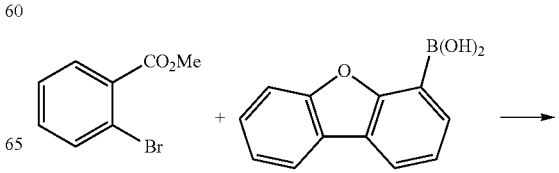

Synthesis Example 9-(3): Synthesis of Intermediate 9-c

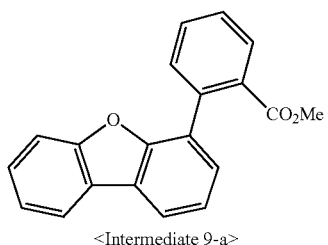

<Intermediate 9-a>

In a 500-mL round-bottom flask reactor were placed methyl 2-bromobenzoate (30.0 g, 0.140 mol), 4-dibenzofuran boronic acid (32.5 g, 0.153 mol), tetrakis(triphenylphosphine) palladium (3.2 g, 3 mmol), and potassium carbonate (38.6 g, 0.279 mol), followed by toluene (210 mL), methanol (90 mL), and water (60 mL). The mixture was stirred overnight under reflux. After completion of the reaction, the reaction mixture was cooled to room temperature and extracted with ethylacetate. After being isolated, the organic layer was concentrated in a vacuum. Purification by column chromatography afforded <Intermediate 9-a>. (25.0 g, 59.1%)

Synthesis Example 9-(2): Synthesis of <Intermediate 9-b>

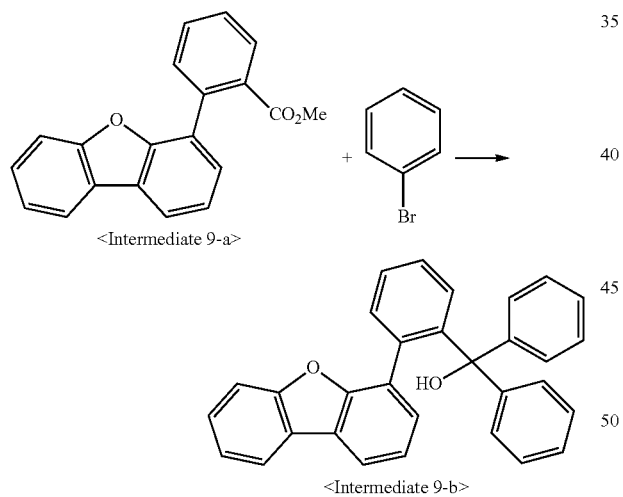

<Intermediate 9-a>

<Intermediate 9-b>

In a 500-ml round-bottom flask reactor, a mixture of bromobenzene (28.6 g, 182 mmol) and tetrahydrofuran (220 ml) was chilled to −78° C. under a nitrogen atmosphere. To the chilled reaction solution, n-butyl lithium (104.6 ml, 167 mmol) was dropwise added at the same temperature, followed by stirring for 2 hours. <Intermediate 9-a> (22.0 g, 73 mmol) was added little by little to the reaction solution while stirring at room temperature. After the reaction was stopped with H$_2$O (50 ml), extraction was conducted with ethyl acetate and water. The organic layer was separated and concentrated in a vacuum afford <Intermediate 9-b>. (28.0 g, 90%)

Synthesis Example 9-(3): Synthesis of Intermediate 9-c

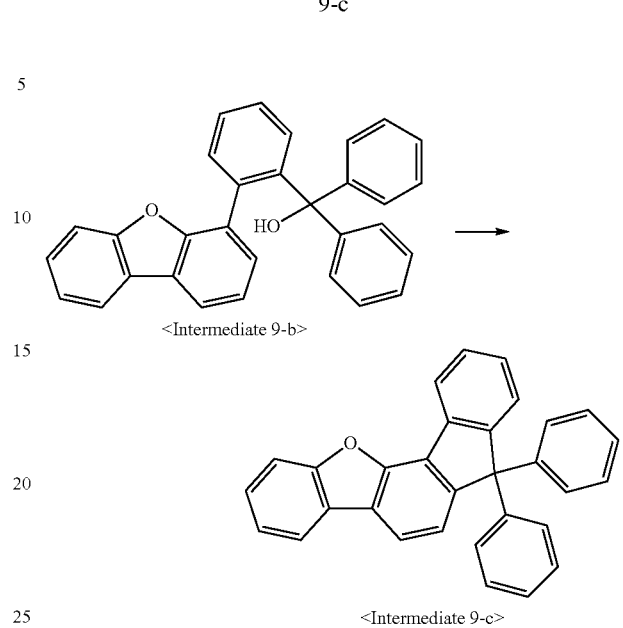

<Intermediate 9-b>

<Intermediate 9-c>

In a 500-ml round-bottom flask reactor, a mixture of <Intermediate 9-b> (28.0 g, 66 mmol), acetic acid (310 ml) and HCl (2 ml) was stirred for 1 hour under reflux. When a precipitate was formed, the completion of the reaction was confirmed using thin-layer chromatography. Thereafter, the reaction mixture was cooled to room temperature and filtered. The filtrate was washed with H$_2$O and methanol and dried to afford <Intermediate 9-c>. (22.3 g, 83.2%)

Synthesis Example 9-(4): Synthesis of Intermediate 9-d

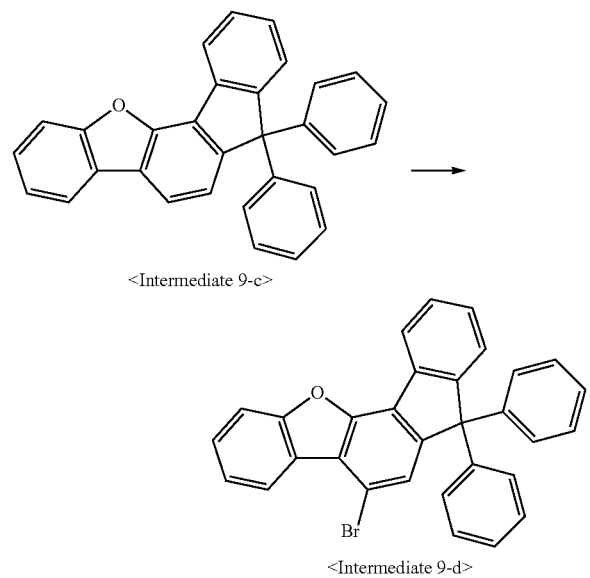

<Intermediate 9-c>

<Intermediate 9-d>

In a 2-L round-bottom flask reactor, Intermediate 2-c (22.3 g, 55 mmol) was dissolved in methylene chloride (500 ml). Drops of a solution of bromine (8.72 g, 55 mmol) in methylene chloride (250 ml) were slowly added to the reactor, and the mixture was then stirred at room temperature for 3 hours. After completion of the reaction, the reaction mixture was washed with an aqueous sodium hydrogen carbonate solution. The precipitate thus formed was filtered and recrystallized in toluene and acetone to afford <Intermediate 9-d>. (25.0 g, 94%)

Synthesis Example 9-(5): Synthesis of Compound 209

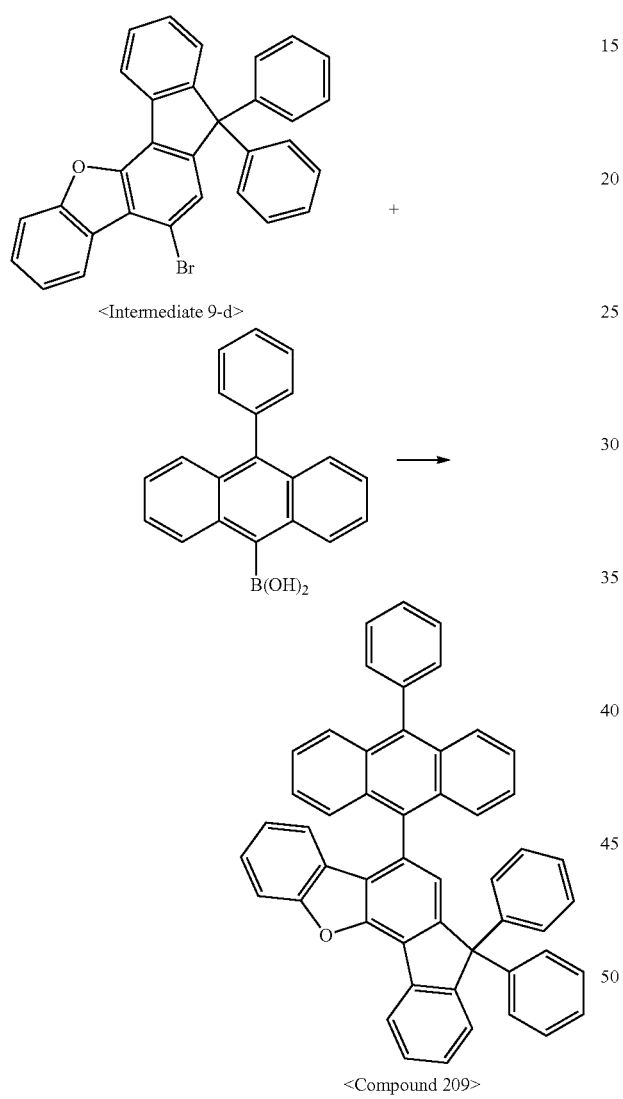

In a 250-mL round-bottom flask reactor were placed <Intermediate 9-d> (7.0 g, 14 mmol), (10-phenyl-anthracene-9-boronic acid (5.1 g, 17 mmol), tetrakis(triphenylphosphine)palladium (0.3 g, 3 mmol), and potassium carbonate (4.0 g, 29 mmol), followed by toluene (49 mL), ethanol (21 mL), and water (14 mL). The mixture was heated to 90° C. and stirred overnight. After completion of the reaction, the reaction mixture was cooled to room temperature and extracted with ethyl acetate. The organic layer thus formed was separated and concentrated in a vacuum. Following purification by column chromatography, recrystallization in methylene chloride and acetone afforded <Compound 209> as a crystal.

MS (MALDI-TOF): m/z 660.25 [M+]

Synthesis Example 10: Synthesis of Compound 213

Synthesis Example 10-(1): Synthesis of Intermediate 10-a

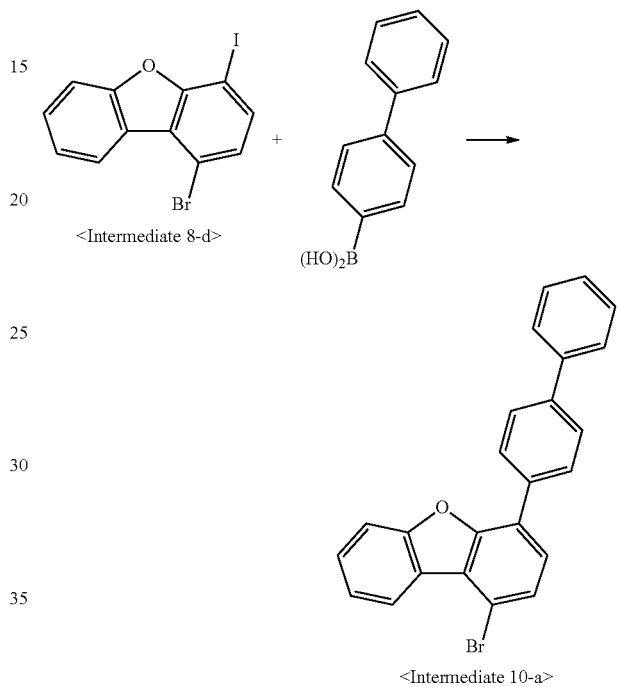

The same procedure as in Synthesis Example 8-(5) was performed, with the exception of using 4-biphenyl boronic acid instead of phenyl boronic acid, to afford <Intermediate 10-a> (8.5 g, 55.9%).

Synthesis Example 10-(2): Synthesis of Compound 213

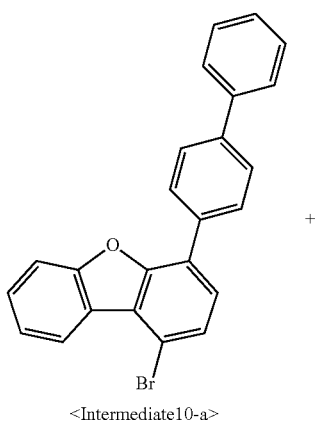

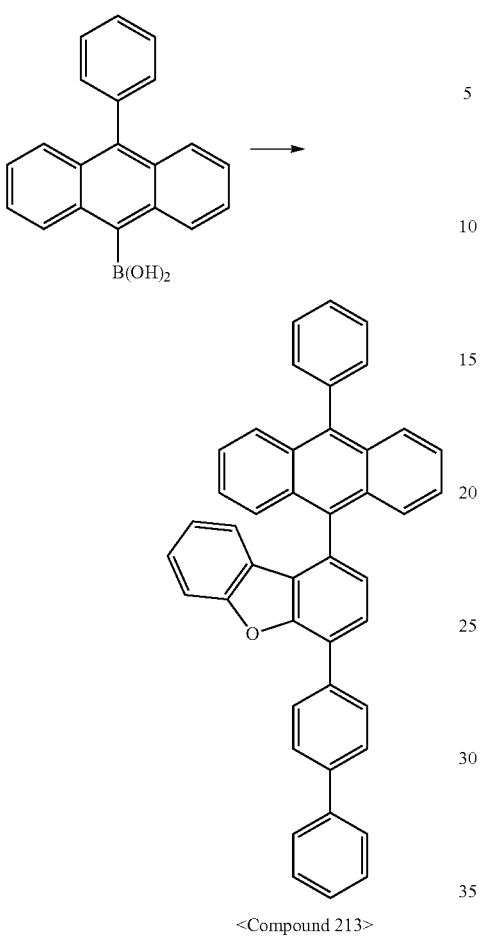

<Compound 213>

The same procedure as in Synthesis Example 9-(5) was performed, with the exception of using <Intermediate 10-a> instead of <Intermediate 9-d>, to afford <Compound 213> (6.3 g, 51%).

MS (MALDI-TOF): m/z 572.21 [M$^+$]

Synthesis Example 11: Synthesis of Compound 281

Synthesis Example 11-(1): Synthesis of Intermediate 11-a

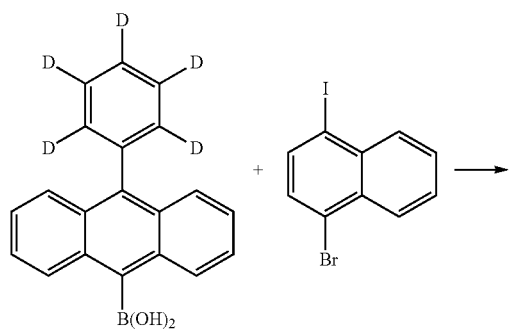

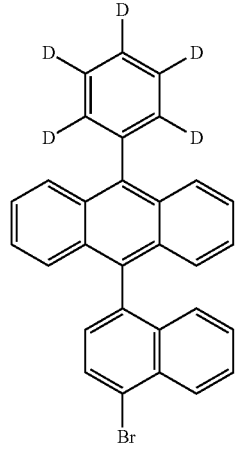

<Intermediate 11-a>

In a 500-mL round-bottom flask reactor were placed 10-phenyl(d$_5$)-anthracene-9-boronic acid (38.6 g, 127 mmol), 1-bromo-4-iodonaphthalene (35.3 g, 106 mmol), tetrakis(triphenylphosphine)palladium (3.43 g, 3 mmol), and potassium carbonate (27.35 g, 197.9 mmol), followed by toluene (150 mL), tetrahydrofuran (150 mL), and water (60 mL). The reactor was heated to 90° C., followed by stirring overnight. After completion of the reaction, the reaction mixture was cooled to room temperature and extracted with ethyl acetate. The organic layer thus formed was isolated, concentrated in a vacuum, and purified through column chromatography to afford <Intermediate 11-a>. (39.2 g, 79.7%)

Synthesis Example 11-(2): Synthesis of Intermediate 11-b

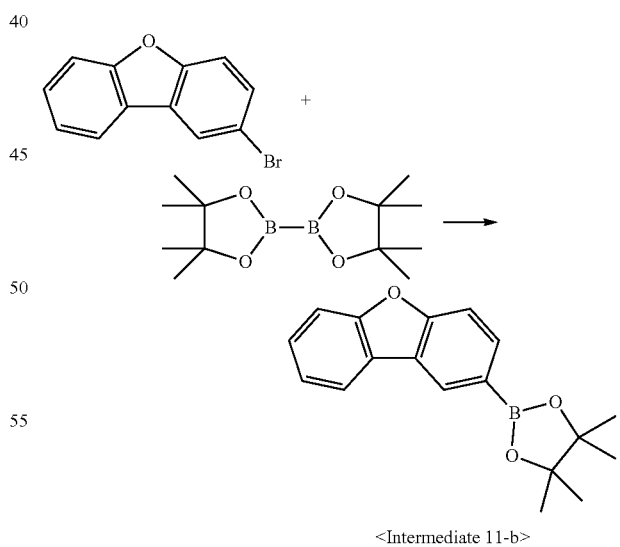

<Intermediate 11-b>

In a 2-L round-bottom flask reactor, 2-bromodibenzofuran (70.0 g, 0.283 mol), bis(pinacolato)diboron (86.3 g, 0.340 mol), 1,1'-bis(diphenylphosphino)ferrocene-palladium(II) dichloride (4.6 g, 0.006 mol), potassium acetate (56.6 g, 0.567 mol), and 1,4-dioxane (700 ml) were stirred together overnight under reflux. After completion of the reaction, the reaction mixture was filtered through a celite pad and the filtrate was concentrated in a vacuum. Purification by column chromatography afforded <Intermediate 11-b>. (66.4 g, 79%)

Synthesis Example 11-(3): Synthesis of Compound 281

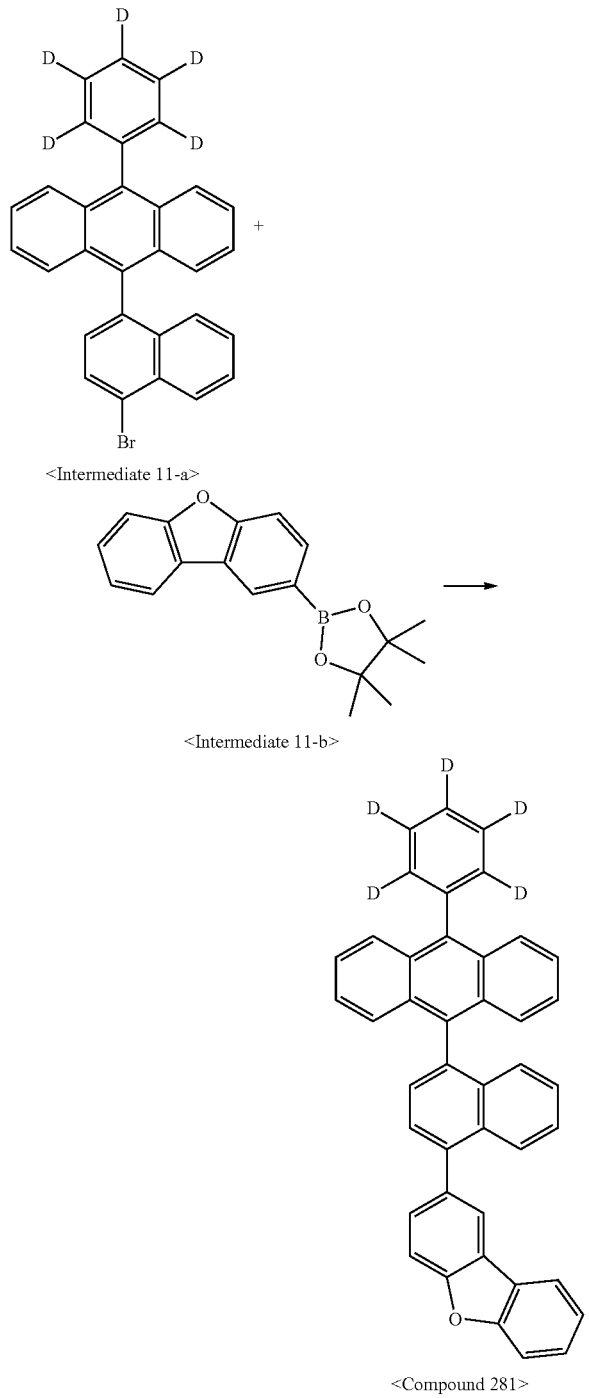

The same procedure as in Synthesis Example 11-(1) was carried out, with the exception of using <Intermediate 11-b> and <Intermediate 11-a> instead of 10-phenyl($d_5$)-anthracene-9-boronic acid and 1-bromo-4-iodonaphthalene, respectively, to afford <Compound 281> (8.5 g, 66.5%).

MS (MALDI-TOF): m/z 551.23 [M$^+$]

Examples 1 to 7: Fabrication of Organic Light-Emitting Diode

An ITO glass substrate was patterned to have a translucent area of 2 mm×2 mm and then rinsed. The ITO glass was mounted in a vacuum chamber, which was then set to have a base pressure of 1×10$^7$ torr. On the ITO glass substrate, films were formed of DNTPD (700 Å) and α-NPD (300 Å) in that order. A light-emitting layer (250 Å) was formed of a mixture including [BH] as a host and each of the compounds shown in Table 1 as a dopant (weight ratio 97:3). Then, each of the compounds given in Table 1 below was deposited to form an electron density control layer (50 Å), followed by forming a film (250 Å) with each of the compounds given for electron transport layer in Table 1, below. On the electron transport layer was formed an electron injection layer of [Chemical Formula E-1] (5 Å thick), which was then covered with an Al layer (1000 Å) to fabricate an organic light-emitting diode.

The organic light-emitting diodes thus obtained were measured at 0.4 mA/cm$^2$ to determine the luminescence properties thereof.

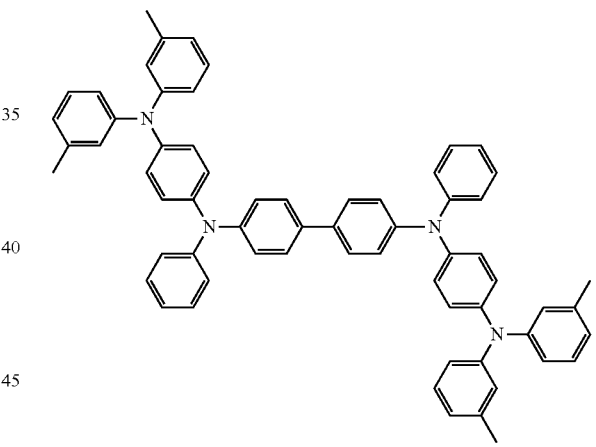

[DNTPD]

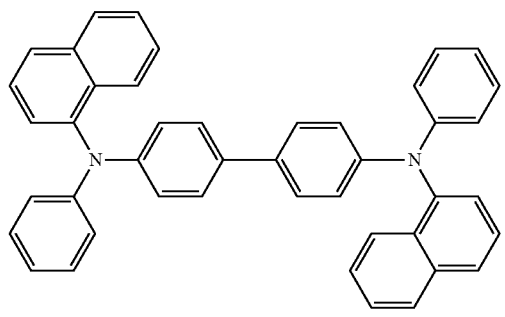

[α-NPD]

-continued

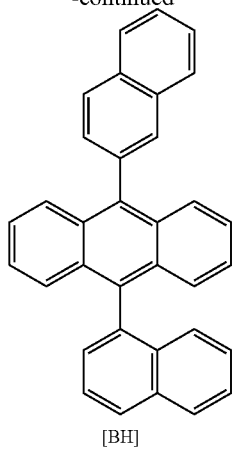

[BH]

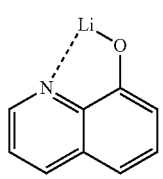

[Compound E-1]

Example 8

An organic light-emitting device was fabricated in the same manner as in Examples 1 to 7, with the exception that an electron density control layer formed of the compounds shown in Table 1 was not employed and that an electron transport layer (300 Å) was formed of [Compound 3]. The organic light-emitting device was measured at 10 mA/cm² to determine the luminescence properties thereof.

Example 9

An organic light-emitting device was fabricated in the same manner as in Example 8, with the exception of employing the compound of Chemical Formula 231 as the dopant and [Compound 57] for the electron transport layer. The organic light-emitting device was measured at 10 mA/cm² to determine the luminescence properties thereof.

Example 10

An organic light-emitting device was fabricated in the same manner as in Example 8, with the exception of employing the compound of Chemical Formula 231 as the dopant and [Compound 61] for the electron transport layer. The organic light-emitting device was measured at 10 mA/cm² to determine the luminescence properties thereof.

Example 11

An organic light-emitting device was fabricated in the same manner as in Example 8, with the exception of employing [Compound 61] for the electron transport layer. The organic light-emitting device was measured at 10 mA/cm² to determine the luminescence properties thereof.

Example 12

An organic light-emitting device was fabricated in the same manner as in Example 8, with the exception of employing the compound of Chemical Formula 231 as the dopant and [Compound 62] for the electron transport layer. The organic light-emitting device was measured at 10 mA/cm² to determine the luminescence properties thereof.

Example 13

An organic light-emitting device was fabricated in the same manner as in Example 8, with the exception of employing the compound of Chemical Formula 231 as the dopant and [Compound 63] for the electron transport layer. The organic light-emitting device was measured at 10 mA/cm² to determine the luminescence properties thereof.

Comparative Example 1

An organic light-emitting device was fabricated in the same manner as in Example 8, with the exception of employing the conventional material [Compound E-2], instead of [Compound 3], for the electron transport layer. The organic light-emitting device was measured at 10 mA/cm² to determine the luminescence properties thereof.

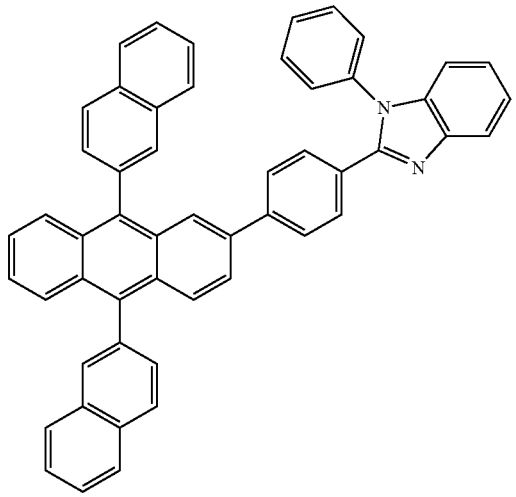

[Compound E-2]

Comparative Example 2

An organic light-emitting device was fabricated in the same manner as in Example 8, with the exception of employing the conventional material [Alq3], instead of [Compound 3], for the electron transport layer. The organic light-emitting device was measured at 10 mA/cm² to determine the luminescence properties thereof.

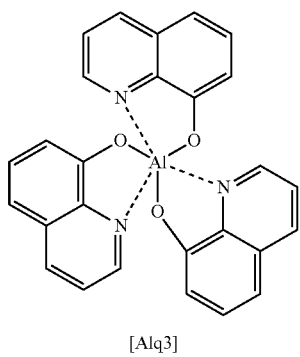

[Alq3]

TABLE 1

| Ex. No. | Dopant | Electron Density Control Layer (EDCL) | ETL | V | CIEx | CIEy | EQE |
|---|---|---|---|---|---|---|---|
| Ex. 1 | Chemical Formula 1 | Compound 203 | Compound 3 | 3.43 | 0.138 | 0.106 | 12.31 |
| Ex. 2 | Chemical Formula 1 | Compound 209 | Compound 3 | 3.45 | 0.137 | 0.110 | 12.05 |
| Ex. 3 | Chemical Formula 231 | Compound 213 | Compound 3 | 3.42 | 0.138 | 0.105 | 12.12 |
| Ex. 4 | Chemical Formula 1 | Compound 203 | Compound 57 | 3.28 | 0.138 | 0.106 | 11.45 |
| Ex. 5 | Chemical Formula 1 | Compound 209 | Compound 57 | 3.31 | 0.138 | 0.104 | 12.02 |
| Ex. 6 | Chemical Formula 231 | Compound 213 | Compound 57 | 3.26 | 0.138 | 0.104 | 11.96 |
| Ex. 7 | Chemical Formula 1 | Compound 281 | Compound 3 | 3.44 | 0.137 | 0.109 | 11.61 |
| Ex. 8 | Chemical Formula 1 | — | Compound 3 | 3.63 | 0.138 | 0.107 | 11.09 |
| Ex. 9 | Chemical Formula 231 | — | Compound 57 | 3.47 | 0.138 | 0.107 | 10.94 |
| Ex. 10 | Chemical Formula 231 | — | Compound 61 | 3.82 | 0.138 | 0.107 | 10.44 |
| Ex. 11 | Chemical Formula 1 | — | Compound 61 | 3.51 | 0.138 | 0.107 | 10.50 |
| Ex. 12 | Chemical Formula 231 | — | Compound 62 | 3.56 | 0.137 | 0.108 | 10.68 |
| Ex. 13 | Chemical Formula 231 | — | Compound 63 | 3.76 | 0.137 | 0.109 | 11.04 |
| C. Ex. 1 | Chemical Formula 1 | — | Chemical Formula E-2 | 3.66 | 0.137 | 0.110 | 9.92 |
| C. Ex. 2 | Chemical Formula 2 | — | Alq3 | 3.76 | 0.138 | 0.107 | 8.88 |

Figure 4:
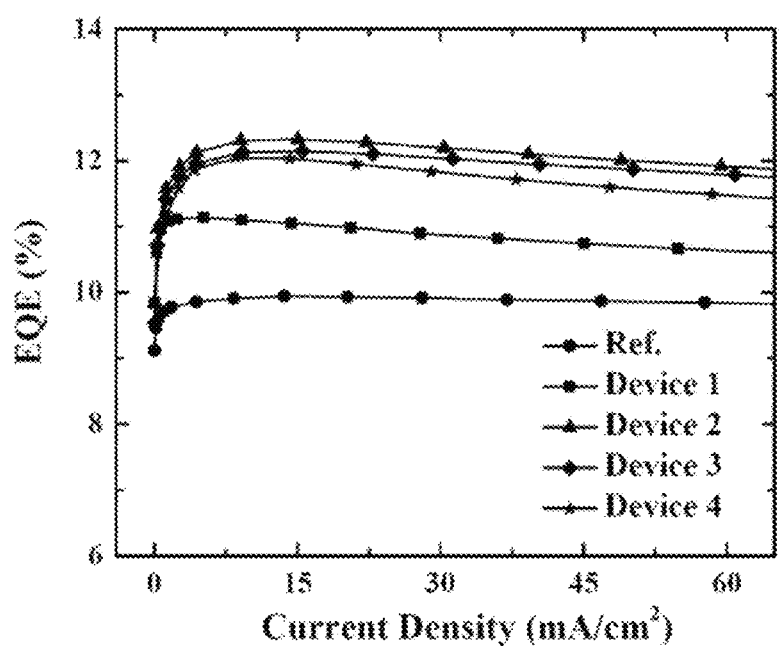
FIG. 4 is a graph in which external quantum efficiencies of organic light-emitting diodes according to the Examples and Comparative Examples are plotted with current densities.

FIG. 4 is a graph in which the external quantum efficiencies of organic light-emitting diodes according to the Examples and Comparative Examples are plotted with current densities. In FIG. 4, the plot of Ref. is depicted from the results of Comparative Example 1, while the plots of Device 1 and Devices 2 to 4 are depicted from the results of Example 7 and Examples 1 to 3, respectively.

As is understood from the data of Table 1 and FIG. 4, the organic light-emitting diodes according to the present invention can be operated at lower driving voltages and have higher EQE than those of Comparative Examples 1 and 2, employing the conventional compounds for an electron transport layer, thus finding better applications.

Further, far lower driving voltages and far higher EQE were found in the organic light-emitting diodes of Examples 1 to 7, which employed an electron density control layer, than those of Examples 8 to 13, which lacked an electron density control layer.

INDUSTRIAL APPLICABILITY

The present invention provides an organic light-emitting diode exhibiting excellent device characteristics of high efficiency and low driving voltage, and thus is industrially available.

The invention claimed is:

1. An organic light-emitting diode, comprising:
a first electrode;
a second electrode facing the first electrode; and
a light-emitting layer and an electron transport layer sequentially arranged between the first and the second electrode,
wherein the light-emitting layer contains at least one of the amine compounds represented by following Chemical Formula A or Chemical Formula B, and the electron transport layer contains at least one of the compounds represented by the following Chemical Formula E:

[Chemical Formula A]

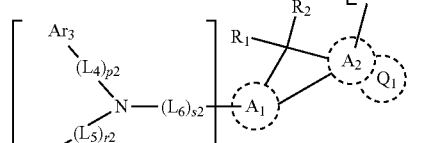

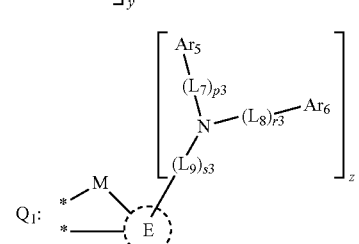

-continued

[Chemical Formula B]

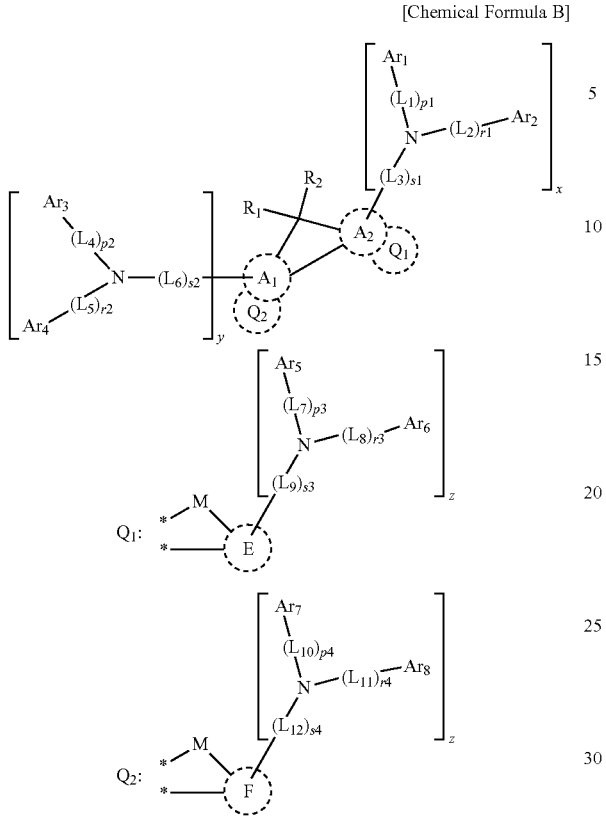

[Chemical Formula E]

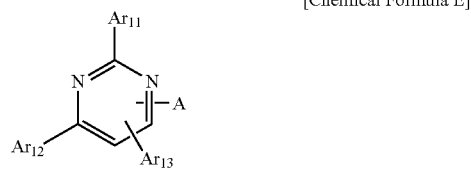

wherein,
A₁, A₂, E, and F may be the same or different, and are each independently a substituted or unsubstituted aromatic hydrocarbon ring of 6 to 50 carbon atoms, or a substituted or unsubstituted heteroaromatic ring of 2 to 40 carbon atoms, wherein two adjacent carbon atoms within the aromatic ring A₁ and two adjacent carbon atoms within the aromatic ring A₂ form a 5-membered fused ring with a carbon atom to which the substituents R₁ and R₂ are both bonded;

linkers L₁ to L₁₂ may be the same or different, and are each independently selected from among a single bond and substituted or unsubstituted arylene of 6 to 60 carbon atoms;

M is any one selected from among N—R₃, CR₄R₅, O, and S;

R₁ to R₅, and Ar₁ to Ar₈ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkylsilyl of 1 to 30 carbon atoms, a substituted or unsubstituted arylsilyl of 6 to 30 carbon atoms, a substituted or unsubstituted alkylgermanium of 1 to 30 carbon atoms, a substituted or unsubstituted arylgermanium of 6 to 30 carbon atoms, a cyano, a nitro, and a halogen, with the proviso that R₁ and R₂ may be bonded to each other to form a mono- or polycyclic aliphatic or aromatic ring, which may be a heterocyclic ring containing at least one heteroatom selected from among N, O, P, Si, and S as a ring member;

p1 to p4, r1 to r4, and s1 to s4 are each independently an integer of 1 to 3, with the proviso that when any of them is 2 or greater, the corresponding linkers may be the same or different, in Chemical Formula A, x is 1, and y and z are the same or different and are each independently an integer of 0 or 1 wherein y+z is not zero;

in Chemical Formula B, x is 1, and y and z are the same or different and are each independently an integer of 0 or 1; and respective rings may be formed through linkages between Ar₁ and Ar₂, between Ar₃ and Ar₄, between Ar₅ and Ar₆, and between Ar₇ and Ar₈;

two adjacent carbon atoms of the A₂ ring moiety of Chemical Formula A may occupy respective positions * of Structural Formula Q₁ to form a fused ring; and two adjacent carbon atoms of the A₁ ring moiety of Chemical Formula B may occupy respective positions * of structural Formula Q₂ to form a fused ring, and two adjacent carbon atoms of the A₂ ring moiety of Chemical Formula B may occupy respective positions * of Structural Formula Q₁ to form a fused ring; and wherein, Ar₁₁, Ar₁₂, and Ar₁₃ may be the same or different, and are each independently a hydrogen atom, a deuterium atom, a substituted or unsubstituted aryl of 6 to 50 carbon atoms, or a substituted or unsubstituted heteroaryl of 2 to 50 carbon atoms, with the proviso that when Ar₁₂ is a hydrogen or deuterium atom, Ar₁₃ is neither a hydrogen atom nor a deuterium atom, A is a monovalent substituent represented by the following Structural Formula A:

[Structural Formula A]

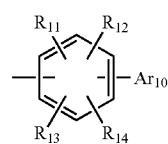

wherein Ar₁₀ is a substituted or unsubstituted heteroaryl of 2 to 50 carbon atoms, R₁₁ to R₁₄ may be the same or different, and are each independently any one selected from among a hydrogen atom, a deuterium atom, a fluorine atom, a chlorine atom, a cyano, a substituted or unsubstituted alkyl of 1 to 30 carbon atoms, a substituted or unsubstituted aryl of 6 to 50 carbon atoms, and a substituted or unsubstituted heteroaryl of 2 to 50 carbon atoms, wherein 'substituted' in an expression 'substituted or unsubstituted' used in Chemical Formulas A, B, and E means having at least one substituent selected from the group consisting of a deuterium atom, a cyano, a halogen, a nitro, an alkyl of 1 to 24 carbon atoms, a halogenated alkyl of 1 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkylsilyl of 1 to 24 carbon atoms, and an arylsilyl of 6 to 24 carbon atoms.

2. The organic light-emitting diode of claim 1, wherein the compound represented by Chemical Formula E is a compound represented by the following Chemical Formula E-1:

[Chemical Formula E-1]

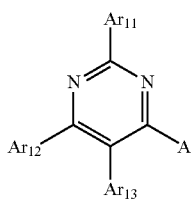

wherein $Ar_{11}$ to $Ar_{13}$ and A are each as defined in claim 1.

3. The organic light-emitting diode of claim 1, wherein the compound represented by Chemical Formula E is a compound represented by the following Chemical Formula E-2:

[Chemical Formula E-2]

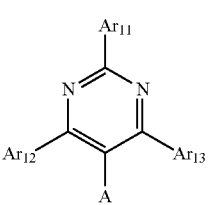

wherein $Ar_{11}$ to $Ar_{13}$ and A are each as defined in claim 1.

4. The organic light-emitting diode of claim 1, wherein $A_1$, $A_2$, E, and F in Chemical Formula A or B may be same or different and are each independently substituted or unsubstituted aromatic hydrocarbon rings of 6 to 50.

5. The organic light-emitting diode of claim 4, wherein the substituted or unsubstituted aromatic hydrocarbon rings of 6 to 50 carbon atoms may be same or different and are each independently any one selected from among the compounds represented by the following [Structural Formula 10] to [Structural Formula 21]:

[Structural Formula 10]

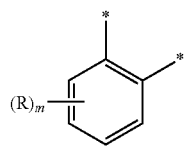

[Structural Formula 11]

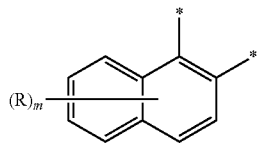

[Structural Formula 12]

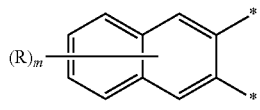

[Structural Formula 13]

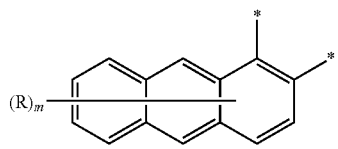

[Structural Formula 14]

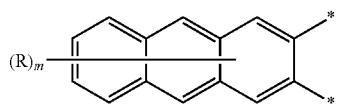

[Structural Formula 15]

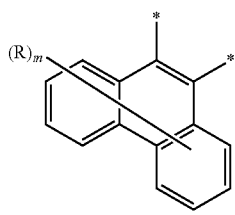

[Structural Formula 16]

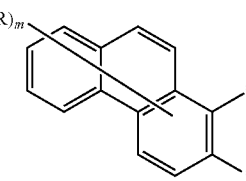

[Structural Formula 17]

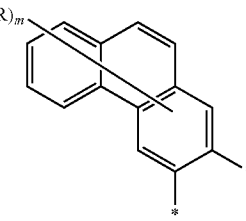

[Structural Formula 18]

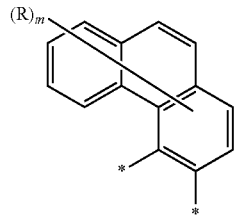

[Structural Formula 19]

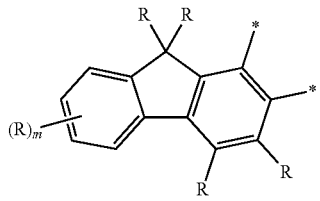

[Structural Formula 20]

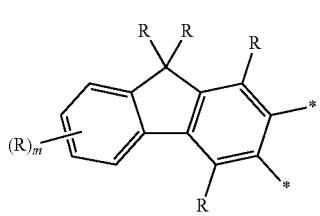

[Structural Formula 21]

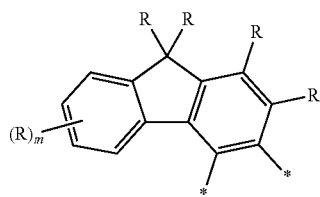

wherein
"-*" denotes a bonding site for forming a 5-membered ring bearing a carbon atom which is connected to both the substituents $R_1$ and $R_2$ or a bonding site for forming a 5-membered ring bearing M of the Structural Formulas $Q_1$ and $Q_2$;
when one of the aromatic hydrocarbon rings of [Structural Formula 10] to [Structural Formula 21] for $A_1$ or $A_2$ is bonded to Structural Formula $Q_1$ or Structural Formula $Q_2$, two adjacent carbon atoms of the aromatic hydrocarbon ring occupy respective positions * of Structural Formula $Q_1$ or $Q_2$ to form a fused ring; and
R's are the same as defined above for $R_1$ and $R_2$, and m is an integer of 1 to 8, with a proviso that when m is 2 or greater or two or more R's exist, the corresponding R's may be the same or different.

6. The organic light-emitting diode of claim 1, wherein linkers Li to Liz in Chemical Formulas A and B are a single bond or any one selected from among the compounds represented by the following [Structural Formula 22], [Structural Formula 23], [Structural Formula 25], [Structural Formula 27], [Structural Formula 28], and [Structural Formula 30]:

[Structural Formula 22]

[Structural Formula 23]

[Structural Formula 25]

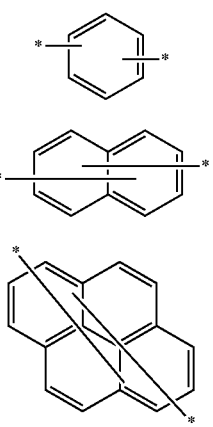

[Structural Formula 27]

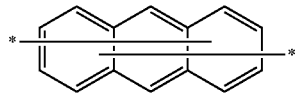

[Structural Formula 28]

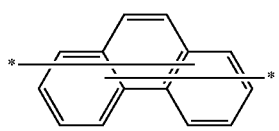

[Structural Formula 30]

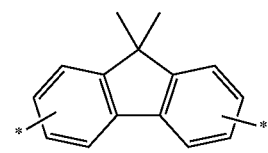

wherein each of the unsubstituted carbon atoms of the aromatic ring moiety may be bound with a hydrogen atom or a deuterium atom.

7. The organic light-emitting diode of claim 1, wherein the Structural Formula A is the following [Structural Formula A-1]:

[Structural Formula A-1]

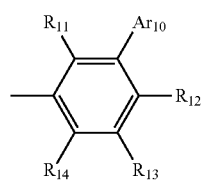

wherein $R_{11}$ to $R_{14}$, and $Ar_{10}$ are each as defined in claim 1.

8. The organic light-emitting diode of claim 1, wherein the amine Compound is any one selected from among the compounds represented by [Chemical Formula 1] to [Chemical Formula 239]:

<Chemical Formula 1>

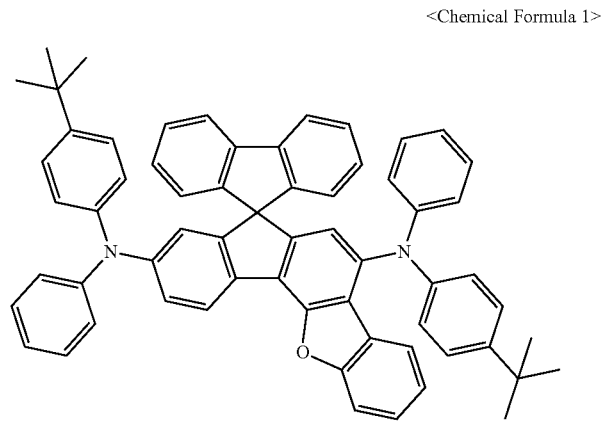

<Chemical Formula 2>

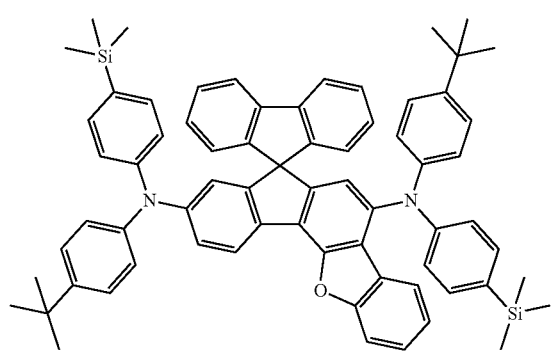

-continued
<Chemical Formula 3>
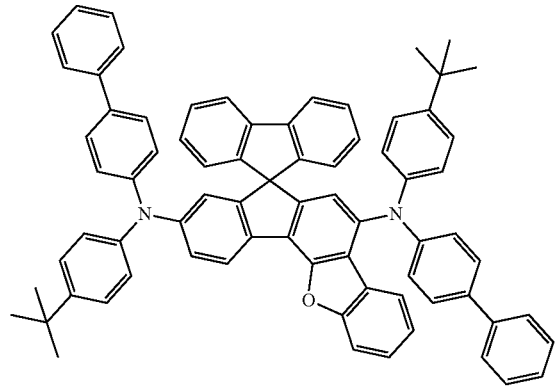
<Chemical Formula 4>
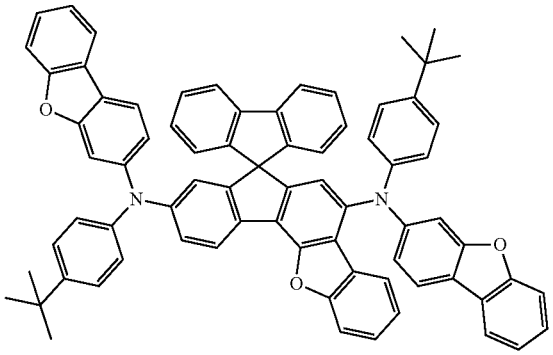
<Chemical Formula 5>
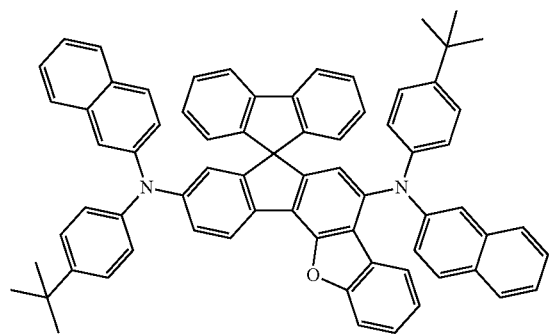
<Chemical Formula 6>
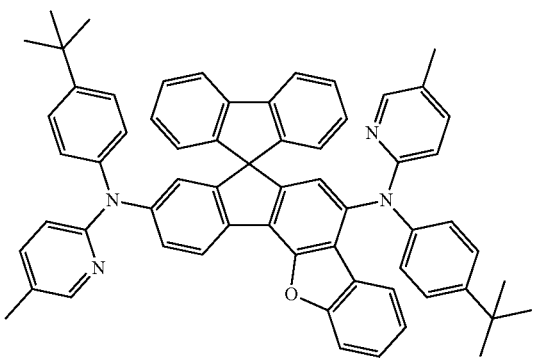
<Chemical Formula 7>
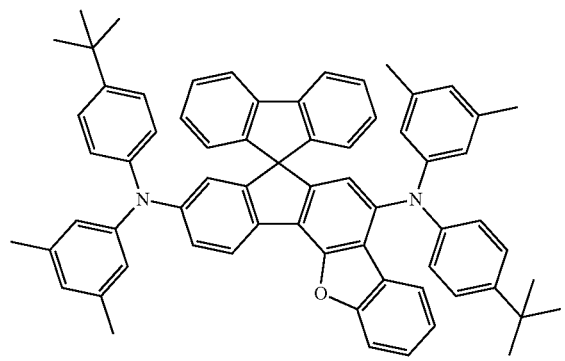
<Chemical Formula 8>
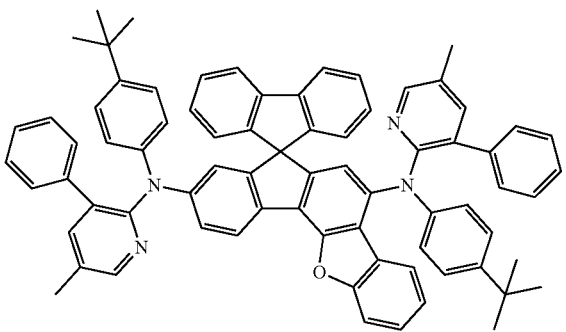
<Chemical Formula 9>
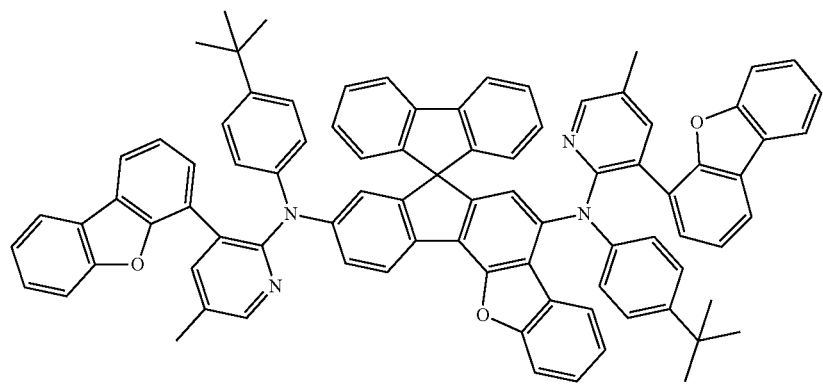

-continued
<Chemical Formula 10>
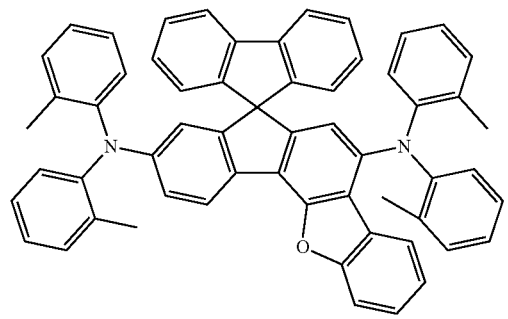
<Chemical Formula 11>
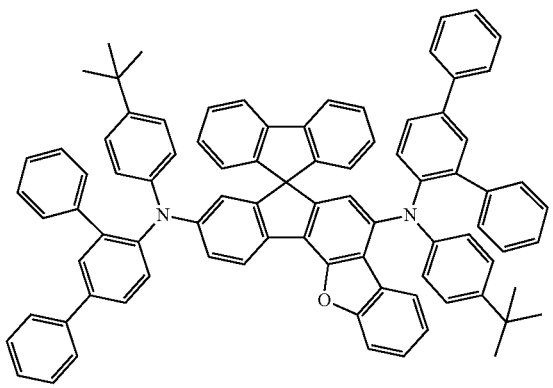
<Chemical Formula 12>
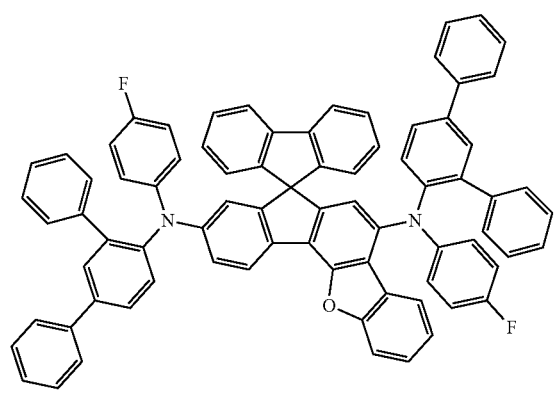
<Chemical Formula 13>
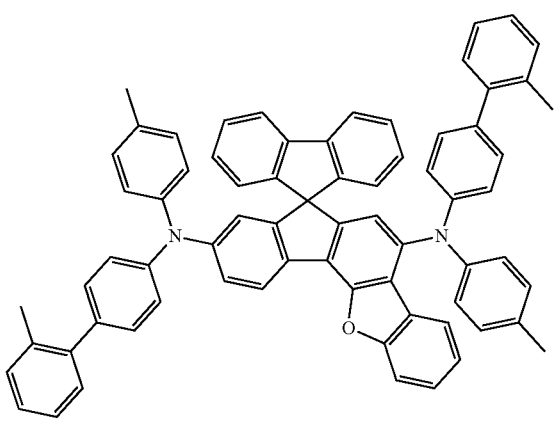
<Chemical Formula 14>
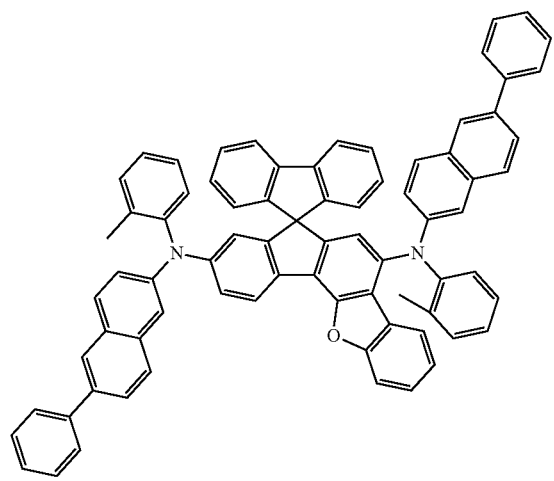
<Chemical Formula 15>
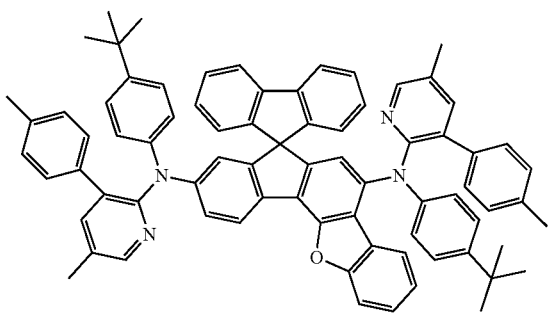

<Chemical Formula 16>
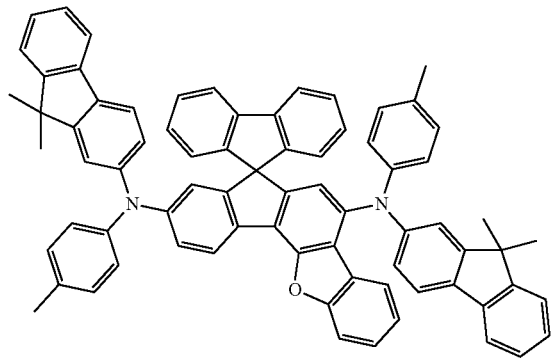
<Chemical Formula 17>
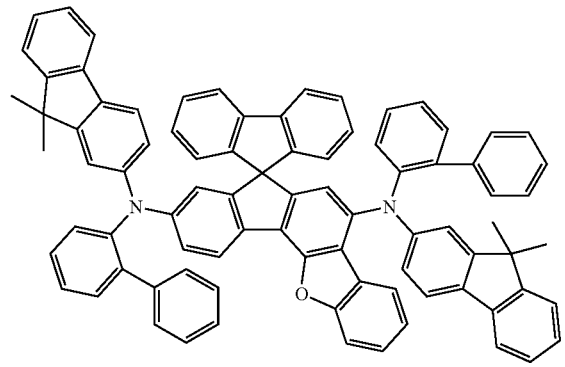
<Chemical Formula 18>
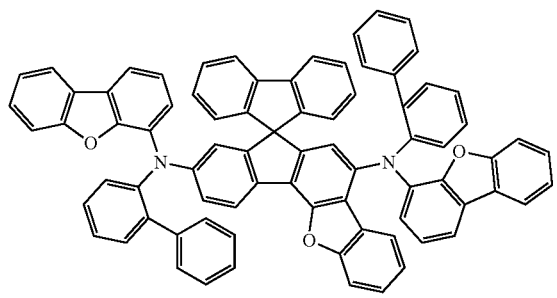
<Chemical Formula 19>
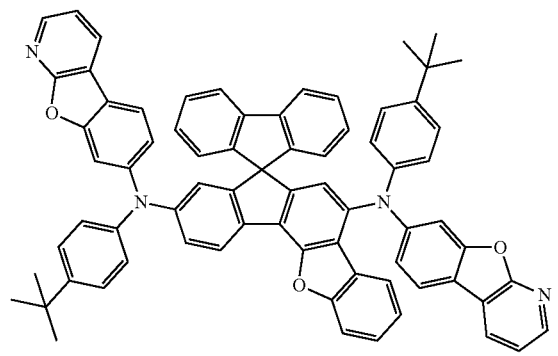
<Chemical Formula 20>
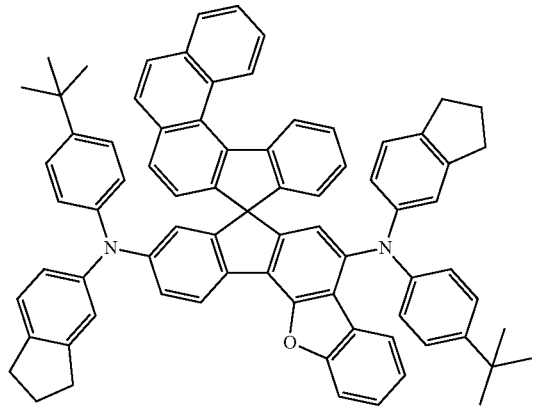
<Chemical Formula 21>
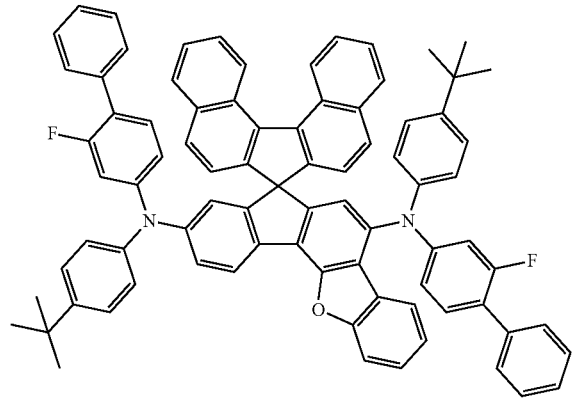
<Chemical Formula 22>
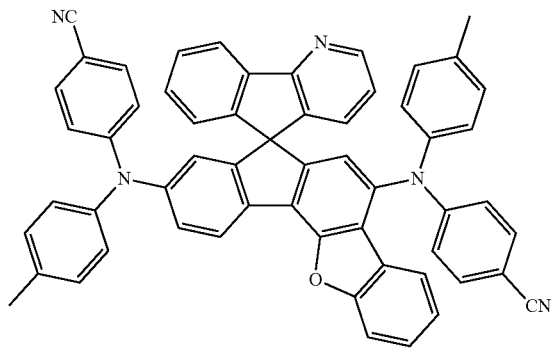
<Chemical Formula 23>
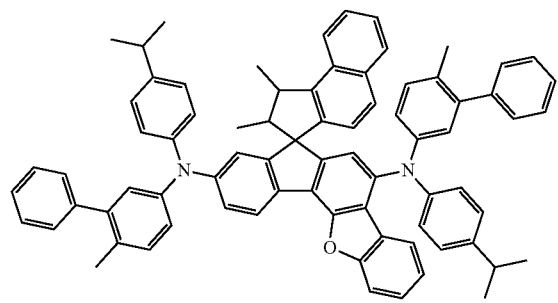

-continued
<Chemical Formula 24>
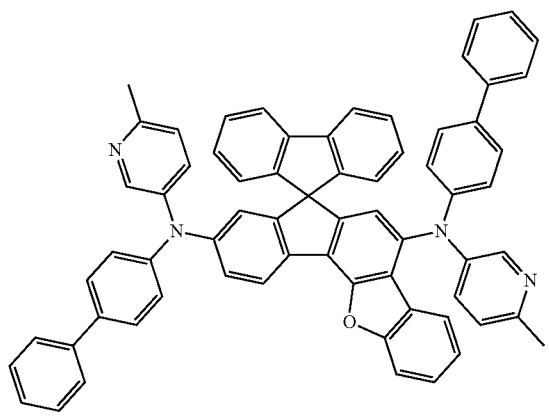
<Chemical Formula 25>
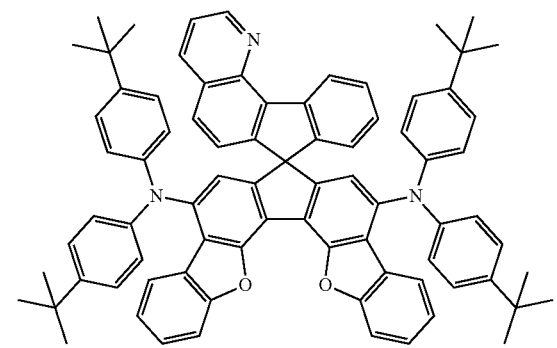
<Chemical Formula 26>
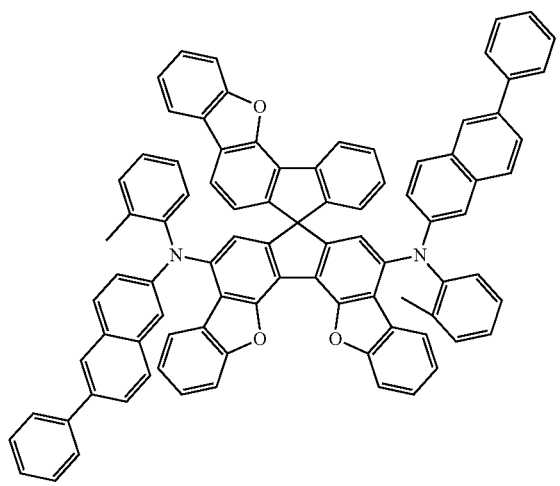
<Chemical Formula 27>
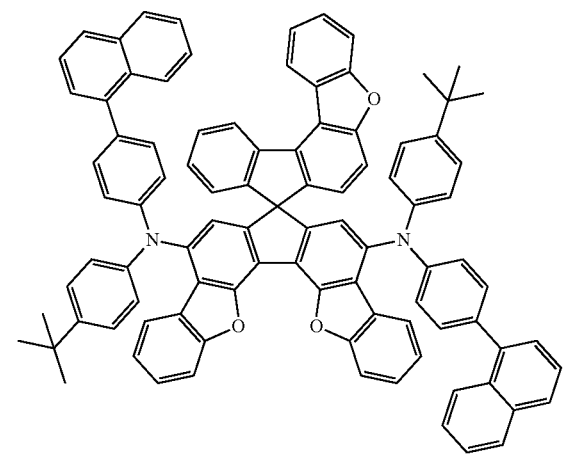
<Chemical Formula 28>
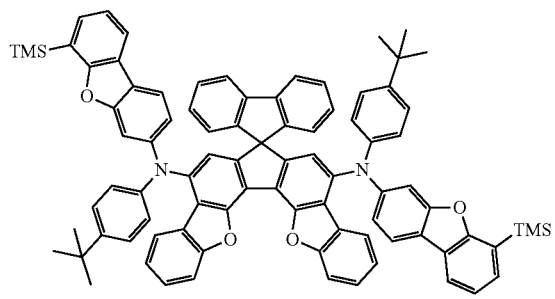
<Chemical Formula 29>
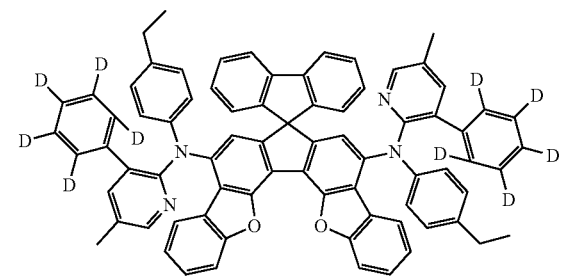
<Chemical Formula 30>
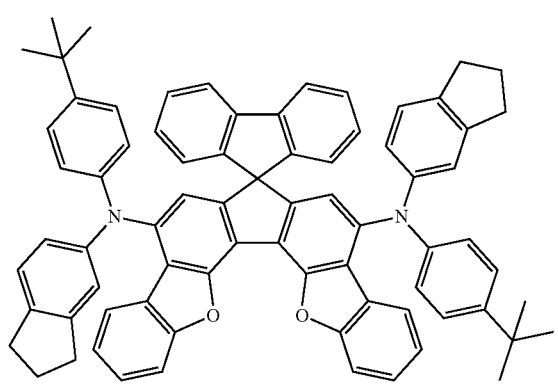
<Chemical Formula 31>
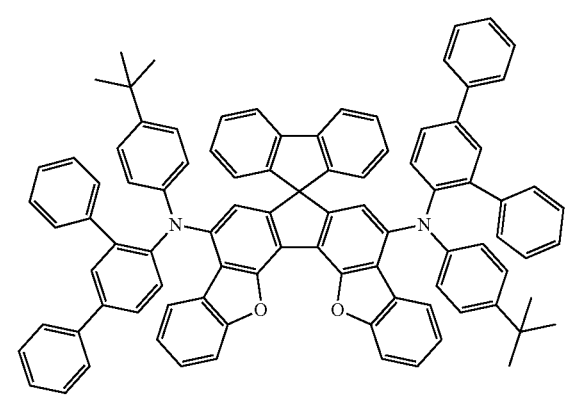

-continued
<Chemical Formula 32>
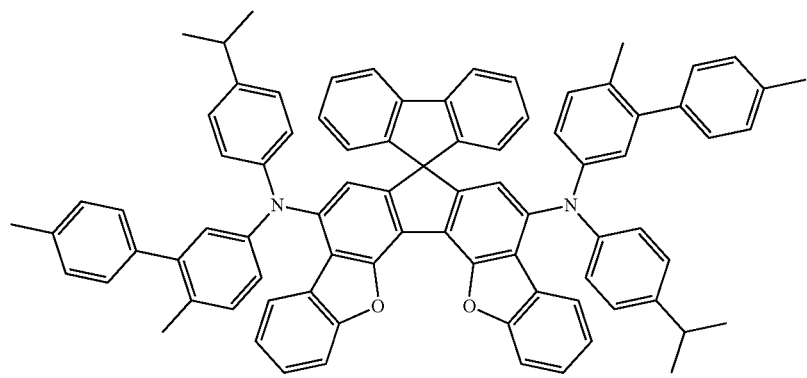
<Chemical Formula 33>
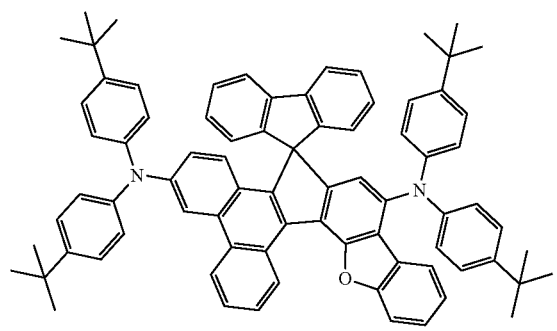
<Chemical Formula 34>
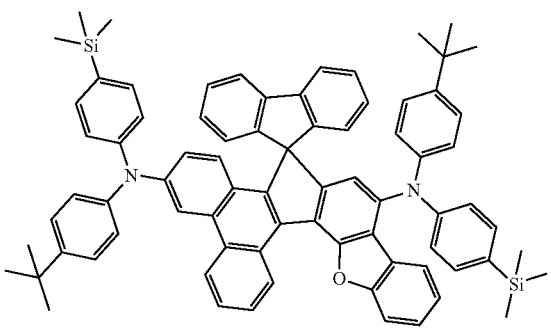
<Chemical Formula 35>
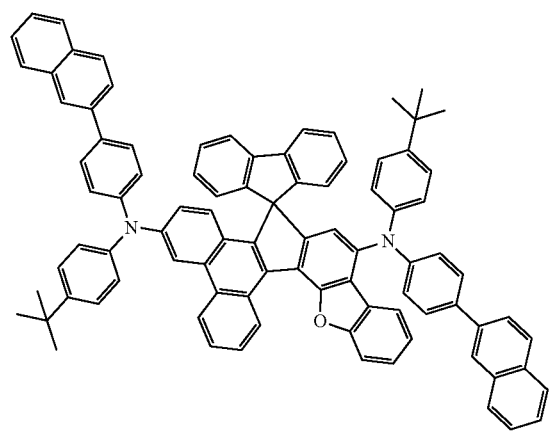
<Chemical Formula 36>
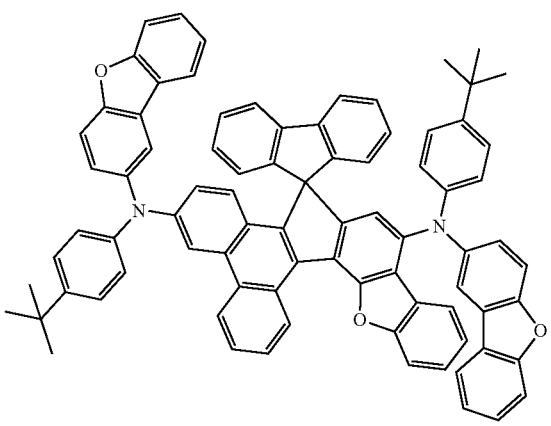
<Chemical Formula 37>
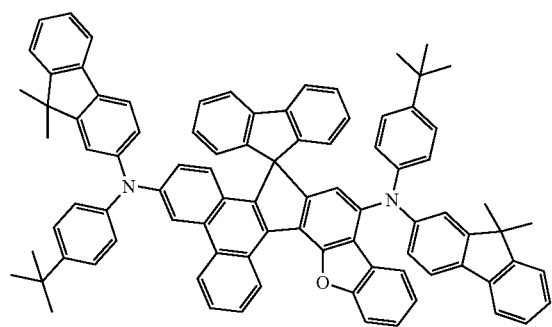
<Chemical Formula 38>
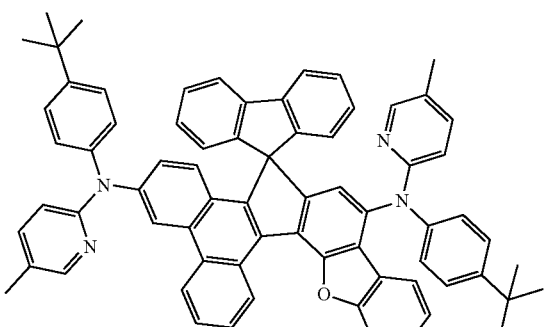

-continued
<Chemical Formula 39>
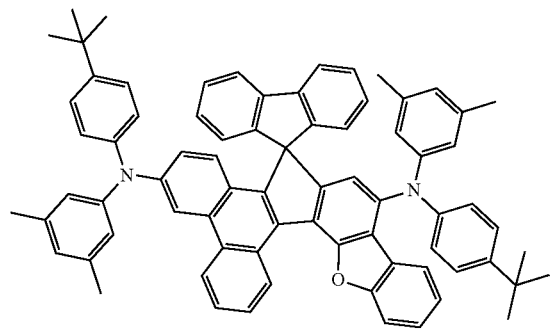
<Chemical Formula 40>
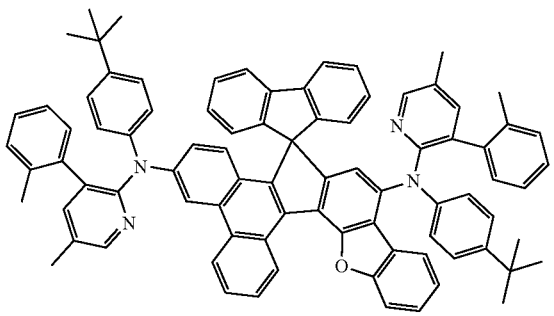
<Chemical Formula 41>
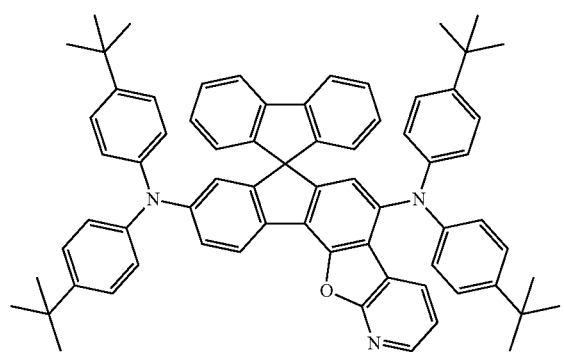
<Chemical Formula 42>
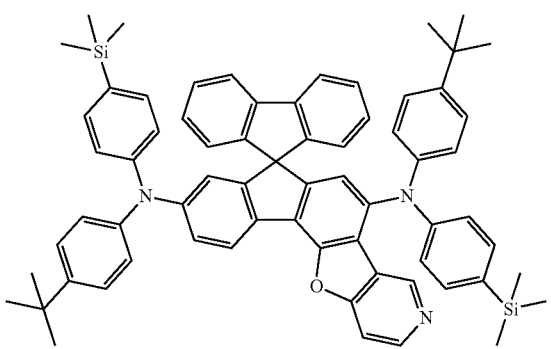
<Chemical Formula 43>
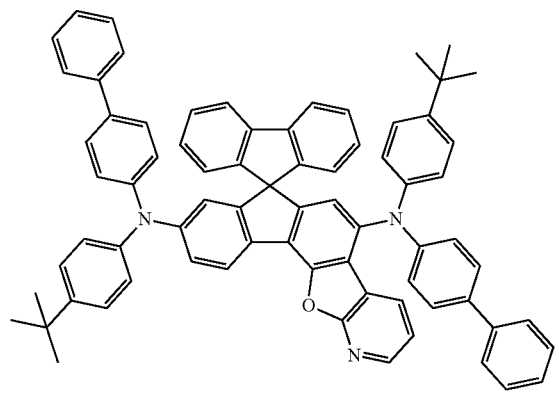
<Chemical Formula 44>
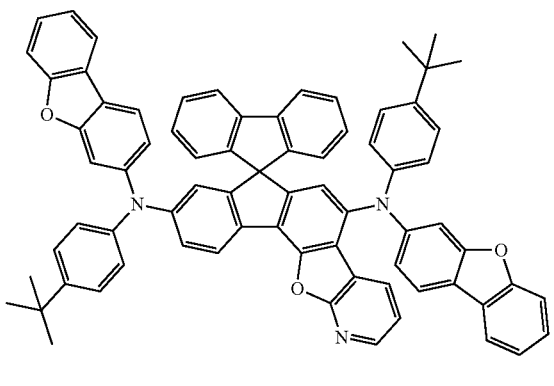
<Chemical Formula 45>
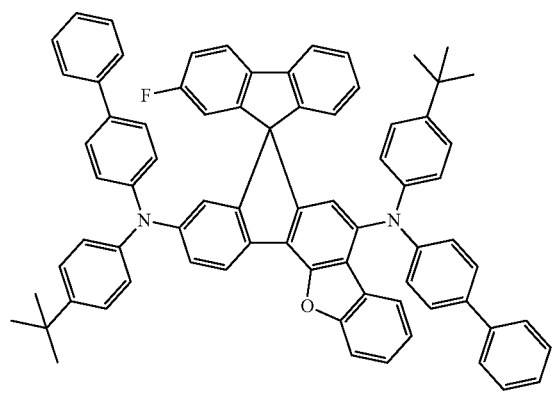
<Chemical Formula 46>
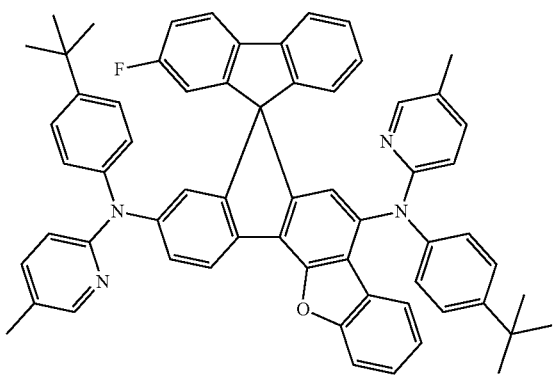

<Chemical Formula 47>
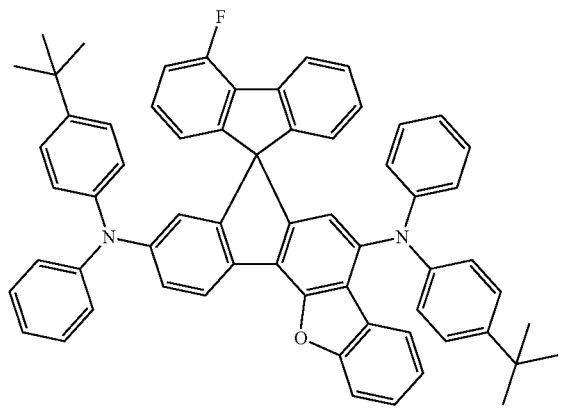
<Chemical Formula 48>
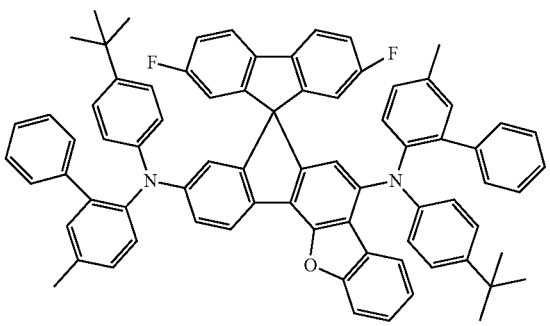
<Chemical Formula 49>
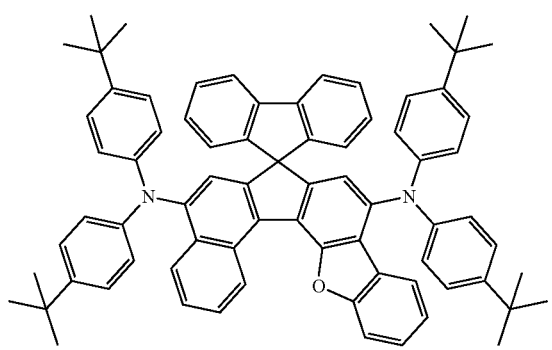
<Chemical Formula 50>
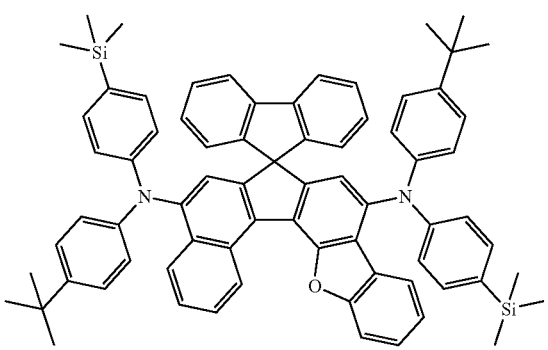
<Chemical Formula 51>
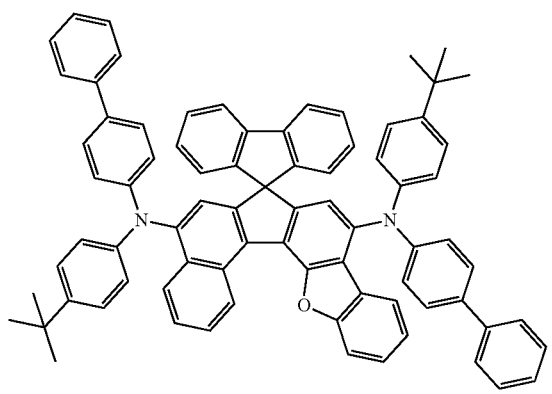
<Chemical Formula 52>
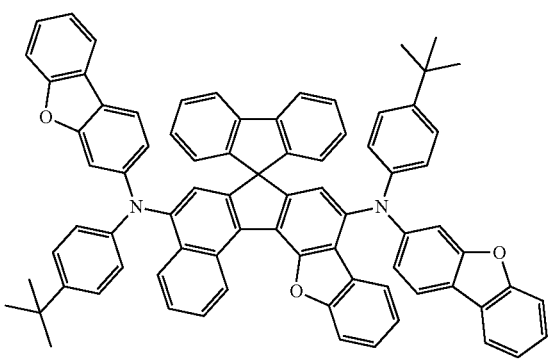
<Chemical Formula 53>
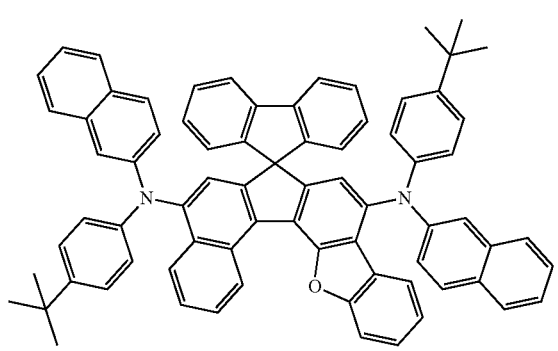
<Chemical Formula 54>
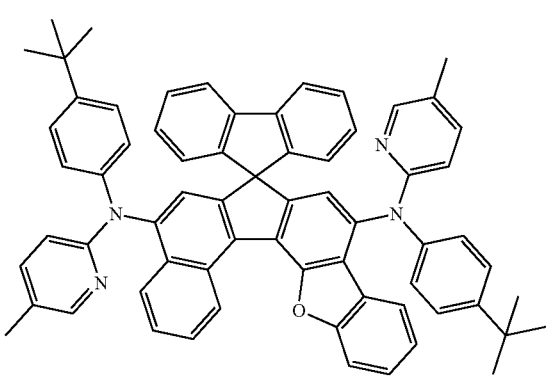

-continued
<Chemical Formula 55>
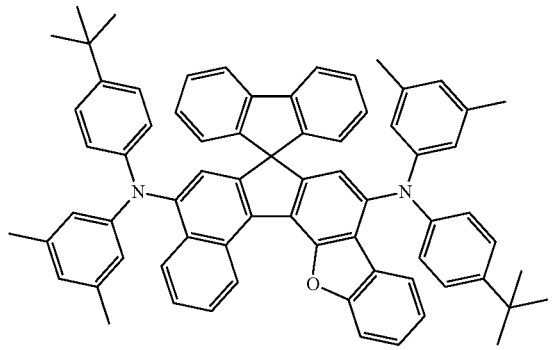
<Chemical Formula 56>
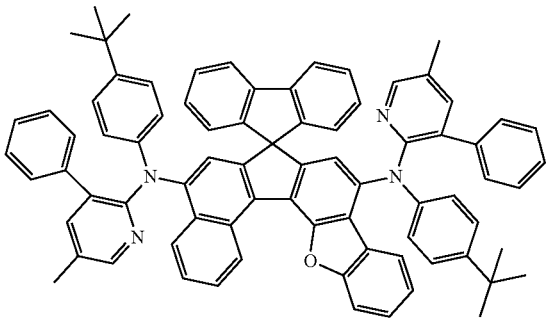
<Chemical Formula 57>
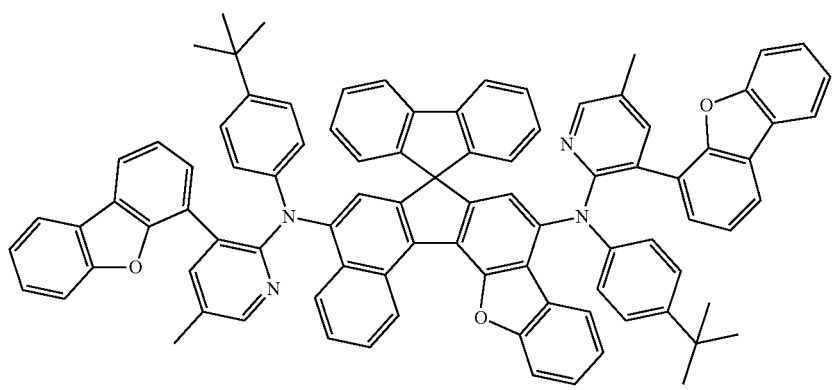
<Chemical Formula 58>
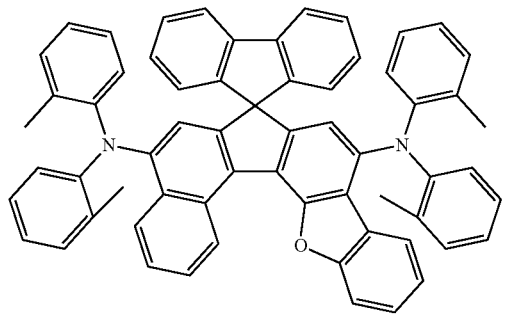
<Chemical Formula 59>
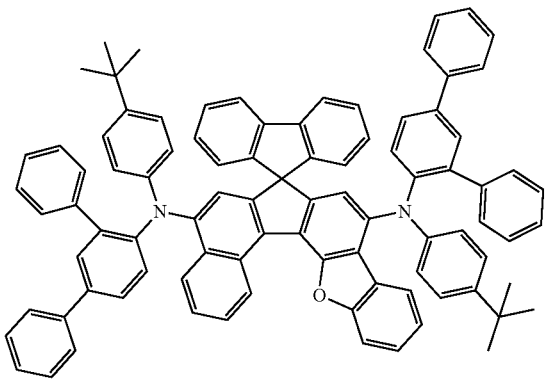
<Chemical Formula 60>
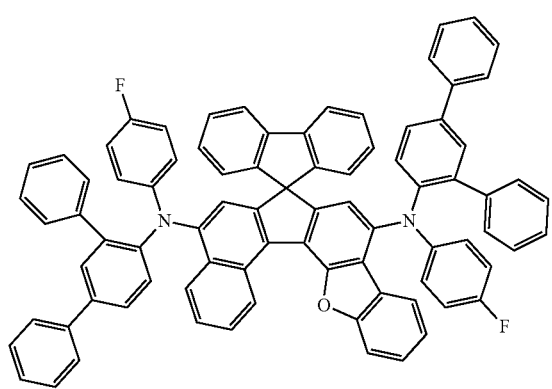
<Chemical Formula 61>
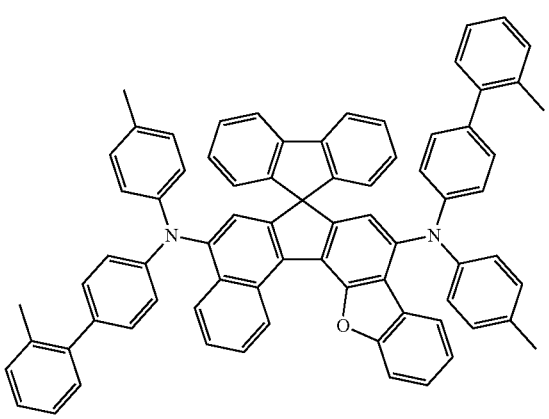

<Chemical Formula 62>
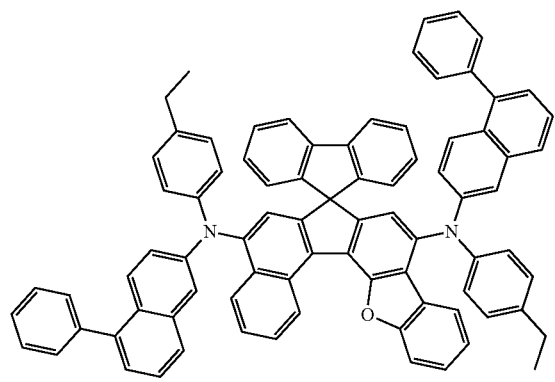
<Chemical Formula 63>
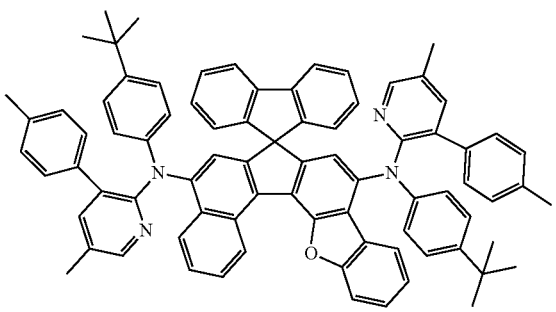
<Chemical Formula 64>
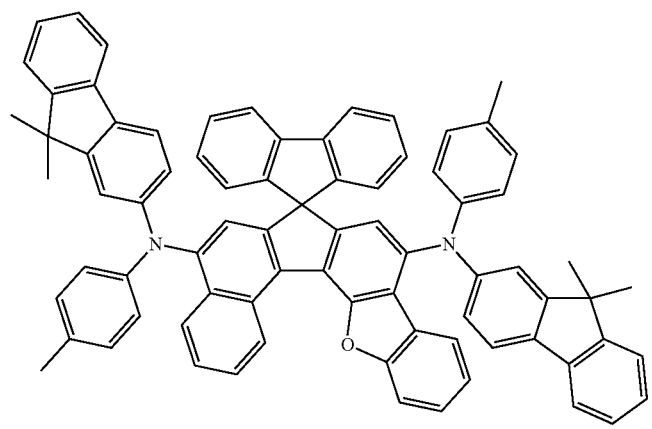
<Chemical Formula 65>
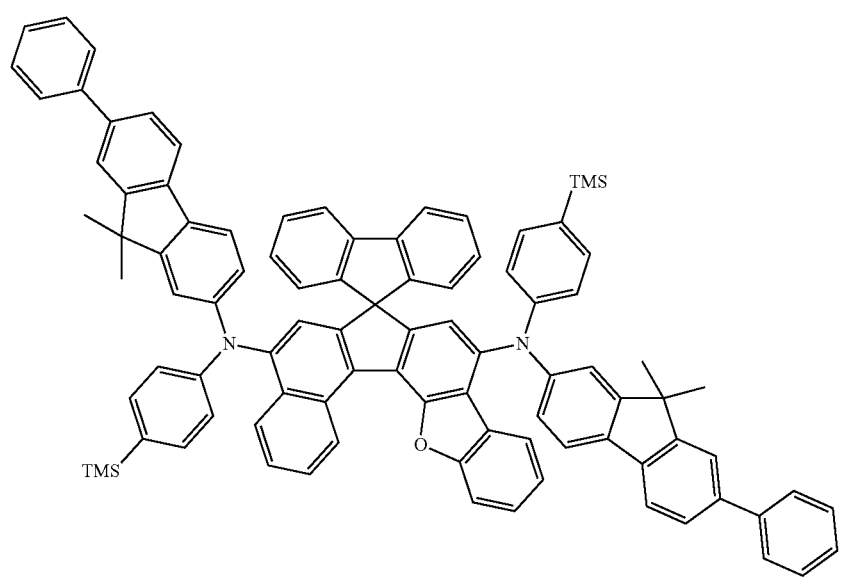

-continued
<Chemical Formula 66>
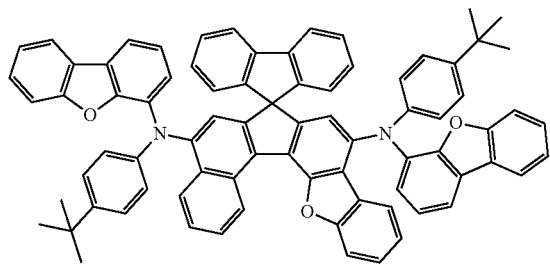
<Chemical Formula 67>
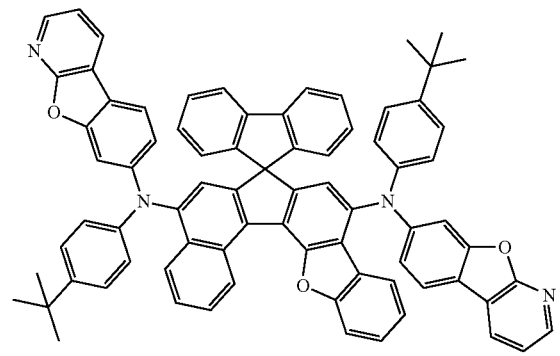
<Chemical Formula 68>
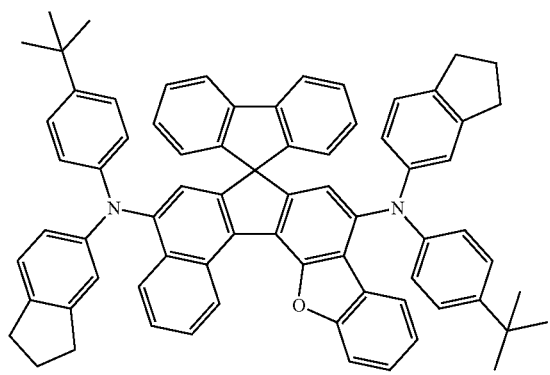
<Chemical Formula 69>
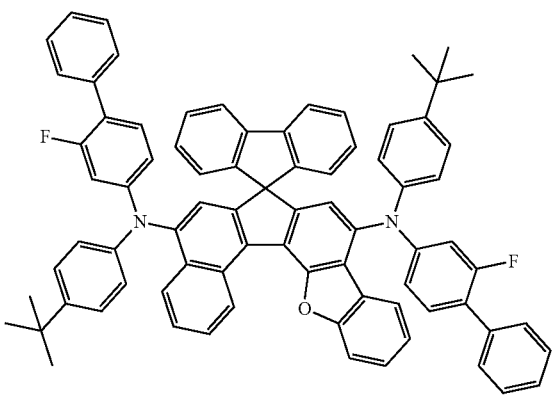
<Chemical Formula 70>
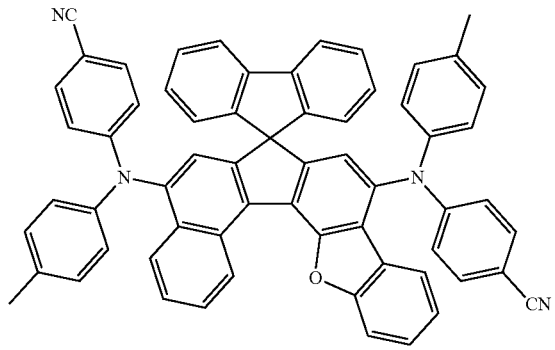
<Chemical Formula 71>
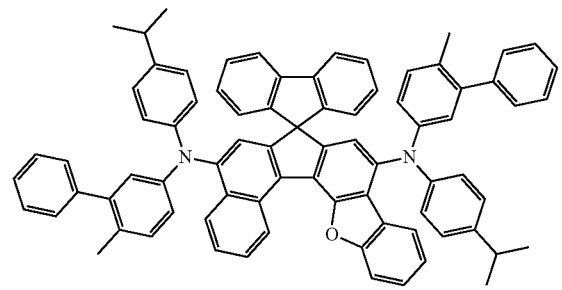
<Chemical Formula 72>
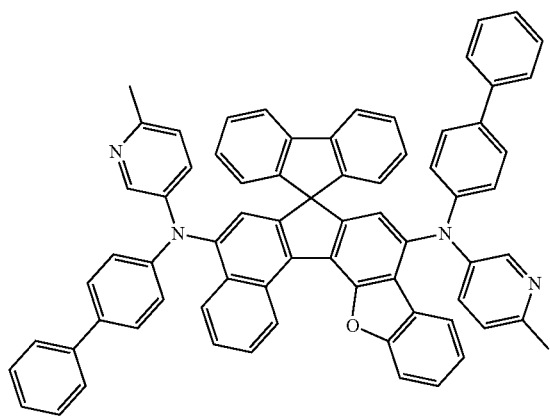
<Chemical Formula 73>
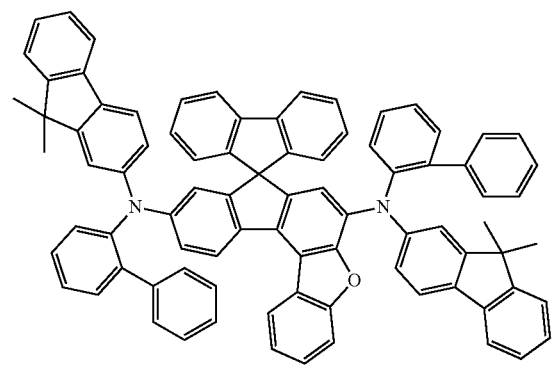

<Chemical Formula 74>
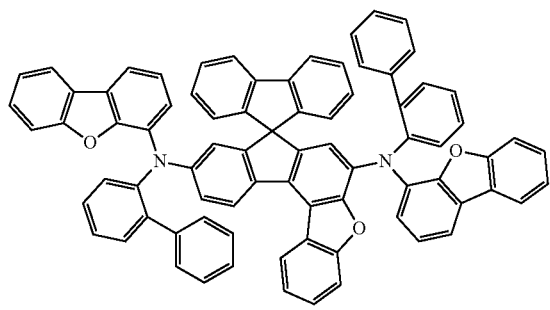
<Chemical Formula 75>
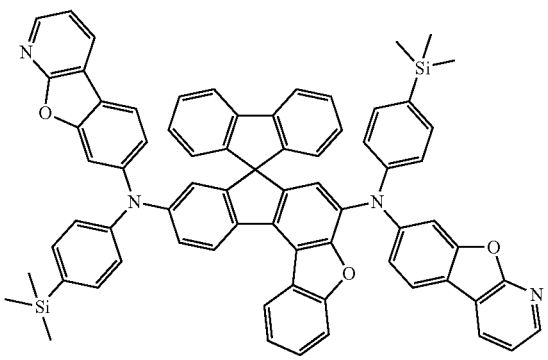
<Chemical Formula 76>
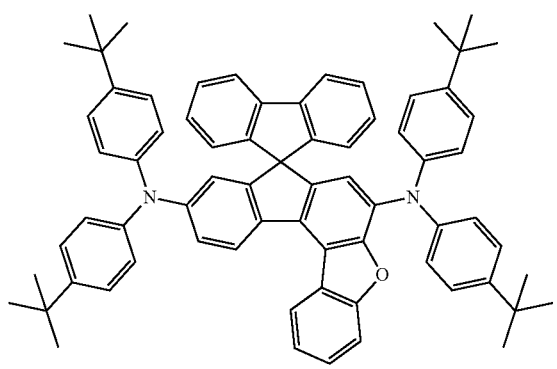
<Chemical Formula 77>
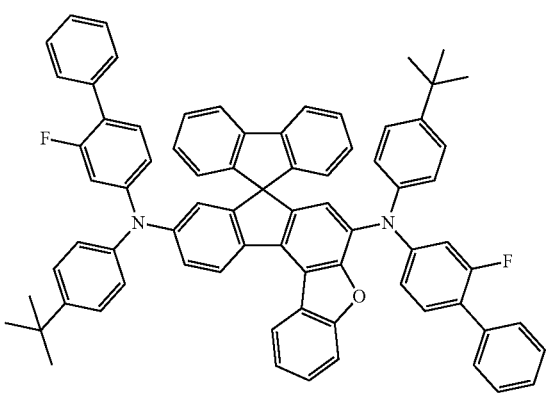
<Chemical Formula 78>
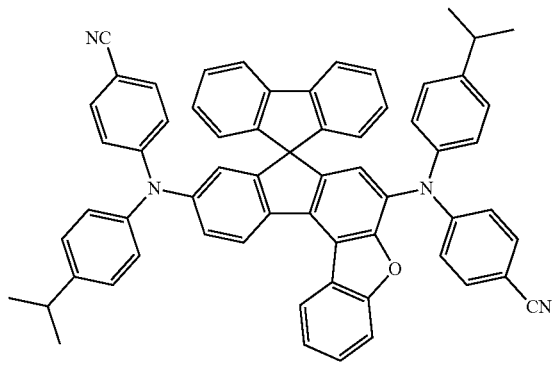
<Chemical Formula 79>
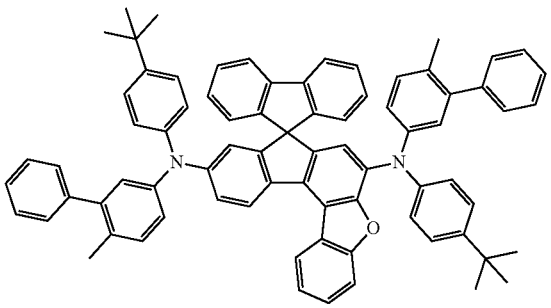
<Chemical Formula 80>
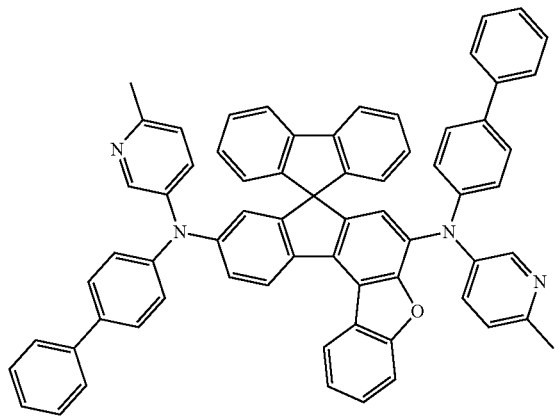
<Chemical Formula 81>
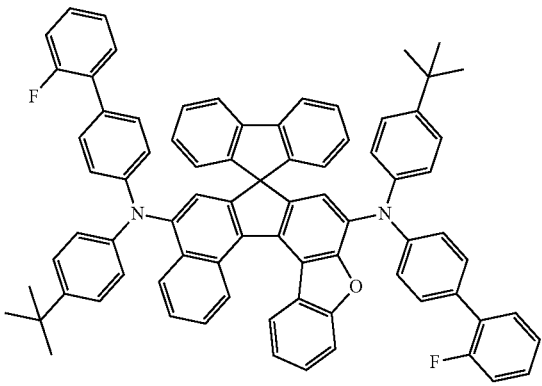

-continued
<Chemical Formula 82>
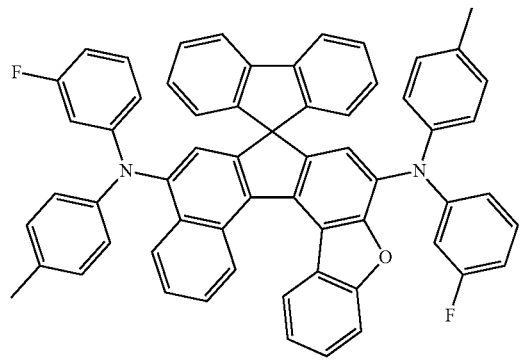
<Chemical Formula 83>
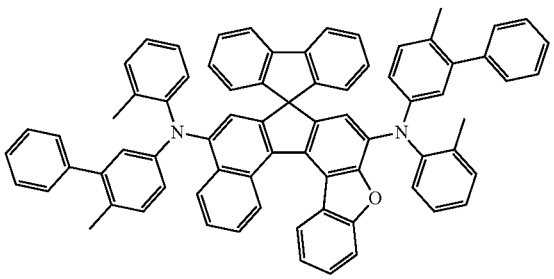
<Chemical Formula 84>
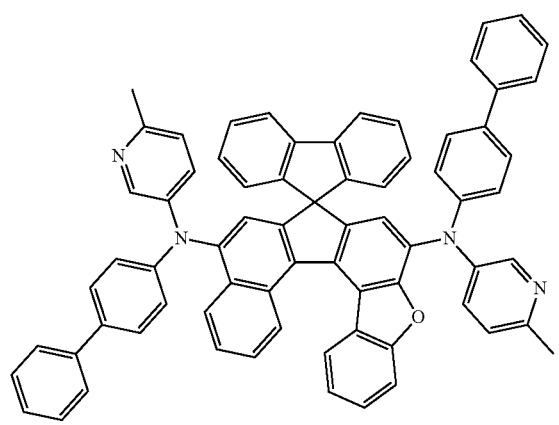
<Chemical Formula 85>
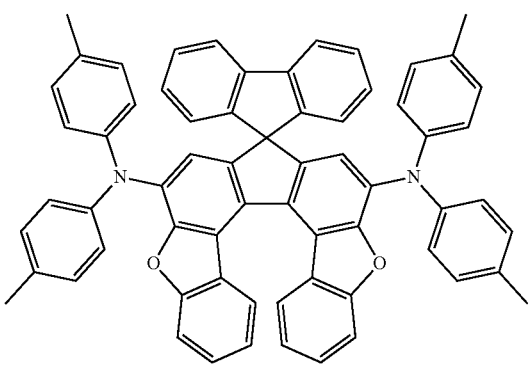
<Chemical Formula 86>
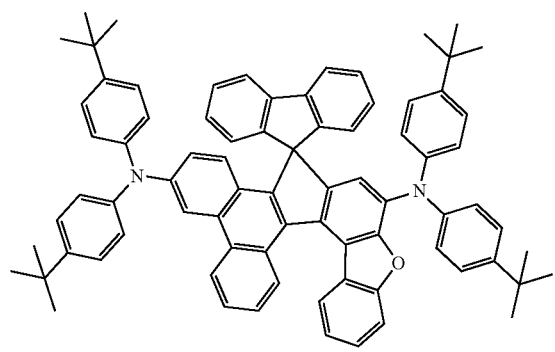
<Chemical Formula 87>
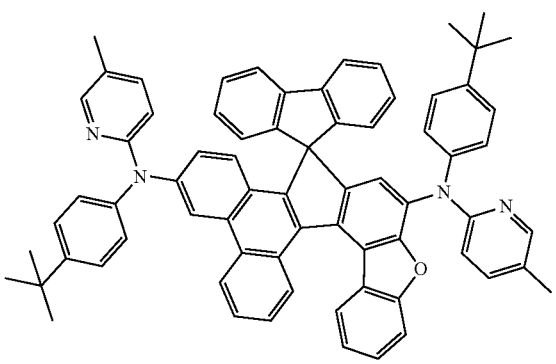
<Chemical Formula 88>
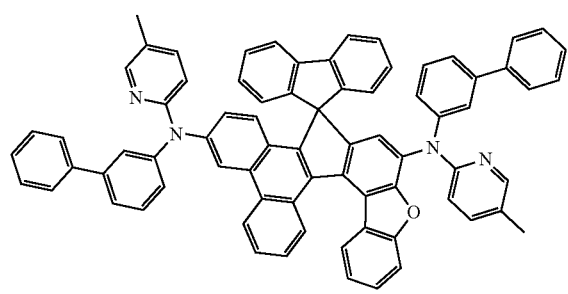
<Chemical Formula 89>
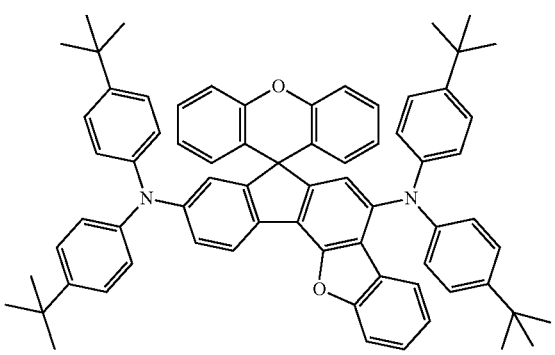

<Chemical Formula 90>
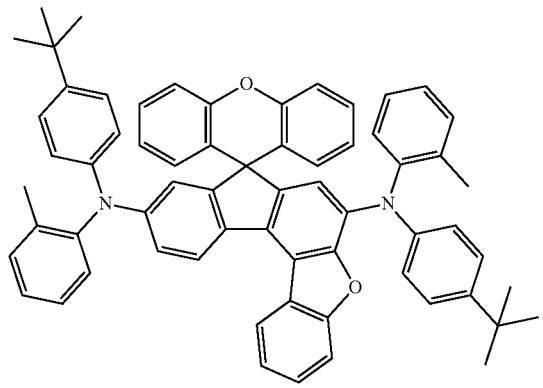
<Chemical Formula 91>
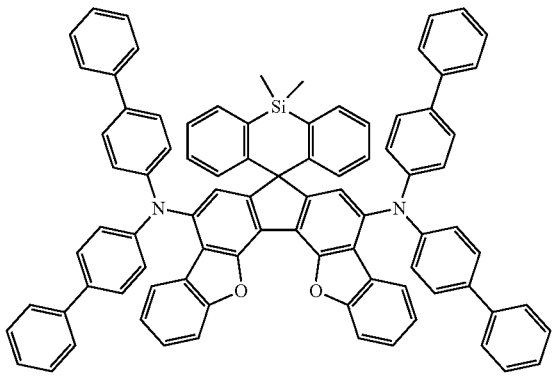
<Chemical Formula 92>
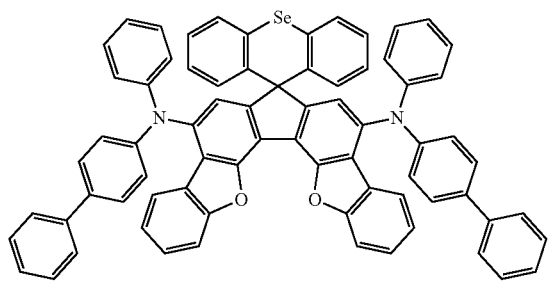
<Chemical Formula 93>
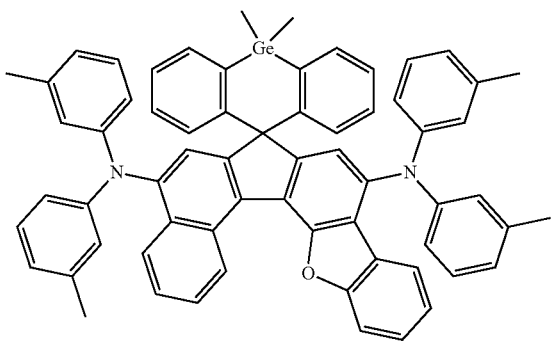
<Chemical Formula 94>
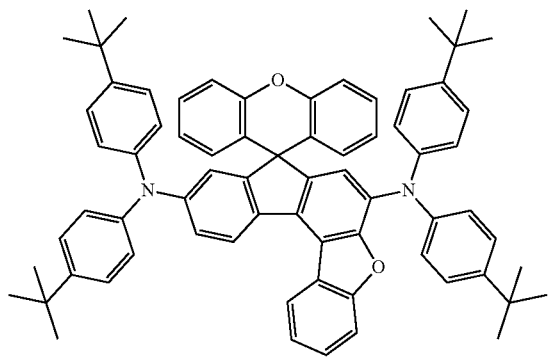
<Chemical Formula 95>
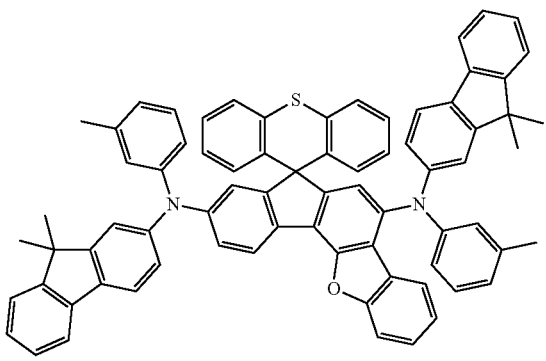

-continued
<Chemical Formula 96>
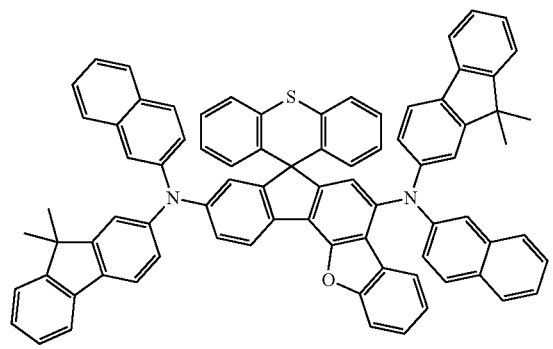
<Chemical Formula 97>
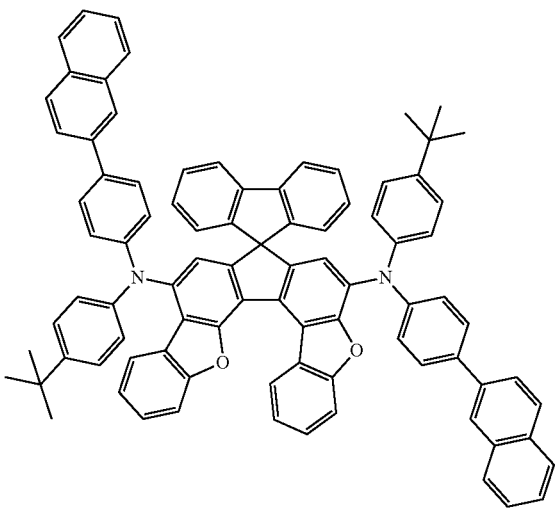
<Chemical Formula 98>
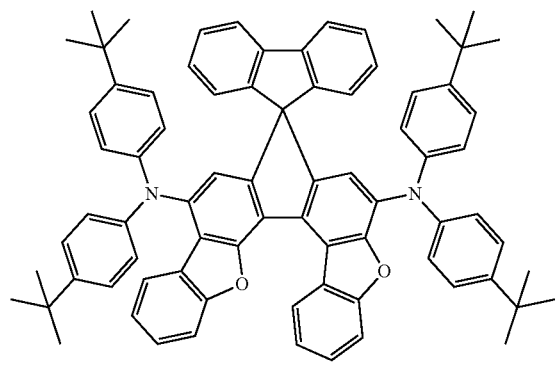
<Chemical Formula 99>
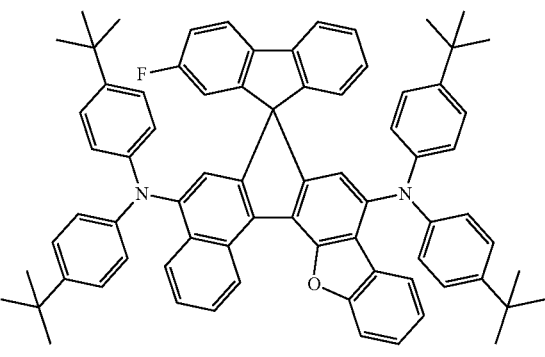
<Chemical Formula 100>
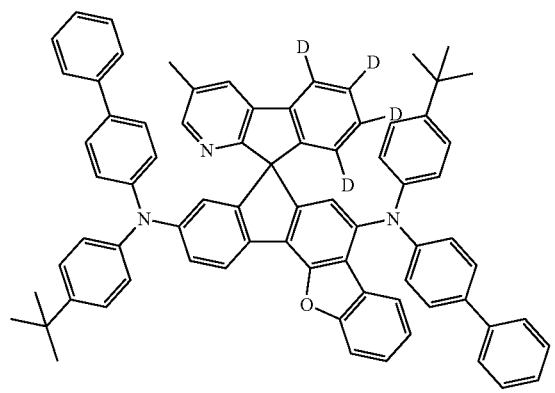
<Chemical Formula 101>
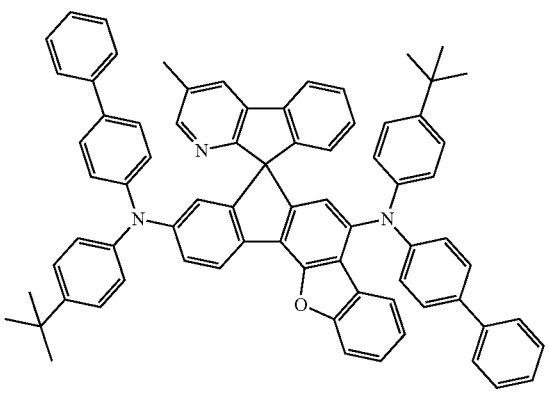

-continued
<Chemical Formula 102>
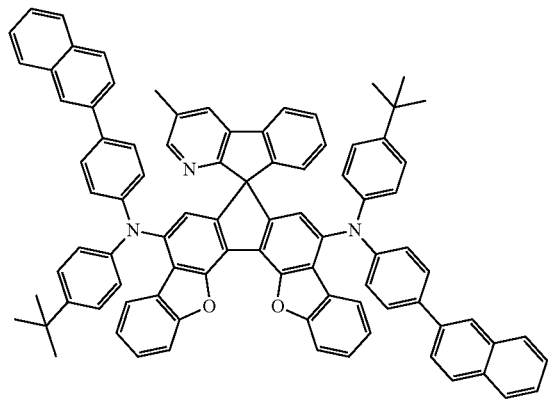
<Chemical Formula 103>
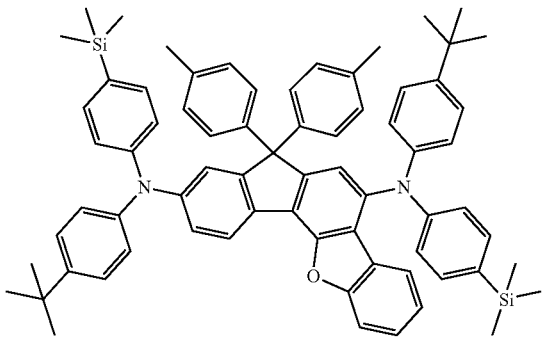
<Chemical Formula 104>
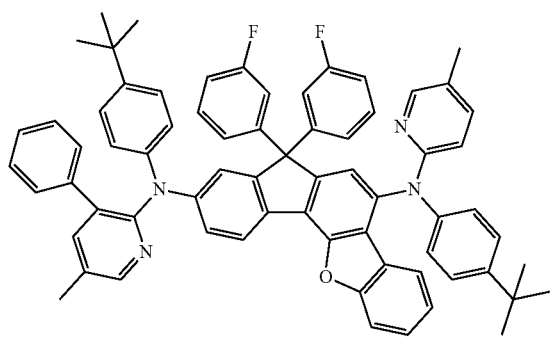
<Chemical Formula 105>
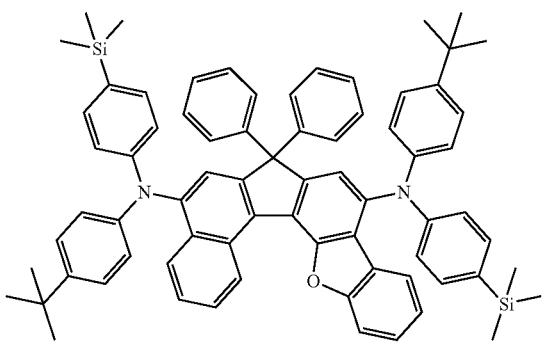
<Chemical Formula 106>
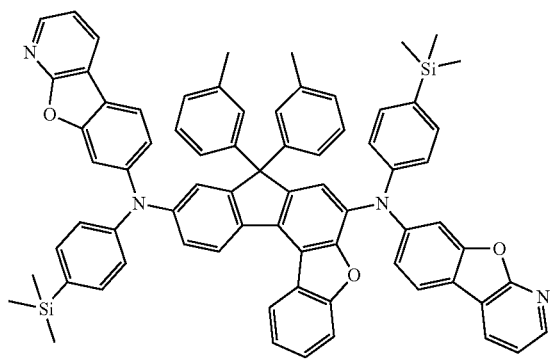
<Chemical Formula 107>
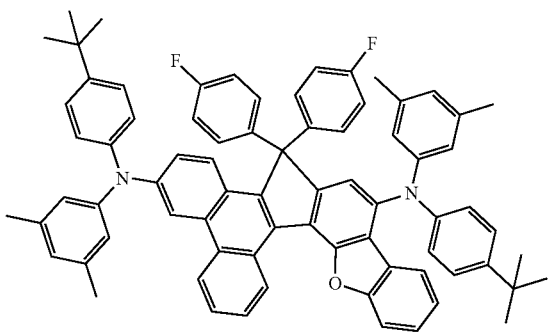
<Chemical Formula 108>
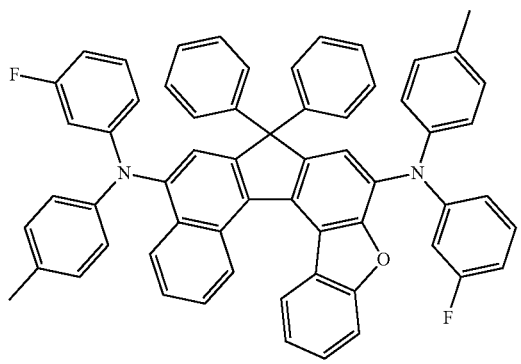
<Chemical Formula 109>
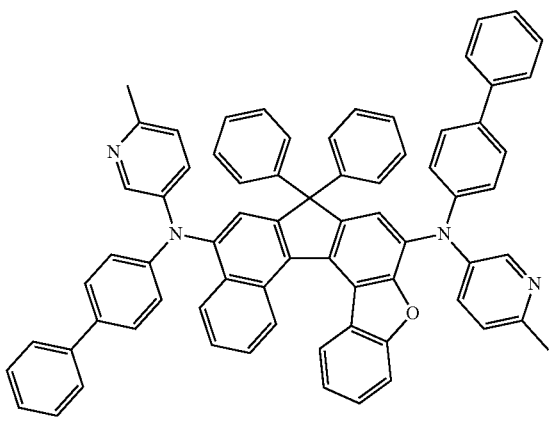

-continued
<Chemical Formula 110>
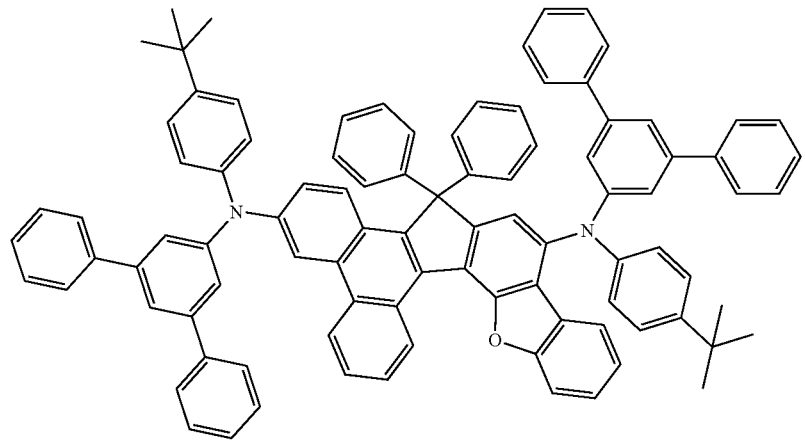
<Chemical Formula 111>
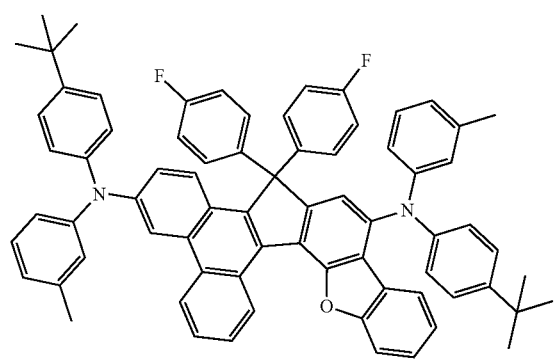
<Chemical Formula 112>
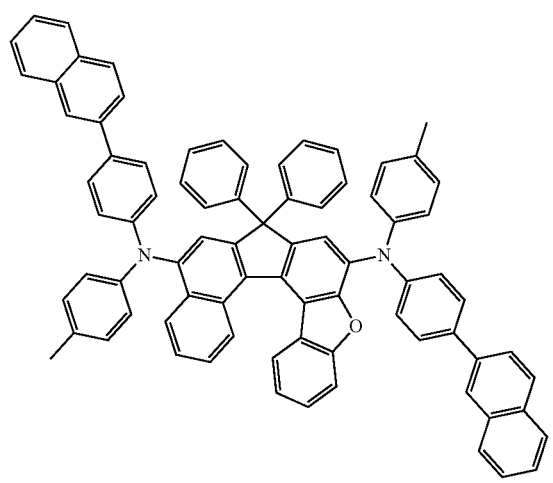
<Chemical Formula 113>
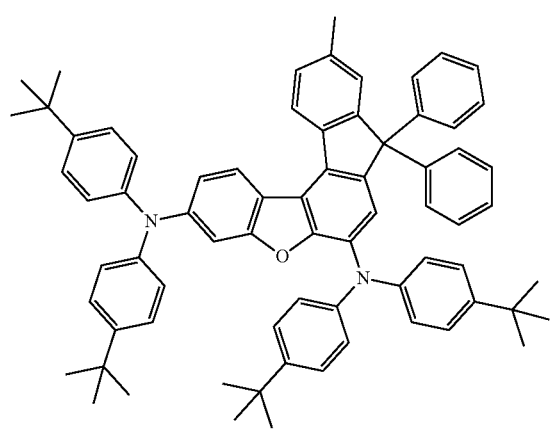
<Chemical Formula 114>
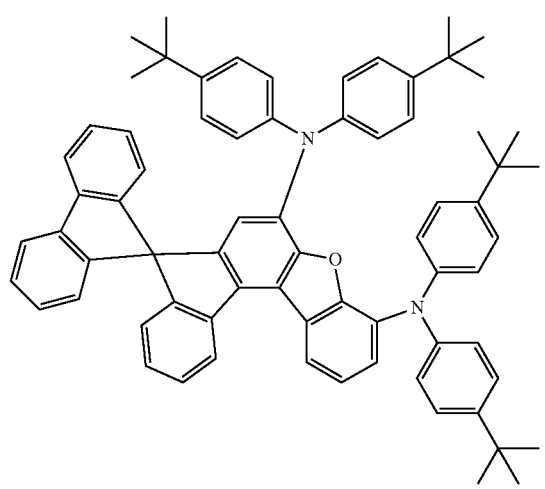

-continued
<Chemical Formula 115>
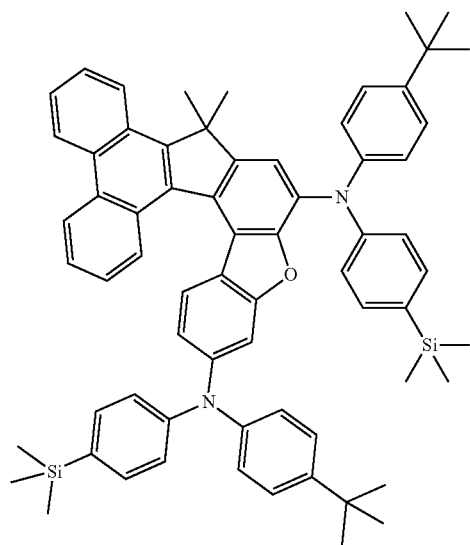
<Chemical Formula 116>
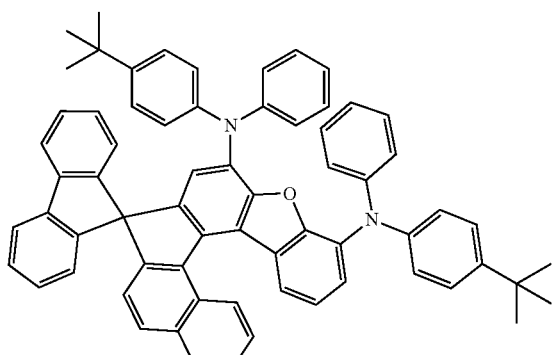
<Chemical Formula 117>
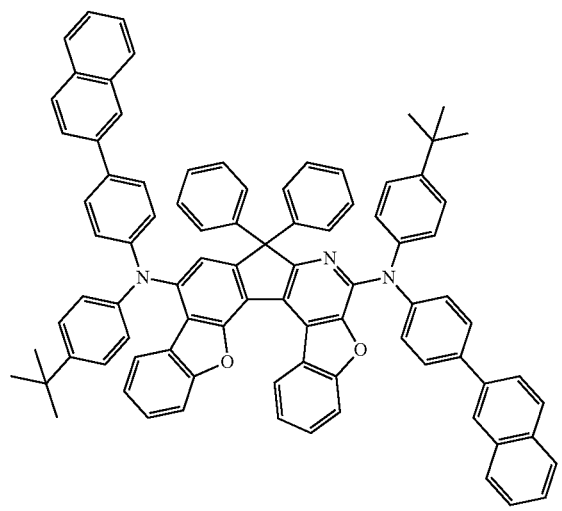
<Chemical Formula 118>
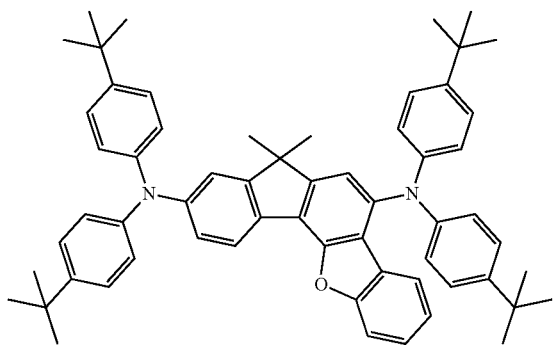
<Chemical Formula 119>
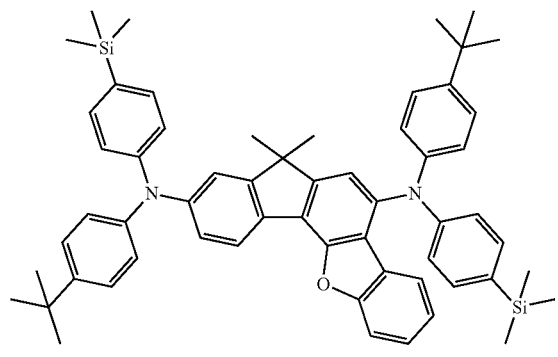
<Chemical Formula 120>
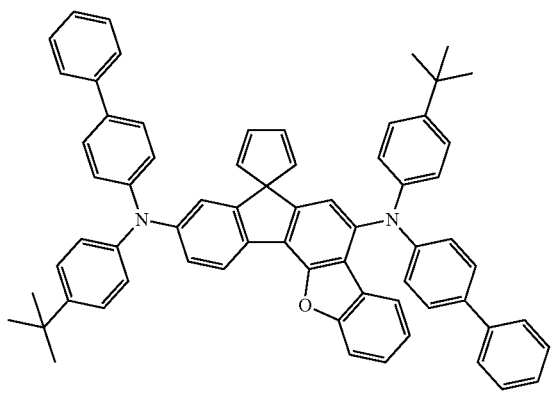

-continued
<Chemical Formula 121>
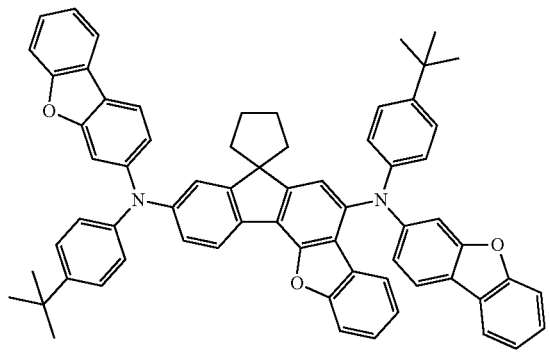
<Chemical Formula 122>
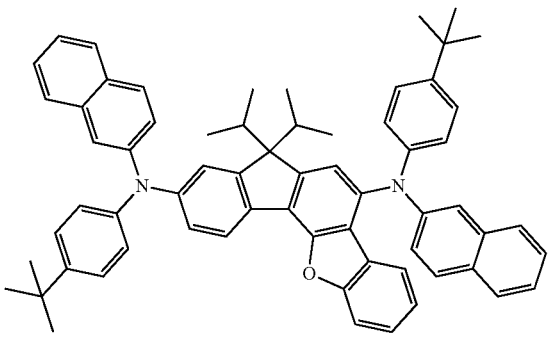
<Chemical Formula 123>
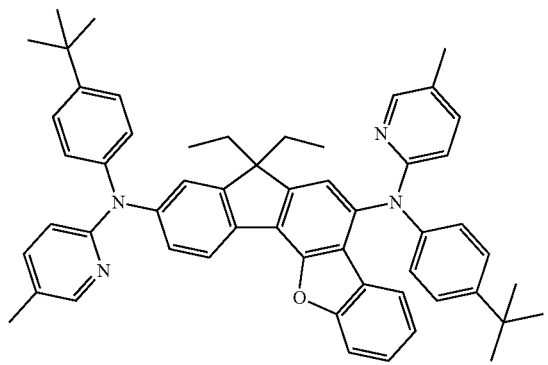
<Chemical Formula 124>
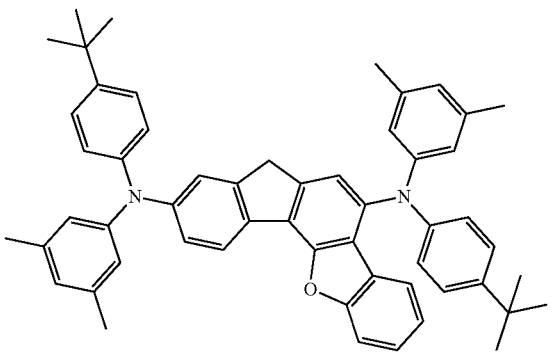
<Chemical Formula 125>
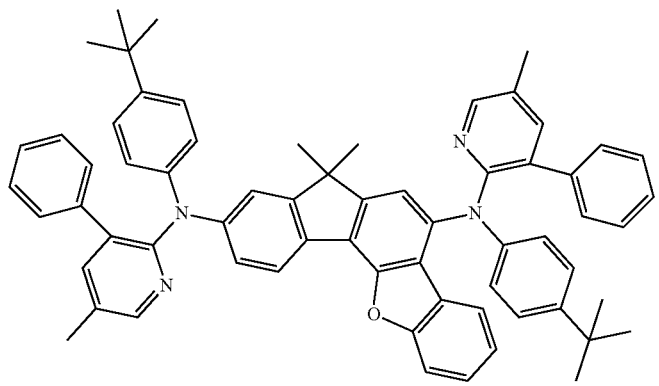
<Chemical Formula 126>
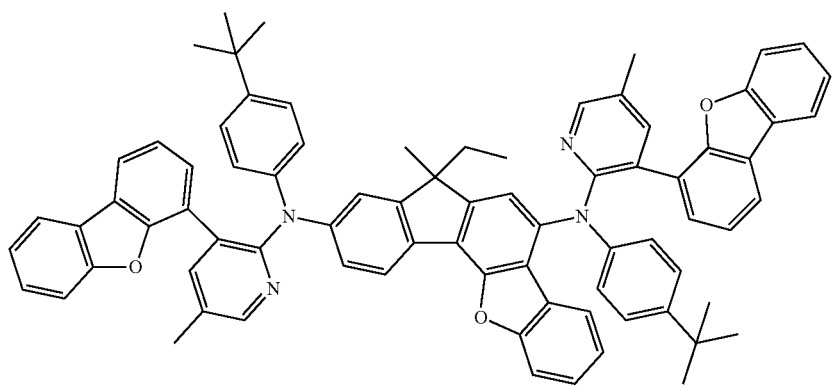

-continued
<Chemical Formula 127>
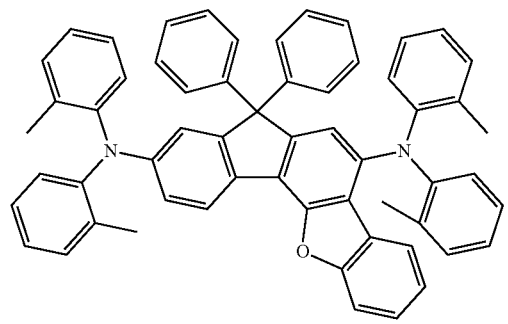
<Chemical Formula 128>
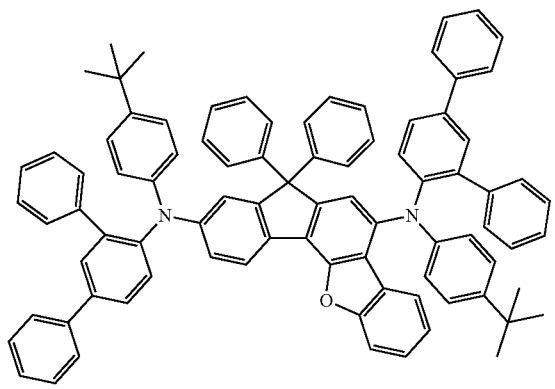
<Chemical Formula 129>
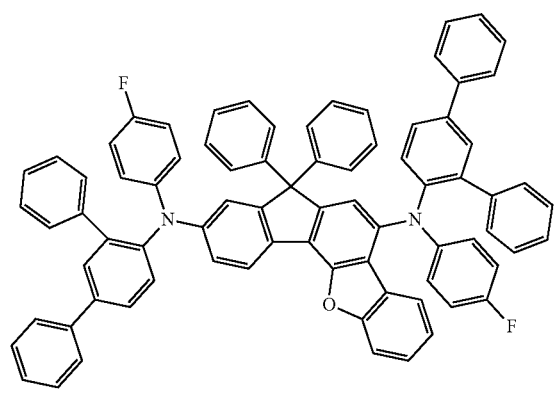
<Chemical Formula 130>
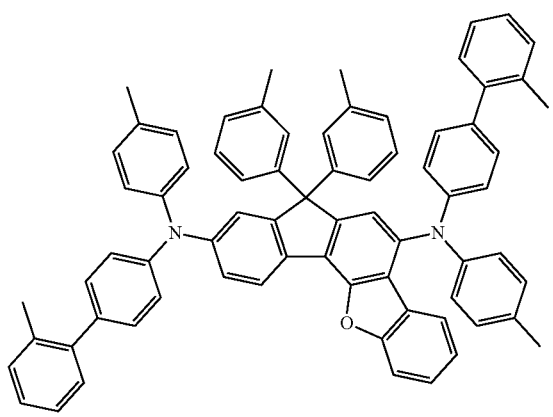
<Chemical Formula 131>
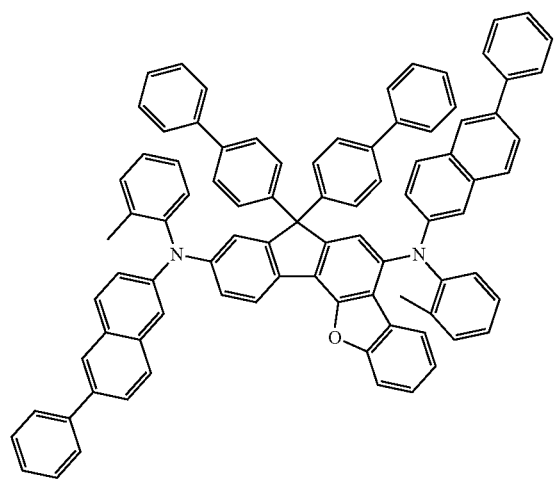
<Chemical Formula 132>
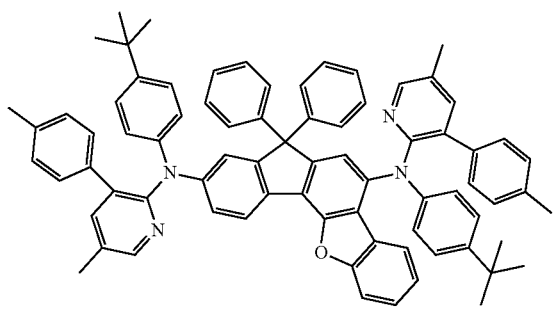

-continued
<Chemical Formula 133>
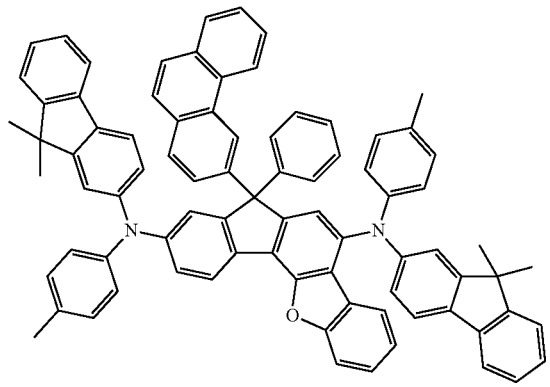
<Chemical Formula 134>
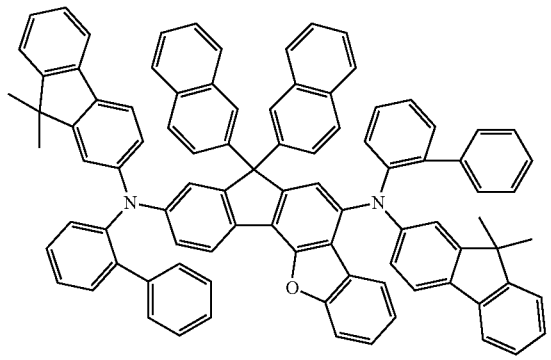
<Chemical Formula 135>
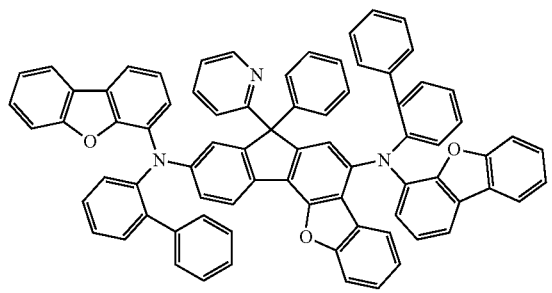
<Chemical Formula 136>
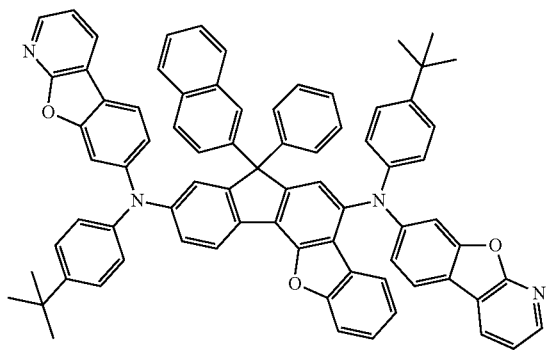
<Chemical Formula 137>
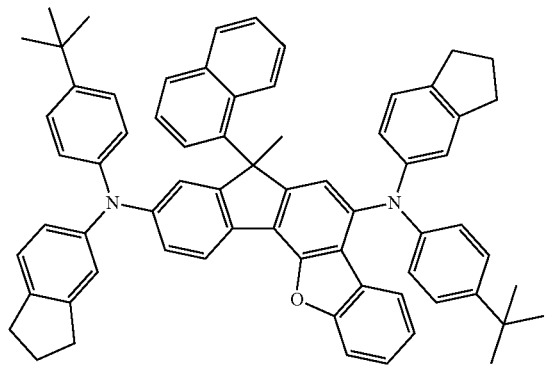
<Chemical Formula 138>
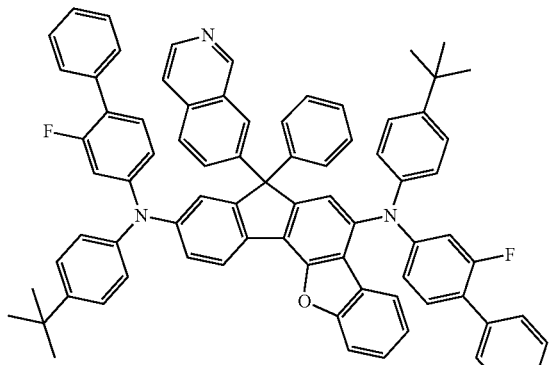
<Chemical Formula 139>
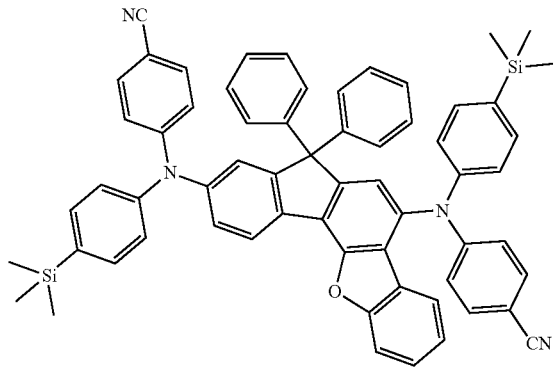
<Chemical Formula 140>
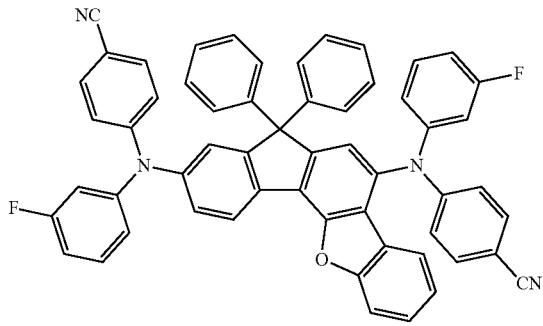

<Chemical Formula 141>
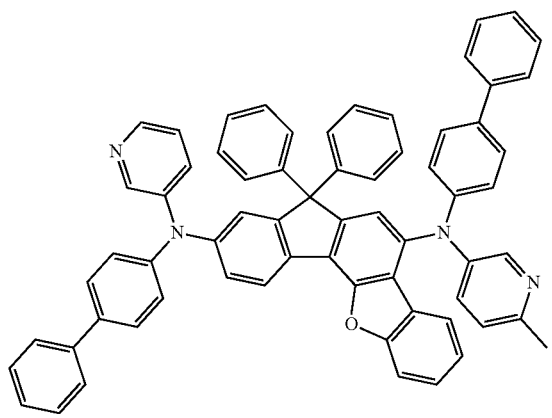
<Chemical Formula 142>
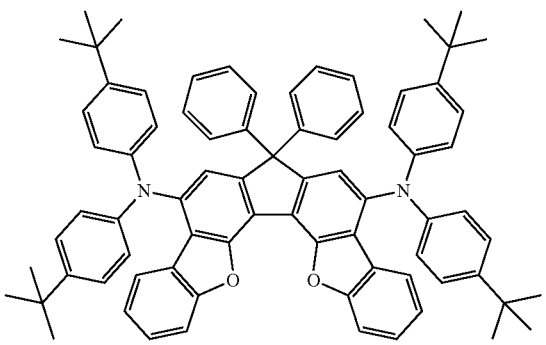
<Chemical Formula 143>
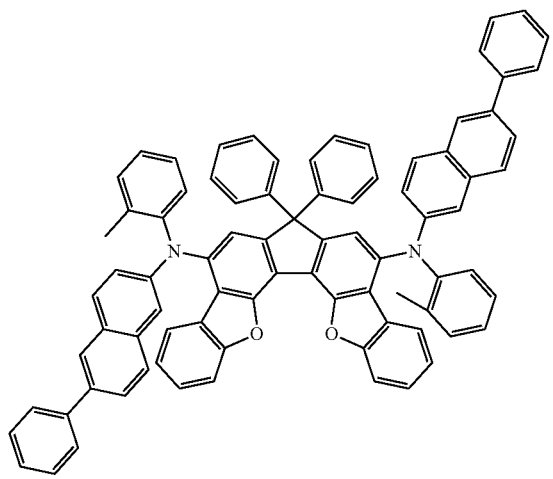
<Chemical Formula 144>
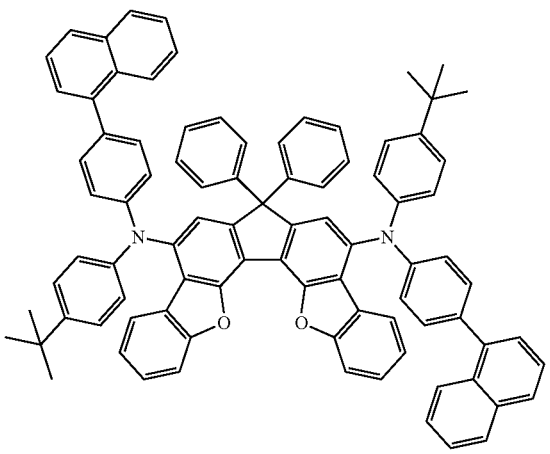
<Chemical Formula 145>
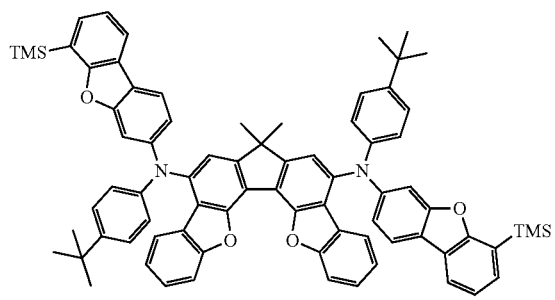
<Chemical Formula 146>
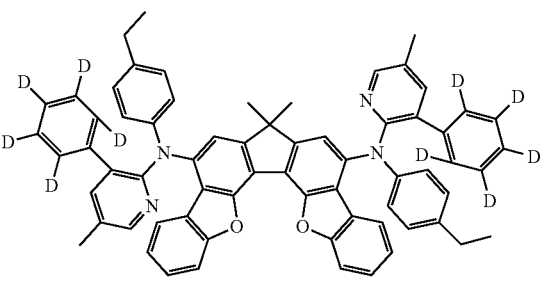
<Chemical Formula 147>
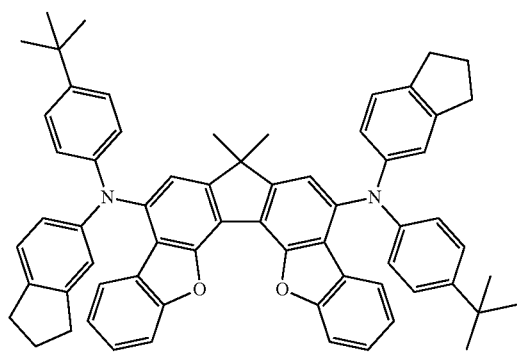
<Chemical Formula 148>
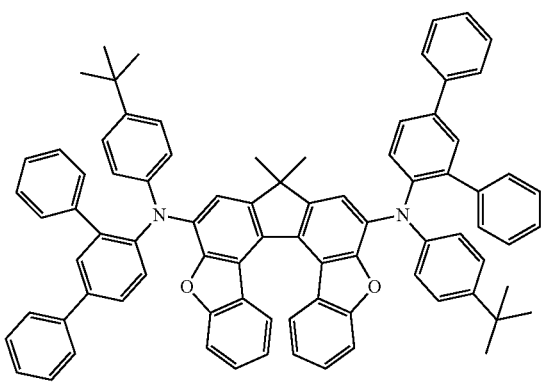

<Chemical Formula 149>
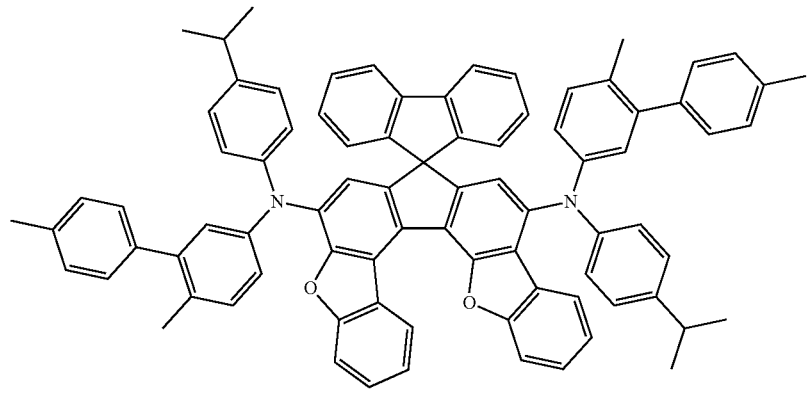
<Chemical Formula 150>
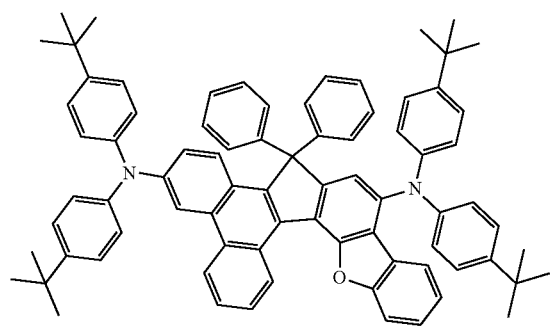
<Chemical Formula 151>
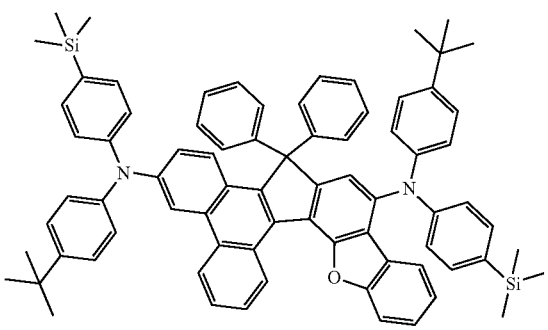
<Chemical Formula 152>
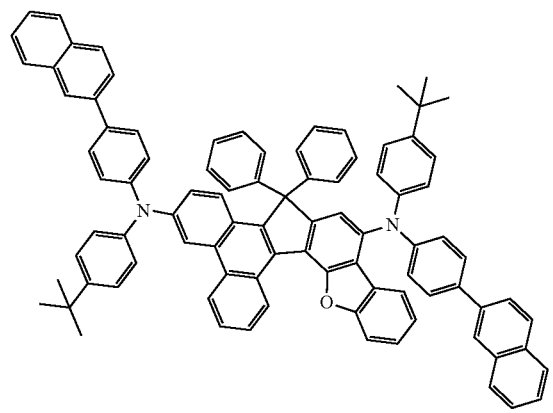
<Chemical Formula 153>
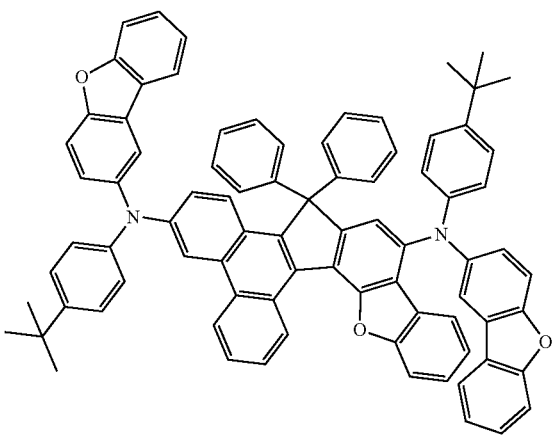
<Chemical Formula 154>
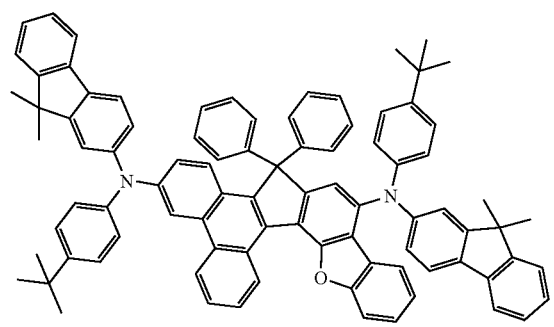
<Chemical Formula 155>
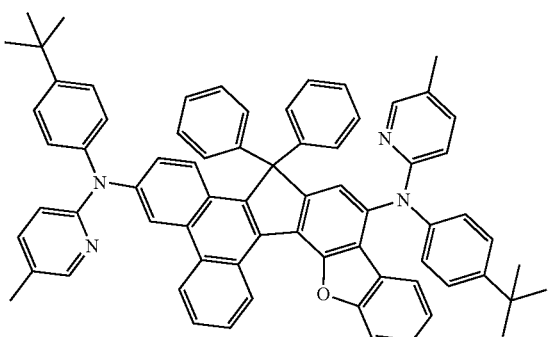

-continued
<Chemical Formula 156>
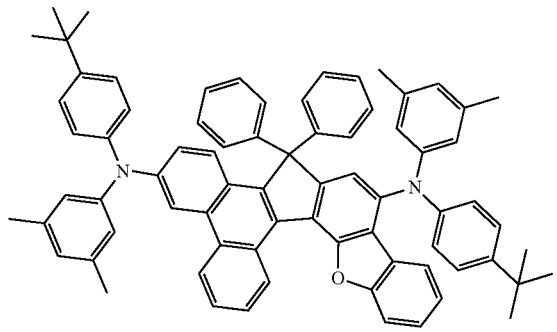
<Chemical Formula 157>
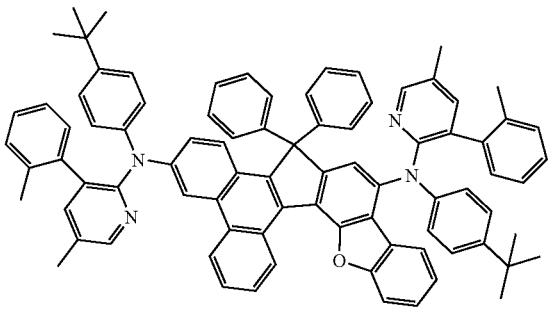
<Chemical Formula 158>
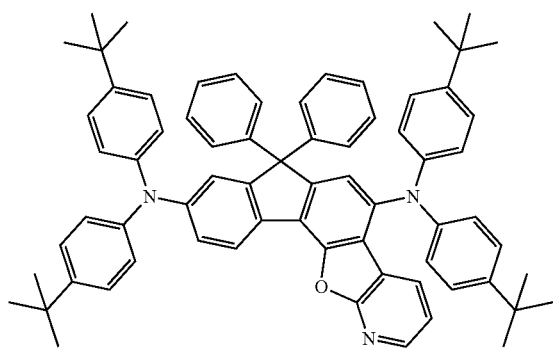
<Chemical Formula 159>
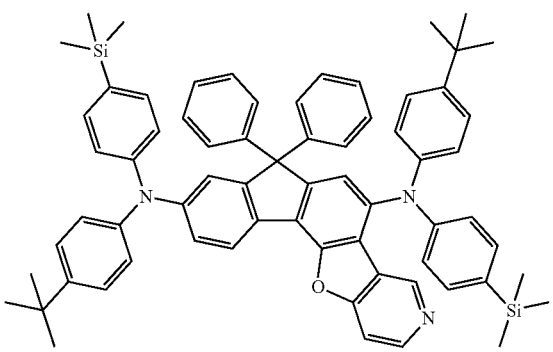
<Chemical Formula 160>
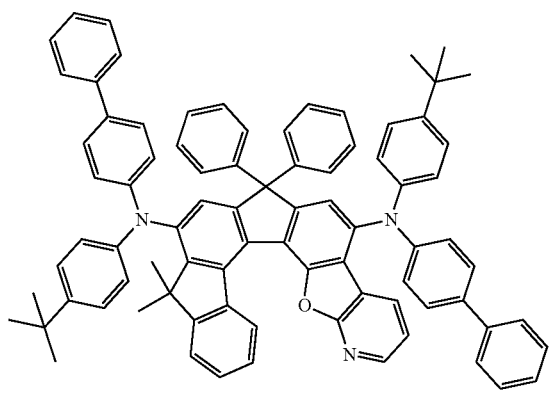
<Chemical Formula 161>
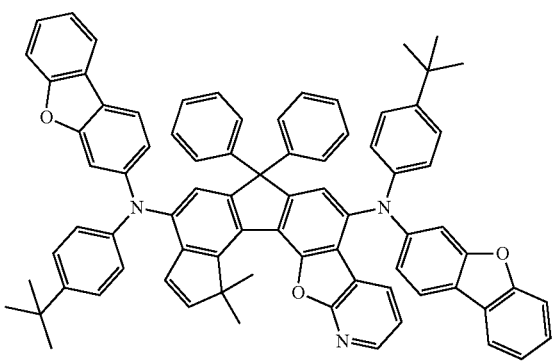
<Chemical Formula 162>
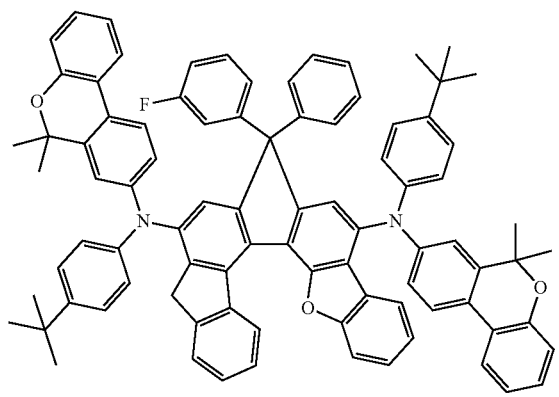
<Chemical Formula 163>
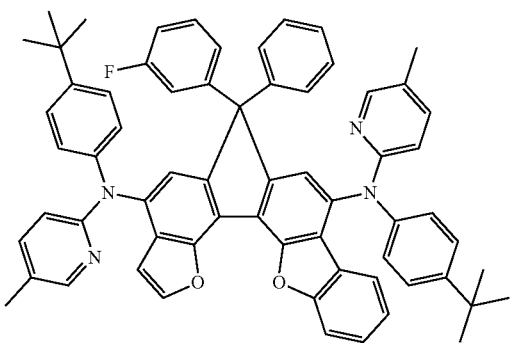

-continued
<Chemical Formula 164>
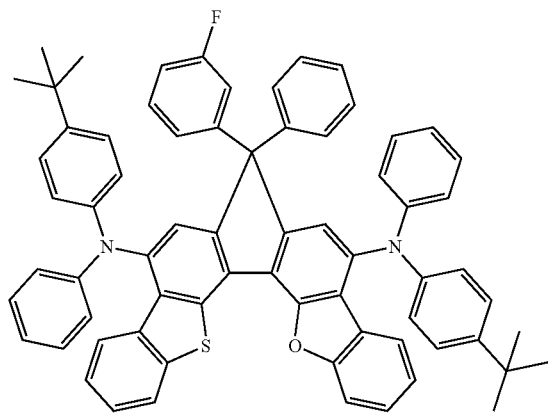
<Chemical Formula 165>
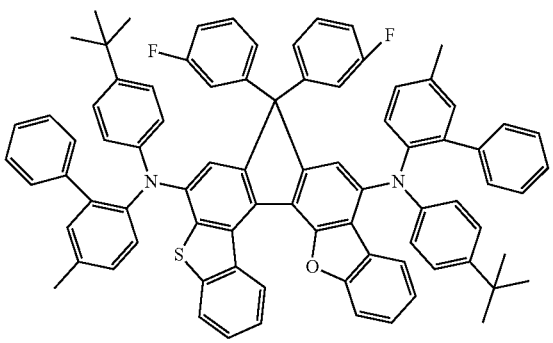
<Chemical Formula 166>
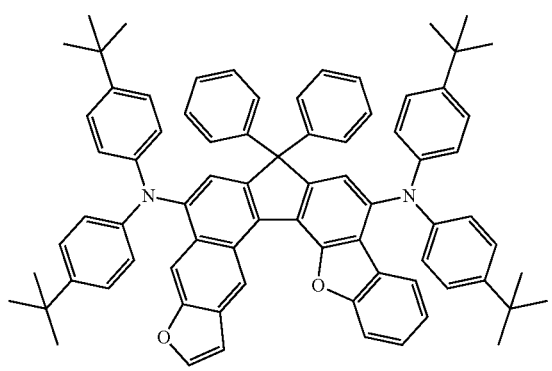
<Chemical Formula 167>
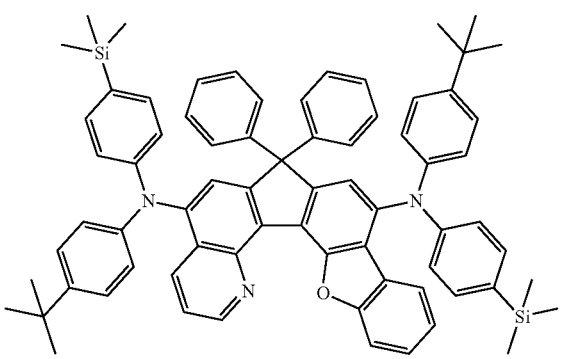
<Chemical Formula 168>
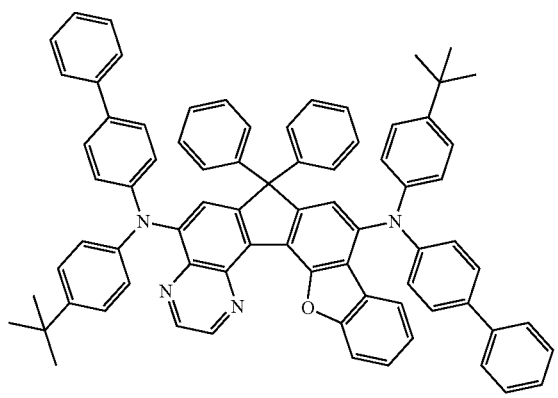
<Chemical Formula 169>
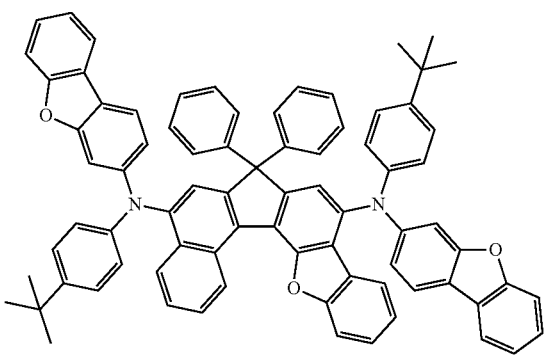
<Chemical Formula 170>
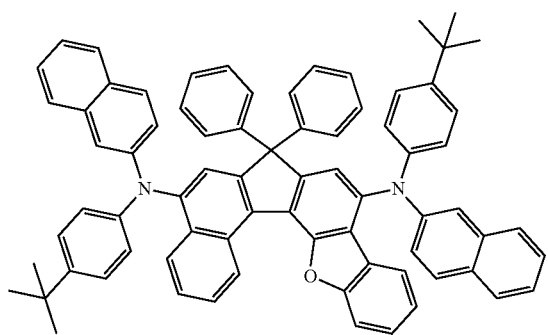
<Chemical Formula 171>
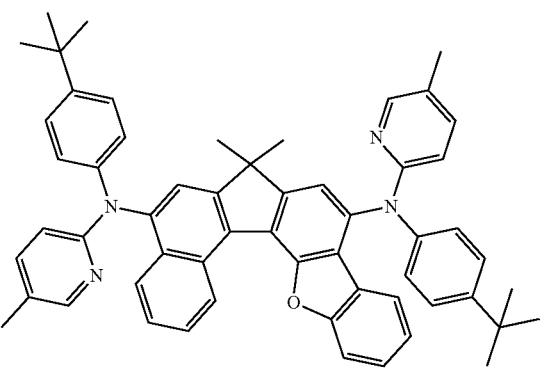

-continued
<Chemical Formula 172>
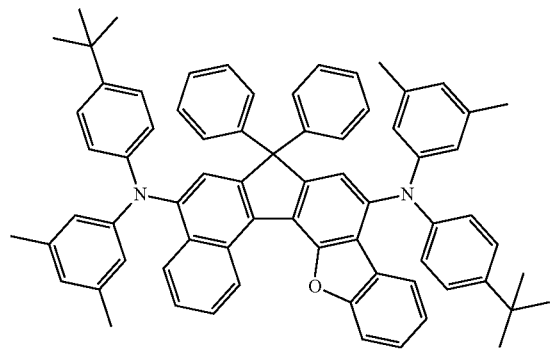
<Chemical Formula 173>
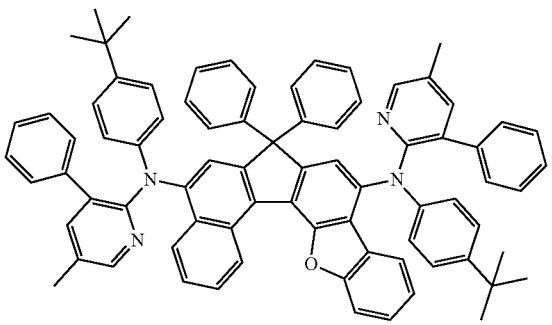
<Chemical Formula 174>
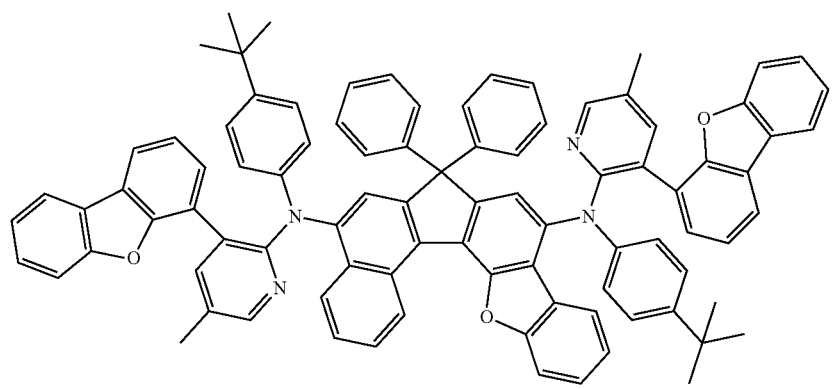
<Chemical Formula 175>
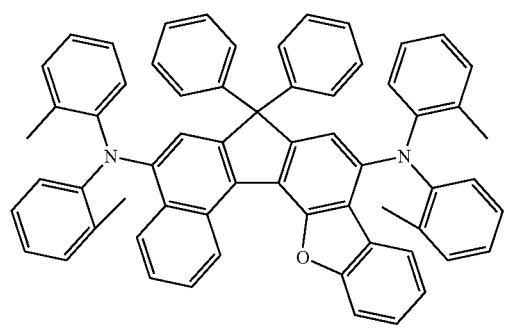
<Chemical Formula 176>
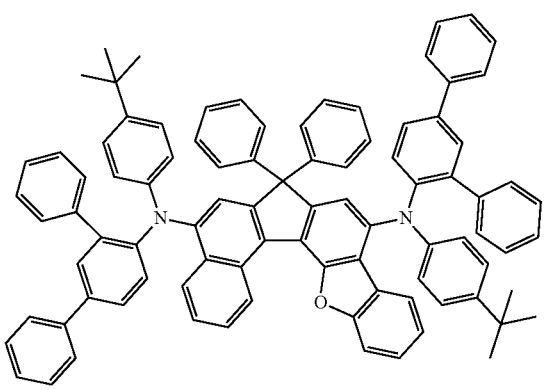
<Chemical Formula 177>
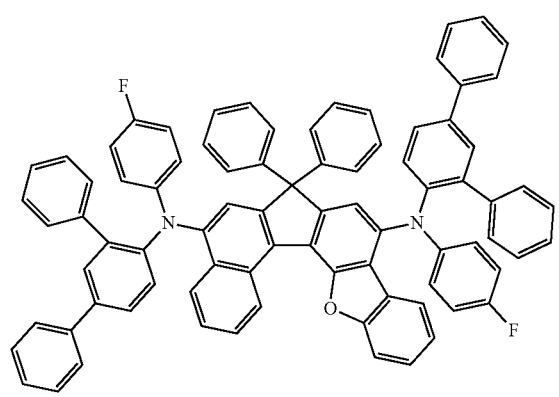
<Chemical Formula 178>
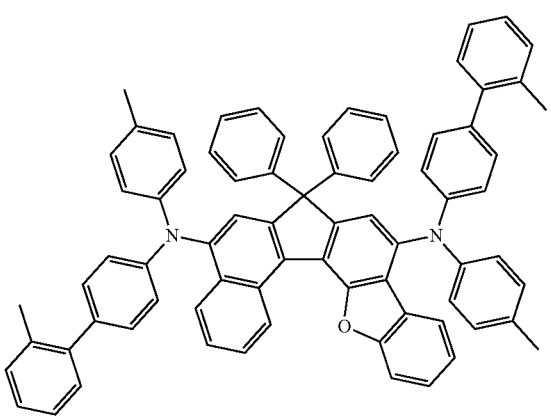

-continued
<Chemical Formula 179>
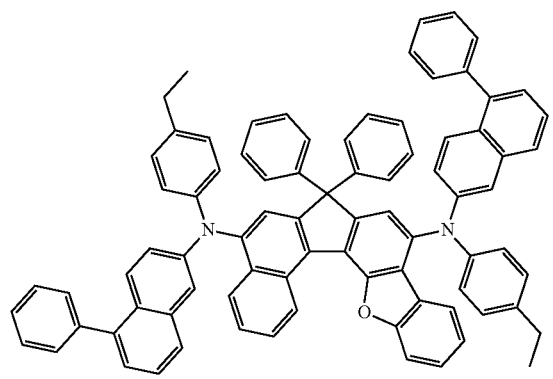
<Chemical Formula 180>
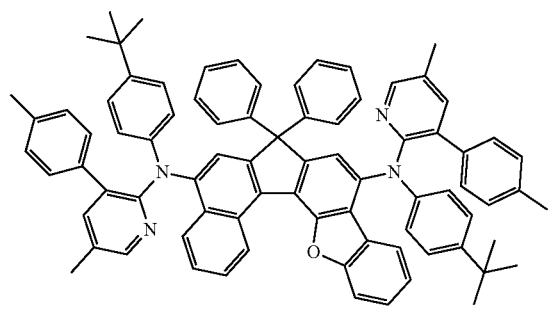
<Chemical Formula 181>
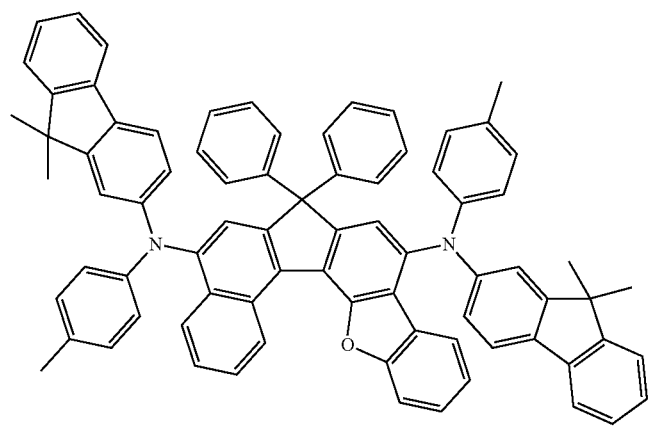
<Chemical Formula 182>
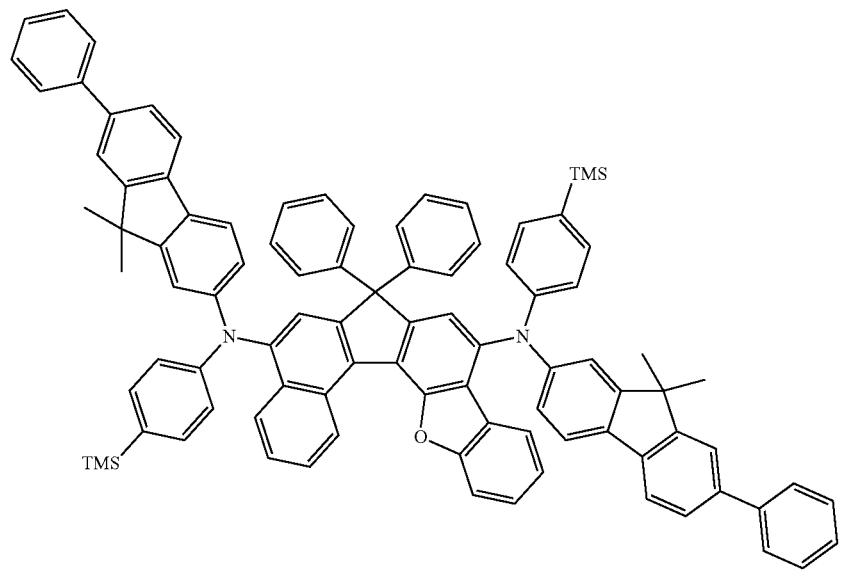

<Chemical Formula 183>
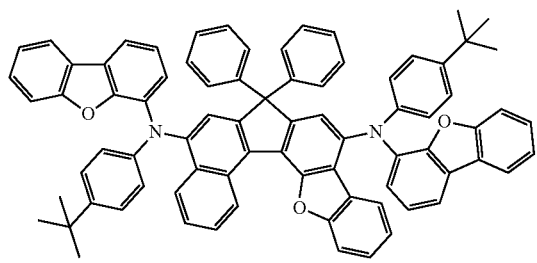
<Chemical Formula 184>
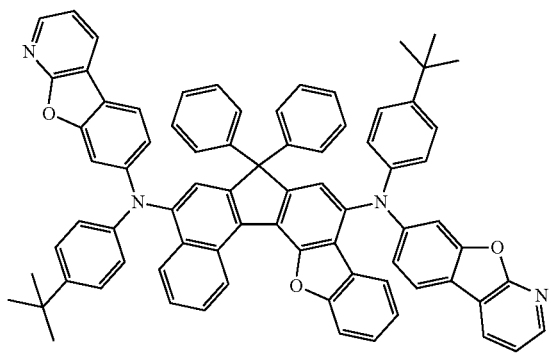
<Chemical Formula 185>
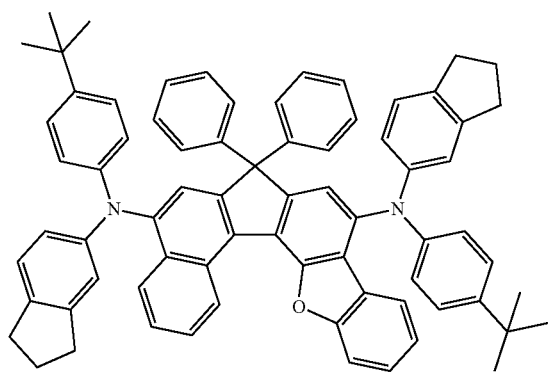
<Chemical Formula 186>
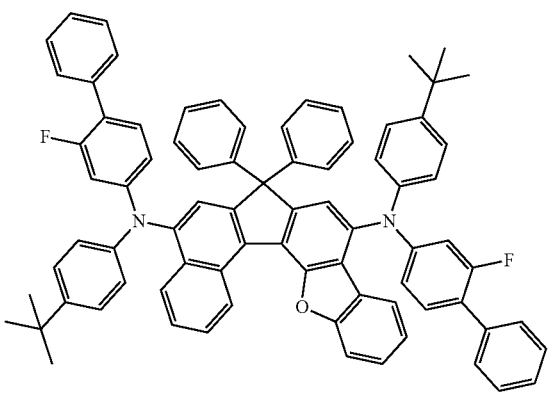
<Chemical Formula 187>
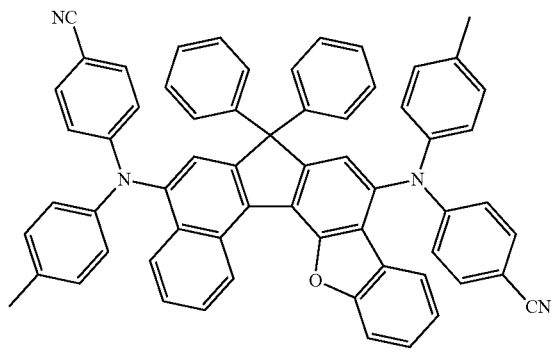
<Chemical Formula 188>
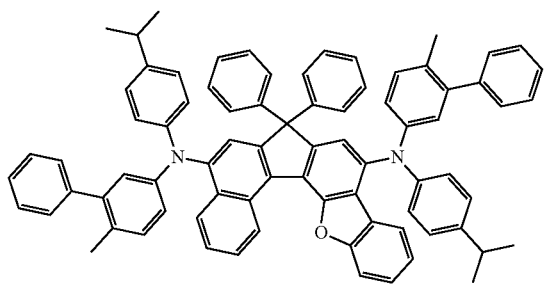
<Chemical Formula 189>
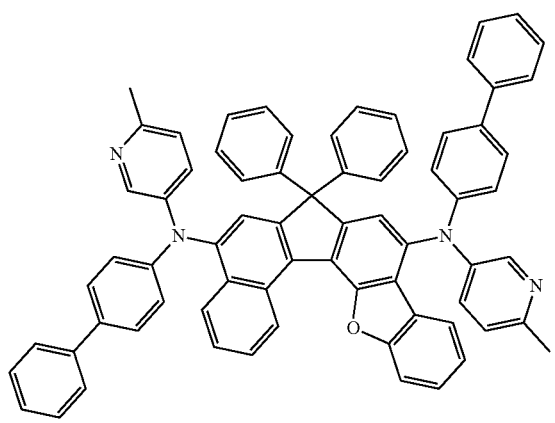
<Chemical Formula 190>
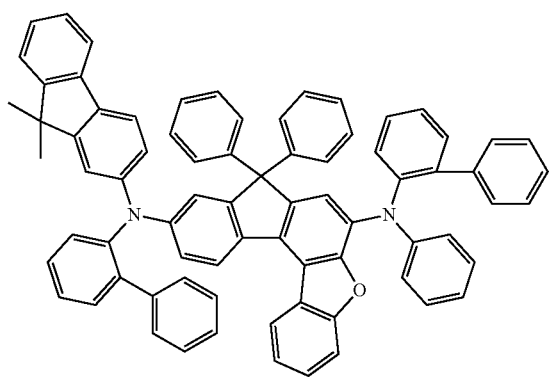

<Chemical Formula 191>
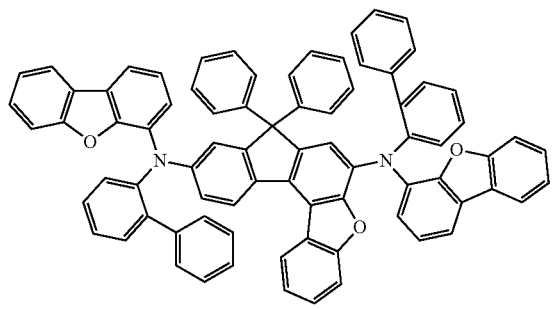
<Chemical Formula 192>
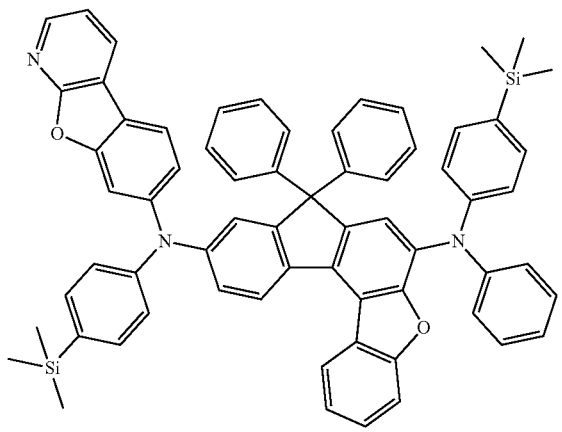
<Chemical Formula 193>
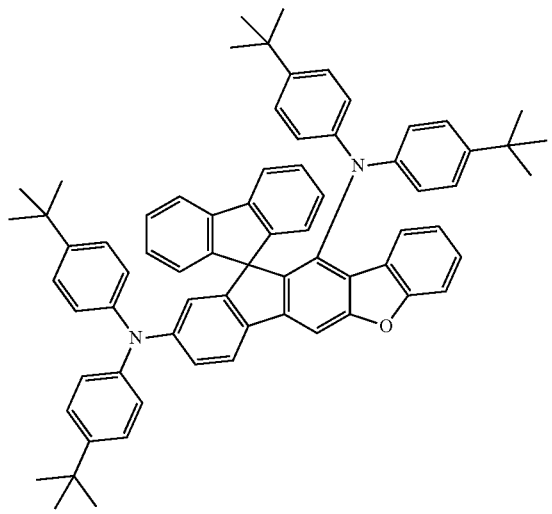
<Chemical Formula 194>
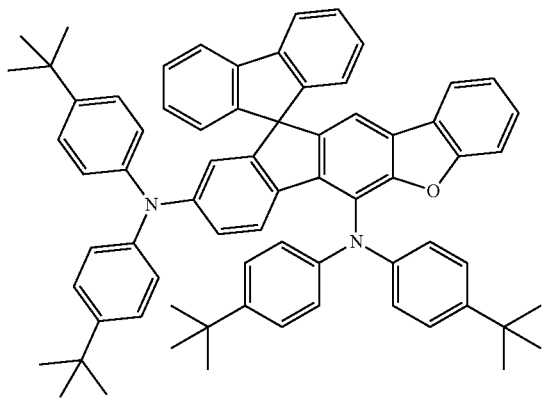
<Chemical Formula 195>
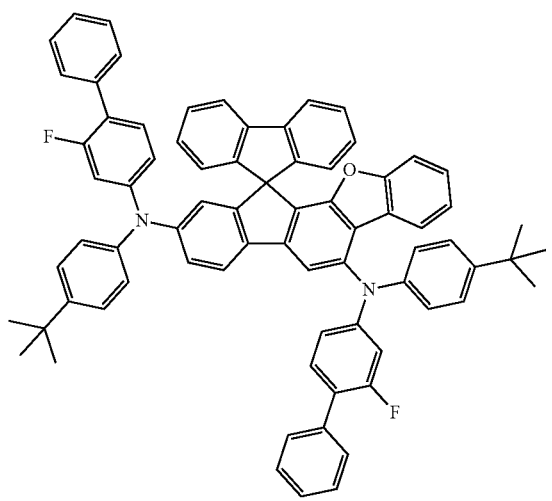
<Chemical Formula 196>
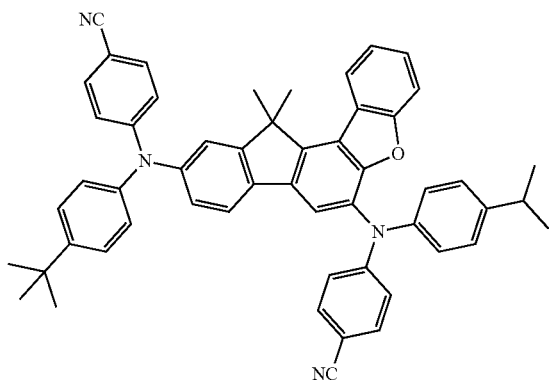

-continued
<Chemical Formula 197>
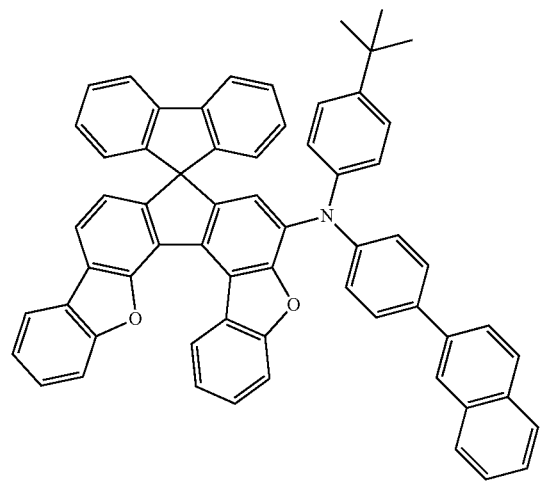
<Chemical Formula 198>
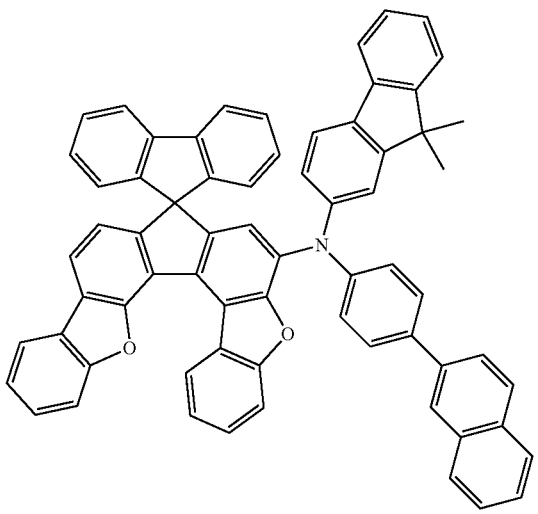
<Chemical Formula 199>
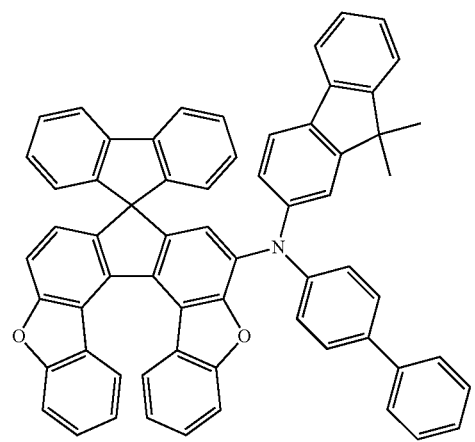
<Chemical Formula 200>
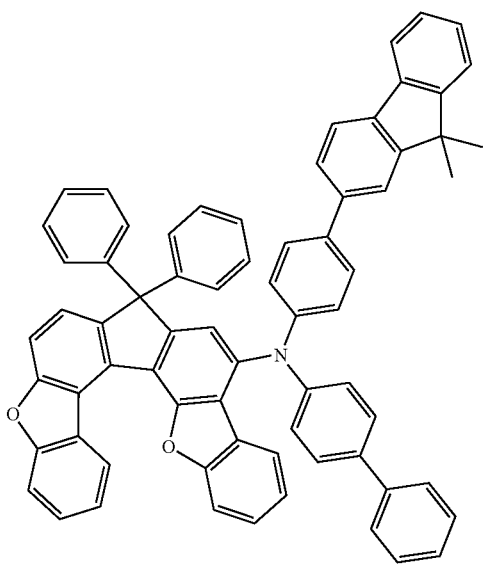

-continued
<Chemical Formula 201>
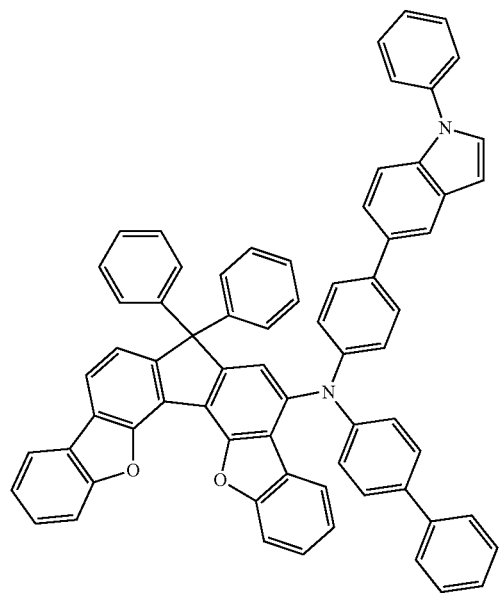
<Chemical Formula 202>
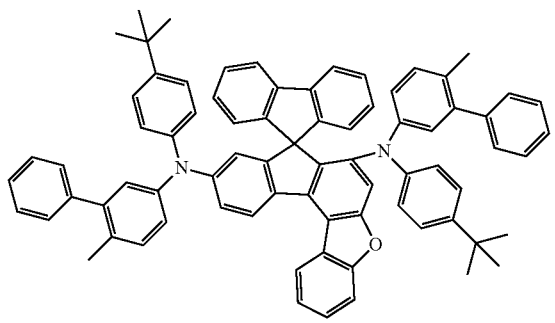
<Chemical Formula 203>
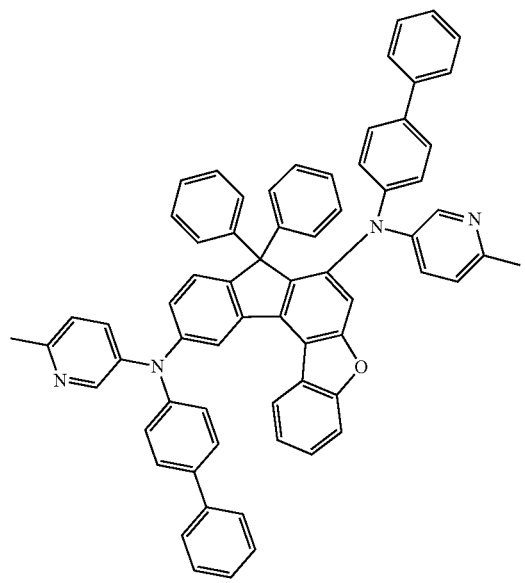
<Chemical Formula 204>
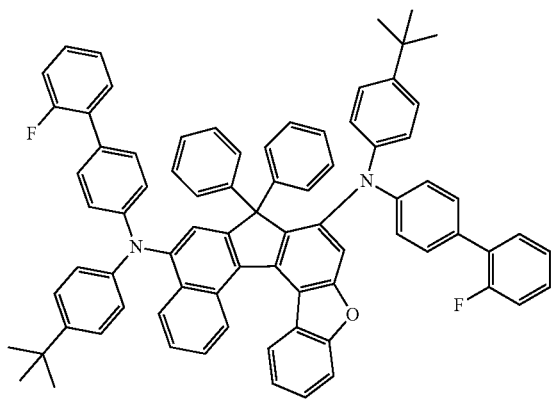
<Chemical Formula 205>
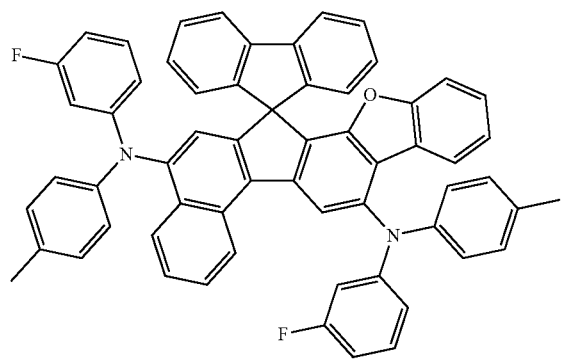
<Chemical Formula 206>
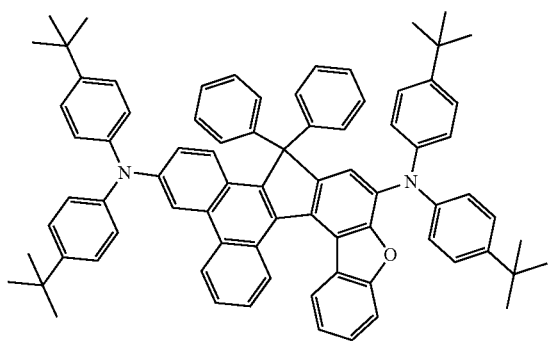

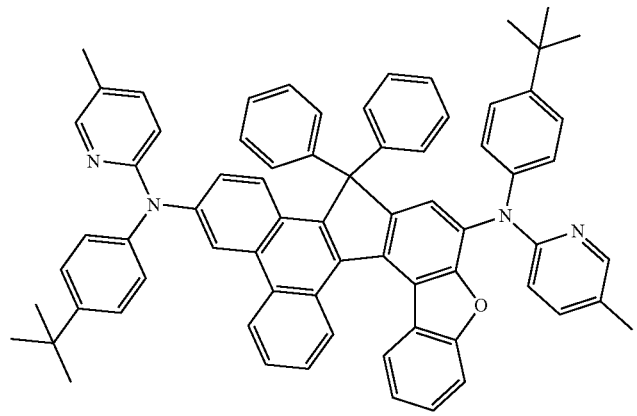
<Chemical Formula 207>
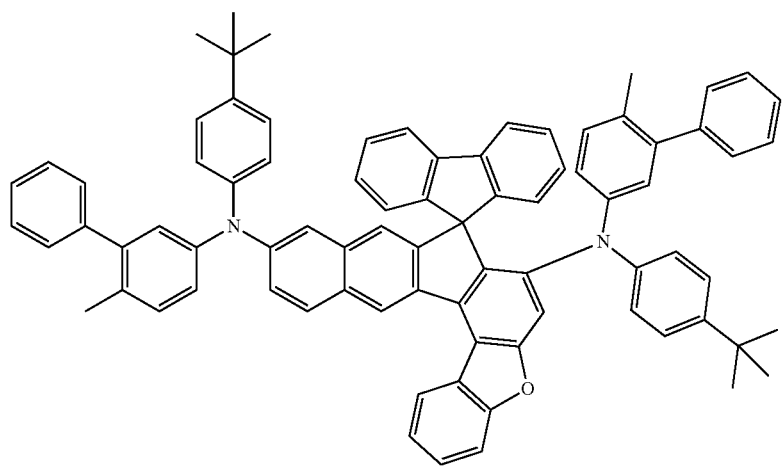
<Chemical Formula 208>
<Chemical Formula 209>
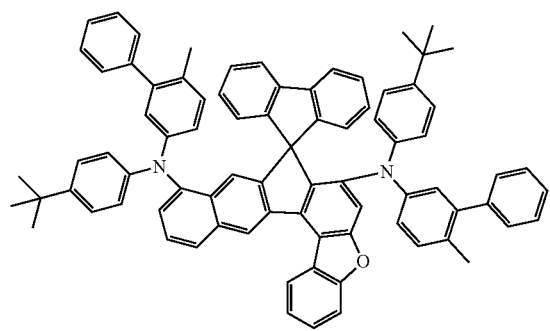
<Chemical Formula 210>
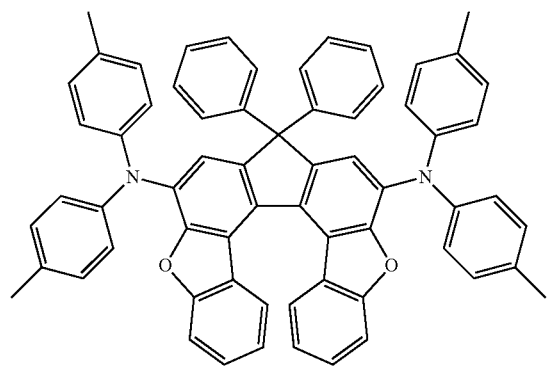

<Chemical Formula 211>
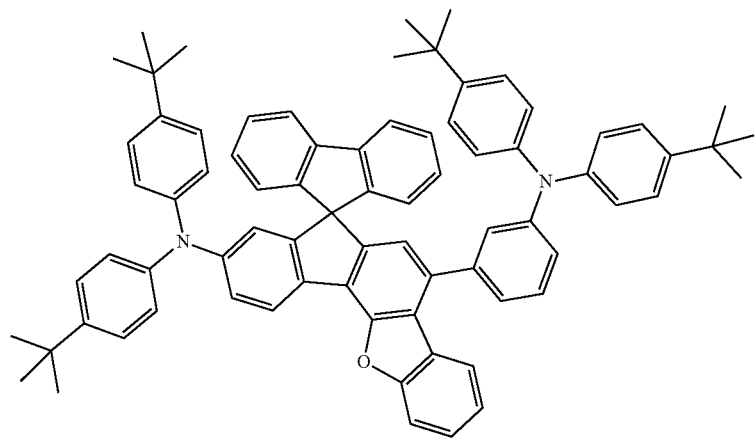
<Chemical Formula 212>
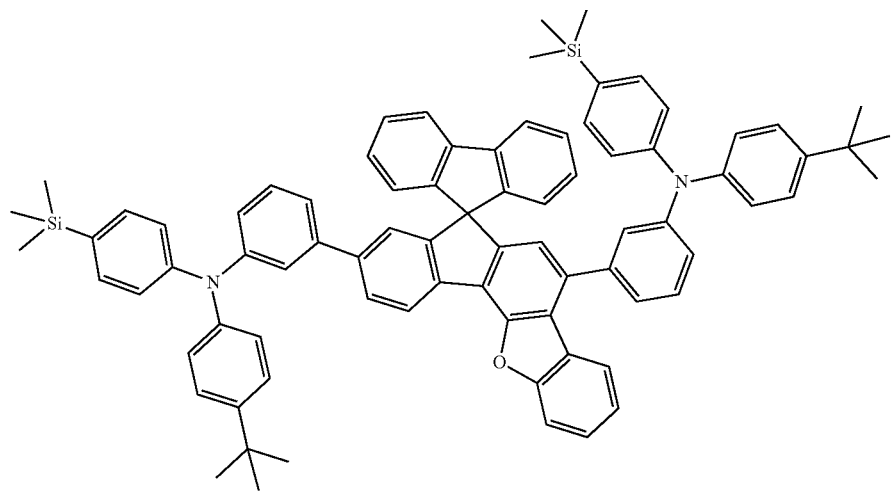
<Chemical Formula 213>
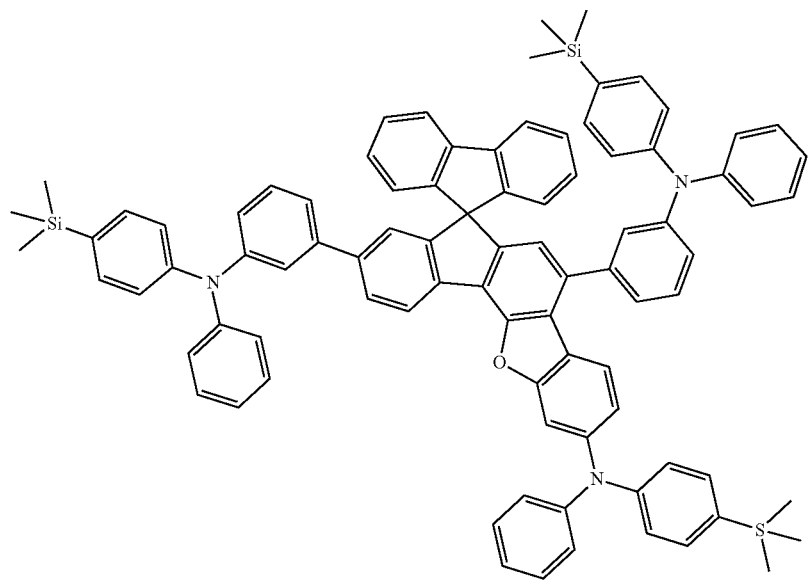

<Chemical Formula 214>
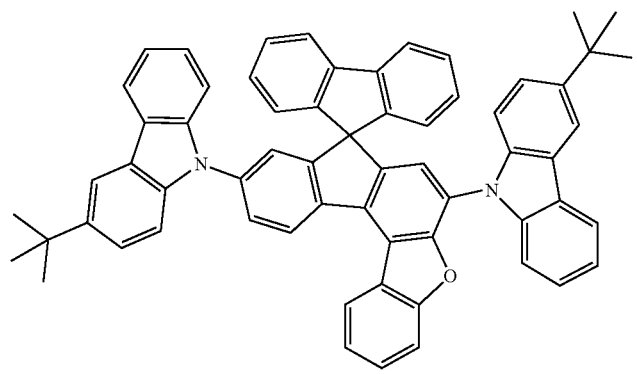
<Chemical Formula 215>
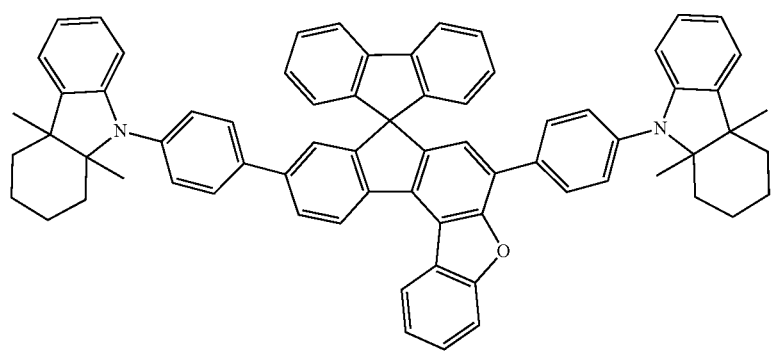
<Chemical Formula 216>
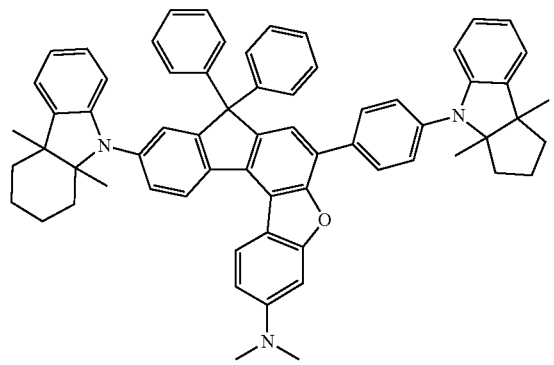
<Chemical Formula 217>
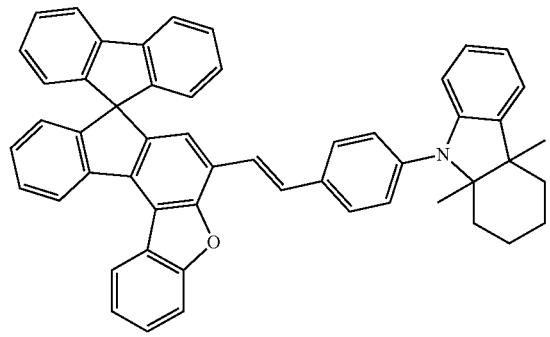
<Chemical Formula 218>
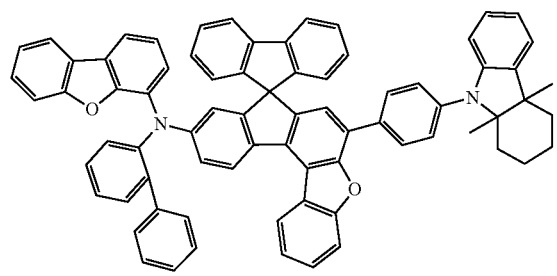
<Chemical Formula 219>
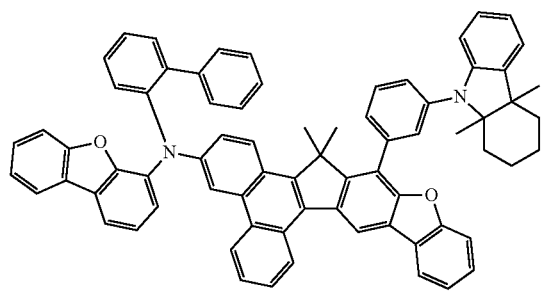

<Chemical Formula 220>
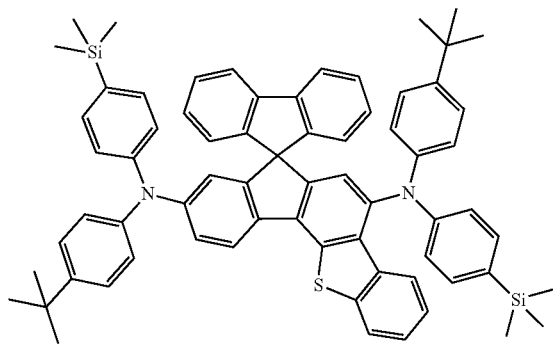
<Chemical Formula 221>
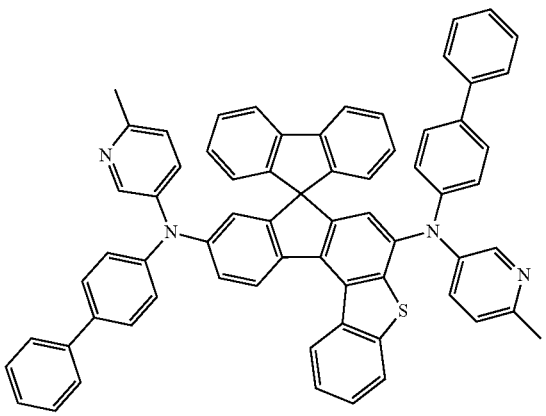
<Chemical Formula 222>
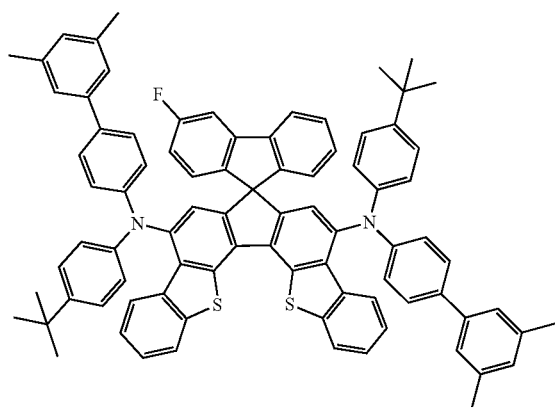
<Chemical Formula 223>
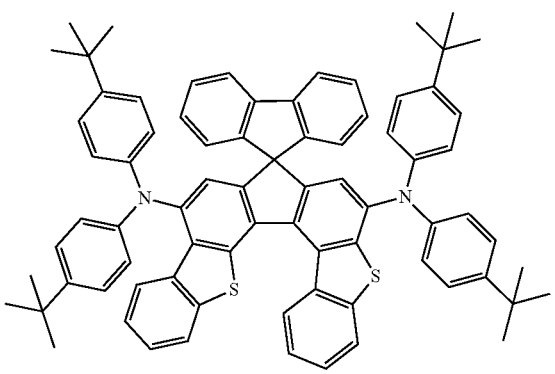
<Chemical Formula 224>
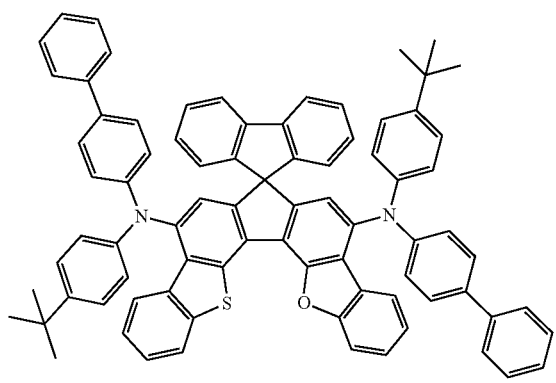
<Chemical Formula 225>
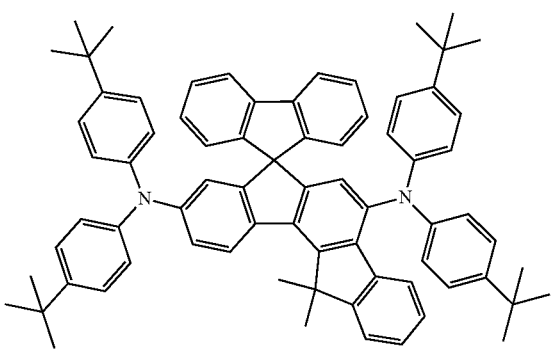

-continued
<Chemical Formula 226>
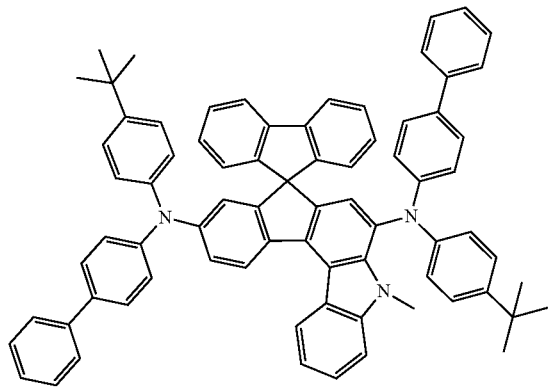
<Chemical Formula 227>
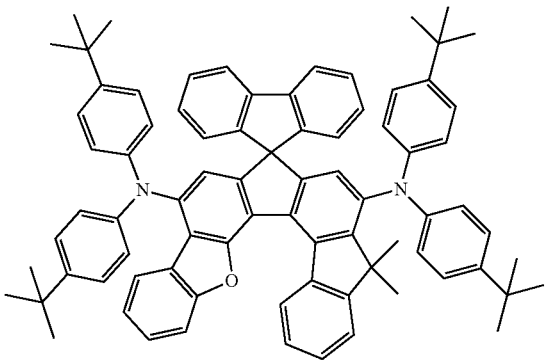
<Chemical Formula 228>
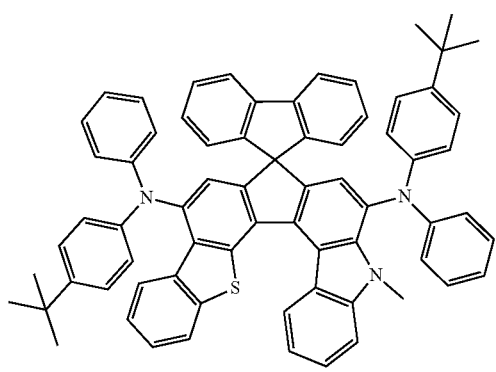
<Chemical Formula 229>
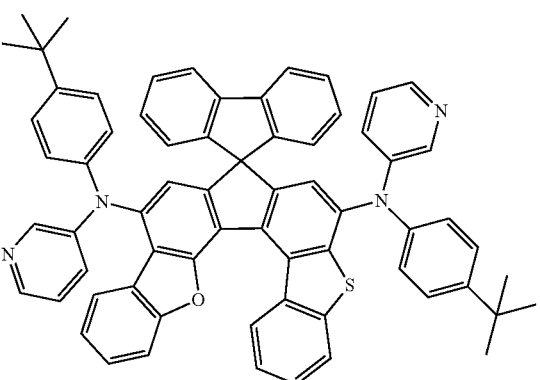
<Chemical Formula 230>
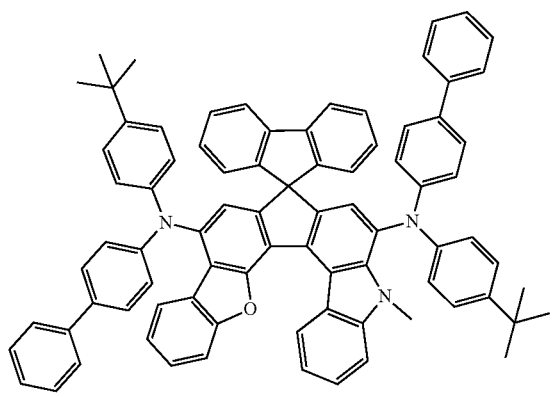
<Chemical Formula 231>
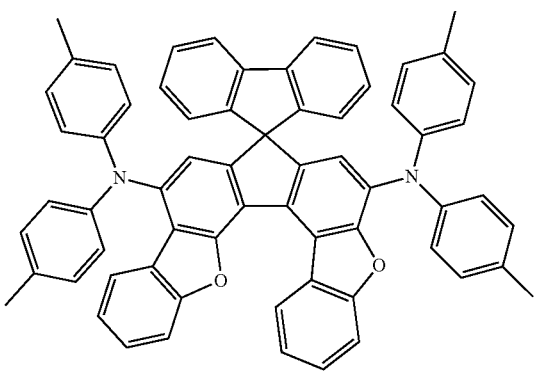
<Chemical Formula 232>
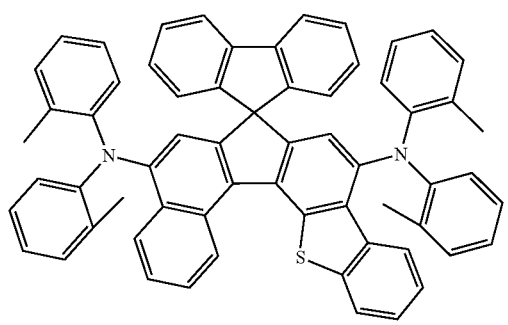
<Chemical Formula 233>
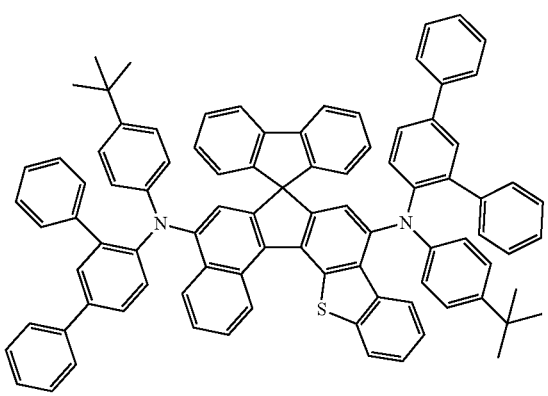

-continued
<Chemical Formula 234>
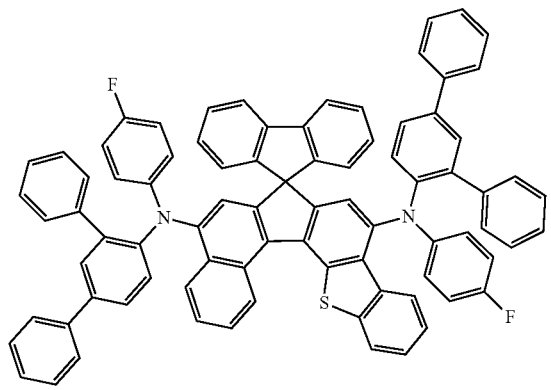
<Chemical Formula 235>
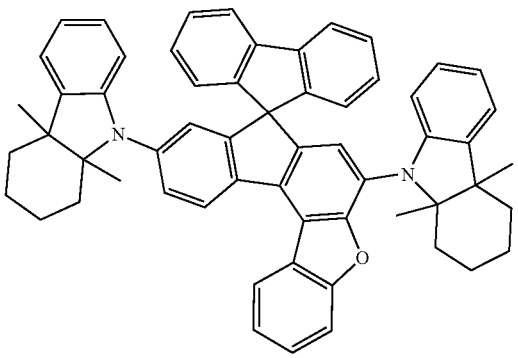
<Chemical Formula 236>
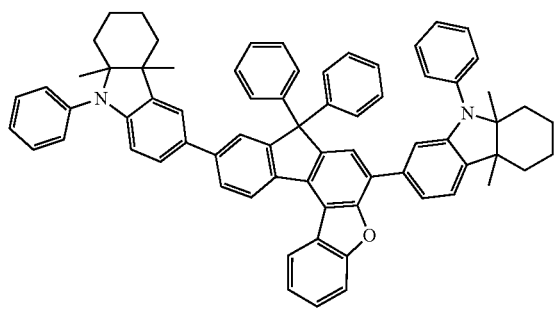
<Chemical Formula 237>
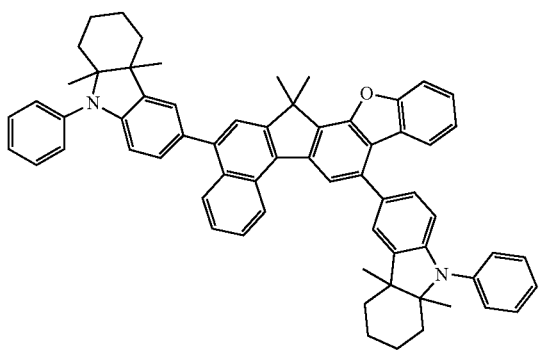
<Chemical Formula 238>
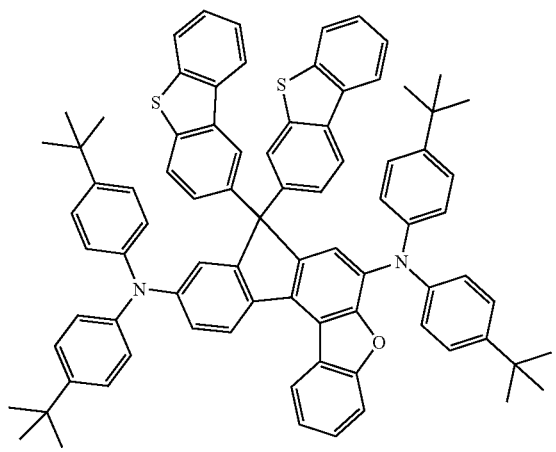
<Chemical Formula 239>
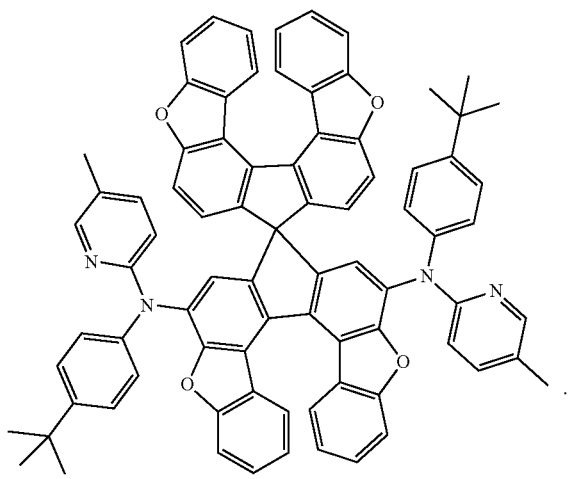
9. The organic light-emitting diode of claim 1, wherein the compound represented by [Chemical Formula E] is any one selected from the group consisting of the following [Compound 1] to [Compound 63]:

[Compound 1]
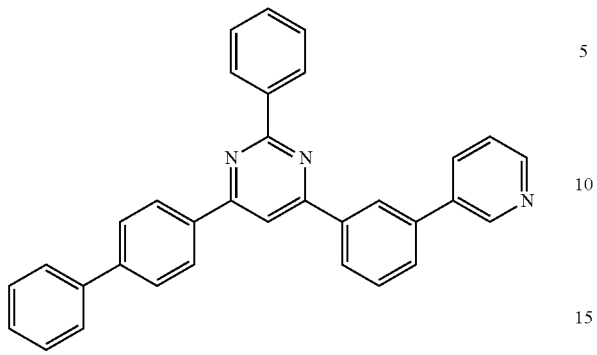
[Compound 2]
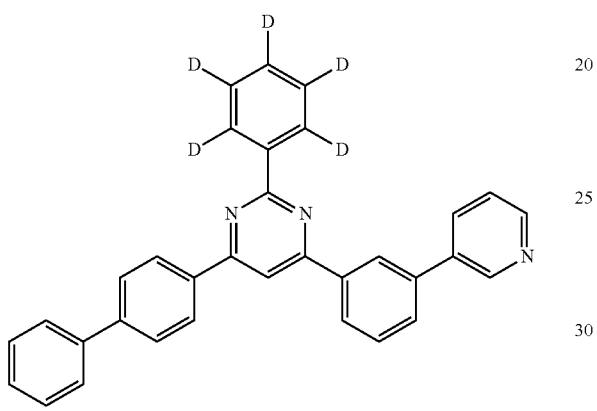
[Compound 3]
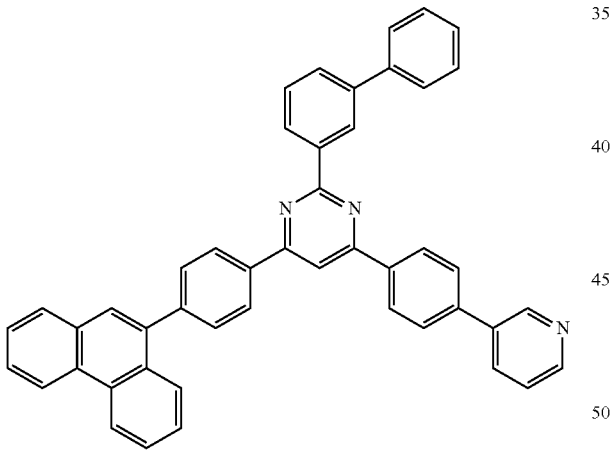
[Compound 4]
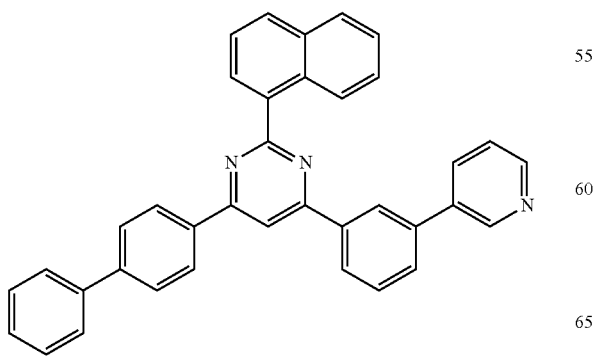
[Compound 5]
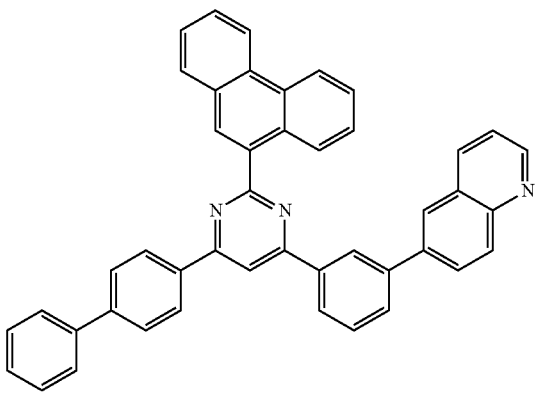
[Compound 6]
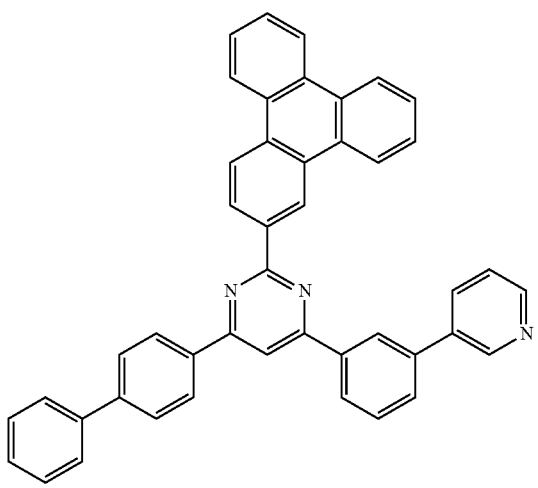
[Compound 7]
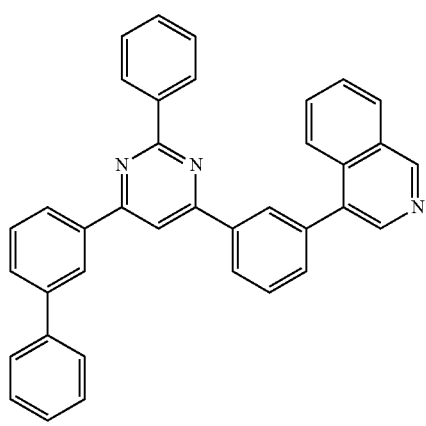

[Compound 8]
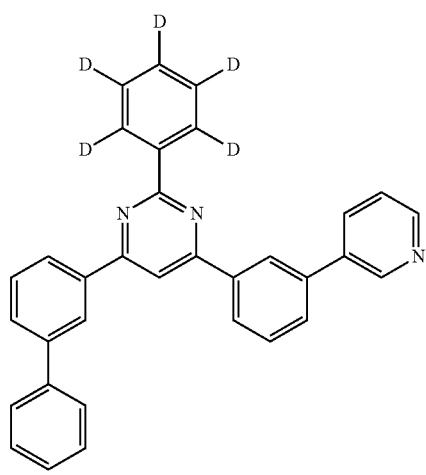
[Compound 9]
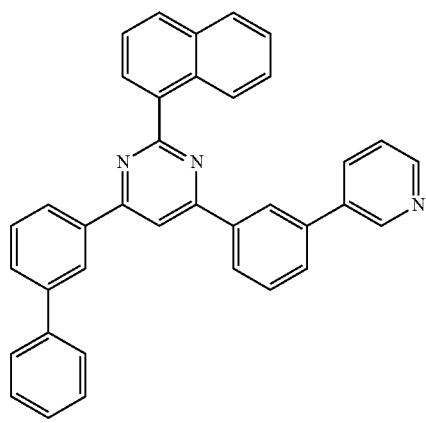
[Compound 10]
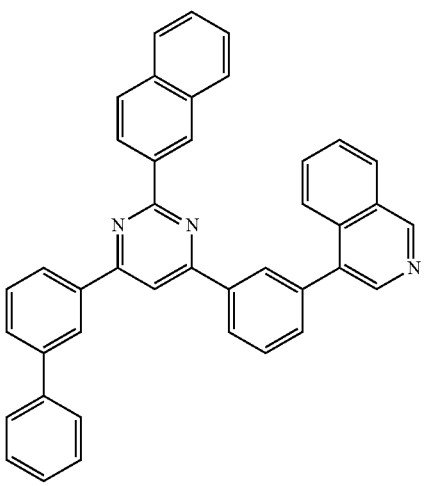
[Compound 11]
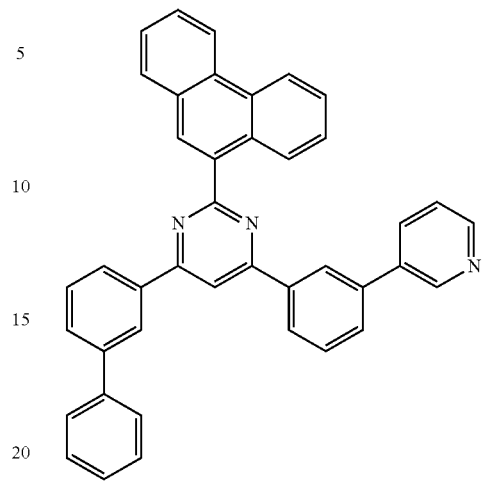
[Compound 12]
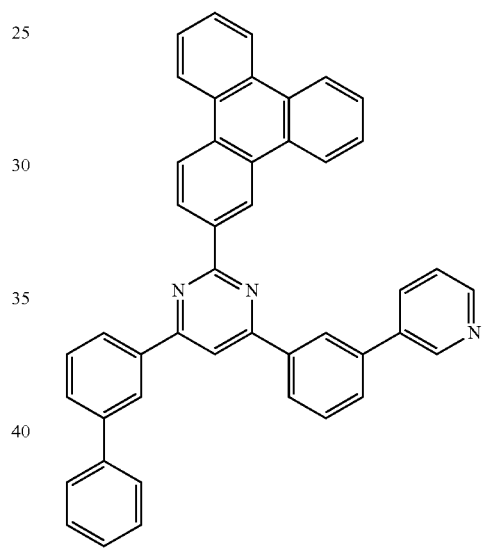
[Compound 13]
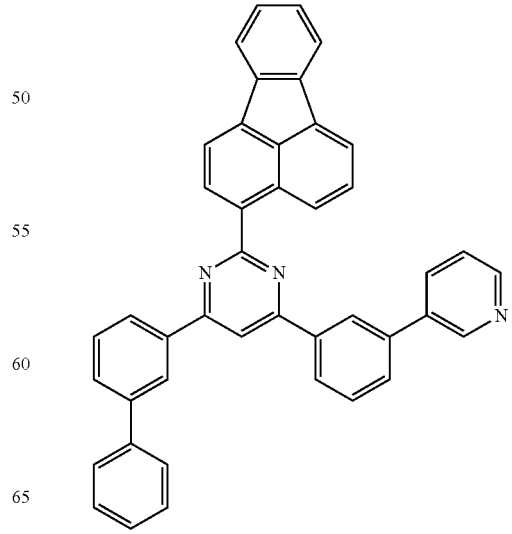

[Compound 14]
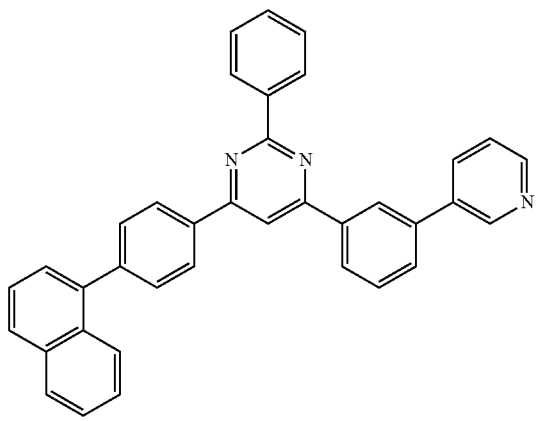
[Compound 15]
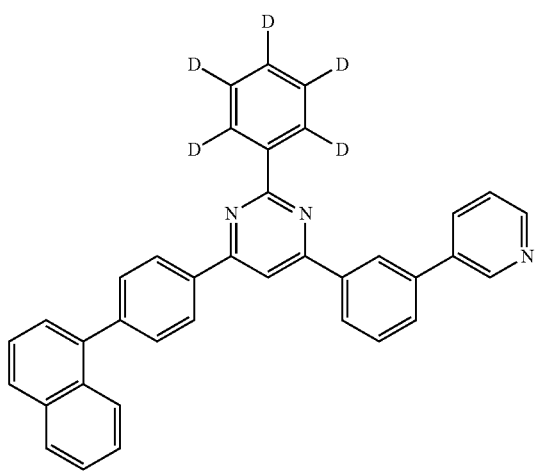
[Compound 16]
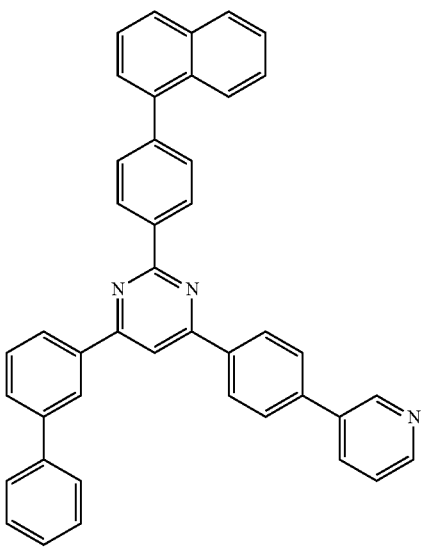
[Compound 17]
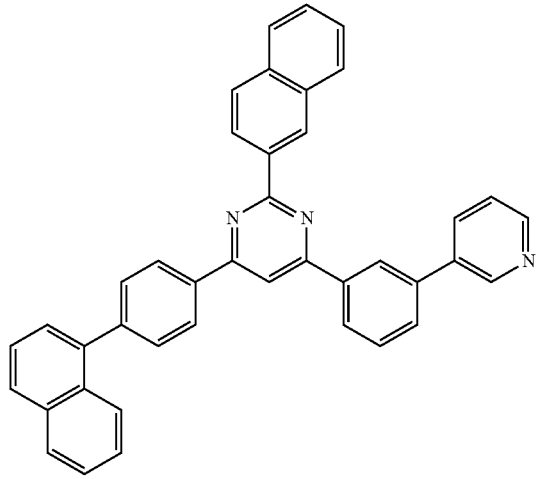
[Compound 18]
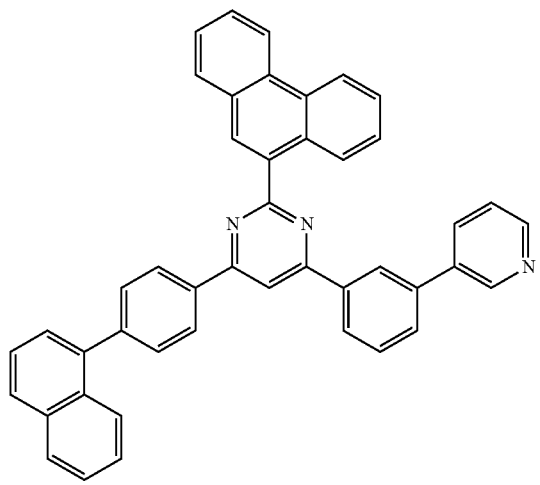
[Compound 19]
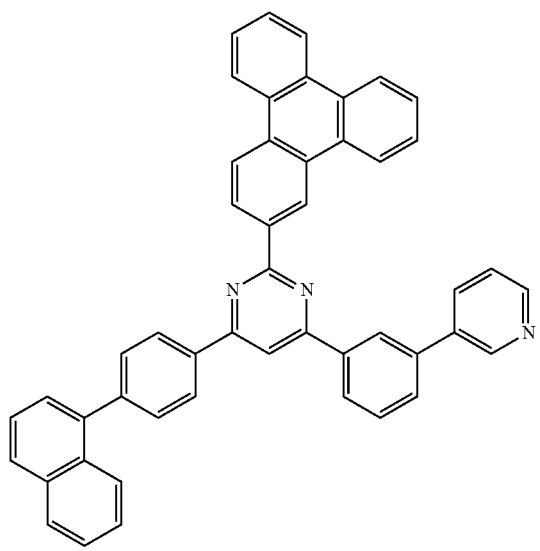

[Compound 20]
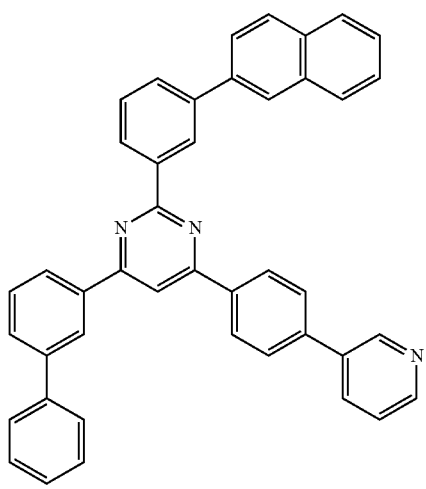
[Compound 21]
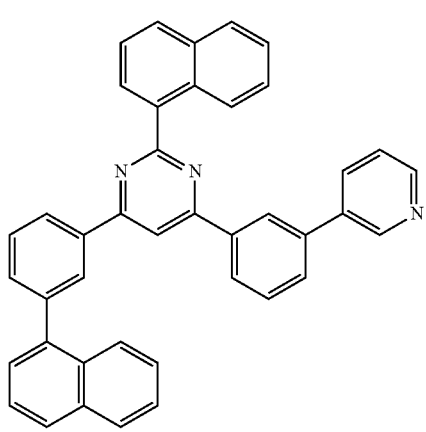
[Compound 22]
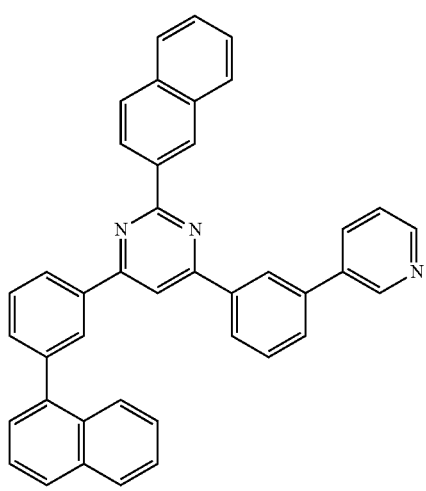
[Compound 23]
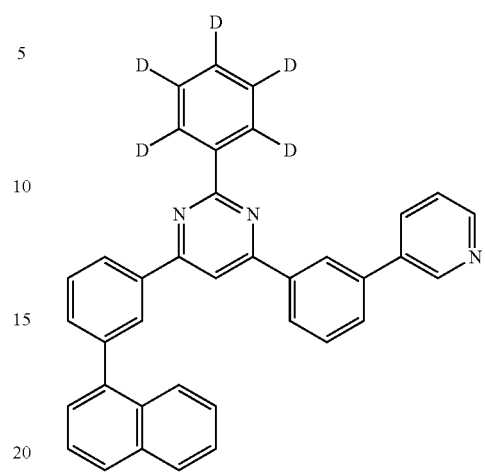
[Compound 24]
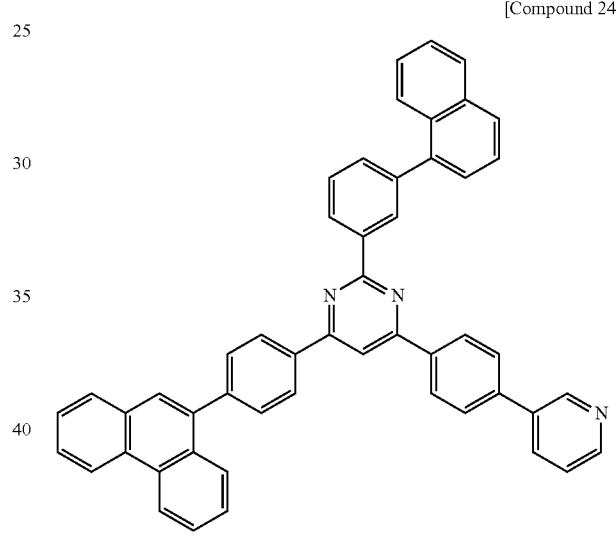
[Compound 25]
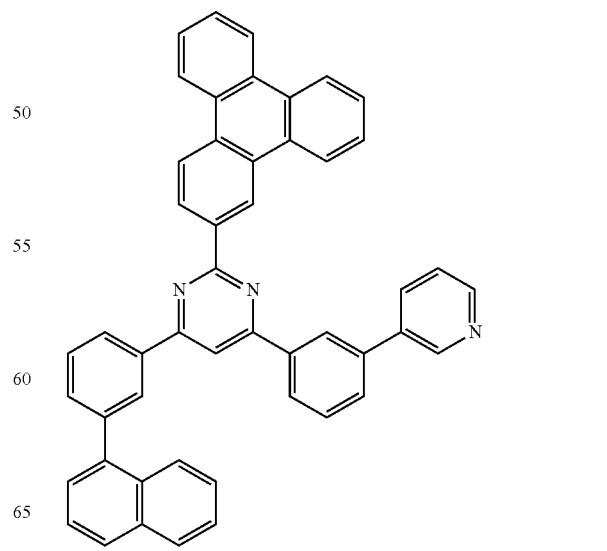

[Compound 26]
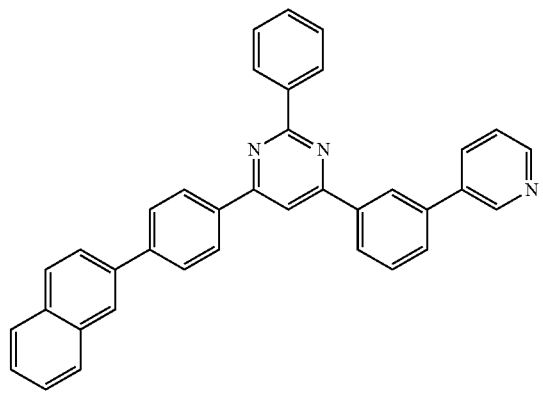
[Compound 27]
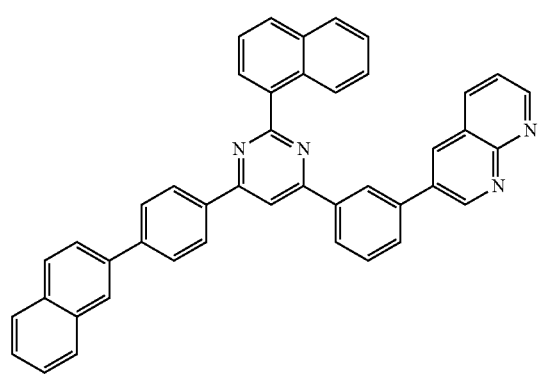
[Compound 28]
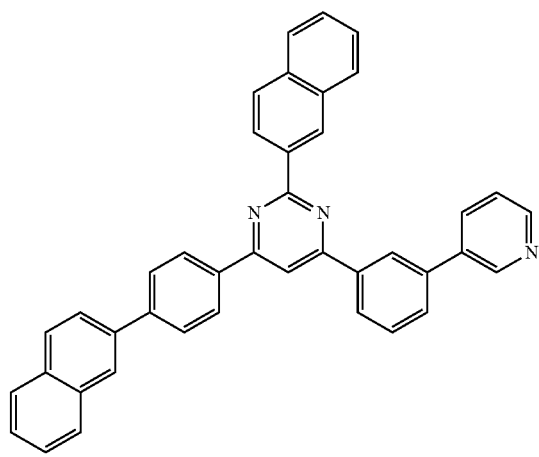
[Compound 29]
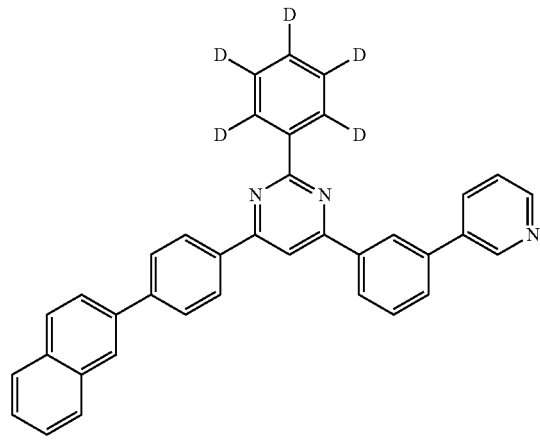
[Compound 30]
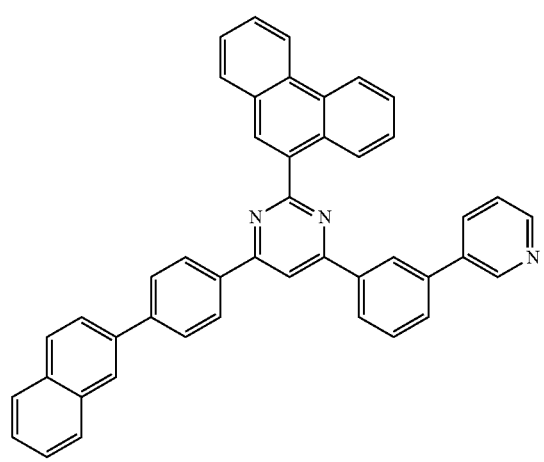
[Compound 31]
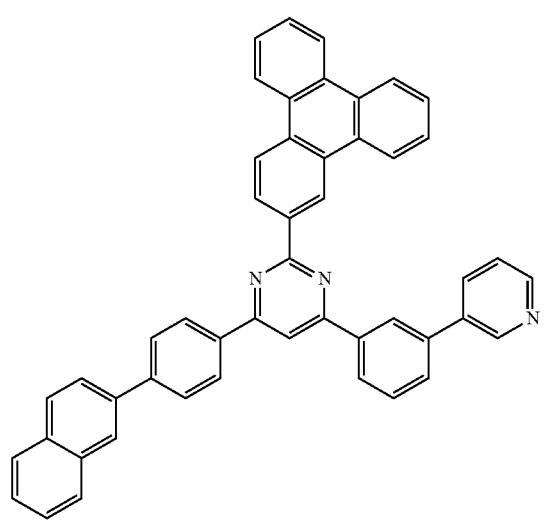

[Compound 32]
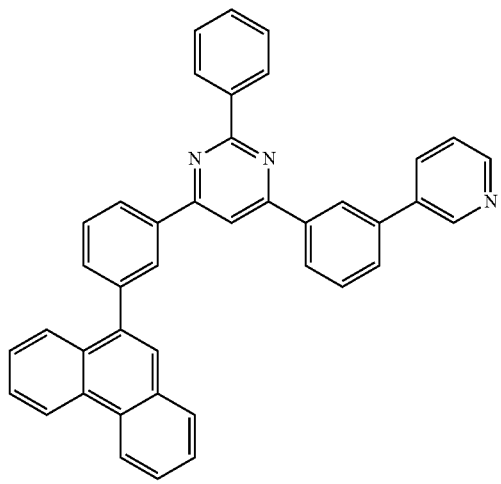
[Compound 33]
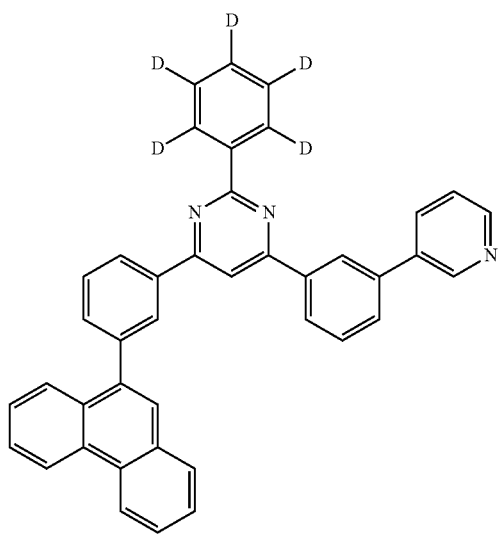
[Compound 34]
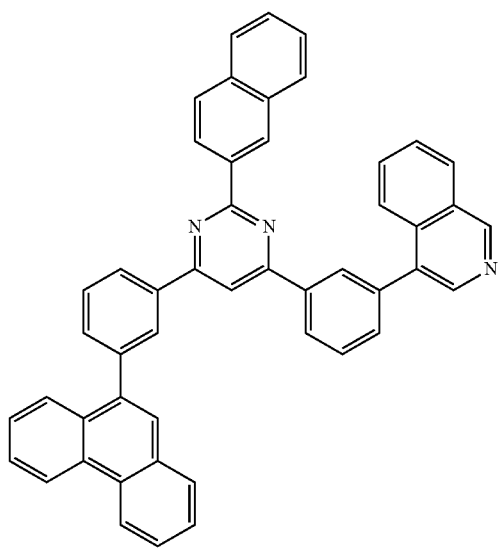
[Compound 35]
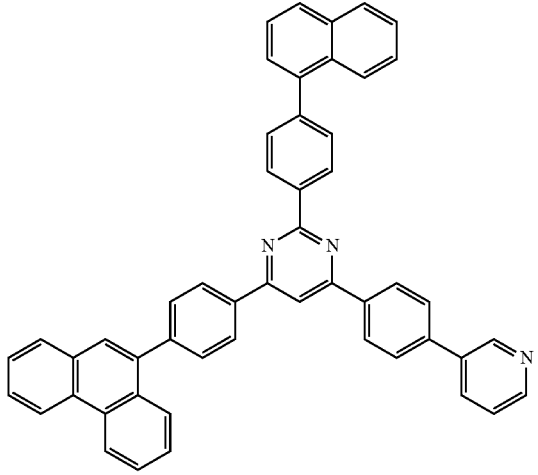
[Compound 36]
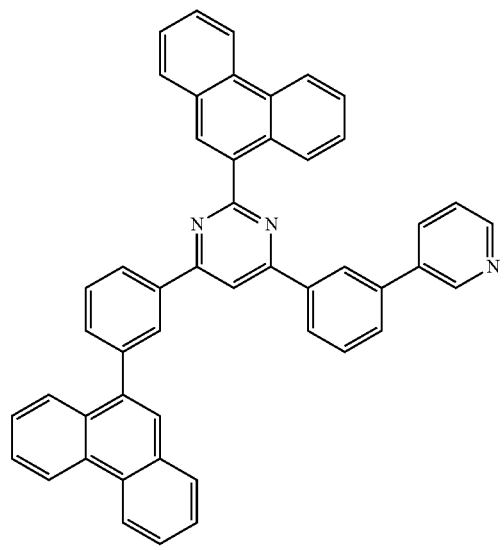
[Compound 37]
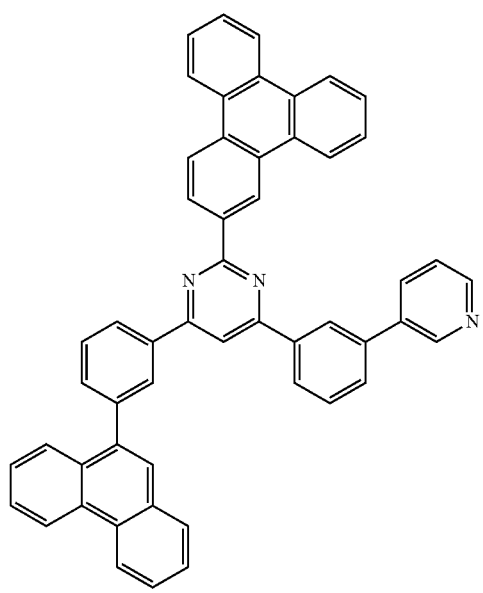

[Compound 38]
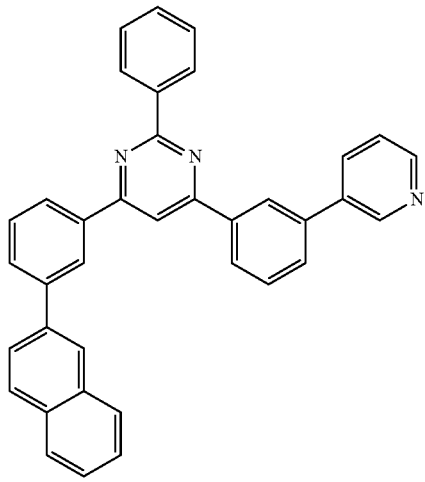
[Compound 39]
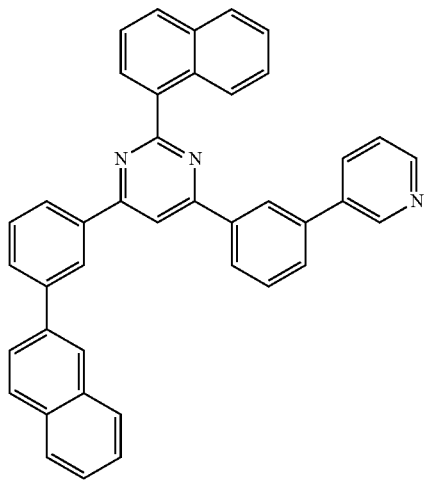
[Compound 40]
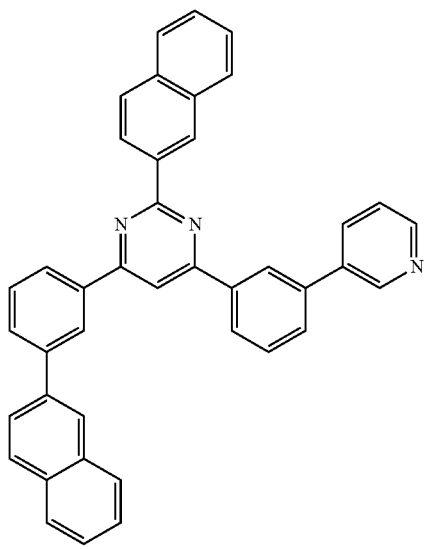
[Compound 41]
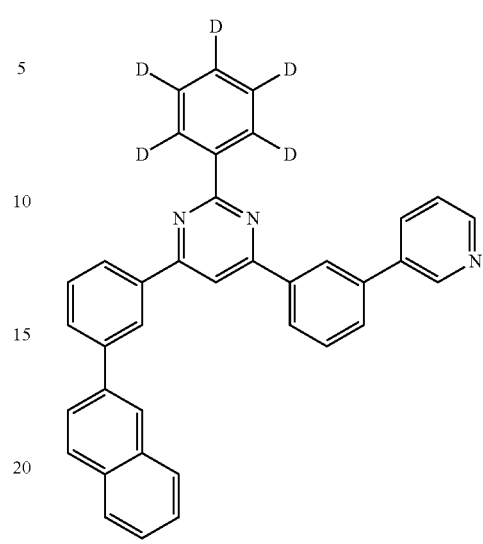
[Compound 42]
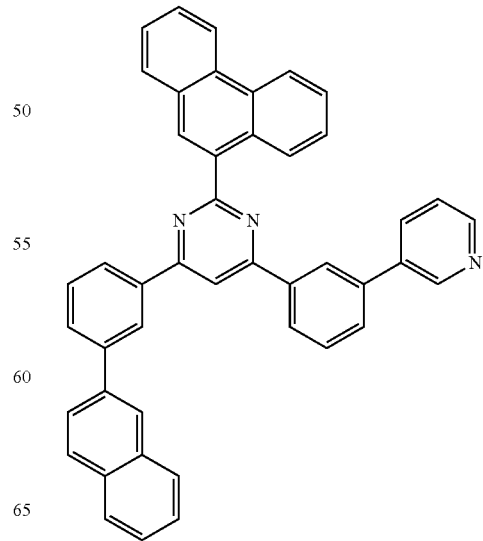

[Compound 43]
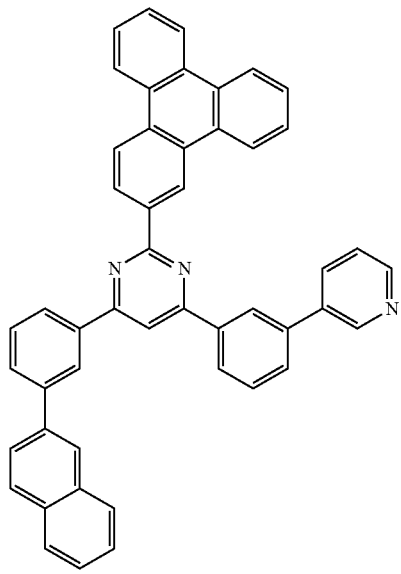
[Compound 44]
[Compound 45]
[Compound 46]
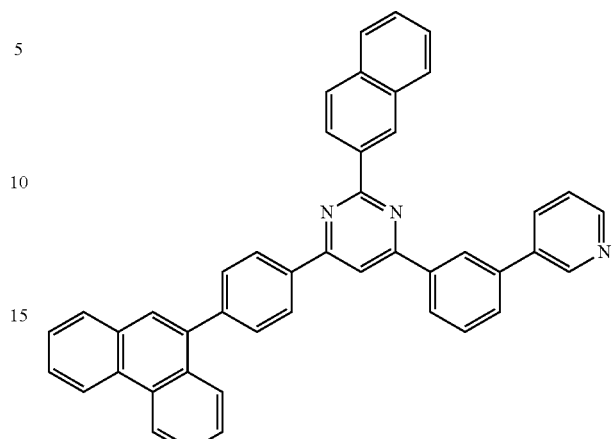
[Compound 47]
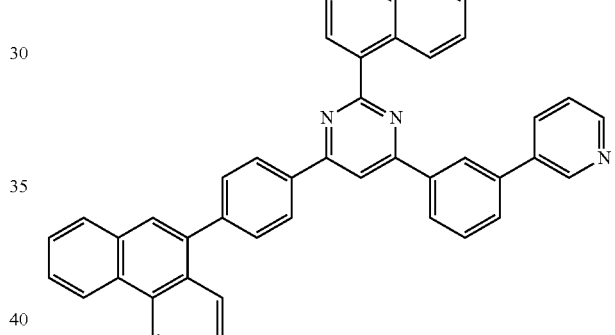
[Compound 48]
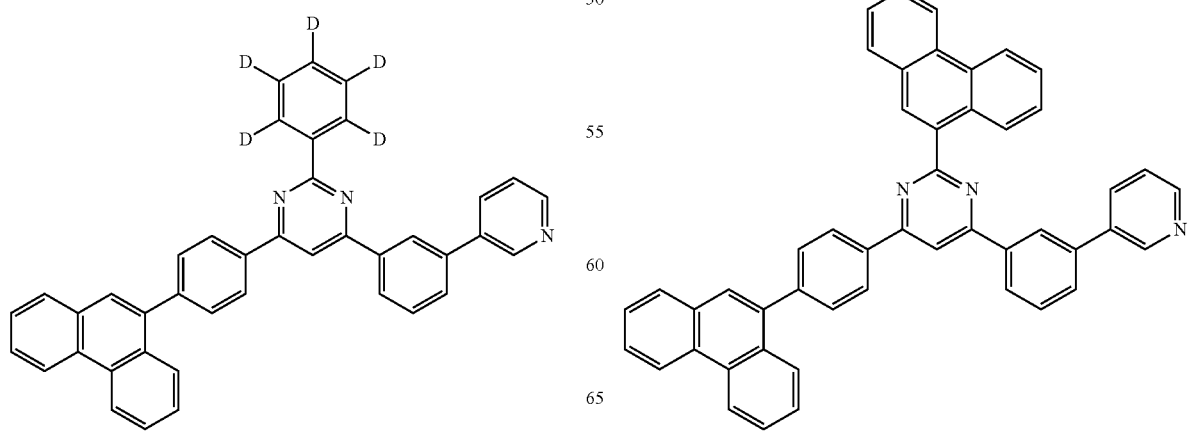

[Compound 49]
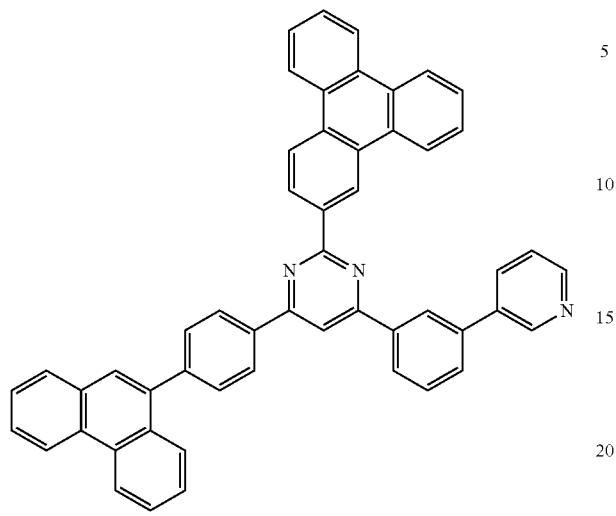
[Compound 52]
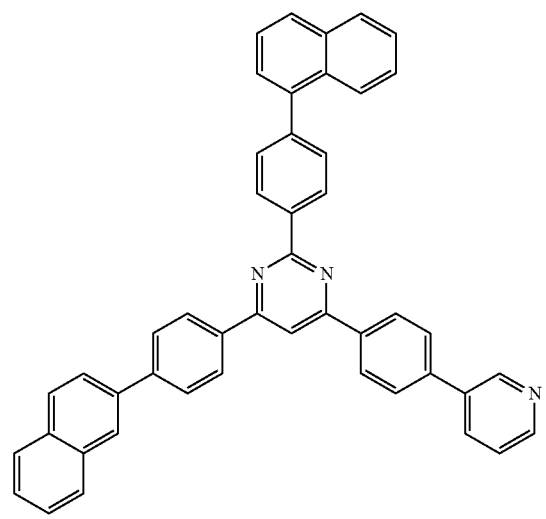
[Compound 50]
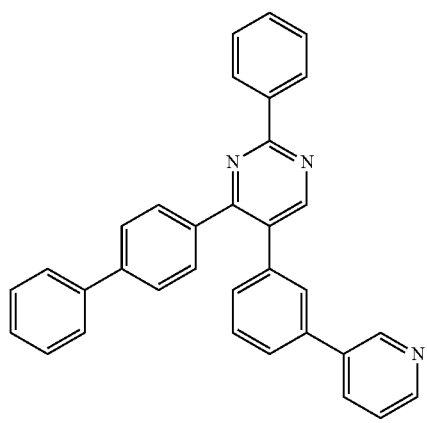
[Compound 53]
[Compound 51]
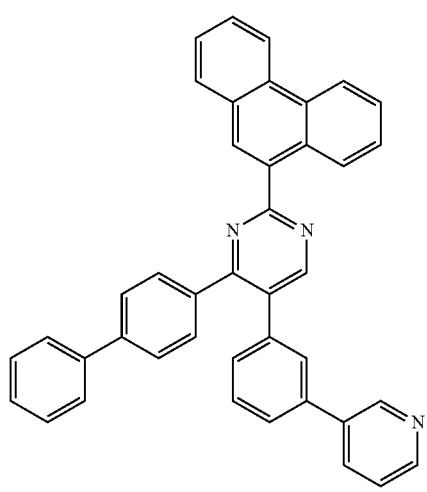
[Compound 54]
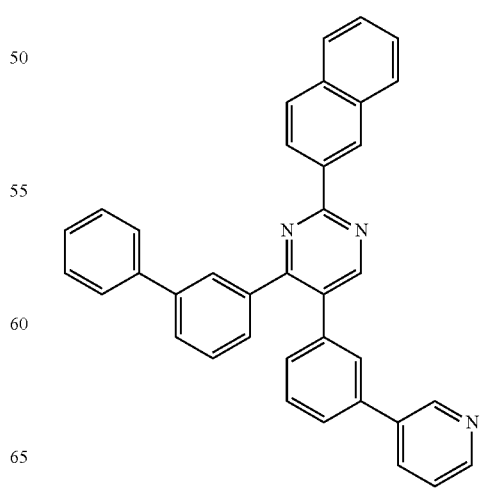

[Compound 55]
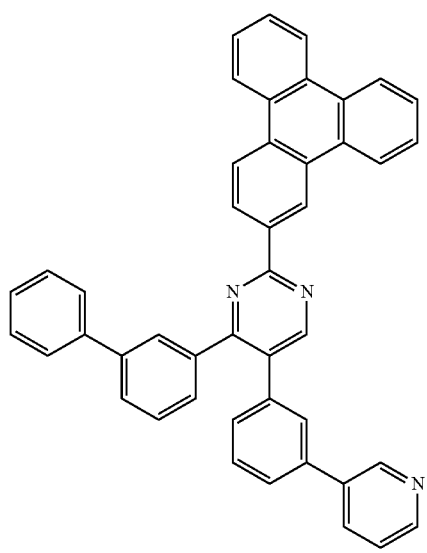
[Compound 56]
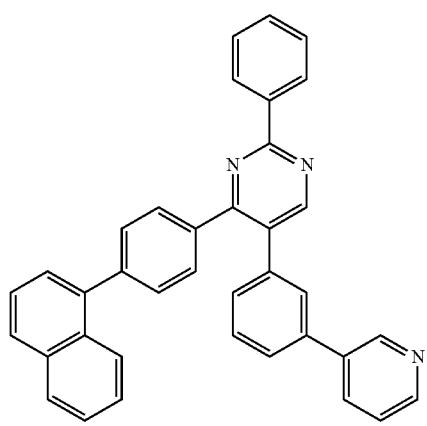
[Compound 57]
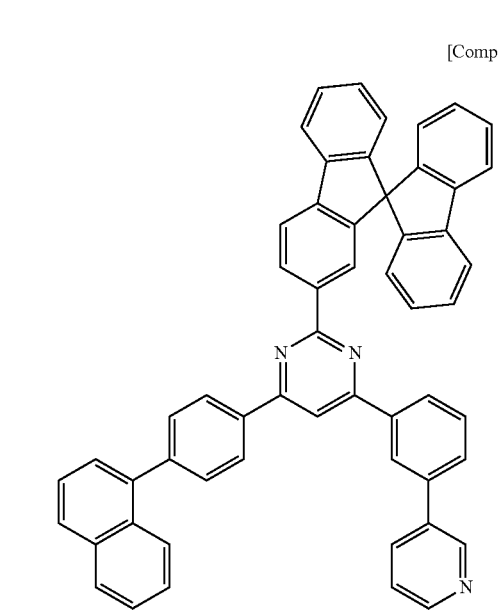
[Compound 58]
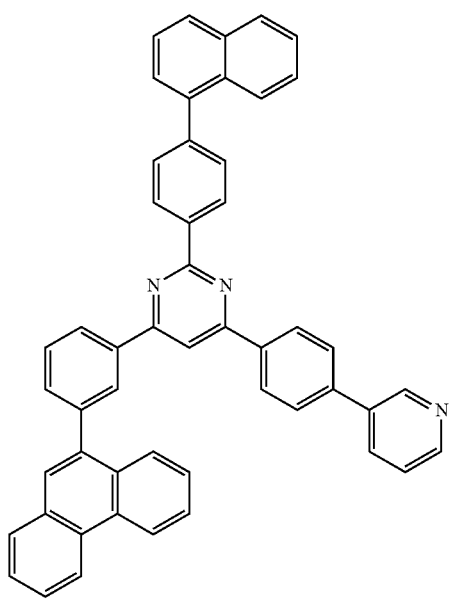
[Compound 59]
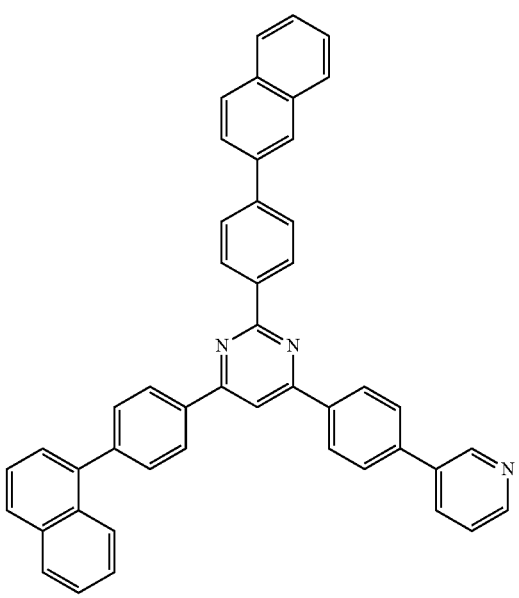

[Compound 60]

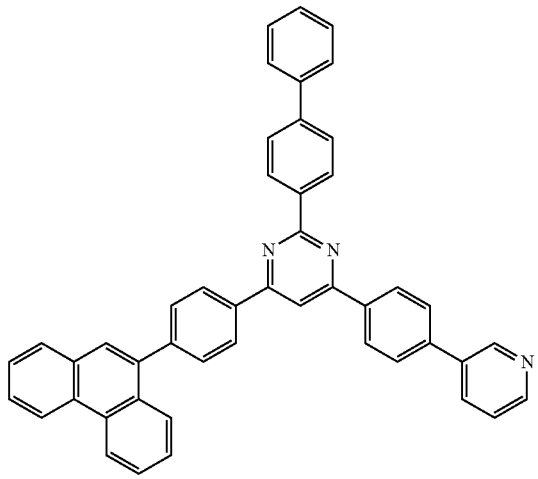

[Compound 61]

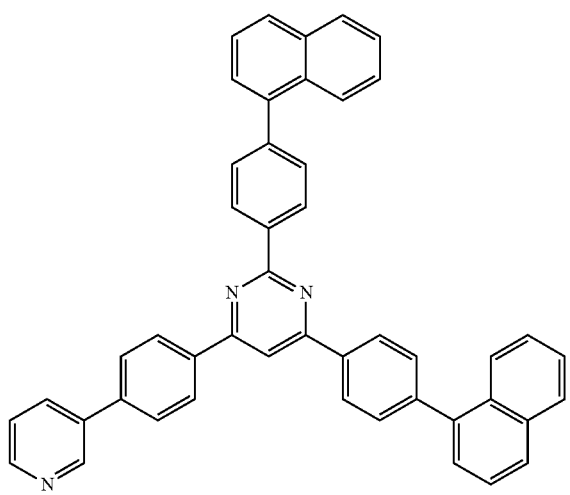

[Compound 62]

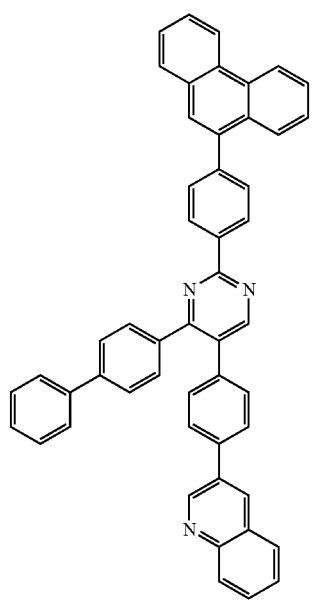

[Compound 63]

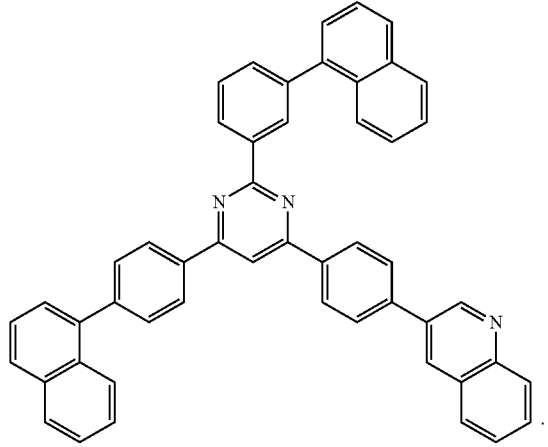

10. The organic light-emitting diode of claim 1, wherein the first electrode is an anode, the second electrode is a cathode, the light-emitting layer and the electron transport layer are sequentially arranged between the anode and the cathode, and an electron density control layer is further arranged between the light-emitting layer and the electron transport layer.

11. The organic light-emitting diode of claim 10, wherein the electron density control layer includes a compound represented by any one of the following Chemical Formulas F to H:

[Chemical Formula F]

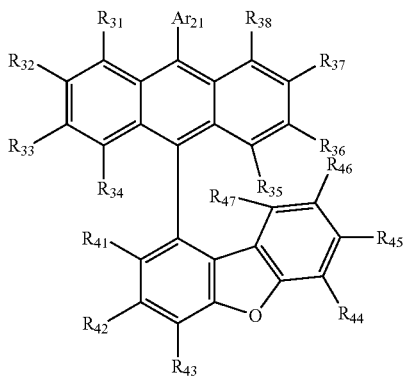

[Chemical Formula G]

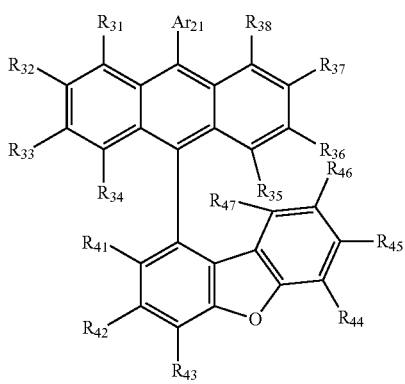

Structural Formula Q:

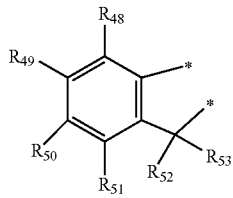

wherein,
R$_{31}$ to R$_{38}$, and R$_{41}$ to R$_{53}$ may be the same or different, and are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 2 to 50 carbon atoms bearing 0, N or S as a hetero atom, a cyano, a nitro, a halogen, a substituted or unsubstituted alkyl silyl of 1 to 30 carbon atoms, a substituted or unsubstituted alkyl germanium of 1 to 30 carbon atoms, a substituted or unsubstituted alkyl boron of 1 to 30 carbon atoms, a substituted or unsubstituted alkyl aluminum of 1 to 30 carbon atoms, a carbonyl, a phosphoryl, an amino, a thiol, a hydroxy, a selenium atom, a tellurium atom, an amide, an ether, and an ester;

Ar$_{21}$ is a substituted or unsubstituted aryl of 6 to 50 carbon atoms or a substituted or unsubstituted heteroaryl of 2 to 50 carbon atoms;

wherein adjacent two of the substituents R$_{41}$ to R$_{43}$ or adjacent two of the substituents R$_{44}$ to R$_{47}$ in Chemical Formula G are respective single bonds to form a 5-membered ring as a fused ring together with a carbon to which substituents R$_{52}$ and R$_{53}$ of Structural Formula Q are bonded, wherein a bond may be formed between the substituents R$_{52}$ and R$_{53}$ to form respective rings;

[Chemical Formula H]

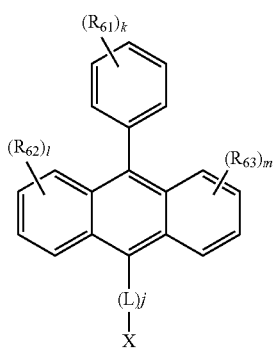

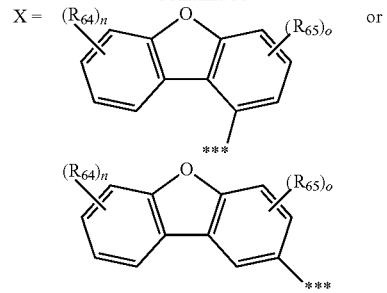

wherein,
R$_{61}$ to R$_{65}$ may be the same or different, and are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted aryl thioxy of 5 to 30 carbon atoms, a substituted or unsubstituted alkylamine of 1 to 30 carbon atoms, a substituted or unsubstituted aryl amine of 5 to 30 carbon atoms, a substituted or unsubstituted aryl of 6 to 50 carbon atoms, a substituted or unsubstituted heteroaryl of 2 to 50 carbon atoms bearing 0, N or S as a hetero atom, a cyano, a nitro, a halogen, a substituted or unsubstituted silyl of 1 to 30 carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium atom, a tellurium atom, an amide, an ether, and an ester, with the proviso that a hydrogen atom is positioned on each of the aromatic ring carbon atoms to which none of the substituents R$_{61}$ to R$_{65}$ are bonded;

the linker L is a single bond or a substituted or unsubstituted arylene of 6 to 60 carbon atoms;

j is an integer of 0 to 2;
k is an integer of 1 to 5;
l to n may be the same or different, and are each independently an integer of 1 to 4;
o is an integer of 1 to 3, with the proviso that when each of k to o is 2 or greater, corresponding R$_{61}$'s to R$_{65}$'s may be the same or different;

'***' denotes a bonding site for bonding the linker L;

wherein the term 'substituted' in the expression 'substituted or unsubstituted' used in Chemical Formulas F to H means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

12. The organic light-emitting diode of claim 10, wherein at least one selected from among a hole injection layer and a hole transport layer is arranged between the anode and the light-emitting layer, and an electron injection layer is optionally arranged between the electron transport layer and the cathode.

13. The organic light-emitting diode of claim 12, wherein at least one of the layers arranged between the anode and the cathode is formed using a deposition process or a solution process.

14. The organic light-emitting diode of claim 1, wherein the organic light-emitting diode is used for a device selected from among a flat display device; a flexible display device; a monochrome or grayscale flat illumination device; and a monochrome or grayscale flexible illumination device.

* * * * *